US012622164B2

(12) United States Patent
Allan et al.

(10) Patent No.: US 12,622,164 B2
(45) Date of Patent: May 5, 2026

(54) FOLDABLE SUBSTRATES AND METHODS OF MAKING

(71) Applicant: CORNING INCORPORATED, Corning, NY (US)

(72) Inventors: Douglas Clippinger Allan, Corning, NY (US); Matthew John Dejneka, Corning, NY (US); Yuhui Jin, Painted Post, NY (US); Xinghua Li, Horseheads, NY (US); Yousef Kayed Qaroush, Painted Post, NY (US); Tingge Xu, Santa Clara, CA (US)

(73) Assignee: CORNING INCORPORATED, Corning, NY (US)

( * ) Notice: Subject to any disclaimer, the term of this patent is extended or adjusted under 35 U.S.C. 154(b) by 205 days.

(21) Appl. No.: 18/023,824

(22) PCT Filed: Aug. 28, 2020

(86) PCT No.: PCT/US2020/048492
§ 371 (c)(1),
(2) Date: Feb. 28, 2023

(87) PCT Pub. No.: WO2022/046080
PCT Pub. Date: Mar. 3, 2022

(65) Prior Publication Data
US 2023/0309368 A1     Sep. 28, 2023

(51) Int. Cl.
*H10K 77/10*     (2023.01)
*H10K 102/00*     (2023.01)

(52) U.S. Cl.
CPC ...... *H10K 77/111* (2023.02); *H10K 2102/311* (2023.02); *H10K 2102/351* (2023.02)

(58) Field of Classification Search
CPC ............ H10K 77/111; H10K 2102/311; H10K 2102/351; B32B 1/00; B32B 2307/30; B32B 3/266; B32B 2457/20
See application file for complete search history.

(56) References Cited

U.S. PATENT DOCUMENTS 9,321,677 B2 *  4/2016  Chang ...................... B32B 7/12
9,578,150 B2    2/2017  Xie et al.
(Continued)

FOREIGN PATENT DOCUMENTS

CN        104347000 A      2/2015
CN        104724917 A      6/2015
(Continued)

OTHER PUBLICATIONS

Chinese Patent Application No. 202080106831.0 , Office Action dated May 31, 2024, 5 pages (English Translation only), Chinese Patent Office.
(Continued)

*Primary Examiner* — J. E. Schoenholtz
(74) *Attorney, Agent, or Firm* — Yiqun Zhao

(57)     ABSTRACT
Foldable substrates comprise a first outer layer comprising a first major surface, a second outer layer comprising a second major surface, and a core layer positioned therebetween. The core layer may comprise a first central surface area positioned between a first portion and a second portion of the first outer layer, and the core layer comprising a second central surface area positioned between a third portion and fourth portion of the second outer layer. Some foldable substrates comprise a first portion comprising a first depth of compression, a first depth of layer, and a first average concentration. The central portion may comprise a first central depth of compression, a first central depth of layer, and a central average concentration. Methods comprise chemically strengthening a foldable substrate. Some meth-
(Continued)

ods comprise etching the foldable substrate and then further chemically strengthening the foldable substrate.

15 Claims, 27 Drawing Sheets

(56) References Cited

U.S. PATENT DOCUMENTS

| | | | |
|---|---|---|---|
| 9,779,190 | B2 | 10/2017 | Ahmed et al. |
| 10,545,537 | B2 | 1/2020 | Ahn et al. |
| 2010/0167059 | A1 | 7/2010 | Hashimoto et al. |
| 2015/0043174 | A1* | 2/2015 | Han .................... G02F 1/13452 |
| | | | 428/156 |
| 2015/0110990 | A1 | 4/2015 | Chou et al. |
| 2015/0210588 | A1* | 7/2015 | Chang .................... B32B 37/16 |
| | | | 428/220 |
| 2015/0210589 | A1 | 7/2015 | Chang et al. |
| 2015/0227172 | A1 | 8/2015 | Namkung et al. |
| 2016/0214889 | A1 | 7/2016 | Garner et al. |
| 2016/0224069 | A1 | 8/2016 | Chang et al. |
| 2017/0309843 | A1 | 10/2017 | Kim |
| 2018/0009706 | A1 | 1/2018 | Luo et al. |
| 2018/0224894 | A1 | 8/2018 | Namkung et al. |
| 2019/0106353 | A1 | 4/2019 | Rai et al. |
| 2019/0161401 | A1 | 5/2019 | Kuang et al. |
| 2020/0006683 | A1 | 1/2020 | Kim |
| 2020/0264669 | A1* | 8/2020 | Namkung ............. G06F 1/1652 |
| 2021/0107251 | A1 | 4/2021 | Chen et al. |
| 2021/0107829 | A1 | 4/2021 | Chen et al. |
| 2021/0230057 | A1 | 7/2021 | Kuang et al. |
| 2022/0212446 | A1 | 7/2022 | Harris et al. |
| 2022/0274871 | A1 | 9/2022 | Allan et al. |
| 2022/0291712 | A1 | 9/2022 | Baby et al. |

FOREIGN PATENT DOCUMENTS

| | | | |
|---|---|---|---|
| CN | 104835415 | A | 8/2015 |
| CN | 107305906 | A | 10/2017 |
| CN | 108328939 | A | 7/2018 |
| CN | 111433167 | A | 7/2020 |
| GB | 1253284 | A | 11/1971 |
| KR | 10-2016-0058792 | A | 5/2016 |
| KR | 10-2068685 | B1 | 1/2020 |
| KR | 10-2068729 | B1 | 1/2020 |
| KR | 10-2069040 | B1 | 1/2020 |

OTHER PUBLICATIONS

International Search Report and Written Opinion of the International Searching Authority; PCT/US2020/048492 Mailed on May 21, 2021, 16 pages; European Patent Office.

Sun et al., "A Study On Ion-Exchanged, Soda-Lime Glass's Residual Stress Relationship With K+/Na+ Concentration", Int. J. Appl Glass Sci., vol. 11, 2020, pp. 134-146.

Tandia et al., "Elasticity of Ion Stuffing in Chemically Strengthened Glass", Journal of Non-Crystalline Solids, vol. 358, 2012, pp. 1569-1574.

Chinese Patent Application No. 202080106831.0, Office Action dated Mar. 7, 2025, 5 pages (English Translation only), Chinese Patent Office.

Korean Patent Application No. 10-2023-7010332, Notice of Allowance dated Aug. 28, 2025, 3 pages (English Translation only), Korean Patent Office.

Li et al., "China Die & Mould Design Canon", Design of Moulds for Light Industry, vol. 2, 2003, 8 pages (2 pages of English Translation and 6 pages of Original Document).

* cited by examiner

*101, 301, 401, 501, 601, 701, 801*

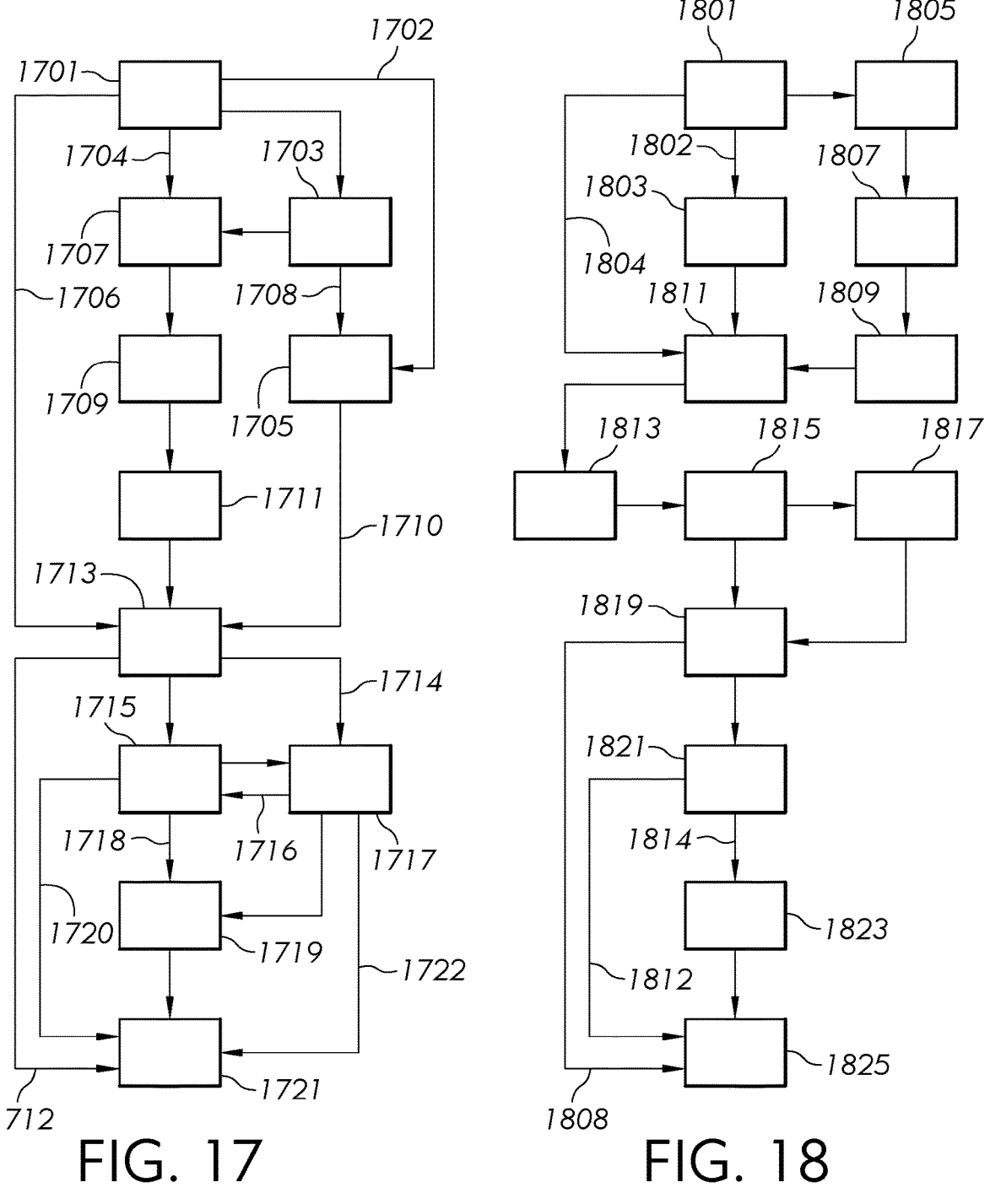
FIG. 17                                    FIG. 18

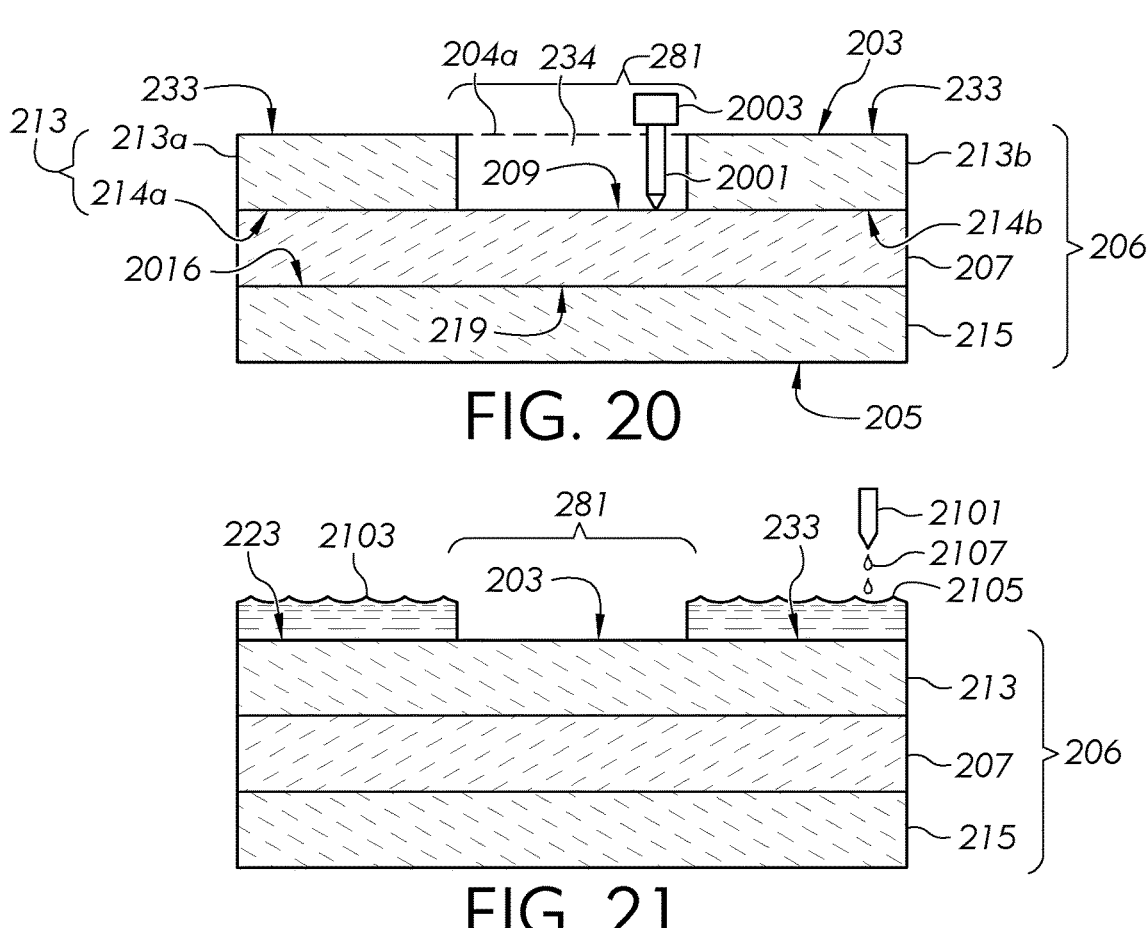
FIG. 20
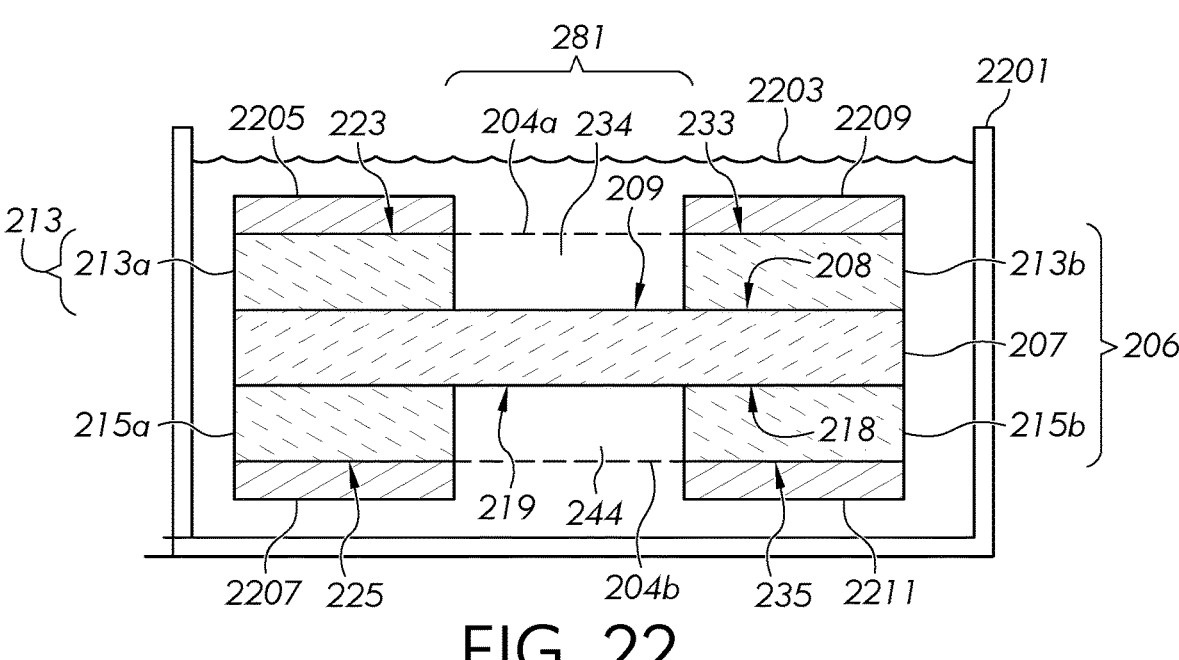
FIG. 21
FIG. 22

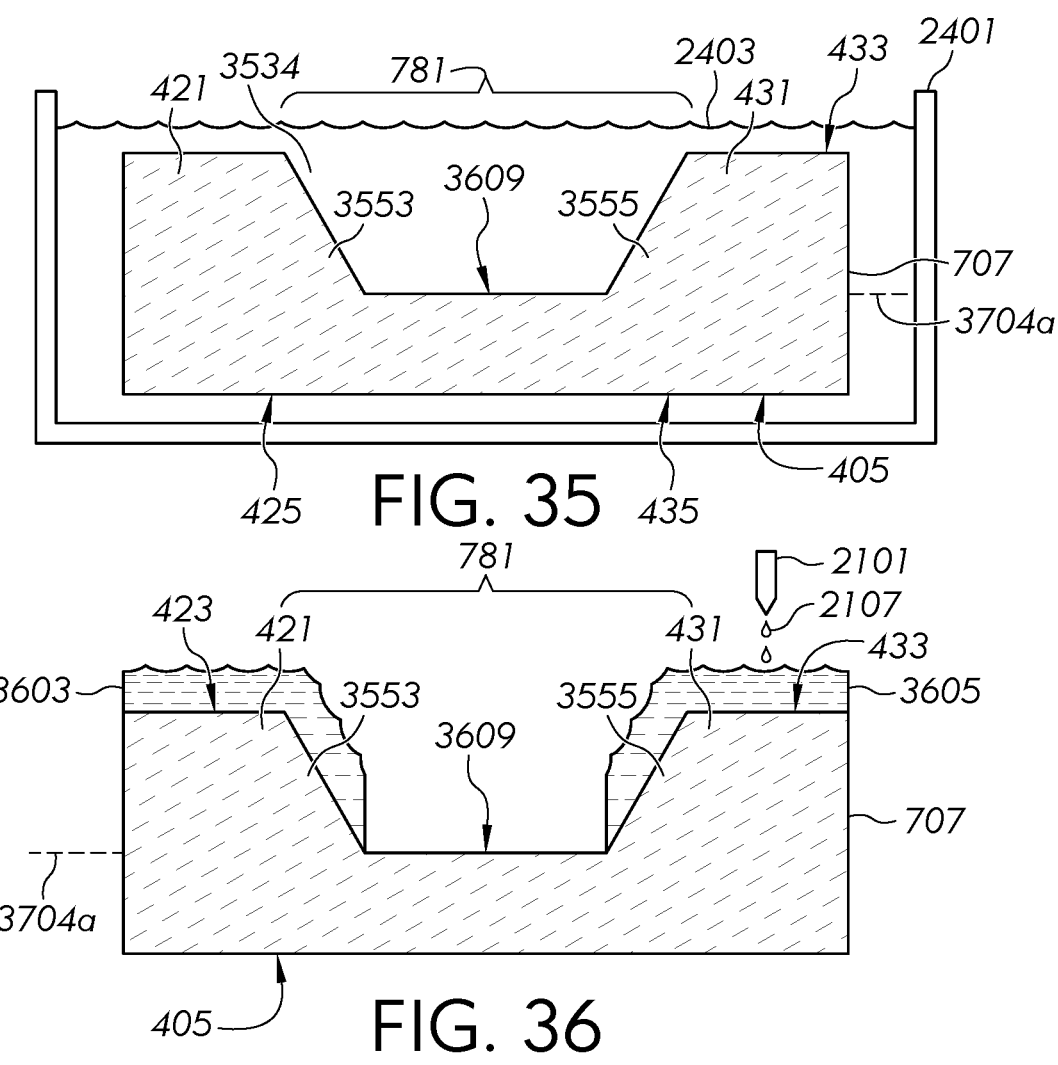
FIG. 35
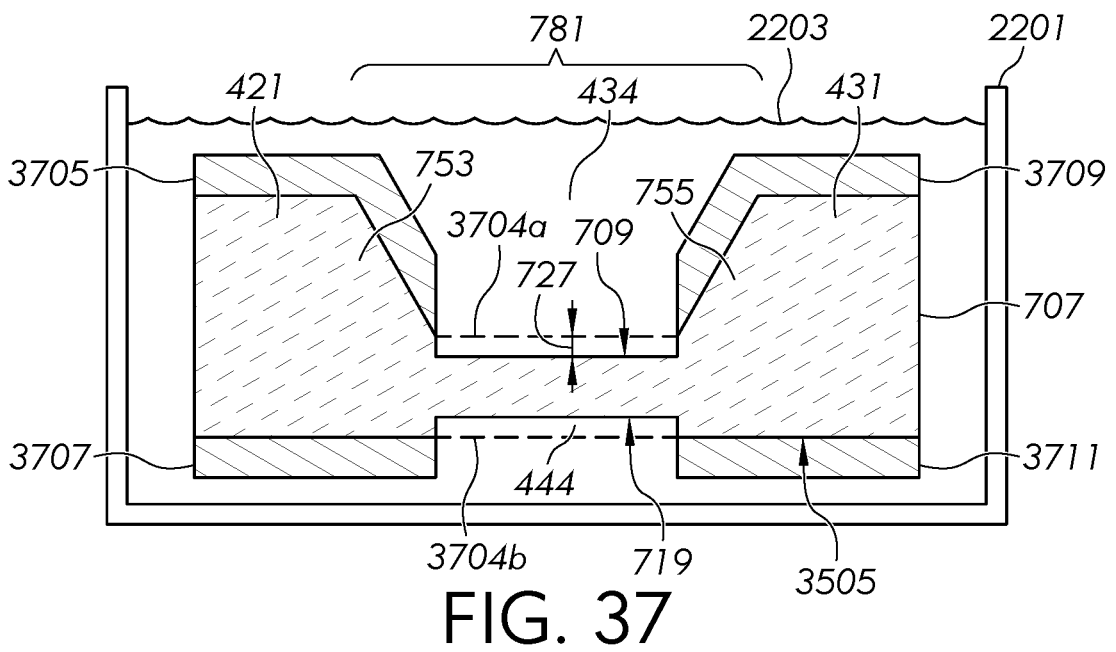
FIG. 36
FIG. 37

FOLDABLE SUBSTRATES AND METHODS OF MAKING

CROSS-REFERENCE TO RELATED APPLICATIONS

This application is a national stage entry of International Patent Application Serial No. PCT/US2020/048492, filed on Aug. 28, 2020, the content of which is relied upon and incorporated herein by reference in its entirety.

FIELD

The present disclosure relates generally to foldable substrates and methods of making and, more particularly, to foldable substrates comprising portions and methods of making foldable substrates.

BACKGROUND

Glass-based substrates are commonly used, for example, in display devices, for example, liquid crystal displays (LCDs), electrophoretic displays (EPD), organic light emitting diode displays (OLEDs), plasma display panels (PDPs), or the like.

There is a desire to develop foldable versions of displays as well as foldable protective covers to mount on foldable displays. Foldable displays and covers should have good impact and puncture resistance. At the same time, foldable displays and covers should have small minimum bend radii (e.g., about 10 millimeters (mm) or less). However, plastic displays and covers with small minimum bend radii tend to have poor impact and/or puncture resistance. Furthermore, conventional wisdom suggests that ultra-thin glass-based sheets (e.g., about 75 micrometers (μm or microns) or less thick) with small minimum bend radii tend to have poor impact and/or puncture resistance. Furthermore, thicker glass-based sheets (e.g., greater than 125 micrometers) with good impact and/or puncture resistance tend to have relatively large minimum bend radii (e.g., about 30 millimeters or more). Consequently, there is a need to develop foldable apparatus that have low minimum bend radii and good impact and puncture resistance.

SUMMARY

There are set forth herein foldable apparatus comprising foldable substrates, foldable substrates, and methods of making foldable apparatus and foldable substrates comprising foldable substrates that comprise a first portion and a second portion. The portions can comprise glass-based and/or ceramic-based portions, which can provide good dimensional stability, reduced incidence of mechanical instabilities, good impact resistance, and/or good puncture resistance. The first portion and/or the second portion can comprise glass-based and/or ceramic-based portions comprising one or more compressive stress regions, which can further provide increased impact resistance and/or increased puncture resistance. By providing a substrate comprising a glass-based and/or ceramic-based substrate, the substrate can also provide increased impact resistance and/or puncture resistance while simultaneously facilitating good folding performance. In some embodiments, the substrate thickness can be sufficiently large (e.g., from about 80 micrometers (microns or μm) to about 2 millimeters) to further enhance impact resistance and puncture resistance. Providing foldable substrates comprising a central portion comprising a central thickness that is less than a substrate thickness (e.g., first thickness of the first portion and/or second thickness of the second portion) can enable small effective minimum bend radii (e.g., about 10 millimeters or less) based on the reduced thickness in the central portion.

In some embodiments, the foldable apparatus and/or foldable substrates can comprise a plurality of recesses, for example, a first central surface area recessed from a first major surface by a first distance and a second central surface area recessed from a second major surface by a second distance. Providing a first recess opposite a second recess can provide the central thickness that is less than a substrate thickness. Further, providing a first recess opposite a second recess can reduce a maximum bend-induced strain of the foldable apparatus, for example, between a central portion and a first portion and/or second portion since the central portion comprising the central thickness can be closer to a neutral axis of the foldable apparatus and/or foldable substrates than if only single recess was provided. Additionally, providing the first distance substantially equal to the second distance can reduce the incidence of mechanical instabilities in the central portion, for example, because the foldable substrate is symmetric about a plane comprising a midpoint in the substrate thickness and the central thickness. Moreover, providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials can be positioned in the first recess, which can improve impact resistance, puncture resistance, abrasion resistance, and/or scratch resistance of the foldable apparatus. Additionally, controlling properties of a first material positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure.

In some embodiments, the foldable apparatus and/or foldable substrates can comprise a first transition portion attaching the central portion to the first portion and/or a second transition region attaching the central portion to the second portion. Providing transition regions with continuously increasing thicknesses can reduce stress concentration in the transition regions and/or avoid optical distortions. Providing a sufficient length of the transition region(s) (e.g., about 1 mm or more) can avoid optical distortions that may otherwise exist from an abrupt, stepped changed in thickness of the foldable substrate. Providing a sufficiently small length of the transition regions (e.g., about 5 mm or less) can reduce the amount of the foldable apparatus and/or foldable substrates having an intermediate thickness that may have reduced impact resistance and/or reduced puncture resistance. Further, providing the first transition portion and/or the second transition portion with a tensile stress region comprising a maximum tensile stress that is greater than a maximum tensile stress of a central tensile stress region of the central portion can counteract a strain between the first portion or the second portion and the first transition portion and/or second transition portion during folding. Further, providing the first transition portion and/or the second transition portion with a tensile stress region comprising a maximum tensile stress that is greater than a maximum tensile stress of a first tensile stress region of the first portion and/or a second tensile stress region of the second portion can counteract a strain between the central portion and the first transition portion and/or second transition portion during folding.

Apparatus and methods of embodiments of the disclosure and reduce (e.g., mitigate, eliminate) the incidence of mechanical instabilities, apparatus fatigue, and/or apparatus failure by controlling (e.g., limiting, reducing, equalizing) a difference between an expansion of different portions of the foldable apparatus and/or the foldable substrates as a result of chemically strengthening. Controlling the difference between the expansion of different portion can reduce the chemical strengthening induced strain between portions of the foldable apparatus and/or the foldable substrates that can facilitate a greater fold-induced strain before the foldable apparatus and/or foldable substrates reach a critical buckling strain (e.g., onset of mechanical instabilities). Further, reducing mechanical instabilities and/or the difference between the core layer and the first outer layer and/or the first outer layer or the difference between the central portion and the first portion and/or the second portion can reduce optical distortions, for example, caused by strain within the foldable apparatus and/or foldable substrate from such difference(s).

In some embodiments, providing a foldable apparatus and/or foldable substrates comprising a laminate can enable control of a difference in expansion between a first portion, a second portion, and a central portion in a single chemically strengthening process. For example, the properties of a core layer relative to a first outer layer and/or a second outer layer can enable a substantially uniform expansion of the foldable apparatus and/or foldable substrate. In some embodiments, a density of the core layer can be greater than a density of the first outer layer and/or the second outer layer. In some embodiments, a coefficient of thermal expansion of the core layer can be greater than a coefficient of thermal expansion of the first outer layer and/or the second outer layer. In some embodiments, a network dilation coefficient of the core layer can be less than a network dilation coefficient of the first outer layer and/or the second outer layer. Further, providing a core layer with a relationship to the first outer layer and/or the second outer layer can reduce (e.g., minimize) a force to fold the foldable apparatus and/or foldable substrates.

Providing a first portion and/or a second portion comprising an average concentration of one or more alkali metal that is close to (e.g., within 100 parts per million, 10 parts per million on an oxide basis) a concentration of one or more alkali metal of the central portion can minimize differences in expansion of the first portion and/or the second portion compared to the central portion as a result of chemically strengthening. Substantially uniform expansion can decrease the incidence of mechanical deformation and/or mechanical instability as a result of the chemically strengthening.

Providing a ratio of a depth of layer to a thickness of the first portion and/or the second portion that is close to (e.g., within 0.5%, within 0.1%, within 0.01%) a corresponding ratio of the central portion can minimize differences in near-surface expansion of the first portion and/or the second portion compared to the central portion as a result of chemically strengthening. Minimizing differences in near-surface expansion can reduce stresses and/or strains in a plane of the first major surface, the second major surface, the first central surface area, and/or the second central surface area, which can further reduce the incidence of mechanical deformation and/or mechanical instability as a result of the chemically strengthening.

Providing a ratio of a depth of compression to a thickness of the first portion and/or the second portion that is close to (e.g., within 1%, within 0.5%, within 0.1%) a corresponding ratio of the central portion can minimize differences between chemically strengthening-induced strains in the first portion and/or the second portion relative to the central portion. Minimizing differences in chemically strengthening-induced strains can reduce the incidence of mechanical deformation and/or mechanical instability as a result of the chemically strengthening.

Minimizing stresses and/or strains in the first major surface, the second major surface, the first central surface area, and/or the second central surface area can reduce stress-induced optical distortions. Also, minimizing such stresses can increase puncture and/or impact resistance. Also, minimizing such stresses can be associated with low difference in optical retardation along a centerline (e.g., about 2 nanometers or less). Further, minimizing such stresses can reduce the incidence of mechanical deformation and/or mechanical instability as a result of the chemically strengthening.

Methods of the disclosure can enable making foldable substrates comprising one or more of the above-mentioned benefits. In some embodiments, methods of the disclosure can achieve the above-mentioned benefits in a single chemically strengthening step, for example making a foldable substrate comprising a laminate, which can reduce time, equipment, space, and labor costs associated with producing a foldable substrate. In some embodiments, an existing recess (e.g., existing first central surface area recessed from the first major surface, existing second central surface area recessed from the second major surface) may be provided or formed prior to any chemically strengthening of the foldable substrate, which can provide the above benefits for foldable apparatus with deeper recesses (e.g., greater first distance, greater second distance) than might otherwise be achievable. In some embodiments, the above benefits can be provided by chemically strengthening the foldable substrate, etching the central portion of the foldable substrate (e.g., etching an existing first central surface area to form a new first central surface area, etching an existing second central surface area to form a new second central surface area), and then further chemically strengthening the foldable substrate. In further embodiments, the above benefits can be provided by controlling a period of time of the chemically strengthening relative to a second period of time of the further chemically strengthening, and/or a thickness etched from the central portion. Providing the further chemically strengthening the foldable substrate can achieve greater compressive stresses without encountering mechanical deformation and/or mechanical instability, and the greater compressive stresses can further increase the impact and/or puncture resistance of the foldable substrate.

Some example embodiments of the disclosure are described below with the understanding that any of the features of the various embodiments may be used alone or in combination with one another.

Embodiment 1. A foldable substrate comprises a substrate thickness defined between a first major surface and a second major surface opposite the first major surface. The substrate thickness in a range from about 100 micrometers to about 2 millimeters. The foldable substrate comprises a first outer layer comprising the first major surface and a first inner surface opposite the first major surface. A first outer thickness is defined between the first major surface and the first inner surface. The first outer layer comprises a first portion and a second portion separated by a first minimum distance. The first portion comprises the first major surface and the first inner surface. The second portion comprises the first major surface and the first inner surface. The foldable substrate comprises a second outer layer comprising the second major surface and a second inner surface opposite the second major surface. The second outer layer comprises a second outer thickness defined between the second major surface and the second inner surface. The second outer layer comprises a third portion and a fourth portion separated by a second minimum distance. The third portion comprises the second major surface and the second inner surface. The fourth portion comprises the second major surface and the second inner surface. The foldable substrate comprises a core layer comprising a third inner surface and a fourth inner surface opposite the third inner surface. A central thickness is defined between the third inner surface and the fourth inner surface. The central thickness is in a range from about 25 micrometers to about 80 micrometers. The core layer is positioned between the first outer layer and the second outer layer. The third inner surface contacts the first inner surface of the first portion and the first inner surface of the second portion. A first central surface area is positioned between the first portion of the first outer layer and the second portion of the first outer layer. The fourth inner surface contacts the second inner surface of the third portion and the second inner surface of the fourth portion. A second central surface area is positioned between the third portion of the second outer layer and the fourth portion of the second outer layer. The first central surface area is recessed from the first major surface by a first distance. The second central surface area is recessed from the second major surface by a second distance.

Embodiment 2. The foldable substrate of embodiment 1, wherein the core layer comprises a core coefficient of thermal expansion that is greater than a first coefficient of thermal expansion of the first outer layer. The core coefficient of thermal expansion is greater than a second coefficient of thermal expansion of the second outer layer.

Embodiment 3. The foldable substrate of embodiment 2, wherein the first coefficient of thermal expansion is substantially equal to the second coefficient of thermal expansion.

Embodiment 4. The foldable substrate of any one of embodiments 2-3, wherein the core coefficient of thermal expansion is from about $10 \times 10^{-7 \circ}$ C.$^{-1}$ to about $70 \times 10^{-7 \circ}$ C.$^{-1}$ more than the first coefficient of thermal expansion.

Embodiment 5. The foldable substrate of any one of embodiments 1-4, wherein a core density of the core layer is greater than a first density of the first outer layer. The core density is greater than a second density of the second outer layer.

Embodiment 6. The foldable substrate of embodiment 5, wherein the core density is from about 0.01 to about 0.05 grams per cubic centimeter (g/cm$^3$) more than the first density.

Embodiment 7. The foldable substrate of any one of embodiments 5-6, wherein the first density is substantially equal to the second density.

Embodiment 8. The foldable substrate of any one of embodiments 1-7, wherein a core network dilation coefficient of the core layer is less than a first network dilation coefficient of the first outer layer. The core network dilation coefficient is less than a second network dilation coefficient of the second outer layer.

Embodiment 9. The foldable substrate of embodiment 8, wherein the first network dilation coefficient is substantially equal to the second network dilation coefficient.

Embodiment 10. The foldable substrate of any one of embodiments 1-9, wherein the first minimum distance is in a range from about 5 millimeters to about 50 millimeters.

Embodiment 11. The foldable substrate of any one of embodiments 1-10, wherein the first minimum distance is substantially equal to the second minimum distance.

Embodiment 12. The foldable substrate of any one of embodiments 1-11, wherein the first outer thickness is substantially equal to the second outer thickness.

Embodiment 13. The foldable substrate of any one of embodiments 1-12, wherein the substrate thickness is in a range from about 125 micrometers to about 200 micrometers.

Embodiment 14. The foldable substrate of any one of embodiments 1-13, wherein the central thickness is in a range from about 25 micrometers to about 60 micrometers.

Embodiment 15. The foldable substrate of any one of embodiments 1-14, wherein the first outer layer comprises a glass-based substrate.

Embodiment 16. The foldable substrate of any one of embodiments 1-14, wherein the first outer layer comprises a ceramic-based substrate.

Embodiment 17. The foldable substrate of any one of embodiments 1-16, wherein the core layer comprises a glass-based substrate.

Embodiment 18. The foldable substrate of any one of embodiments 1-16, wherein the core layer comprises a ceramic-based substrate.

Embodiment 19. The foldable substrate of any one of embodiments 1-17, further comprising a coating disposed over the first major surface and filling a recess defined between the first central surface area and a first plane defined by the first major surface.

Embodiments 20. The foldable substrate of any one of embodiments 1-19, wherein the first outer layer comprises a first average concentration of potassium on an oxide basis, the second outer layer comprises a second average concentration of potassium on an oxide basis, and a central portion of the core layer positioned between the first central surface area and the second central surface area comprises a central average concentration of potassium on an oxide basis. An absolute difference between the first average concentration of potassium and the central average concentration of potassium is about 100 parts per million or less.

Embodiment 21. The foldable substrate of embodiment 20, wherein an absolute difference between the second average concentration of potassium and the central average concentration of potassium is about 100 parts per million or less.

Embodiment 22. The foldable substrate of any one of embodiments 1-21, further comprising a first compressive stress region extending to a first depth of compression from the first portion of the first outer layer at the first major surface. The foldable substrate comprises a second compressive stress region extending to a second depth of compression from the third portion of the second outer layer at the second major surface. The foldable substrate comprises a third compressive stress region extending to a third depth of compression from the second portion of the first outer layer at the first major surface. The foldable substrate comprises a fourth compressive stress region extending to a fourth depth of compression from the fourth portion of the second outer layer at the second major surface. The foldable substrate comprises a first central compressive stress region extending to a first central depth of compression from the first central surface area. The foldable substrate comprises a second central compressive stress region extending to a second central depth of compression extending from the second central surface area.

Embodiment 23. The foldable substrate of embodiment 22, wherein an absolute difference between the first depth of compression as a percentage of the substrate thickness and the first central depth of compression as a percentage of the central thickness is about 1% or less.

Embodiment 24. The foldable substrate of any one of embodiments 22-23, wherein an absolute difference between the third depth of compression as a percentage of the substrate thickness and the first central depth of compression as a percentage of the central thickness is about 1% or less.

Embodiment 25. The foldable substrate of any one of embodiments 22-24, wherein an absolute difference between the second depth of compression as a percentage of the substrate thickness and the second central depth of compression as a percentage of the central thickness is about 1% or less.

Embodiment 26. The foldable substrate of any one of embodiments 22-25, wherein an absolute difference between the fourth depth of compression as a percentage of the substrate thickness and the second central depth of compression as a percentage of the central thickness is about 1% or less.

Embodiment 27. The foldable substrate of any one of embodiments 22-26, wherein the first portion comprises a first depth of layer of one or more alkali metal ions associated with the first depth of compression. The third portion comprises a second depth of layer of one or more alkali metal ions associated with the second depth of compression. The second portion comprises a third depth of layer of one or more alkali metal ions associated with the third depth of compression. The fourth portion comprises a fourth depth of layer of one or more alkali metal ions associated with the fourth depth of compression. The central portion comprises a first central depth of layer of one or more alkali metal ions associated with the first central depth of compression. The central portion comprises a second central depth of layer of one or more alkali metal ions associated with the second central depth of compression. An absolute difference between the first depth of layer as a percentage of the substrate thickness and a first central depth of layer as a percentage of the central thickness is about 0.5% or less.

Embodiment 28. The foldable substrate of embodiment 27, wherein an absolute difference between the third depth of layer as a percentage of the substrate thickness and the first central depth of layer as a percentage of the central thickness is about 0.5% or less.

Embodiment 29. The foldable substrate of any one of embodiments 27-28, wherein an absolute difference between the second depth of layer as a percentage of the substrate thickness and the second central depth of layer as a percentage of the central thickness is about 0.5% or less.

Embodiment 30. The foldable substrate of any one of embodiments 27-29, wherein an absolute difference between the fourth depth of layer as a percentage of the substrate thickness and the second central depth of layer as a percentage of the central thickness is about 0.5% or less.

Embodiment 31. The foldable substrate of any one of embodiments 1-30, wherein the second central surface area is recessed from the second major surface area by a second distance. The second distance is from about 5% to about 20% of the substrate thickness.

Embodiment 32. The foldable substrate of embodiment 31, wherein the first distance is substantially equal to the second distance.

Embodiment 33. A foldable substrate comprises a substrate thickness defined between a first major surface and a second major surface opposite the first major surface. The substrate thickness is in a range from about 100 micrometers to about 2 millimeters. The foldable substrate comprises a first portion comprising the substrate thickness. The first portion comprises a first compressive stress region extending to a first depth of compression from the first major surface. The first portion comprises a second compressive stress region extending to a second depth of compression from the second major surface. The first portion comprises a first depth of layer of one or more alkali metal ions associated with the first depth of compression. The first portion comprises a second depth of layer of one or more alkali metal ions associated with the second depth of compression. The foldable substrate comprises a second portion comprising the substrate thickness. The second portion comprises a third compressive stress region extending to a third depth of compression from the first major surface. The second portion comprises a fourth compressive stress region extending to a fourth depth of compression from the second major surface. The second portion comprises a third depth of layer of one or more alkali metal ions associated with the third depth of compression. The second portion comprises a fourth depth of layer of one or more alkali metal ions associated with the fourth depth of compression. The foldable substrate comprises a central portion is positioned between the first portion and the second portion. The central portion comprises a central thickness defined between a first central surface area and a second central surface area opposite the first central surface area. The central portion comprises a first central compressive stress region extending to a first central depth of compression from the first central surface area. The central portion comprises a second central compressive stress region extending to a second central depth of compression from the second central surface area. The central portion comprises a first central depth of layer of one or more alkali metal ions associated with the first central depth of compression. The central portion comprises a second central depth of layer of the one or more alkali metal ions associated with the second central depth of compression. The central thickness is in a range from about 25 micrometers to about 80 micrometers. The first central surface area is recessed from the first major surface by a first distance. An absolute difference between the first depth of layer as a percentage of the substrate thickness and the first central depth of layer as a percentage of the central thickness is about 0.5% or less.

Embodiment 34. The foldable substrate of embodiment 33, wherein an absolute difference between the third depth of layer as a percentage of the substrate thickness and the first central depth of layer as a percentage of the central thickness is about 0.5% or less.

Embodiment 35. The foldable substrate of any one of embodiments 33-34, wherein an absolute difference between the second depth of layer as a percentage of the substrate thickness and the second central depth of layer as a percentage of the central thickness is about 0.5% or less.

Embodiment 36. The foldable substrate of any one of embodiments 33-35, wherein an absolute difference between the fourth depth of layer as a percentage of the substrate thickness and the second central depth of layer as a percentage of the central thickness is about 0.5% or less.

Embodiment 37. The foldable substrate of any one of embodiments 33-36, wherein the first portion comprises a first average concentration of potassium on an oxide basis, the second portion comprises a second average concentration of potassium on an oxide basis, and the central portion comprises a central average concentration of potassium on an oxide basis. An absolute difference between the first average concentration of potassium and the central average concentration of potassium is about 100 parts per million or less.

Embodiment 38. A foldable substrate comprises a substrate thickness defined between a first major surface and a second major surface opposite the first major surface. The substrate thickness is in a range from about 100 micrometers to about 2 millimeters. The foldable substrate comprises a first portion comprising the substrate thickness. The first portion comprises a first average concentration of potassium on an oxide basis. The first portion comprises a first compressive stress region extending to a first depth of compression from the first major surface. The first portion comprises a second compressive stress region extending to a second depth of compression from the second major surface. The foldable substrate comprises a second portion comprising the substrate thickness. The second portion comprises a second average concentration of potassium on an oxide basis. The second portion comprises a third compressive stress region extending to a third depth of compression from the first major surface. The second portion comprises a fourth compressive stress region extending to a fourth depth of compression from the second major surface. The foldable substrate comprises a central portion positioned between the first portion and the second portion. The central portion comprises a central thickness defined between a first central surface area and a second central surface area opposite the first central surface area. The central portion comprises a central average concentration of potassium on an oxide basis. The central portion comprises a first central compressive stress region extending to a first central depth of compression from the first central surface area. The central portion comprises a second central compressive stress region extending to a second central depth of compression from the second central surface area. The central thickness is in a range from about 25 micrometers to about 80 micrometers. The first central surface area is recessed from the first major surface by a first distance. An absolute difference between the first average concentration of potassium and the central average concentration of potassium is about 100 parts per million or less.

Embodiment 39. The foldable substrate of any one of embodiments 37-38, wherein an absolute difference between the second average concentration of potassium and the central average concentration of potassium is about 100 parts per million or less.

Embodiment 40. The foldable substrate of any one of embodiments 33-39, wherein an absolute difference between the first depth of compression as a percentage of the substrate thickness and the first central depth of compression as a percentage of the central thickness is about 1% or less.

Embodiment 41. A foldable substrate comprises a substrate thickness defined between a first major surface and a second major surface opposite the first major surface. The substrate thickness is in a range from about 100 micrometers to about 2 millimeters. The foldable substrate comprises a first portion comprising the substrate thickness. The first portion comprises a first compressive stress region extending to a first depth of compression from the first major surface. The first portion comprises a second compressive stress region extending to a second depth of compression from the second major surface. The foldable substrate comprises a second portion comprising the substrate thickness. The second portion comprises a third compressive stress region extending to a third depth of compression from the first major surface. The second portion comprises a fourth compressive stress region extending to a fourth depth of compression from the second major surface. The foldable substrate comprises a central portion comprising a central thickness defined between a first central surface area and a second central surface area opposite the first central surface area. The central portion comprises a first central compressive stress region extending to a first central depth of compression from the first central surface area. The central portion comprises a second central compressive stress region extending to a second central depth of compression from the second central surface area. The central thickness is in a range from about 25 micrometers to about 80 micrometers. The first central surface area is recessed from the first major surface by a first distance. The central portion is positioned between the first portion and the second portion. An absolute difference between the first depth of compression as a percentage of the substrate thickness and the first central depth of compression as a percentage of the central thickness is about 1% or less.

Embodiment 42. The foldable substrate of any one of embodiments 40-41, wherein an absolute difference between the third depth of compression as a percentage of the substrate thickness and the first central depth of compression as a percentage of the central thickness is about 1% or less.

Embodiment 43. The foldable substrate of any one of embodiments 40-42, wherein an absolute difference between the second depth of compression as a percentage of the substrate thickness and the second central depth of compression as a percentage of the central thickness is about 1% or less.

Embodiment 44. The foldable substrate of any one of embodiments 40-43, wherein an absolute difference between the fourth depth of compression as a percentage of the substrate thickness and the second central depth of compression as a percentage of the central thickness is about 1% or less.

Embodiment 45. The foldable substrate of any one of embodiments 33-44, wherein the substrate thickness is in a range from about 125 micrometers to about 200 micrometers.

Embodiment 46. The foldable substrate of any one of embodiments 33-45, wherein the central thickness is in a range from about 25 micrometers to about 60 micrometers.

Embodiment 47. The foldable substrate of any one of embodiments 33-46, wherein the foldable substrate comprises a glass-based substrate.

Embodiment 48. The foldable substrate of any one of embodiments 33-46, wherein the foldable substrate comprises a ceramic-based substrate.

Embodiment 49. The foldable substrate of any one of embodiments 33-48, wherein the second central surface area is recessed from the second major surface by a second distance.

Embodiment 50. The foldable substrate of embodiment 49, wherein the second distance is from about 5% to about 20% of the substrate thickness.

Embodiment 51. The foldable substrate of any one of embodiments 49-50, wherein the first distance is substantially equal to the second distance.

Embodiment 52. The foldable substrate of any one of embodiments 49-51, wherein the second major surface comprises the second central surface area.

Embodiment 53. The foldable substrate of any one of embodiments 22-52, wherein the first compressive stress region comprises a first maximum compressive stress of about 700 MegaPascals or more. The second compressive stress region comprises a second maximum compressive stress. The third compressive stress region comprises a third maximum compressive stress of about 700 MegaPascals or more. The fourth compressive stress region comprises a fourth maximum compressive stress. The first central compressive stress region comprises a first central maximum compressive stress of about 700 MegaPascals or more. The second central compressive stress region comprises a second central maximum compressive stress.

Embodiment 54. The foldable substrate of embodiment 53, wherein the second maximum compressive stress is about 700 MegaPascals or more. The fourth maximum compressive stress is about 700 MegaPascals or more. The second central maximum compressive stress is about 700 MegaPascals or more.

Embodiment 55. The foldable substrate of any one of embodiments 22-53, further comprising a first tensile stress region of the first portion positioned between the first compressive stress region and the second compressive stress region. The first tensile stress region comprises a first maximum tensile stress. The foldable substrate comprises a second tensile stress region of the second portion positioned between the third compressive stress region and the fourth compressive stress region. The second tensile stress region comprises a second maximum tensile stress. The foldable substrate comprises a central tensile stress region of the central portion positioned between the first central compressive stress region and a second central compressive stress region. The central tensile stress region comprises a central maximum tensile stress. An absolute difference between the central maximum tensile stress and the first maximum tensile stress is about 10 MegaPascals or less.

Embodiment 56. The foldable substrate of embodiment 55, wherein an absolute difference between the central maximum tensile stress and the second maximum tensile stress is about 10 MegaPascals or less.

Embodiment 57. The foldable substrate of any one of embodiments 55-56, wherein the first maximum tensile stress is substantially equal to the second maximum tensile stress.

Embodiment 58. The foldable substrate of any one of embodiments 22-57, wherein the central portion further comprises a central tensile stress region of the central portion positioned between a portion of the first central surface area and a portion of the second central surface area. The central tensile stress region comprising a central maximum tensile stress. The central portion comprises a first transition portion attaching the first central major surface to the first portion. The first transition portion comprising a first transition tensile stress region comprising a first transition maximum tensile stress. The central portion comprises a second transition portion attaching the first central major surface to the second portion. The second transition portion comprising a second transition tensile stress region comprising a second transition maximum tensile stress. The first transition maximum tensile stress is greater than the central maximum tensile stress.

Embodiment 59. The foldable substrate of embodiment 58, wherein the second transition maximum tensile stress is greater than the central maximum tensile stress.

Embodiment 60. The foldable substrate of any one of embodiments 58-59, further comprising a first tensile stress region of the first portion positioned between the first compressive stress region and the second compressive stress region. The first tensile stress region comprising a first maximum tensile stress. The first transition maximum tensile stress is greater than the first maximum tensile stress.

Embodiment 61. The foldable substrate of any one of embodiments 58-60, further comprising a second tensile stress region of the second portion positioned between the third compressive stress region and the fourth compressive stress region. The foldable substrate comprises the second tensile stress region comprising a second maximum tensile stress. The second transition maximum tensile stress is greater than the second maximum tensile stress.

Embodiment 62. The foldable substrate of any one of embodiments 1-61, wherein the first distance is about 20% to about 45% of the substrate thickness.

Embodiment 63. The foldable substrate of any one of embodiments 1-62, wherein the substrate thickness is at least 71 micrometers greater than about 4 times the central thickness.

Embodiment 64. The foldable substrate of any one of embodiments 1-63, wherein the substrate achieves an effective bend radius of 5 millimeters.

Embodiment 65. A foldable apparatus comprising the foldable substrate of any one of embodiments 1-64. The foldable apparatus comprises an adhesive comprising a first contact surface and a second contact surface opposite the first contact surface. At least a portion of the adhesive is positioned in a recess defined between the second central surface area and a second plane defined by the second major surface.

Embodiment 66. A foldable apparatus comprises the foldable substrate of any one of embodiments 1-64. The foldable apparatus comprises a polymer-based portion positioned in a recess defined between the second central surface area and a second plane defined by the second major surface. The foldable apparatus comprises an adhesive comprising a first contact surface and a second contact surface opposite the first contact surface.

Embodiment 67. The foldable apparatus of embodiment 66, wherein the polymer-based portion comprises a strain at yield in a range from about 5% to about 10%.

Embodiment 68. The foldable apparatus of any one of embodiments 66-67, wherein a magnitude of a difference between an index of refraction of the foldable substrate and an index of refraction of the polymer-based portion is about 0.1 or less.

Embodiment 69. The foldable apparatus of any one of embodiments 65-68, wherein a magnitude of a difference between an index of refraction of the substrate and an index of refraction of the adhesive is about 0.1 or less.

Embodiment 70. The foldable apparatus of any one of embodiments 65-69, further comprising a display device attached to the second contact surface of the adhesive.

Embodiment 71. A consumer electronic product comprises a housing comprising a front surface, a back surface, and side surfaces. The consumer electronic product comprises electrical components at least partially within the housing. The electrical components comprising a controller, a memory, and a display. The display at or adjacent the front surface of the housing. The consumer electronic product comprises a cover substrate disposed over the display. At least one of a portion of the housing or the cover substrate comprises the foldable substrate of any one of embodiments 1-64.

Embodiment 72. A method of making a foldable substrate comprising a core layer positioned between and contacting a first outer layer and a second outer layer. A substrate thickness is defined between a first major surface and a second major surface. The first outer layer defines the first major surface and the second outer layer defines the second major surface opposite the first major surface. The method comprises etching a portion of the first major surface to form a first central surface area of the core layer. The method comprises etching a portion of the second major surface to form a second central surface area of the core layer. A central portion comprises a central thickness defined between the first central surface area and the second central surface area. The first central surface area of the core layer in the central portion is positioned between a first portion of the first outer layer and a second portion of the first outer layer. The second central surface area of the core layer in the central portion is positioned between a third portion of the second outer layer and a fourth portion of the second outer layer.

Embodiment 73. A method of making a foldable substrate comprises draw-forming a core layer. The method comprises draw-forming a first outer layer and a second outer layer. The method comprises laminating the first outer layer to a third inner surface of the core layer and laminating the second outer layer to a fourth inner surface of the core layer. The first outer layer defines a first major surface and the second outer layer defines a second major surface opposite the first major surface. A substrate thickness is defined between the first major surface and the second major surface. During the laminating, the first outer layer comprises a first temperature above a softening point of the first outer layer, the second outer layer comprises a second temperature above a softening point of the second outer layer, the core layer comprises a third temperature above a softening point of the core layer. Then, the method comprises etching a portion of the first major surface to form a first central surface area of the core layer. The method comprises etching a portion of the second major surface to form a second central surface area of the core layer. The foldable substrate comprises a central portion comprising a central thickness defined between the first central surface area and the second central surface area. The first central surface area is positioned between a first portion of the first outer layer and a third portion of the first outer layer. The second central surface area is positioned between a second portion of the second outer layer and a fourth portion of the second outer layer.

Embodiment 74. The method of any one of embodiments 72-73, wherein a the first outer layer comprises a first existing average concentration of potassium on an oxide basis. The core layer comprises a core existing average concentration of potassium on an oxide basis. The core existing average concentration of potassium is about 10 parts per million or more than the first existing average concentration of potassium.

Embodiment 75. The method of embodiment 74, wherein the second outer layer comprises a second existing average concentration of potassium on an oxide basis, and the core existing average concentration of potassium is about 10 parts per million or more than the second existing average concentration of potassium.

Embodiment 76. The method of any one of embodiments 72-75, wherein the first outer layer comprises a first existing average concentration of lithium on an oxide basis, the core layer comprises a core existing average concentration of lithium on an oxide basis, and the first existing average concentration of lithium is about 10 parts per million or more than the core existing average concentration of lithium.

Embodiment 77. The method of any one of embodiments 72-76, further comprising chemically strengthening the foldable substrate after the etching the portion of the first major surface and the etching the portion of the second major surface.

Embodiment 78. A method of making a foldable substrate comprising a core layer positioned between and contacting a first outer layer and a second outer layer. A substrate thickness is defined between a first major surface of the first outer layer and a second major surface of the second outer layer. The core layer comprises a central portion comprising a central thickness defined between a first central surface area and a second central surface area. The first central surface area of the core layer in the central portion positioned between a first portion of the first outer layer and a second portion of the first outer layer. The second central surface area of the core layer in the central portion is positioned between a third portion of the second outer layer and a fourth portion of the second outer layer. The method comprises chemically strengthening the foldable substrate.

Embodiment 79. The method of any one of embodiments 77-78, wherein, before the chemically strengthening, the first outer layer comprises a first diffusivity of one or more alkali metal ions. The core layer comprises a core diffusivity of one or more alkali metal ions, and the first diffusivity is greater than the core diffusivity.

Embodiment 80. The method of embodiment 79, wherein a first ratio comprises a square root of the first diffusivity divided by a first thickness defined between the first major surface and a first inner surface of the first outer layer. A core ratio comprises a square root of the core diffusivity divided by the central thickness, and an absolute difference between the first ratio and the core ratio is about $0.01$ $s^{-0.5}$ or less.

Embodiment 81. The method of embodiment 80, wherein a second ratio comprises a square root of a second diffusivity of one or more alkali metal ions of the second outer layer divided by a second thickness defined between the second major surface and a second inner surface of the second portion. An absolute difference between the second ratio and the core ratio is about $0.01$ $s^{-0.5}$ or less.

Embodiment 82. The method of any one of embodiments 77-81, wherein, after the chemically strengthening, the first outer layer comprises a first average concentration of potassium on an oxide basis. The second outer layer comprises a second average concentration of potassium on an oxide basis. The central portion is positioned between the first central surface area and the second central surface area comprises a central average concentration of potassium on an oxide basis. An absolute difference between the first average concentration of potassium and the central average concentration of potassium is about 100 parts per million or less.

Embodiment 83. The method of any one of embodiments 77-82, wherein the chemically strengthening comprises forming a first compressive stress region extending to a first depth of compression from the first portion of the first outer layer at the first major surface. The method comprises forming a second compressive stress region extending to a second depth of compression from the third portion of the second outer layer at the second major surface. The method comprises forming a third compressive stress region extending to a third depth of compression from the second portion of the first outer layer at the first major surface. The method comprises forming a fourth compressive stress region extending to a fourth depth of compression from the fourth portion of the second outer layer at the second major surface. The method comprises forming a first central compressive stress region extending to a first central depth of compression from the first central surface area. The method comprises forming a second central compressive stress region extending to a second central depth of compression extending from the second central surface area.

Embodiment 84. The method of embodiment 83, wherein an absolute difference between the first depth of compression as a percentage of the substrate thickness and the first central depth of compression as a percentage of the central thickness is about 1% or less.

Embodiment 85. The method of any one of embodiments 83-84, wherein an absolute difference between the third depth of compression as a percentage of the substrate thickness and the first central depth of compression as a percentage of the central thickness is about 1% or less.

Embodiment 86. The method of any one of embodiments 83-85, wherein an absolute difference between the second depth of compression as a percentage of the substrate thickness and the second central depth of compression as a percentage of the central thickness is about 1% or less.

Embodiment 87. The method of any one of embodiments 83-86, wherein an absolute difference between the fourth depth of compression as a percentage of the substrate thickness and the second central depth of compression as a percentage of the central thickness is about 1% or less.

Embodiment 88. The method of any one of embodiments 83-87, wherein the first portion comprises a first depth of layer of one or more alkali metal ions associated with the first depth of compression. The third portion comprises a second depth of layer of one or more alkali metal ions associated with the second depth of compression. The second portion comprises a third depth of layer of one or more alkali metal ions associated with the third depth of compression. The fourth portion comprises a fourth depth of layer of one or more alkali metal ions associated with the fourth depth of compression. The central portion comprises a first central depth of layer of one or more alkali metal ions associated with the first central depth of compression. The central portion comprises a second central depth of layer of one or more alkali metal ions associated with the second central depth of compression. An absolute difference between the first depth of layer as a percentage of the substrate thickness and the first central depth of layer as a percentage of the central thickness is about 0.5% or less.

Embodiment 89. The method of embodiment 88, wherein an absolute difference between the third depth of layer as a percentage of the substrate thickness and the first central depth of layer as a percentage of the central thickness is about 0.5% or less.

Embodiment 90. The method of any one of embodiments 88-89, wherein an absolute difference between the second depth of layer as a percentage of the substrate thickness and the second central depth of layer as a percentage of the central thickness is about 0.5% or less.

Embodiment 91. The method of any one of embodiments 88-89, wherein an absolute difference between the fourth depth of layer as a percentage of the substrate thickness and the second central depth of layer as a percentage of the central thickness is about 0.5% or less.

Embodiment 92. The method of any one of embodiments 72-91, wherein the core layer comprises a core coefficient of thermal expansion that is greater than a first coefficient of thermal expansion of the first outer layer. The core coefficient of thermal expansion is greater than a second coefficient of thermal expansion of the second outer layer.

Embodiment 93. The method of any one of embodiments 72-92, wherein a core density of the core layer is greater than a first density of the first outer layer. The core density is greater than a second density of the second outer layer.

Embodiment 94. The method of any one of embodiments 72-93, wherein a core network dilation coefficient of the core layer is less than a first network dilation coefficient of the first outer layer. The core network dilation coefficient is less than a second network dilation coefficient of the second outer layer.

Embodiment 95. A method of making a foldable substrate comprising a substrate thickness defined between a first major surface and a second major surface opposite the first major surface. The method comprises chemically strengthening the foldable substrate for a first period of time. Then, the method comprises etching a portion of the first major surface to form a first central surface area. The method comprises etching a portion of the second major surface to form a second central surface area. Then the method comprises further chemically strengthening the foldable substrate for a second period of time. A central portion comprises a central thickness defined between the first central surface area and the second central surface area. The central portion is positioned between a first portion and a second portion. The first central surface area is recessed from the first major surface by a first distance. The second central surface area is recessed from the second major surface by a second distance. After the further chemically strengthening, the foldable substrate comprising a first compressive stress region of the first portion extending to a first depth of compression from the first major surface. The foldable substrate comprises a second compressive stress region of the third portion extending to a second depth of compression from the second major surface. The foldable substrate comprises a third compressive stress region of the second portion extending to a third depth of compression from the first major surface. The foldable substrate comprises a fourth compressive stress region of the fourth portion extending to a fourth depth of compression from the second major surface. The foldable substrate comprises a first central compressive stress region of the central portion extending to a first central depth of compression from the first central surface area. The foldable substrate comprises a second central compressive stress region of the central portion extending to a second central depth of compression from the second central surface area.

Embodiment 96. A method of making a foldable substrate comprising a substrate thickness defined between a first major surface and a second major surface opposite the first major surface. The method comprises chemically strengthening the foldable substrate for a first period of time. Then, the method comprises etching an existing first central surface area to form a first central surface area. The existing first central surface area is non-coplanar with the first major surface. The method comprises etching an existing second central surface area to form a second central surface area. Then, the method comprises further chemically strengthening the foldable substrate for a second period of time. A central portion comprises a central thickness defined between the first central surface area and the second central surface area. The central portion is positioned between a first portion and a second portion. The first central surface area is recessed from the first major surface by a first distance. After the further chemically strengthening, the foldable substrate comprises a first compressive stress region of the first portion extending to a first depth of compression from the first major surface. The foldable substrate comprises a second compressive stress region of the third portion extending to a second depth of compression from the second major surface. The foldable substrate comprises a third compressive stress region of the second portion extending to a third depth of compression from the first major surface. The foldable substrate comprises a fourth compressive stress region of the fourth portion extending to a fourth depth of compression from the second major surface. The foldable substrate comprises a first central compressive stress region of the central portion extending to a first central depth of compression from the first central surface area. The foldable substrate comprises a second central compressive stress region of the central portion extending to a second central depth of compression from the second central surface area.

Embodiment 97. The method of embodiment 96, wherein before the etching the first central surface area, the existing first central surface area is recessed from the first major surface by a first existing distance ranging from about 10% to about 75% of the substrate thickness.

Embodiment 98. The method of any one of embodiments 96-97, wherein before the etching the existing second central surface area, the existing second central surface area is substantially coplanar with the second major surface.

Embodiment 99. The method of any one of embodiments 96-97, wherein before the etching the existing second central surface area, the existing second central surface area is recessed from the second major surface by a second existing distance ranging from about 1% to about 50%.

Embodiment 100. The method of any one of embodiments 96-99, wherein the second central surface area is recessed from the second major surface by a second distance.

Embodiment 101. The method of any one of embodiments 97-98, wherein before the etching the existing second central surface area, the existing second central surface area stands proud from the second major surface.

Embodiment 102. The method of embodiment 101, wherein after the etching the existing second central surface area, the second central surface area is substantially coplanar with the second major surface.

Embodiment 103. The method of embodiment 95 or embodiment 100, wherein the first distance is substantially equal to the second distance.

Embodiment 104. The method of embodiment 95 or embodiment 100, wherein the second distance is from about 5% to about 20% of the substrate thickness.

Embodiment 105. The method of any one of embodiments 95-104, wherein the first distance is about 20% to about 45% of the substrate thickness.

Embodiment 106. The method of any one of embodiments 95-105, wherein a square root of a ratio of the second period of time to the first period of time is within 10% of the central thickness divided by the difference between the substrate thickness and the central thickness.

Embodiment 107. The method of embodiment 106, wherein the square root of the ratio of the second period of time to the first period of time is substantially equal to the central thickness divided by the difference between the substrate thickness and the central thickness.

Embodiment 108. The method of any one of embodiments 95-107, wherein the second period of time is from about 2% to about 50% of the first period of time.

Embodiment 109. The method of any one of embodiments 95-108, wherein, after the chemically strengthening but before the further chemically strengthening, the first portion comprises a first intermediate compressive stress region extending to a first intermediate depth of compression. The first intermediate depth of compression divided by the substrate thickness is in a range from about 10% to about 20%.

Embodiment 110. The method of any one of embodiments 95-108, wherein, after the chemically strengthening but before the further chemically strengthening, the first portion comprises a first intermediate compressive stress region and a first intermediate depth of layer from the first major surface of one or more alkali metal ions introduced during the chemically strengthening. The first intermediate depth of layer divided by the substrate thickness is in a range from about 10% to about 20%.

Embodiment 111. The method of any one of embodiments 95-110, wherein, after the further chemically strengthening the foldable substrate, the first portion comprises a first depth of layer from the first major surface of one or more alkali metal ions introduced into the first portion during the chemically strengthening and/or the further chemically strengthening. The central portion comprises a first central depth of layer from the first central surface area of one or more alkali metal ions introduced into the central portion during the further chemically strengthening. An absolute difference between the first depth of layer as a percentage of the substrate thickness and the first central depth of layer as a percentage of the central thickness is about 0.5% or less.

Embodiment 112. The method of embodiment 111, wherein, after the further chemically strengthening the foldable substrate, the foldable substrate further comprises a third depth of layer from the first major surface of one or more alkali metal ions introduced into the second portion during the chemically strengthening and/or the further chemically strengthening. An absolute difference between the third depth of layer as a percentage of the substrate thickness and the first central depth of layer as a percentage of the central thickness is about 0.5% or less.

Embodiment 113. The method of any one of embodiments 111-112, wherein the one or more alkali metal ions comprise potassium ions.

Embodiment 114. The method of any one of embodiments 95-113, wherein, after the further chemically strengthening the foldable substrate, the first portion comprises a first average concentration of potassium on an oxide basis. The central portion comprises a central average concentration of potassium on an oxide basis. An absolute difference between the first average concentration of potassium and the central average concentration of potassium is about 100 parts per million or less.

Embodiment 115. The method of embodiment 114, wherein, after the further chemically strengthening the foldable substrate, the second portion comprises a second average concentration of potassium on an oxide basis. An absolute difference between the second average concentration of potassium and the central average concentration of potassium is about 100 parts per million or less.

Embodiment 116. The method of any one of embodiments 95-115, wherein, after the further chemically strengthening the foldable substrate, an absolute difference between the first depth of compression as a percentage of the substrate thickness to the first central depth of compression as a percentage of the central thickness is about 1% or less.

Embodiment 117. The method of embodiment 116, wherein, after the further chemically strengthening the foldable substrate. An absolute difference between the third depth of compression as a percentage of the substrate thickness to the first central depth of compression as a percentage of the central thickness is about 1% or less.

Embodiment 118. The method of any one of embodiments 95-117, wherein after the chemically strengthening, the foldable substrate further comprises a first tensile stress region of the first portion positioned between the first compressive stress region and the second compressive stress region. The first tensile stress region comprising a first maximum tensile stress. The foldable substrate further comprises a second tensile stress region of the second portion positioned between the third compressive stress region and the fourth compressive stress region. The second tensile stress region comprising a second maximum tensile stress. The foldable substrate further comprises a central tensile stress region of the central portion positioned between the first central compressive stress region and a second central compressive stress region. The central tensile stress region comprising a central maximum tensile stress. An absolute difference between the central maximum tensile stress and the first maximum tensile stress is about 10 MegaPascals or less.

Embodiment 119. The method of embodiment 118, wherein an absolute difference between the central maximum tensile stress and the second maximum tensile stress is about 10 MegaPascals or less.

Embodiment 120. The method of any one of embodiments 118-119, wherein the first maximum tensile stress is substantially equal to the second maximum tensile stress.

Embodiment 121. The method of any one of embodiments 95-120, wherein after the chemically strengthening, the central portion further comprises a central tensile stress region of the central portion positioned between a portion of the first central surface area and a portion of the second central surface area. The central tensile stress region comprising a central maximum tensile stress. The central portion comprises a first transition portion attaching the first central surface area to the first portion. The first transition portion comprising a first transition tensile stress region comprising a first transition maximum tensile stress. The central portion comprises a second transition portion attaching the first central surface area to the second portion. The second transition portion comprising a second transition tensile stress region comprising a second transition maximum tensile stress. The first transition maximum tensile stress is greater than the central maximum tensile stress.

Embodiment 122. The method of embodiment 121, wherein the second transition maximum tensile stress is greater than the central maximum tensile stress.

Embodiment 123. The method of any one of embodiments 121-122, wherein after the chemically strengthening, the foldable substrate further comprises a first tensile stress region of the first portion positioned between the first compressive stress region and the second compressive stress region. The first tensile stress region comprising a first maximum tensile stress. The first transition maximum tensile stress is greater than the first maximum tensile stress.

Embodiment 124. The method of any one of embodiments 121-123, wherein after the chemically strengthening, the foldable substrate further comprises a second tensile stress region of the second portion positioned between the third compressive stress region and the fourth compressive stress region. The second tensile stress region comprising a second maximum tensile stress. The second transition maximum tensile stress is greater than the second maximum tensile stress.

Embodiment 125. The method of any one of embodiments 78-124, further comprising disposing a coating over the first major surface, the coating fills a recess defined between the first central surface area and a first plane defined by the first major surface.

Embodiment 126. The method of any one of embodiments 78-125, further comprising disposing an adhesive over the second major surface of the foldable substrate. The adhesive comprises a first contact surface and a second contact surface opposite the first contact surface.

Embodiment 127. The method of embodiment 126, wherein at least a portion of the adhesive is positioned in a recess defined between the second central surface area and a second plane defined by the second major surface.

Embodiment 128. The method of any one of embodiments 126-127, wherein a magnitude of a difference between an index of refraction of the substrate and an index of refraction of the adhesive is about 0.1 or less.

Embodiment 129. The method of any one of embodiments 126-128, further comprising attaching a display device to the second contact surface of the adhesive.

BRIEF DESCRIPTION OF THE DRAWINGS

The above and other features and advantages of embodiments of the present disclosure are better understood when the following detailed description is read with reference to the accompanying drawings, in which:

FIGS. 15-18 are flow charts illustrating example methods making foldable apparatus in accordance with embodiments of the disclosure;

FIGS. 19-52 schematically illustrate steps in methods of making a foldable substrate and/or foldable apparatus;

Figure 1:
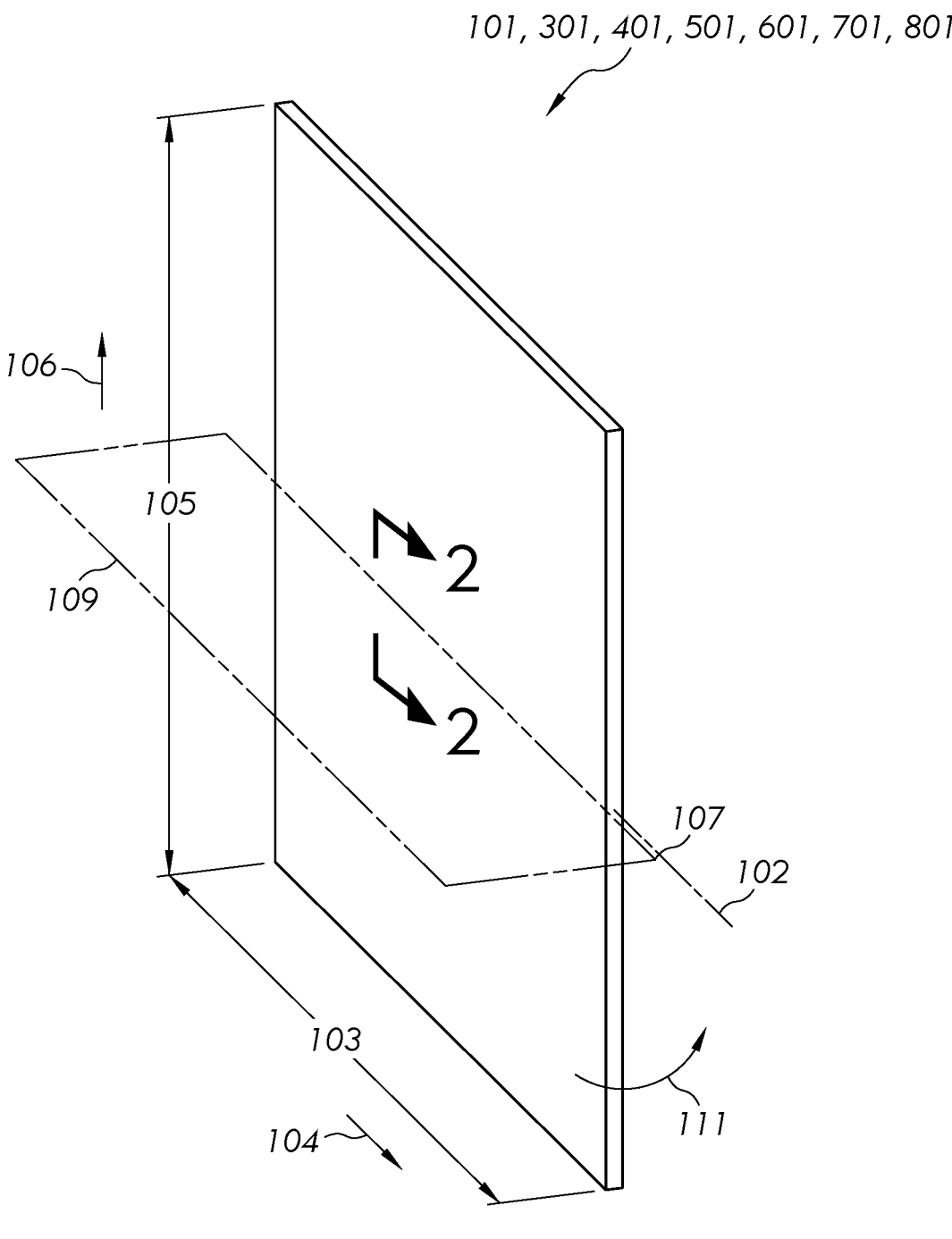
FIG. 1 is a schematic view of an example foldable apparatus in a flat configuration according to some embodiments, wherein a schematic view of the folded configuration may appear as shown in FIG. 9.

Throughout the disclosure, the drawings are used to emphasize certain aspects. As such, it should not be assumed that the relative size of different regions, portions, and substrates shown in the drawings are proportional to its actual relative size, unless explicitly indicated otherwise.

DETAILED DESCRIPTION

Embodiments will now be described more fully hereinafter with reference to the accompanying drawings in which example embodiments are shown. Whenever possible, the same reference numerals are used throughout the drawings to refer to the same or like parts. However, claims may encompass many different aspects of various embodiments and should not be construed as limited to the embodiments set forth herein.

FIGS. 1-9 and 11-12 illustrate views of foldable apparatus 101, 301, 401, 501, 601, 701, 801, and 1201 and/or test foldable apparatus 1102 comprising a foldable substrate 206, 407, or 807 in accordance with embodiments of the disclosure. Unless otherwise noted, a discussion of features of embodiments of one foldable apparatus can apply equally to corresponding features of any embodiments of the disclosure. For example, identical part numbers throughout the disclosure can indicate that, in some embodiments, the identified features are identical to one another and that the discussion of the identified feature of one embodiment, unless otherwise noted, can apply equally to the identified feature of any of the other embodiments of the disclosure.

Figure 2:
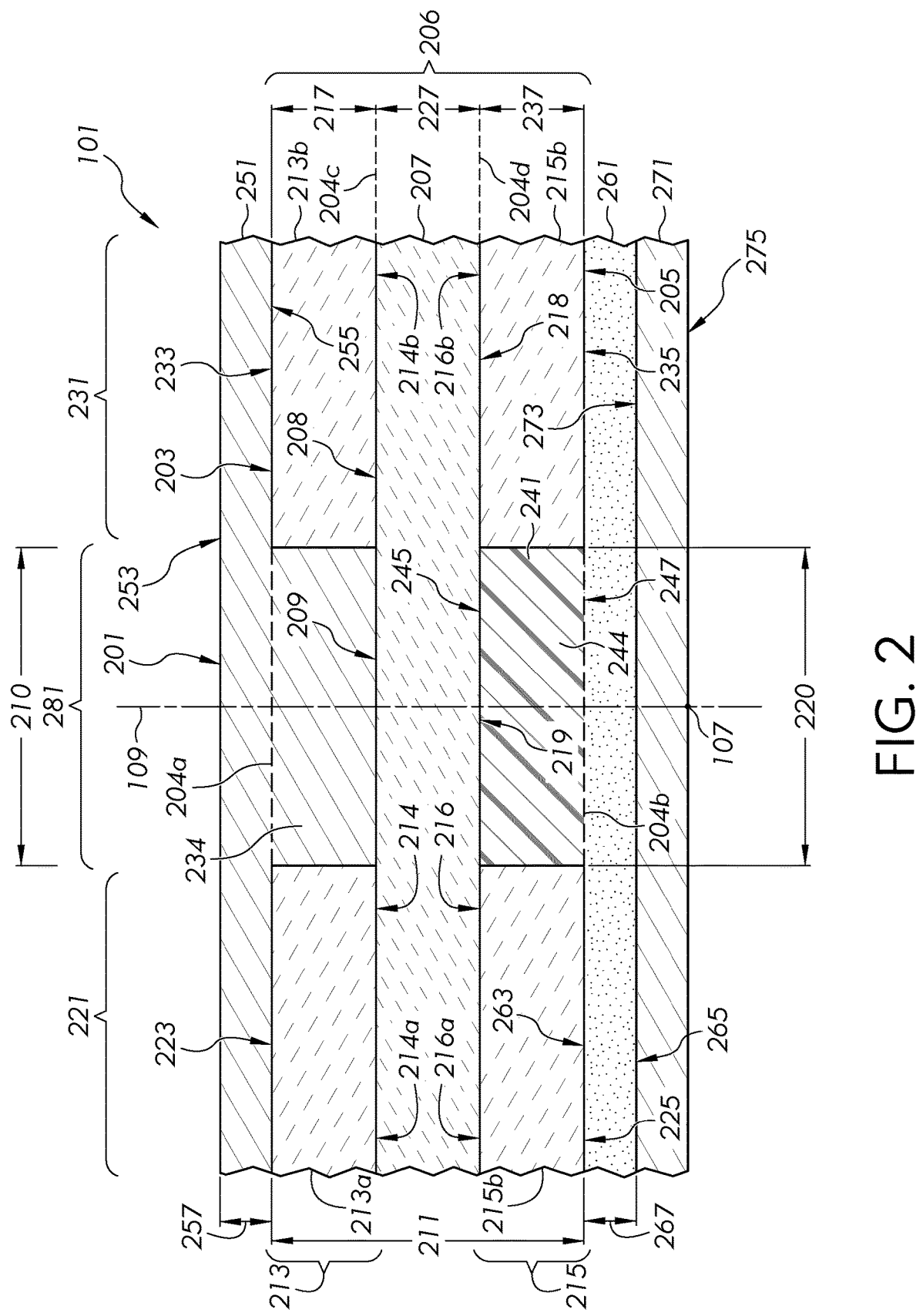
FIGS. 2-8 are cross-sectionals view of the foldable apparatus along line 2-2 of FIG. 1 according to some embodiments.
Figure 3:
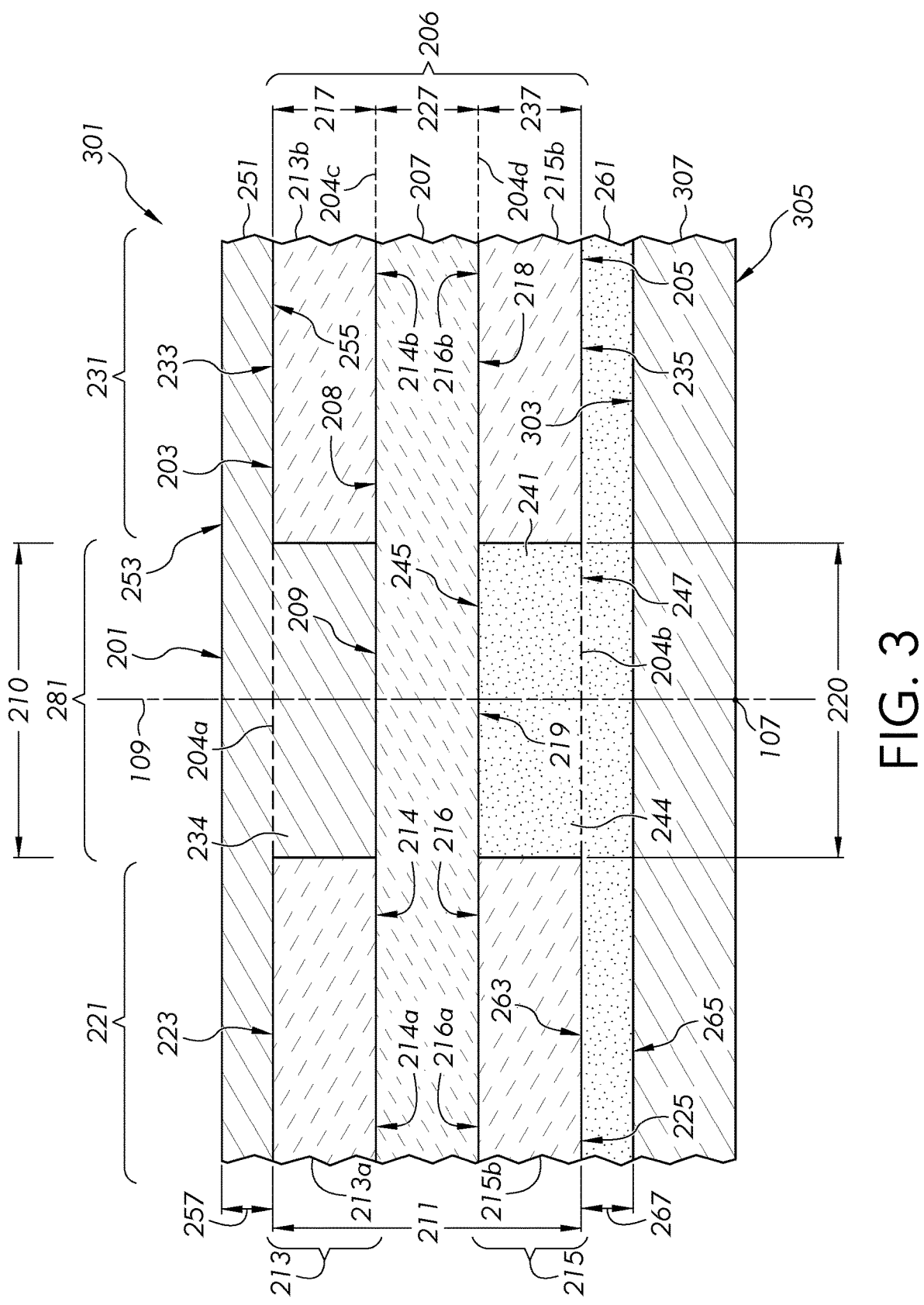
Figure 4:
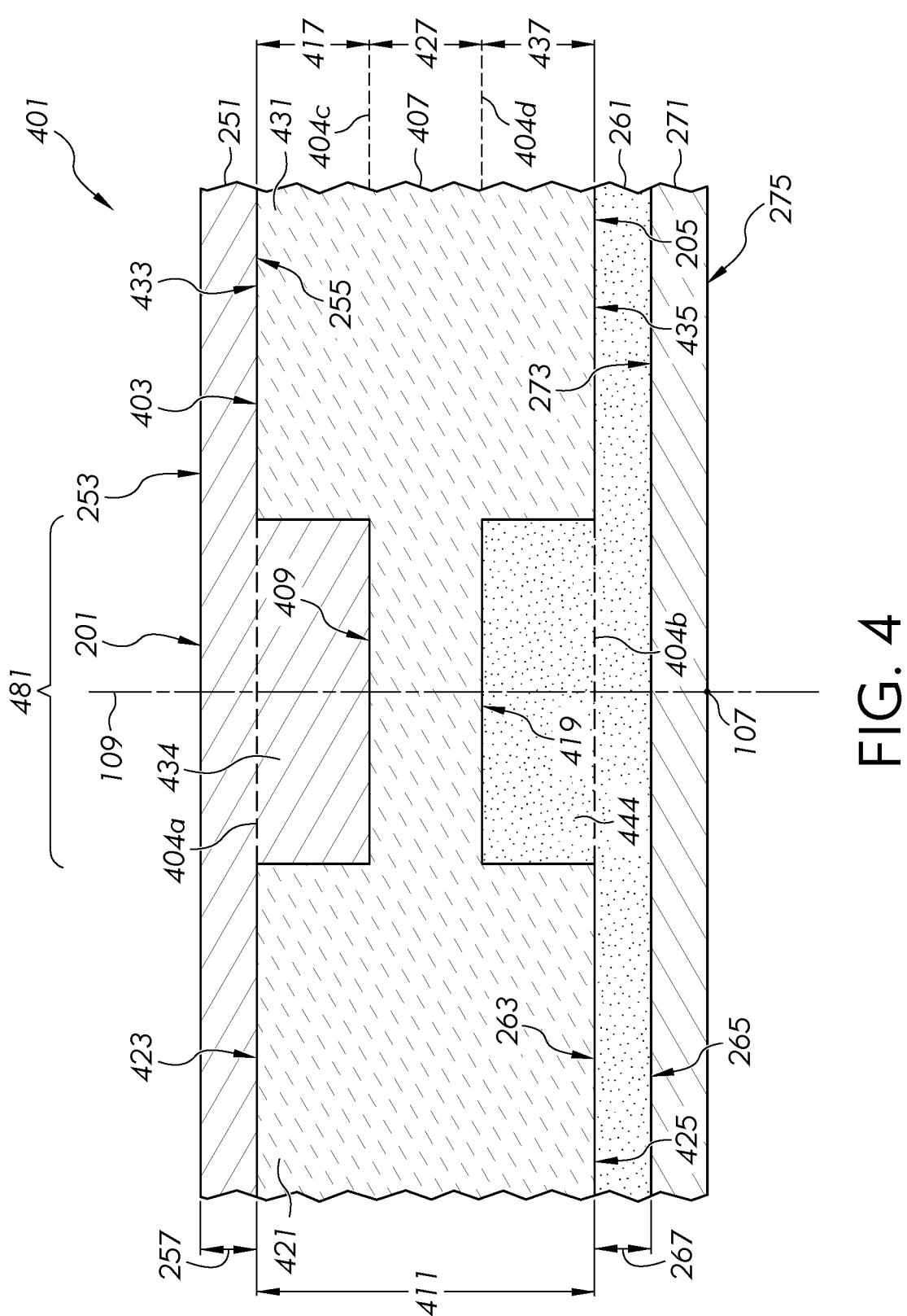
Figure 5:
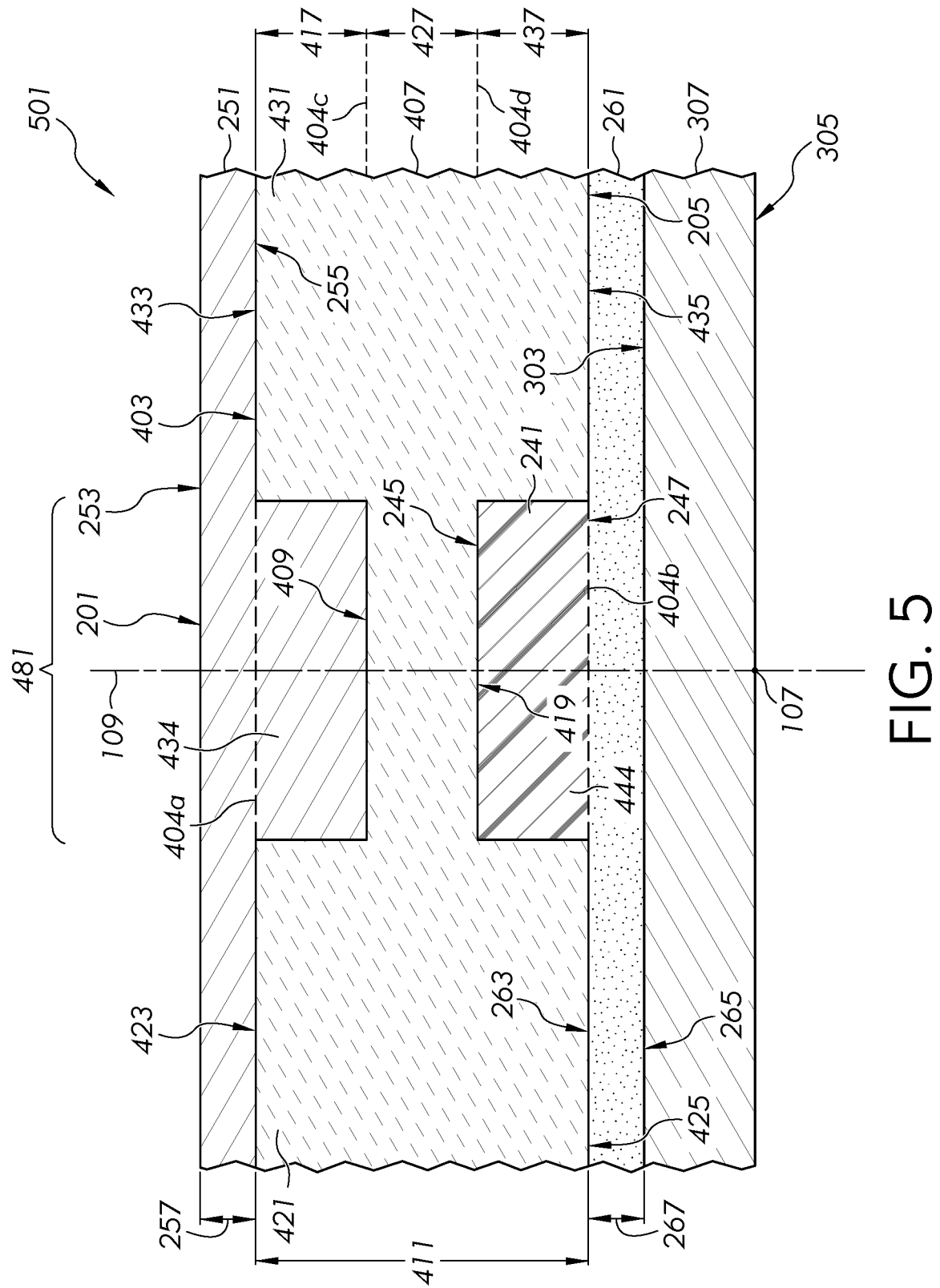
Figures 6, 7, 8:
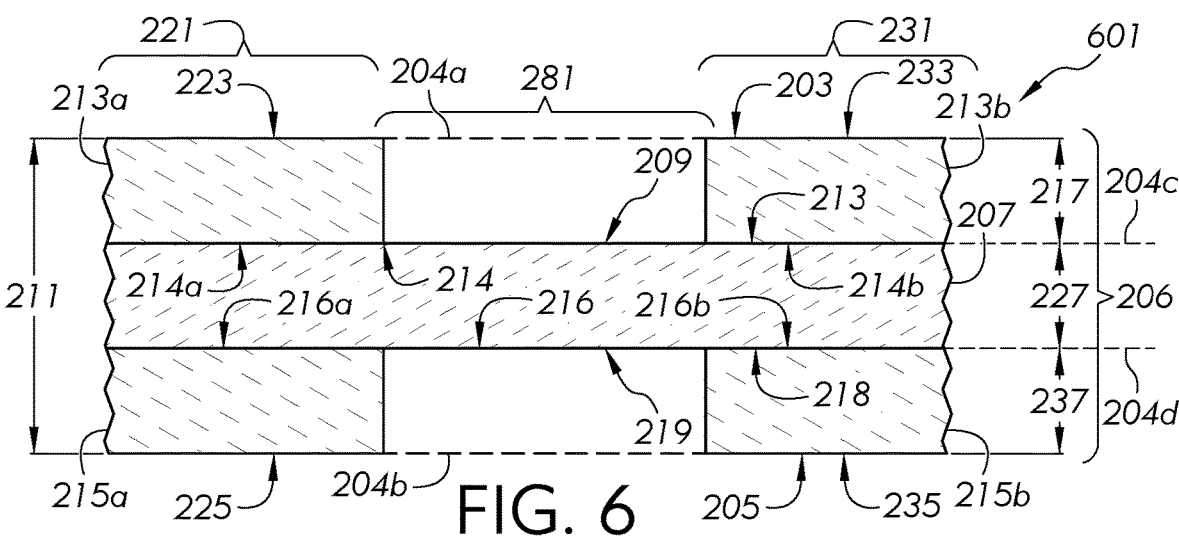
Figures 11, 12:
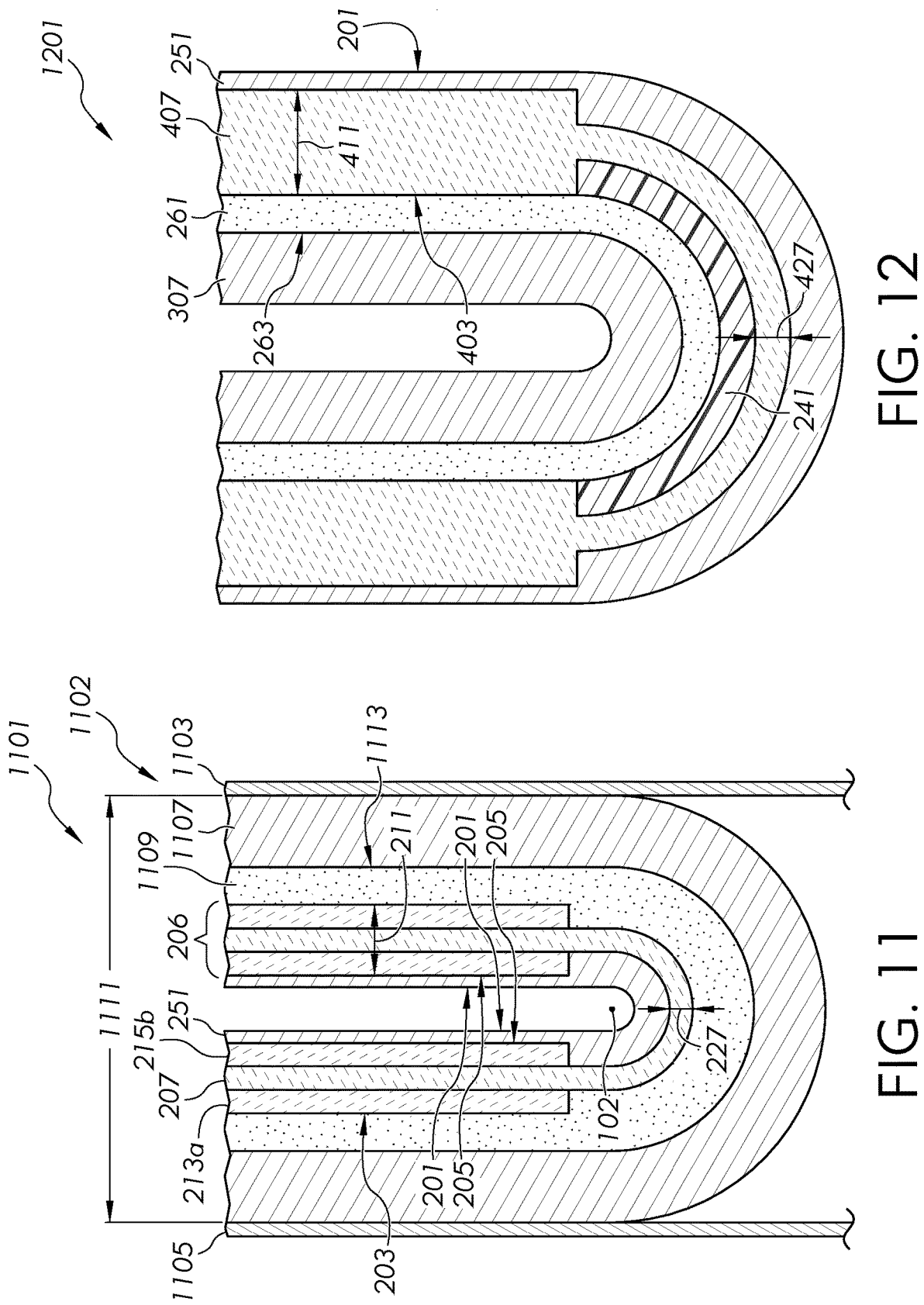
FIG. 12 is a schematic view of example foldable apparatus of embodiments of the disclosure in a folded configuration.

FIGS. 2-3 and 6 schematically illustrate example embodiments of foldable apparatus 101, 301, and 601 comprising the foldable substrate 206 in accordance with embodiments of the disclosure in an unfolded (e.g., flat) configuration while FIG. 11 illustrates an example embodiment of a test foldable apparatus 1102 comprising the foldable substrate 206 in accordance with embodiments of the disclosure in a folded configuration. The foldable substrate 206 comprises a laminate comprising a core layer 207 positioned between a first outer layer 213 and a second outer layer 215. FIGS. 4-5 and 7 schematically illustrate example embodiments of foldable apparatus 401, 501, and 701 comprising the foldable substrate 407 in accordance with embodiments of the disclosure in an unfolded (e.g., flat) configuration while FIG. 12 comprises a folded foldable apparatus 1201 comprising the foldable substrate 407 in accordance with embodiments of the disclosure in a folded configuration. FIG. 8 schematically illustrates a foldable apparatus 801 comprising a foldable substrate 807 in accordance with embodiments of the disclosure in an unfolded (e.g., flat) configuration.

The foldable apparatus 101, 301, 401, 501, 601, 701, 801, and 1201 comprise a first portion 221, 421, or 821, a second portion 231, 431, or 831, and a central portion 281, 481, or 881 positioned between the first portion 221, 421, or 821 and the second portion 231, 431, or 831. In some embodiments, as shown in FIGS. 2 and 4, the foldable apparatus 101 or 401 can comprise a release liner 271 although other substrates (e.g., a glass-based substrate and/or a ceramic-based substrate discussed throughout the application) may be used in further embodiments rather than the illustrated release liner 271. In some embodiments, as shown in FIGS. 1-5 and 11-12, the foldable apparatus 101, 301, 401, 501, and 1201 or the test foldable apparatus 1102 can comprise a coating 251. In some embodiments, as shown in FIGS. 1-5 and 12, the foldable apparatus 101, 301, 401, 501, and 1201 can comprise an adhesive layer 261. In some embodiments, as shown in FIGS. 2, 5, and 12, foldable apparatus 101, 501, and 1201 can comprise a polymer-based portion 241. In some embodiments, as shown in FIGS. 1-12, the foldable substrate 206, 407, or 807 can comprise a first recess 234, 434, or 834. In further embodiments, as shown in FIGS. 1-7 and 10-12, the foldable substrate 206 or 407 can further comprise a second recess 244 or 444. It is to be understood that any of the foldable apparatus of the disclosure can comprise a second substrate (e.g., a glass-based substrate and/or a ceramic-based substrate), a release liner 271, a display device 307, a coating 251, an adhesive layer 261, and/or a polymer-based portion 241.

Throughout the disclosure, with reference to FIG. 1, the width 103 of the foldable apparatus 101, 301, 401, 501, 601, 701, and/or 801 is considered the dimension of the foldable apparatus taken between opposed edges of the foldable apparatus in a direction 104 of a fold axis 102 of the foldable apparatus, wherein the direction 104 also comprises the direction of the width 103. Furthermore, throughout the disclosure, the length 105 of the foldable apparatus 101, 301, 401, 501, 601, 701, and/or 801 is considered the dimension of the foldable apparatus 101, 301, 401, 501, 601, 701, and/or 801 taken between opposed edges of the foldable apparatus 101, 301, 401, 501, 601, 701, and/or 801 in a direction 106 perpendicular to the fold axis 102 of the foldable apparatus 101, 301, 401, 501, 601, 701, and/or 801. In some embodiments, as shown in FIGS. 1-5, the foldable apparatus of any embodiments of the disclosure can comprise a fold plane 109 that includes the fold axis 102 and a direction of the substrate thickness 211, 411, or 811 when the foldable apparatus is in the flat configuration (e.g., see FIG. 1). The plane 109, in some embodiments, may comprise a central axis 107 of the foldable apparatus. In some embodiments, the foldable apparatus can be folded in a direction 111 (e.g., see FIG. 1) about the fold axis 102 extending in the direction 104 of the width 103 to form a folded configuration (e.g., see FIGS. 9 and 11-12). As shown, the foldable apparatus may include a single fold axis to allow the foldable apparatus to comprise a bifold wherein, for example, the foldable apparatus may be folded in half. In further embodiments, the foldable apparatus may include two or more fold axes with each fold axis including a corresponding central portion similar or identical to the central portion 281, 481, or 881 discussed herein. For example, providing two fold axes can allow the foldable apparatus to comprise a trifold wherein, for example, the foldable apparatus may be folded with the first portion 221, 421, or 821, the second portion 231, 431, or 831, and a third portion similar or identical to the first portion or second portion with the central portion 281, 481, or 881 and another central portion similar to or identical to the central portion positioned between the first portion and the second portion and between the second portion and the third portion, respectively.

Foldable apparatus 101, 301, or 601 comprising the foldable substrate 206 can comprise the core layer 207 positioned between the first outer layer 213 and the second outer layer 215. Foldable apparatus 401, 501, 701, or 801 can comprise the foldable substrate 407 or 807. In some embodiments, the foldable substrate 407, or 807, the first outer layer 213, the second outer layer 215, and/or the core layer 207 can comprise a glass-based substrate and/or a ceramic-based substrate having a pencil hardness of 8H or more, for example, 9H or more.

In some embodiments, the foldable substrate 407, or 807, the first outer layer 213, the second outer layer 215, and/or the core layer 207 can comprise a glass-based substrate. As used herein, "glass-based" includes both glasses and glass-ceramics, wherein glass-ceramics have one or more crystalline phases and an amorphous, residual glass phase. A glass-based material (e.g., glass-based substrate) may comprise an amorphous material (e.g., glass) and optionally one or more crystalline materials (e.g., ceramic). Amorphous materials and glass-based materials may be strengthened. As used herein, the term "strengthened" may refer to a material that has been chemically strengthened, for example, through ion-exchange of larger ions for smaller ions in the surface of the substrate, as discussed below. However, other strengthening methods, for example, thermal tempering, or utilizing a mismatch of the coefficient of thermal expansion between portions of the substrate to create compressive stress and central tension regions, may be utilized to form strengthened substrates. Exemplary glass-based materials, which may be free of lithia or not, comprise soda lime glass, alkali aluminosilicate glass, alkali-containing borosilicate glass, alkali-containing aluminoborosilicate glass, alkali-containing phosphosilicate glass, and alkali-containing aluminophosphosilicate glass. In one or more embodiments, a glass-based material may comprise, in mole percent (mol %): $SiO_2$ in a range from about 40 mol % to about 80%, $Al_2O_3$ in a range from about 5 mol % to about 30 mol %, $B_2O_3$ in a range from 0 mol % to about 10 mol %, $ZrO_2$ in a range from 0 mol % to about 5 mol %, $P_2O_5$ in a range from 0 mol % to about 15 mol %, $TiO_2$ in a range from 0 mol % to about 2 mol %, $R_2O$ in a range from 0 mol % to about 20 mol %, and RO in a range from 0 mol % to about 15 mol %. As used herein, $R_2O$ can refer to an alkali metal oxide, for example, $Li_2O$, $Na_2O$, $K_2O$, $Rb_2O$, and $Cs_2O$. As used herein, RO can refer to MgO, CaO, SrO, BaO, and ZnO. In some embodiments, a glass-based substrate may optionally further comprise in a range from 0 mol % to about 2 mol % of each of $Na_2SO_4$, NaCl, NaF, NaBr, $K_2SO_4$, KCl, KF, KBr, $As_2O_3$, $Sb_2O_3$, $SnO_2$, $Fe_2O_3$, MnO, $MnO_2$, $MnO_3$, $Mn_2O_3$, $Mn_3O_4$, $Mn_2O_7$. "Glass-ceramics" include materials produced through controlled crystallization of glass. In some embodiments, glass-ceramics have about 1% to about 99% crystallinity. Examples of suitable glass-ceramics may include $Li_2O$—$Al_2O_3$—$SiO_2$ system (i.e., LAS-System) glass-ceramics, MgO—$Al_2O_3$—$SiO_2$ system (i.e., MAS-System) glass-ceramics, ZnO×$Al_2O_3$×n$SiO_2$ (i.e., ZAS system), and/or glass-ceramics that include a predominant crystal phase including β-quartz solid solution, β-spodumene, cordierite, petalite, and/or lithium disilicate. The glass-ceramic substrates may be strengthened using the chemical strengthening processes. In one or more embodiments, MAS-System glass-ceramic substrates may be strengthened in $Li_2SO_4$ molten salt, whereby an exchange of $2Li^+$ for $Mg^{2+}$ can occur.

In some embodiments, the foldable substrate 407, or 807, the first outer layer 213, the second outer layer 215, and/or the core layer 207 can comprise a ceramic-based substrate. As used herein, "ceramic-based" includes both ceramics and glass-ceramics, wherein glass-ceramics have one or more crystalline phases and an amorphous, residual glass phase. Ceramic-based materials may be strengthened (e.g., chemically strengthened). In some embodiments, a ceramic-based material can be formed by heating a glass-based material to form ceramic (e.g., crystalline) portions. In further embodiments, ceramic-based materials may comprise one or more nucleating agents that can facilitate the formation of crystalline phase(s). In some embodiments, the ceramic-based materials can comprise one or more oxide, nitride, oxynitride, carbide, boride, and/or silicide. Example embodiments of ceramic oxides include zirconia ($ZrO_2$), zircon zirconia ($ZrSiO_4$), an alkali metal oxide (e.g., sodium oxide ($Na_2O$)), an alkali earth metal oxide (e.g., magnesium oxide (MgO)), titania ($TiO_2$), hafnium oxide ($Hf_2O$), yttrium oxide ($Y_2O_3$), iron oxide, beryllium oxide, vanadium oxide ($VO_2$), fused quartz, mullite (a mineral comprising a combination of aluminum oxide and silicon dioxide), and spinel ($MgAl_2O_4$). Example embodiments of ceramic nitrides include silicon nitride ($Si_3N_4$), aluminum nitride (AlN), gallium nitride (GaN), beryllium nitride ($Be_3N_2$), boron nitride (BN), tungsten nitride (WN), vanadium nitride, alkali earth metal nitrides (e.g., magnesium nitride ($Mg_3N_2$)), nickel nitride, and tantalum nitride. Example embodiments of oxynitride ceramics include silicon oxynitride, aluminum oxynitride, and a SiAlON (a combination of alumina and silicon nitride and can have a chemical formula, for example, $Si_{12-m-n}Al_{m+n}O_nN_{16-n}$, $Si_{6-n}Al_nO_nN_{8-n}$, or $Si_{2-n}Al_nO_{1+n}N_{2-n}$, where m, n, and the resulting subscripts are all non-negative integers). Example embodiments of carbides and carbon-containing ceramics include silicon carbide (SiC), tungsten carbide (WC), an iron carbide, boron carbide ($B_4C$), alkali metal carbides (e.g., lithium carbide ($Li_4C_3$)), alkali earth metal carbides (e.g., magnesium carbide ($Mg_2C_3$)), and graphite. Example embodiments of borides include chromium boride ($CrB_2$), molybdenum boride ($Mo_2B_5$), tungsten boride ($W_2B_5$), iron boride, titanium boride, zirconium boride ($ZrB_2$), hafnium boride ($HfB_2$), vanadium boride ($VB_2$), Niobium boride ($NbB_2$), and lanthanum boride ($LaB_6$). Example embodiments of silicides include molybdenum disilicide ($MoSi_2$), tungsten disilicide ($WSi_2$), titanium disilicide ($TiSi_2$), nickel silicide (NiSi), alkali earth silicide (e.g., sodium silicide (NaSi)), alkali metal silicide (e.g., magnesium silicide ($Mg_2Si$)), hafnium disilicide ($HfSi_2$), and platinum silicide (PtSi).

Throughout the disclosure, a tensile strength, ultimate elongation (e.g., strain at failure), and yield point of a polymeric material (e.g., adhesive, polymer-based portion) is determined using ASTM D638 using a tensile testing machine, for example, an Instron 3400 or Instron 6800, at 23° C. and 50% relative humidity with a type I dogbone shaped sample. Throughout the disclosure, an elastic modulus (e.g., Young's modulus) and/or a Poisson's ratio is measured using ISO 527-1:2019. In some embodiments, the foldable substrate 206, 407, or 807, the first outer layer 213, the second outer layer 215, and/or the core layer 207 can comprise an elastic modulus of about 1 GigaPascal (GPa) or more, about 3 GPa or more, about 5 GPa or more, about 10 GPa or more, about 100 GPa or less, about 80 GPa or less, about 60 GPa or less, or about 20 GPa or less. In some embodiments, the foldable substrate 206, 407, or 807 can comprise an elastic modulus in a range from about 1 GPa to about 100 GPa, from about 1 GPa to about 80 GPa, from about 3 GPa to about 80 GPa, from about 3 GPa to about 60 GPa, from about 5 GPa to about 60 GPa, from about 5 GPa to about 20 GPa, from about 10 GPa to about 20 GPa, or any range or subrange therebetween. In further embodiments, the foldable substrate 206, 407, or 807, the first outer layer 213, the second outer layer 215, and/or the core layer 207 can comprise a glass-based portion or a ceramic-based portion comprising an elastic modulus in a range from about 10 GPa to about 100 GPa, from about 40 GPa to about 100 GPa, from about 60 GPa to about 100 GPa, from about 60 GPa to about 80 GPa, from about 80 GPa to about 100 GPa, or any range or subrange therebetween.

In some embodiments, the foldable substrate 206, 407, or 807, the first outer layer 213, the second outer layer 215, and/or the core layer 207 can be optically transparent. As used herein, "optically transparent" or "optically clear" means an average transmittance of 70% or more in the wavelength range of 400 nm to 700 nm through a 1.0 mm thick piece of a material. In some embodiments, an "optically transparent material" or an "optically clear material" may have an average transmittance of 75% or more, 80% or more, 85% or more, or 90% or more, 92% or more, 94% or more, 96% or more in the wavelength range of 400 nm to 700 nm through a 1.0 mm thick piece of the material. The average transmittance in the wavelength range of 400 nm to 700 nm is calculated by measuring the transmittance of whole number wavelengths from about 400 nm to about 700 nm and averaging the measurements.

As shown in FIGS. 2-3, 6, and 11, the foldable apparatus 101, 301, and 601 and test foldable apparatus 1102 comprise the foldable substrate 206. The foldable substrate comprises a first major surface 203 and a second major surface 205 opposite the first major surface 203. As shown in FIGS. 2-3 and 6, the first major surface 203 can extend along a first plane 204*a*. The second major surface 205 can extend along a second plane 204*b*. In some embodiments, as shown, the second plane 204*b* can be parallel to the first plane 204*a*. As used herein, a substrate thickness 211 can be defined between the first major surface 203 and the second major surface 205 as a distance between the first plane 204*a* and the second plane 204*b*.

As shown in FIGS. 2-3, 6, and 11, the foldable substrate 206 can comprise the first outer layer 213. As shown, the first outer layer 213 can comprise the first major surface 203 and a first inner surface 214 opposite the first major surface 203. In some embodiments, the first inner surface 214 can extend along a third plane 204*c* when the foldable apparatus 101, 301, and/or 601 is in a flat configuration. As used herein, a first outer thickness 217 of the first outer layer 213 can be defined between the first major surface 203 and the first inner surface 214 as a distance between the first plane 204*a* and the third plane 204*c*. In some embodiments, the substrate thickness 211 can be about 10 micrometers (μm) or more, about 25 μm or more, about 40 μm or more, about 60 μm or more, about 80 μm or more, about 100 μm or more, about 125 μm or more, about 150 μm or more, about 2 millimeters (mm) or less, about 1 mm or less, about 800 μm or less, about 500 μm or less, about 300 μm or less, about 200 μm or less, about 180 μm or less, or about 160 μm or less. In some embodiments, the substrate thickness 211 can be in a range from about 10 μm to about 2 mm, from about 25 μm to about 2 mm, from about 40 μm to about 2 mm, from about 60 μm to about 2 mm, from about 80 μm to about 2 mm, from about 100 μm to about 2 mm, from about 100 μm to about 1 mm, from about 100 μm to about 800 μm, from about 100 μm to about 500 μm, from about 125 μm to about 500 μm, from about 125 μm to about 300 μm, from about 125 μm to about 200 μm, from about 150 μm to about 200 μm, from about 150 μm to about 160 μm, or any range or subrange therebetween.

The first outer layer 213 will now be described with reference to the foldable apparatus 101 of FIG. 2 with the understanding that such description of the first outer layer 213, unless otherwise stated, can also apply to any embodiments of the disclosure, for example, the foldable apparatus 301 and/or 601, test foldable apparatus 1102, and/or the foldable substrate 206 illustrated in FIGS. 3, 6, and 11. As shown in FIG. 2, the first outer layer 213 can comprise a first portion 213*a* and a second portion 213*b*. A first minimum distance 210 can be defined between the first portion 213*a* of the first outer layer 213 and the second portion 213*b* of the first outer layer 213. In some embodiments, the first portion 213*a* of the first outer layer 213 can comprise a first surface area 223 of the first major surface 203 and a first inner surface area 214*a* of the first inner surface 214 opposite the first surface area 223. In some embodiments, the second portion 213*b* of the first outer layer 213 can comprise a third surface area 233 of the first major surface 203 and a second inner surface area 214*b* of the first inner surface 214 opposite the third surface area 233. In some embodiments, as shown, the first surface area 223 and the third surface area 233 can extend along the first plane 204*a*. In some embodiments, as shown, the first inner surface area 214*a* and the second inner surface area 214*b* can extend along the third plane 204*c*. In some embodiments, the first portion 213*a* of the first outer layer 213 can comprise the first outer thickness 217. In further embodiments, the first outer thickness 217 may be substantially uniform between the first surface area 223 and the first inner surface area 214*a* across its corresponding length (i.e., in the direction 106 of the length 105 of the foldable apparatus) and/or its corresponding width (i.e., in the direction 104 of the width 103 of the foldable apparatus). In some embodiments, the second portion 213*b* of the first outer layer 213 can comprise the first outer thickness 217. In further embodiments, the first outer thickness 217 may be substantially uniform between the third surface area 233 and the second inner surface area 214*b* across its corresponding length (i.e., in the direction 106 of the length 105 of the foldable apparatus) and/or its corresponding width (i.e., in the direction 104 of the width 103 of the foldable apparatus).

As shown in FIGS. 2-3, 6, and 11, the foldable substrate 206 can comprise the second outer layer 215. As shown, the second outer layer 215 can comprise the second major surface 205 and a second inner surface 216 opposite the second major surface 205. In some embodiments, the second inner surface 216 can extend along a fourth plane 204*d* when the foldable apparatus 101, 301, and/or 601 is in a flat configuration. As used herein, a second outer thickness 237 of the second outer layer 215 can be defined between the second major surface 205 and the second inner surface 216 as a distance between the second plane 204*b* and the fourth plane 204*d*.

The second outer layer 215 will now be described with reference to the foldable apparatus 101 of FIG. 2 with the understanding that such description of the second outer layer 215, unless otherwise stated, can also apply to any embodiments of the disclosure, for example, the foldable apparatus 301 and/or 601, test foldable apparatus 1102, and/or the foldable substrate 206 illustrated in FIGS. 3, 6, and 11. As shown in FIG. 2, the second outer layer 215 can comprise a first portion 215*a* and a second portion 215*b*. A second minimum distance 220 can be defined between the first portion 215*a* of the second outer layer 215 and the second portion 215*b* of the second outer layer 215. In some embodiments, the first portion 215*a* of the second outer layer 215 can comprise a second surface area 225 of the second major surface 205 and a third inner surface area 216*a* of the second inner surface 216 opposite the second surface area 225. In some embodiments, the second portion 215*b* of the second outer layer 215 can comprise a fourth surface area 235 of the second major surface 205 and a fourth inner surface area 216*b* of the second inner surface 216 opposite the fourth surface area 235. In some embodiments, as shown, the second surface area 225 and the fourth surface area 235 can extend along the second plane 204*b*. In some embodiments, as shown, the third inner surface area 216*a* and the fourth inner surface area 216*b* can extend along the fourth plane 204*d*. In some embodiments, the first portion 215*a* of the second outer layer 215 can comprise the second outer thickness 237. In further embodiments, the second outer thickness 237 may be substantially uniform between the second surface area 225 and the third inner surface area 216*a* across its corresponding length (i.e., in the direction 106 of the length 105 of the foldable apparatus) and/or its corresponding width (i.e., in the direction 104 of the width 103 of the foldable apparatus). In some embodiments, the second portion 215*b* of the second outer layer 215 can comprise the second outer thickness 237. In further embodiments, the second outer thickness 237 may be substantially uniform between the fourth surface area 235 and the fourth inner surface area 216*b* across its corresponding length (i.e., in the direction 106 of the length 105 of the foldable apparatus) and/or its corresponding width (i.e., in the direction 104 of the width 103 of the foldable apparatus).

As shown in FIGS. 2-3, 6, and 11, the foldable substrate 206 can comprise the core layer 207. As shown, the core layer 207 can comprise a third inner surface 208 and a fourth inner surface 218 opposite the third inner surface 208. In some embodiments, the third inner surface 208 can extend along the third plane 204*c*. In some embodiments, the fourth inner surface 218 can extend along the fourth plane 204*d*. As used herein, a central thickness 227 of the core layer 207 can be defined between the third inner surface 208 and the fourth inner surface 218 as a distance between the third plane 204*c* and the fourth plane 204*d*.

In some embodiments, the first outer thickness 217, second outer thickness 237, and/or central thickness 227 can be about 1 μm or more, about 5 μm or more, about 10 μm or more, about 25 μm or more, about 40 μm or more, about 80 μm or more, about 100 μm or more, about 125 μm or more, about 150 μm or more, about 1 mm or less, about 800 μm or less, about 500 μm or less, about 300 μm or less, about 200 μm or less, about 180 μm or less, or about 160 μm or less. In some embodiments, the first outer thickness 217, second outer thickness 237, and/or central thickness 227 can be in a range from about 1 μm to about 1 mm, from about 1 μm to about 800 μm, from about 5 μm to about 800 μm, from about 5 μm to about 500 μm, from about 10 μm to about 500 μm, from about 10 μm to about 300 μm, from about 25 μm to about 300 μm, from about 25 μm to about 200 μm, from about 40 μm to about 200 μm, from about 80 μm to about 200 μm, from about 80 μm to about 200 μm, from about 100 μm to about 200 μm, from about 125 μm to about 200 μm, from about 125 μm to about 180 μm, from about 125 μm to about 160 μm, from about 125 μm to about 150 μm, or any range or subrange therebetween. In further embodiments, the central thickness 227 can be about 1 μm or more, about 5 μm or more, about 10 μm or more, about 25 μm or more, about 40 μm or more, about 100 μm or less, about 80 μm or less, about 60 μm or less, or about 50 μm or less. In further embodiments, the central thickness 227 can be in a range from about 1 μm to about 100 μm, from about 5 μm to about 100 μm, from about 10 μm to about 100 μm, from about 10 μm to about 80 μm, from about 25 μm to about 80 μm, from about 25 μm to about 60 μm, from about 40 μm to about 60 μm, or any range or subrange therebetween. In some embodiments, the first outer thickness 217 can be substantially equal to the second outer thickness 237. In some embodiments, the first outer thickness 217 can be greater than the second outer thickness 237. In some embodiments, the second outer thickness 237 can be greater than the first outer thickness 217.

The core layer 207 will now be described with reference to the foldable apparatus 101 of FIG. 2 with the understanding that such description of the core layer 207, unless otherwise stated, can also apply to any embodiments of the disclosure, for example, the foldable apparatus 301 and/or 601, test foldable apparatus 1102, and/or the foldable substrate 206 illustrated in FIGS. 3, 6, and 11. As shown in FIG. 2, the core layer 207 can be positioned between the first outer layer 213 and the second outer layer 215. In some embodiments, as shown, the third inner surface 208 of the core layer 207 can contact the first inner surface area 214*a* of the first inner surface 214 of the first portion 213*a* of the first outer layer 213. In some embodiments, as shown, the third inner surface 208 of the core layer 207 can contact the second inner surface area 214*b* of the first inner surface 214 of the second portion 213*b* of the first outer layer 213. In some embodiments, as shown, the fourth inner surface 218 of the core layer 207 can contact the third inner surface area 216*a* of the second inner surface 216 of the first portion 215*a* of the second outer layer 215. In some embodiments, as shown, the fourth inner surface 218 of the core layer 207 can contact the fourth inner surface area 216*b* of the second portion 215*b* of the second outer layer 215.

As shown in FIG. 2, the third inner surface 208 can comprise a first central surface area 209 between the first inner surface area 214*a* of the first inner surface 214 of the first portion 213*a* of the first outer layer 213 and the second inner surface area 214*b* of the first inner surface 214 of the second portion 213*b* of the first outer layer 213. In some embodiments, as shown, the first central surface area 209 of the core layer 207 can be recessed from the first major surface 203 by a first distance, which can be substantially equal to or greater than the first outer thickness 217. A first recess 234 can be defined between the first plane 204*a* and the first central surface area 209.

As shown in FIG. 2, the fourth inner surface 218 can comprise a second central surface area 219 between the third inner surface area 216*a* of the second inner surface 216 of the first portion 215*a* of the second outer layer 215 and the fourth inner surface area 216*b* of the second inner surface 216 of the second portion 231 of the second outer layer 215. In some embodiments, as shown, the second central surface area 219 of the core layer 207 can be recessed from the second major surface 205 by a second distance, which can be substantially equal to or greater than the second outer thickness 237. A second recess 244 can be defined between the second plane 204*b* and the second central surface area 219.

A width of the first central surface area 209 can be substantially equal to the first minimum distance 210, and a width of the second central surface area 219 can be substantially equal to the second minimum distance 220. In some embodiments, the first minimum distance 210 and/or the second minimum distance 220 can be about 1 mm or more, about 3 mm or more, about 5 mm or more, about 8 mm or more, about 10 mm or more, about 15 mm or more, about 20 mm or more, about 100 mm or less, about 60 mm or less, about 50 mm or less, about 40 mm or less, about 35 mm or less, about 30 mm or less, or about 25 mm or less. In some embodiments, the first minimum distance 210 and/or the second minimum distance 220 can be in a range from about 1 mm to about 100 mm, from about 3 mm to about 100 mm, from about 3 mm to about 60 mm, from about 5 mm to about 60 mm, from about 5 mm to about 50 mm, from about 8 mm to about 50 mm, from about 8 mm to about 40 mm, from about 10 mm to about 40 mm, from about 10 mm to about 35 mm, from about 15 mm to about 35 mm, from about 15 mm to about 30 mm, from about 20 mm to about 30 mm, from about 20 mm to about 25 mm, or any range of subrange therebetween. In some embodiments, the first minimum distance 210 can be substantially equal to the second minimum distance 220. In some embodiments, the first minimum distance 210 can be greater than the second minimum distance 220. In some embodiments, the second minimum distance 220 can be greater than the first minimum distance 210.

In some embodiments, the first distance (e.g., first outer thickness 217) that the first central surface area 209 is recessed from the first plane 204a as a percentage of the substrate thickness 211 and/or the second distance (e.g., second outer thickness 237) that the second central surface area 219 is recessed from the second plane 204b as a percentage of the substrate thickness 211 can be about 1% or more, about 5% or more, about 10% or more, about 15% or more, about 20% or more, about 25% or more, about 75% or less, about 60% or less, about 50% or less, about 40% or less, about 35% or less, or about 30% or less. In some embodiments, the first distance and/or the second distance as a percentage of the substrate thickness 211 can be in a range from about 1% to about 75%, from about 1% to about 60%, from about 5% to about 60%, from about 5% to about 50%, from about 10% to about 50%, from about 10% to about 40%, from about 15% to about 40%, from about 15% to about 35%, from about 20% to about 35%, from about 20% to about 30%, from about 25% to about 30%, or any range or subrange therebetween. In some embodiments, the first distance can be substantially equal to the second distance. Providing the first distance substantially equal to the second distance can further reduce the incidence of mechanical instabilities in the central portion, for example, because the foldable substrate is symmetric about a plane comprising a midpoint in the substrate thickness and the central thickness. In some embodiments, the second distance can be greater than the first distance. In some embodiments, the first distance can be greater than the second distance. In further embodiments, the second distance (e.g., second outer thickness 237) that the second central surface area 219 is recessed from the second plane 204b as a percentage of the substrate thickness 211 can be about 1% or more, about 2% or more, about 5% or more, about 10% or more, about 12% or more, about 30% or less, about 25% or less, about 20% or less, about 18% or less, or about 15% or less. In further embodiments, the second distance (e.g., second outer thickness 237) that the second central surface area 219 is recessed from the second plane 204b as a percentage of the substrate thickness 211 can be in a range from about 1% to about 30%, from about 1% to about 25%, from about 2% to about 25%, from about 5% to about 25%, from about 5% to about 20%, from about 10% to about 20%, from about 10% to about 18%, from about 12% to about 18%, from about 12% to about 15%, or any range or subrange therebetween.

In some embodiments, the central thickness 227 as a percentage of the substrate thickness 211 can be about 0.5% or more, about 1% or more, about 2% or more, about 5% or more, about 6% or more, about 20% or less, about 13% or less, about 10% or less, or about 8% or less. In some embodiments, the central thickness 227 as a percentage of the substrate thickness 211 can be in a range from about 0.5% to about 20%, from about 0.5% to about 13%, from about 1% to about 13%, from about 1% to about 10%, from about 2% to about 10%, from about 2% to about 8%, from about 5% to about 8%, from about 6% to about 8%, or any range or subrange therebetween.

The first outer layer 213 can comprise a first coefficient of thermal expansion, the second outer layer 215 can comprise a second coefficient of thermal expansion, and the core layer 207 can comprise a core coefficient of thermal expansion. Throughout the disclosure, a coefficient of thermal expansion of a foldable substrate or a layer of a foldable substrate refers to a rate of linear expansion based on temperature and is measured in accordance with ASTM E228-17 at 25° C. In some embodiments, the first coefficient of thermal expansion, the second coefficient of thermal expansion, and/or the core coefficient of thermal expansion can be about $5 \times 10^{-7\circ}$ C.$^{-1}$ or more, about $10 \times 10^{-7\circ}$ C.$^{-1}$ or more, about $20 \times 10^{-7\circ}$ C.$^{-1}$ or more, about $30 \times 10^{-7\circ}$ C.$^{-1}$ or more, about $40 \times 10^{-7\circ}$ C.$^{-1}$ or more, about $50 \times 10^{-7\circ}$ C.$^{-1}$ or more, about $60 \times 10^{-7\circ}$ C.$^{-1}$ or more, about $500 \times 10^{-7\circ}$ C.$^{-1}$ or less, about $300 \times 10^{-7\circ}$ C.$^{-1}$ or less, about $200 \times 10^{-7\circ}$ C.$^{-1}$ or less, about $150 \times 10^{-7\circ}$ C.$^{-1}$ or less, about $100 \times 10^{-7\circ}$ C.$^{-1}$ or less, about $90 \times 10^{-7\circ}$ C.$^{-1}$ or less, about $80 \times 10^{-7\circ}$ C.$^{-1}$ or less, or about $70 \times 10^{-7\circ}$ C.$^{-1}$ or less. In some embodiments, the first coefficient of thermal expansion, the second coefficient of thermal expansion, and/or the core coefficient of thermal expansion can be in a range from about $5 \times 10^{-7\circ}$ C.$^{-1}$ to about $500 \times 10^{-7\circ}$ C.$^{-1}$, from about $5 \times 10^{-7\circ}$ C.$^{-1}$ to about $300 \times 10^{-7\circ}$ C.$^{-1}$, from about $10 \times 10^{-7\circ}$ C.$^{-1}$ to about $300 \times 10^{-7\circ}$ C.$^{-1}$, from about $10 \times 10^{-7\circ}$ C.$^{-1}$ to about $200 \times 10^{-7\circ}$ C.$^{-1}$, from about $20 \times 10^{-7\circ}$ C.$^{-1}$ to about $200 \times 10^{-7\circ}$ C.$^{-1}$, from about $20 \times 10^{-7\circ}$ C.$^{-1}$ to about $100 \times 10^{-7\circ}$ C.$^{-1}$, from about $30 \times 10^{-7\circ}$ C.$^{-1}$ to about $100 \times 10^{-7\circ}$ C.$^{-1}$, from about $30 \times 10^{-7\circ}$ C.$^{-1}$ to about $90 \times 10^{-7\circ}$ C.$^{-1}$, from about $40 \times 10^{-7\circ}$ C.$^{-1}$ to about $90 \times 10^{-7\circ}$ C.$^{-1}$, from about $40 \times 10^{-7\circ}$ C.$^{-1}$ to about $80 \times 10^{-7\circ}$ C.$^{-1}$, from about $50 \times 10^{-7\circ}$ C.$^{-1}$ to about $80 \times 10^{-7\circ}$ C.$^{-1}$, from about $50 \times 10^{-7\circ}$ C.$^{-1}$ to about $70 \times 10^{-7\circ}$ C.$^{-1}$, from about $60 \times 10^{-7\circ}$ C.$^{-1}$ to about $70 \times 10^{-7\circ}$ C.$^{-1}$, or any range or subrange therebetween. In some embodiments, the first coefficient of thermal expansion can be substantially equal to the second coefficient of thermal expansion. In some embodiments, the core coefficient of thermal expansion can be greater than the first coefficient of thermal expansion and/or the second coefficient of thermal expansion. In further embodiments, the core coefficient of thermal expansion can be more than the first coefficient of thermal expansion and/or the second coefficient of thermal expansion by about $5 \times 10^{-7\circ}$ C.$^{-1}$ or more, about $10 \times 10^{-7\circ}$ C.$^{-1}$ or more, about $20 \times 10^{-7\circ}$ C.$^{-1}$ or more, about $30 \times 10^{-7\circ}$ C.$^{-1}$ or more, about $40 \times 10^{-7\circ}$ C.$^{-1}$ or more, about $50 \times 10^{-7\circ}$ C.$^{-1}$ or more about $100 \times 10^{-7\circ}$ C.$^{-1}$ or less, about $80 \times 10^{-7\circ}$ C.$^{-1}$ or less, or about $70 \times 10^{-7\circ}$ C.$^{-1}$ or less, or about $60 \times 10^{-7\circ}$ C.$^{-1}$ or more. In further embodiments, an amount that the core coefficient of thermal expansion can be more than the first coefficient of thermal expansion and/or the second coefficient of thermal expansion can be in a range from about $5 \times 10^{-7\circ}$ C.$^{-1}$ to about $100 \times 10^{-7\circ}$ C.$^{-1}$, from about $5 \times 10^{-7\circ}$ C.$^{-1}$ to about $80 \times 10^{-7\circ}$ C.$^{-1}$, from about $10 \times 10^{-7\circ}$ C.$^{-1}$ to about $80 \times 10^{-7\circ}$ C.$^{-1}$, from about $10 \times 10^{-7\circ}$ C.$^{-1}$ to about $70 \times 10^{-7\circ}$ C.$^{-1}$, from about $20 \times 10^{-7\circ}$ C.$^{-1}$ to about $70 \times 10^{-7\circ}$ C.$^{-1}$, from about $20 \times 10^{-7\circ}$ C.$^{-1}$ to about $60 \times 10^{-7\circ}$ C.$^{-1}$, from about $30 \times 10^{-7\circ}$ C.$^{-1}$ to about $60 \times 10^{-7\circ}$ C.$^{-1}$, from about $30 \times 10^{-7\circ}$ C.$^{-1}$ to about $50 \times 10^{-7\circ}$ C.$^{-1}$, from about $40 \times 10^{-7\circ}$ C.$^{-1}$ to about $60 \times 10^{-7\circ}$ C.$^{-1}$, from about $40 \times 10^{-7\circ}$ C.$^{-1}$ to about $50 \times 10^{-7\circ}$ C.$^{-1}$, or any range or subrange therebetween. As discussed elsewhere herein, controlling a difference between a coefficient of thermal expansion of the core layer relative to the first outer layer and/or second outer layer or of the central portion relative to the first portion and/or second portion can reduce the chemical strengthening induced expansion and/or strain between layers and/or portions of the foldable apparatus and/or the foldable substrates that can facilitate a greater fold-induced strain before the foldable apparatus and/or foldable substrates reach a critical buckling strain (e.g., onset of mechanical instabilities) as well as reduce the incidence of optical distortions.

The first outer layer 213 can comprise a first density, the second outer layer 215 can comprise a second density, and the core layer 207 can comprise a core density. Throughout the disclosure, density is measured in accordance with ASTM C693-93(2019) at 25° C. In some embodiments, the first density, second density, and/or core density can be about 2 grams per centimeter cubed ($g/cm^3$) or more, about 2.2 $g/cm^3$ or more, about 2.3 $g/cm^3$ or more, about 2.4 $g/cm^3$ or more, about 2.42 $g/cm^3$ or more, about 2.45 $g/cm^3$ or more, about 2.47 $g/cm^3$ or more, about 3 $g/cm^3$ or less, about 2.8 $g/cm^3$ or less, about 2.7 $g/cm^3$ or less, about 2.65 $g/cm^3$ or less, about 2.6 $g/cm^3$ or less, or about 2.58 $g/cm^3$ or less, about 2.55 $g/cm^3$ or less, about 2.52 $g/cm^3$ or less, or about 2.5 $g/cm^3$ or less. In some embodiments, the first density, second density, and/or core density can be in a range from about 2 $g/cm^3$ to about 3 $g/cm^3$, from about 2 $g/cm^3$ to about 2.8 $g/cm^3$, from about 2.2 $g/cm^3$ to about 2.8 $g/cm^3$, from about 2.2 $g/cm^3$ to about 2.7 $g/cm^3$, from about 2.3 $g/cm^3$ to about 2.7 $g/cm^3$, from about 2.4 $g/cm^3$ to about 2.7 $g/cm^3$, from about 2.42 $g/cm^3$ to about 2.7 $g/cm^3$, from about 2.42 $g/cm^3$ to about 2.68 $g/cm^3$, from about 2.45 $g/cm^3$ to about 2.68 $g/cm^3$, from about 2.45 $g/cm^3$ to about 2.65 $g/cm^3$, from about 2.48 $g/cm^3$ to about 2.65 $g/cm^3$, from about 2.48 $g/cm^3$ to about 2.52 $g/cm^3$, from about 2.48 $g/cm^3$ to about 2.5 $g/cm^3$, or any range or subrange therebetween. In some embodiments, the first density can be substantially equal to the second density. In some embodiments, the core density can be greater than the first density and/or the second density. In further embodiments, the core density can be more than the first density and/or the second density by about 0.005 $g/cm^3$ or more, about 0.01 $g/cm^3$ or more, about 0.015 $g/cm^3$ or more, about 0.02 $g/cm^3$ or more, about 0.025 $g/cm^3$ or more, about 0.055 $g/cm^3$ or less, about 0.05 $g/cm^3$ or less, about 0.045 $g/cm^3$ or less, about 0.04 $g/cm^3$ or less, about 0.35 $g/cm^3$ or less, or about 0.3 $g/cm^3$ or less. In further embodiments, an amount that the core density can be more than the first density and/or the second density can be in a range from about 0.005 $g/cm^3$ to about 0.055 $g/cm^3$, from about 0.005 $g/cm^3$ to about 0.05 $g/cm^3$, from about 0.01 $g/cm^3$ to about 0.05 $g/cm^3$, from about 0.01 $g/cm^3$ to about 0.045 $g/cm^3$, from about 0.015 $g/cm^3$ to about 0.045 $g/cm^3$, from about 0.015 $g/cm^3$ to about 0.04 $g/cm^3$, from about 0.02 $g/cm^3$ to about 0.04 $g/cm^3$, from about 0.02 $g/cm^3$ to about 0.035 $g/cm^3$, from about 0.025 $g/cm^3$ to about 0.035 $g/cm^3$, from about 0.025 $g/cm^3$ to about 0.03 $g/cm^3$, or any range or subrange therebetween. As discussed elsewhere herein, controlling a difference between a density of the core layer relative to the first outer layer and/or second outer layer or of the central portion relative to the first portion and/or second portion can reduce the chemical strengthening induced expansion and/or strain between layers and/or portions of the foldable apparatus and/or the foldable substrates that can facilitate a greater fold-induced strain before the foldable apparatus and/or foldable substrates reach a critical buckling strain (e.g., onset of mechanical instabilities) as well as reduce the incidence of optical distortions.

The first outer layer 213 can comprise a first network dilation coefficient, the second outer layer 215 can comprise a second network dilation coefficient, and the core layer 207 can comprise a core network dilation coefficient. Throughout the disclosure, a network dilation coefficient (e.g., lattice dilation coefficient) refers to the rate that a volume of material (e.g., glass-based material, ceramic-based material) increases per mol % of alkali metal ion increases as the alkali metal ions are exchanged into the material. In some embodiments, the network dilation coefficients can be for potassium on an oxide basis. In some embodiments, the network dilation coefficients can be for sodium on an oxide basis. In some embodiments, the first network dilation coefficient, second network dilation coefficient, and/or core network dilation coefficient can be about $300 \times 10^{-6}$/mol % or more, about $500 \times 10^{-6}$/mol % or more, about $700 \times 10^{-6}$/mol %, about $800 \times 10^{-6}$/mol % or more, about $900 \times 10^{-6}$/mol % or more, about $200 \times 10^{-6}$/mol % or less, about $1500 \times 10^{-6}$/mol % or less, about $1200 \times 10^{-6}$/mol % or less, about $1100 \times 10^{-6}$/mol % or less, or about $1000 \times 10^{-6}$/mol % or less. In some embodiments, the first network dilation coefficient, second network dilation coefficient, and/or core network dilation coefficient can be in a range from about $300 \times 10^{-6}$/mol % to about $2000 \times 10^{-6}$/mol %, from about $300 \times 10^{-6}$/mol % to about $1500 \times 10^{-6}$/mol %, from about $500 \times 10^{-6}$/mol % to about $1500 \times 10^{-6}$/mol %, from about $500 \times 10^{-6}$/mol % to about $1200 \times 10^{-6}$/mol %, from about $700 \times 10^{-6}$/mol % to about $1200 \times 10^{-6}$/mol %, from about $700 \times 10^{-6}$/mol % to about $1100 \times 10^{-6}$/mol %, from about $800 \times 10^{-6}$/mol % to about $1100 \times 10^{-6}$/mol %, from about $800 \times 10^{-6}$/mol % to about $1000 \times 10^{-6}$/mol %, from about $900 \times 10^{-6}$/mol % to about $1000 \times 10^{-6}$/mol %, or any range or subrange therebetween. In some embodiments, the first network dilation coefficient can be substantially equal to the second network dilation coefficient. In some embodiments, the core network dilation coefficient can be less than the first network dilation coefficient and/or the second network dilation coefficient. As discussed above, controlling a difference between a network dilation coefficient of the core layer relative to the first outer layer and/or second outer layer or of the central portion relative to the first portion and/or second portion can reduce the chemical strengthening induced expansion and/or strain between layers and/or portions of the foldable apparatus and/or the foldable substrates that can facilitate a greater fold-induced strain before the foldable apparatus and/or foldable substrates reach a critical buckling strain (e.g., onset of mechanical instabilities) as well as reduce the incidence of optical distortions.

As shown in FIGS. 4-5 and 7, the foldable substrate 407 can comprise a first major surface 403 and a second major surface 405 opposite the first major surface 403. As shown in FIGS. 4-5 and 7, the first major surface 403 can extend along a first plane 404a. The second major surface 405 can extend along a second plane 404b. In some embodiments, as shown, the second plane 404b can be parallel to the first plane 404a. As used herein, a substrate thickness 411 can be defined between the first major surface 403 and the second major surface 405 as a distance between the first plane 404a and the second plane 404b. The substrate thickness 411 can be within one or more of the ranges discussed above with reference to substrate thickness 211.

As shown in FIGS. 4-5 and 7, the foldable substrate 407 can also comprise a first portion 421 comprising a first surface area 423 and a second surface area 425 opposite the first surface area 423. The first portion 421 will now be described with reference to the foldable apparatus 401 of FIG. 4 with the understanding that such description of the first portion 421, unless otherwise stated, can also apply to any embodiments of the disclosure, for example, the foldable apparatus 501 and 701 and/or foldable substrate 407 illustrated in FIGS. 5 and 7. As shown in FIG. 4, the first portion 421 can comprise a first surface area 423 and a second surface area 425 opposite the first surface area 423. In some embodiments, as shown, the second surface area 425 of the first portion 421 can comprise a planar surface. In further embodiments, as shown, the second surface area 425 can be parallel to the first surface area 423. In some embodiments, as shown, the first major surface 403 can comprise the first surface area 423 and the second major surface 405 can comprise the second surface area 425. In further embodiments, the first surface area 423 can extend along the first plane 404a. In further embodiments, the second surface area 425 can extend along the second plane 404b. In some embodiments, the substrate thickness 411 can correspond to the distance between the first surface area 423 of the first portion 421 and the second surface area 425 of the first portion 421. In some embodiments, the substrate thickness 411 can be substantially uniform across the first surface area 423. In some embodiments, a first thickness defined between the first surface area 423 and the second surface area 425 can be within one or more of the ranges discussed above with regards to the substrate thickness 211 or 411. In further embodiments, the first thickness can comprise the substrate thickness 411. In further embodiments, the first thickness of the first portion 421 may be substantially uniform between the first surface area 423 and the second surface area 425 across its corresponding length (i.e., in the direction 106 of the length 105 of the foldable apparatus) and/or its corresponding width (i.e., in the direction 104 of the width 103 of the foldable apparatus).

As shown in FIGS. 4-5 and 7, the foldable substrate 407 can also comprise a second portion 431 comprising a third surface area 433 and a fourth surface area 435 opposite the third surface area 433. The second portion 431 will now be described with reference to the foldable apparatus 401 of FIG. 4 with the understanding that such description of the second portion 431, unless otherwise stated, can also apply to any embodiments of the disclosure, for example, the foldable apparatus 501 and/or 701 and/or foldable substrate 407 illustrated in FIGS. 5 and 7. In some embodiments, as shown, the third surface area 433 of the second portion 431 can comprise a planar surface. In further embodiments, the third surface area 433 of the second portion 431 can be in a common plane with the first surface area 423 of the first portion 421. In some embodiments, as shown, the fourth surface area 435 of the second portion 431 can comprise a planar surface. In further embodiments, as shown, the fourth surface area 435 can be parallel to the third surface area 433. In further embodiments, the fourth surface area 435 of the second portion 431 can be in a common plane with the second surface area 425 of the first portion 421. A second thickness can be defined between the third surface area 433 of the second portion 431 and the fourth surface area 435 of the second portion 431. In some embodiments, the second thickness can be within the range discussed above with regards to the substrate thickness 211 or 411. In further embodiments, the second thickness can comprise the substrate thickness 411. In further embodiments, as shown, the second thickness can be substantially equal to the substrate thickness 411 (e.g., first thickness). In some embodiments, the second thickness of the second portion 431 may be substantially uniform between the third surface area 433 and the fourth surface area 435.

As shown in FIGS. 4-5 and 7, the foldable substrate 407 can comprise a central portion 481 positioned between the first portion 421 and the second portion 431. In some embodiments, the central portion 481 can comprise a first central surface area 409 and a second central surface area 419 opposite the first central surface area 409. In further embodiments, the central portion 481 can comprise the first central surface area 409 positioned between the first surface area 423 and the third surface area 433. In even further embodiments, as shown, the first central surface area 409 can be recessed from the first major surface 403 by a first distance 417. The first distance 417 can be within one or more of the ranges discussed above for the first distance (e.g., first outer thickness 217) with reference to the foldable substrate 206. In even further embodiments, as shown, the first central surface area 409 can extend along a third plane 404c when the foldable apparatus 401, 501, and/or 701 is in a flat configuration, although the first central surface area 409 may be provided as a nonplanar area in further embodiments. A first recess 434 can be defined between the first central surface area 409 (e.g., third plane 404c) and the first plane 404a. In further embodiments, the third plane 404c can be substantially parallel to the first plane 404a and/or the second plane 404b.

In some embodiments, the central portion 481 can comprise the second central surface area 419 positioned between the second surface area 425 and the fourth surface area 435. In further embodiments, as shown, the second central surface area 419 can be recessed from the second major surface 405 by a second distance 437. The second distance 437 can be within one or more of the ranges discussed above for the second distance (e.g., second outer thickness 237) with reference to the foldable substrate 206. In even further embodiments, as shown, the second central surface area 419 can extend along a fourth plane 404d when the foldable apparatus 401, 501, and/or 701 is in a flat configuration, although the second central surface area 419 may be provided as a nonplanar area in further embodiments. A second recess 444 can be defined between the second central surface area 419 (e.g., fourth plane 404d) and the second plane 404b. As discussed above, providing the first distance that the first central surface area is recessed from the first major surface substantially equal to the second distance that the second central surface area is recessed from the second major surface can reduce the incidence of mechanical instabilities in the central portion, for example, because the foldable substrate is symmetric about a plane comprising a midpoint in the substrate thickness and the central thickness.

A central thickness 427 can be defined between the first central surface area 409 and the second central surface area 419, which can be measured as the distance between the third plane 404c and the fourth plane 404d. In some embodiments, the central thickness 427 can be within one or more of the ranges discussed above for the central thickness 227 of foldable substrate 206. In some embodiments, the central thickness 427 as a percentage of the substrate thickness 411 can be within one or more of the ranges discussed above for the central thickness 227 as a percentage of the substrate thickness 211 of foldable substrate 206. By providing the first central surface area 409 of the central portion 481 extending along the third plane 404c parallel to the second central surface area 419 of the central portion 481 extending along the fourth plane 404d, a uniform central thickness 427 may extend across the central portion 481 that can provide enhanced folding performance at a predetermined thickness for the central thickness 427. A uniform central thickness 427 across the central portion 481 can improve folding performance by preventing stress concentrations that would occur if a portion of the central portion 481 was thinner than the rest of the central portion 481.

In some embodiments, as shown in FIGS. 4-5, a transition between the first central surface area 409 and the first surface area 423 and/or the third surface area 433 can be substantially abrupt (e.g., sufficiently narrow to resemble straight sides perpendicular to the first plane 404a and/or third plane 404c). In some embodiments, as shown in FIGS. 4-5, a transition between the second central surface area 419 and the second surface area 425 and/or the fourth surface area 435 can be substantially abrupt (e.g., sufficiently narrow to resemble straight sides perpendicular to the second plane 404b and/or the fourth plane 404d). In some embodiments, although not shown, the foldable substrate 407 can comprise a first transition between the first surface area and the first central surface and/or between the second surface area and the second central surface area that can, for example, resemble the first transition portion 853 in FIG. 8. In some embodiments, although not shown, the foldable substrate 407 can comprise a second transition between the third surface area and the first central surface and/or between the fourth surface area and the second central surface area that can, for example, resemble the second transition portion 855 in FIG. 8.

In some embodiments, as shown in FIG. 7, the foldable apparatus 701 can comprise a foldable substrate 707 that can comprise the first portion 421 and/or the second portion 431 similar to or identical to the corresponding portion of foldable substrate 407. In some embodiments, the foldable substrate 707 can comprise a first transition portion 753 positioned between the first portion 421 and a portion of the central portion 781 (e.g., first central surface area 709) comprising the third plane 404c. In further embodiments, the first transition portion 753 comprises a portion of the first transition portion 753 extending from the first portion 421 where a thickness of the first transition portion continuously changes and a portion extending from the third plane 404c that can change abruptly. In even further embodiments, a transition depth 727 of the abrupt change can be about 1 μm or more, about 5 μm or more, about 10 μm or more, about 12 μm or more, about 50 μm or less, about 30 μm or less, about 25 μm or less, about 20 μm or less, about 18 μm or less, or about 15 μm or less. In even further embodiments, a transition depth 727 of the abrupt change can be in a range from about 1 μm to about 50 μm, from about 1 μm to about 30 μm, from about 2 μm to about 30 μm, from about 2 μm to about 25 μm, from about 5 μm to about 25 μm, from about 5 μm to about 20 μm, from about 10 μm to about 20 μm, from about 10 μm to about 18 μm, from about 12 μm to about 18 μm, from about 12 μm to about 15 μm, or any range or subrange therebetween. In some embodiments, as shown in FIG. 7, the foldable substrate 707 can comprise a second transition portion 755 positioned between the second portion 431 and a portion of the central portion 781 (e.g., first central surface area 709) comprising the third plane 404c. In further embodiments, the second transition portion 755 comprises a portion of the second transition portion 755 extending from the second portion 431 where a thickness of the second transition portion continuously changes and a portion extending from the third plane 404c that can change abruptly. In even further embodiments, a transition depth 727 of the abrupt change in the second transition portion can be within one or more of the ranges discussed above for the transition depth 727 of the abrupt change in the first transition portion. In even further embodiments, a transition depth 727 of the abrupt change in the second transition portion can be substantially equal to the transition depth 727 of the abrupt change in the first transition portion, As shown in FIG. 8, the foldable apparatus 801 can comprise the foldable substrate 807. The foldable substrate can comprise a first major surface 803 and a second major surface 805 opposite the first major surface 803. As shown in FIG. 8, the first major surface 803 can extend along a first plane 804a. The second major surface 805 can extend along a second plane 804b. In some embodiments, as shown, the second plane 804b can be parallel to the first plane 404a. As used herein, a substrate thickness 811 can be defined between the first major surface 803 and the second major surface 805 as a distance between the first plane 804a and the second plane 804b. The substrate thickness 811 can be within one or more of the ranges discussed above with reference to substrate thickness 211 or 411.

As shown in FIG. 8, the foldable substrate 807 can also comprise a first portion 821 comprising a first surface area

823 and a second surface area 825 opposite the first surface area 823. In some embodiments, as shown, the second surface area 825 of the first portion 821 can comprise a planar surface. In further embodiments, as shown, the second surface area 825 can be parallel to the first surface area 823. In some embodiments, as shown, the first major surface 803 can comprise the first surface area 823 and the second major surface 805 can comprise the second surface area 825. In further embodiments, the first surface area 823 can extend along the first plane 804a. In further embodiments, the second surface area 825 can extend along the second plane 804b. In some embodiments, the substrate thickness 811 can correspond to the distance between the first surface area 823 of the first portion 821 and the second surface area 825 of the first portion 821. In some embodiments, the substrate thickness 811 can be substantially uniform across the first surface area 823. In some embodiments, a first thickness defined between the first surface area 823 and the second surface area 825 can be within one or more of the ranges discussed above with regards to the substrate thickness 211, 411, or 811. In further embodiments, the first thickness can comprise the substrate thickness 811. In further embodiments, the first thickness of the first portion 821 may be substantially uniform between the first surface area 823 and the second surface area 825 across its corresponding length (i.e., in the direction 106 of the length 105 of the foldable apparatus) and/or its corresponding width (i.e., in the direction 104 of the width 103 of the foldable apparatus).

As shown in FIG. 8, the foldable substrate 807 can also comprise a second portion 831 comprising a third surface area 833 and a fourth surface area 835 opposite the third surface area 833. In some embodiments, as shown, the third surface area 833 of the second portion 831 can comprise a planar surface. In further embodiments, the third surface area 833 of the second portion 831 can be in a common plane with the first surface area 823 of the first portion 821. In some embodiments, as shown, the fourth surface area 835 of the second portion 831 can comprise a planar surface. In further embodiments, as shown, the fourth surface area 835 can be parallel to the third surface area 833. In further embodiments, the fourth surface area 835 of the second portion 831 can be in a common plane with the second surface area 825 of the first portion 821. A second thickness can be defined between the third surface area 833 of the second portion 831 and the fourth surface area 835 of the second portion 831. In some embodiments, the second thickness can be within the range discussed above with regards to the substrate thickness 211, 411, or 811. In further embodiments, the second thickness can comprise the substrate thickness 811. In further embodiments, as shown, the second thickness can be substantially equal to the substrate thickness 811 (e.g., first thickness). In some embodiments, the second thickness of the second portion 831 may be substantially uniform between the third surface area 833 and the fourth surface area 835.

As shown in FIG. 8, the foldable substrate 807 can comprise a central portion 881 positioned between the first portion 821 and the second portion 831. In some embodiments, the central portion 881 can comprise a first central surface area 809 and a second central surface area 819 opposite the first central surface area 809. In further embodiments, the central portion 881 can comprise the first central surface area 809 positioned between the first surface area 823 and the third surface area 833. In even further embodiments, as shown, the first central surface area 809 can be recessed from the first major surface 803 by a first distance 817. The first distance 817 can be within one or more of the ranges discussed above for the first distance (e.g., first outer thickness 217) with reference to the foldable substrate 206. In even further embodiments, as shown, the first central surface area 809 can extend along a third plane 804*c* when the foldable apparatus 801 is in a flat configuration, although the first central surface area 809 may be provided as a nonplanar area in further embodiments. A first recess 834 can be defined between the first central surface area 809 (e.g., third plane 804*c*) and the first plane 804*a*. In further embodiments, the third plane 804*c* can be substantially parallel to the first plane 804*a* and/or the second plane 804*b*. In further embodiments, the central portion 881 can comprise the second central surface area 819 positioned between the second surface area 825 and the fourth surface area 835. In even further embodiments, as shown, the second major surface 805 can comprise the second central surface area 819. In even further embodiments, although not shown, a portion of the second central surface area can be recessed from the second plane. In even further embodiments, although not shown, the foldable substrate can comprise an another recess in the second major surface of the foldable substrate exposing the second central surface area A central thickness 827 of the central portion 881 can be defined between the first central surface area 809 and the second central surface area 819. In some embodiments, the first central surface area 809 may extend along a third plane 804*c* when the foldable apparatus 801 is in a flat configuration, although the first central surface area 809 may be provided as a nonplanar area in further embodiments. In further embodiments, the third plane 804*c* can be substantially parallel to the first plane 804*a* and/or the second plane 804*b*. In some embodiments, the central thickness 827 can be within one or more of the ranges discussed above for the central thickness 227 of foldable substrate 206. In some embodiments, the central thickness 827 as a percentage of the substrate thickness 811 can be within one or more of the ranges discussed above for the central thickness 227 as a percentage of the substrate thickness 211 of foldable substrate 206. By providing the first central surface area 809 of the central portion 881 extending along a third plane 804*c* parallel to the second plane 804*b*, a uniform central thickness 827 may extend across the central portion 881 that can provide enhanced folding performance at a predetermined thickness for the central thickness 827. A uniform central thickness 827 across the central portion 881 can improve folding performance by preventing stress concentrations that would occur if a portion of the central portion 881 was thinner than the rest of the central portion 881.

As shown in FIG. 8, the central portion 881 can comprise a first transition portion 853. The first transition portion 853 can attach the first portion 821 to a region of the central portion 881 comprising the central thickness 827. A thickness of the first transition portion 853 can be defined between the second plane 804*b* and the first central surface area 809. As shown in FIG. 8, the thickness of the first transition portion 853 can continuously increase from the first central surface area 809 (e.g., the central thickness 827) to the first portion 821 (e.g., substrate thickness 811). In some embodiments, as shown, the thickness of the first transition portion 853 can increase at a constant rate from the first central surface area 809 to the first portion 821. In some embodiments, although not shown, the thickness of the first transition portion 853 may increase more slowly where the first central surface area 809 meets the first transition portion 853 than in the middle of the first transition portion 853. In some embodiments, although not shown, the thickness of the first transition portion 853 may increase more slowly where the first portion 821 meets the first transition portion 853 than in the middle of the first transition portion 853. In some embodiments, although not shown in FIG. 8, the central portion can resemble the central portion 481 of FIG. 4 that may not comprise a first transition portion. In some embodiments, although not shown, the first transition portion 853 can transition from the second surface area to the second central surface area, for example, if the second central surface area is recessed from the second plane. In some embodiments, although not shown, the first transition portion can comprise a portion extending from the first portion where a thickness of the first transition portion continuously changes and a portion extending from the third plane 804*c* can change abruptly (e.g., see FIG. 7).

The central portion 881 can comprise a second transition portion 855. As shown in FIG. 8, the second transition portion 855 can attach the second portion 831 to a region of the central portion 881 comprising the central thickness 827 (e.g., region comprising the first central surface area 809). A thickness of the second transition portion 855 can be defined between the second plane 804*b* and the first central surface area 809. As shown in FIG. 8, the thickness of the second transition portion 855 can continuously increase from the first central surface area 809 (e.g., the central thickness 827) to the second portion 831 (e.g., substrate thickness 811). In some embodiments, as shown, the thickness of the second transition portion 855 can increase at a constant rate from the first central surface area 809 to the second portion 831. In some embodiments, although not shown, the thickness of the second transition portion 855 may increase more slowly where the first central surface area 809 meets the second transition portion 855 than in the middle of the second transition portion 855. In some embodiments, although not shown, the thickness of the second transition portion 855 may increase more slowly where the second portion 831 meets the second transition portion 855 than in the middle of the second transition portion 855. In some embodiments, as shown in FIG. 8, the central portion 881 may comprise a second transition portion. In some embodiments, although not shown in FIG. 8, the central portion can resemble the central portion 481 of FIG. 4 that may not comprise a second transition portion. In some embodiments, although not shown, the second transition portion 855 can transition from the fourth surface area to the second central surface area, for example, if the second central surface area is recessed from the second plane. In some embodiments, although not shown, the second transition portion can comprise a portion extending from the second portion where a thickness of the second transition portion continuously changes and a portion extending from the third plane 804*c* can change abruptly, for example, similar to that shown in FIG. 7.

As shown in FIG. 8, a width of the first transition portion 853 can be defined between a portion of the central portion 881 comprising the central thickness 827 (e.g., the third plane 804*c*) and the first portion 821 in the direction 106 of the length 105 of the foldable apparatus 801. A width of the second transition portion 855 can be defined between a portion of the central portion 881 comprising the central thickness 827 (e.g., the third plane 804*c*) and the second portion 831 in the direction 106 of the length 105 of the foldable apparatus 101. In some embodiments, the width of the first transition portion 853 and/or the width of the second transition portion 855 can be sufficiently large (e.g., 1 mm or more) to avoid optical distortions that may otherwise occur at a step transition or small transition width (e.g., less than 1 mm) between the first and central thickness. In some embodiments, to enhance puncture resistance of the foldable substrate while also avoiding optical distortions, the width of the first transition portion 853 and/or the width of the second transition portion 855 can be about 1 mm or more, about 2 mm or more, about 3 mm or more, about 5 mm or less, about 4 mm or less, or about 3 mm or less. In some embodiments, the width of the first transition portion 853 and/or the width of the second transition portion 855 can be in a range from about 1 mm to about 5 mm, from about 1 mm to about 4 mm, from about 1 mm to about 3 mm, from about 2 mm to about 5 mm, from about 2 mm to about 4 mm, from about 2 mm to about 3 mm, from about 3 mm to about 5 mm, from about 3 mm to about 4 mm, or any range or subrange therebetween.

As used herein, if a first layer and/or component is described as "disposed over" a second layer and/or component, other layers may or may not be present between the first layer and/or component and the second layer and/or component. Furthermore, as used herein, "disposed over" does not refer to a relative position with reference to gravity. For example, a first layer and/or component can be considered "disposed over" a second layer and/or component, for example, when the first layer and/or component is positioned underneath, above, or to one side of a second layer and/or component. As used herein, a first layer and/or component described as "bonded to" a second layer and/or component means that the layers and/or components are bonded to each other, either by direct contact and/or bonding between the two layers and/or components or via an adhesive layer. As used herein, a first layer and/or component described as "contacting" or "in contact with" a second layer and/or components refers to direct contact and includes the situations where the layers and/or components are bonded to each other.

As shown in FIGS. 2-5 and 12, the foldable apparatus 101, 301, 401, 501, and/or 1201 can comprise an adhesive layer 261. As shown, the adhesive layer 261 can comprise a first contact surface 263 and a second contact surface 265 that can be opposite the first contact surface 263. In some embodiments, as shown in FIGS. 2-5, the second contact surface 265 of the adhesive layer 261 can comprise a planar surface. In some embodiments, as shown in FIGS. 2 and 5, the first contact surface 263 of the adhesive layer 261 can comprise a planar surface. An adhesive thickness 267 of the adhesive layer 261 can be defined as a minimum distances between the first contact surface 263 and the second contact surface 265. In some embodiments, the adhesive thickness 267 of the adhesive layer 261 can be about 1 μm or more, about 5 μm or more, about 10 μm or more, about 100 μm or less, about 60 μm or less, about 30 μm or less, or about 20 μm or less. In some embodiments, the adhesive thickness 267 of the adhesive layer 261 can be in a range from about 1 μm to about 100 μm, from about 5 μm to about 100 μm, from about 5 μm to about 60 μm, from about 5 μm to about 30 μm, from about 10 μm to about 30 μm, from about 10 μm to about 20 μm, or any range or subrange therebetween.

In some embodiments, as shown in FIGS. 2 and 4, the second contact surface 265 of the adhesive layer 261 can face the first major surface 273 of a release liner 271 (described below). In further embodiments, as shown, the second contact surface 265 of the adhesive layer 261 can contact the first major surface 273 the release liner 271. In some embodiments, as shown in FIGS. 3, 5, and 12, the second contact surface 265 of the adhesive layer 261 can face the first major surface 303 of the display device 307. In further embodiments, as shown, the second contact surface 265 of the adhesive layer 261 can contact the first major surface 303 of the display device 307.

In some embodiments, as shown in FIGS. 2-5 and 12, the first contact surface 263 of the adhesive layer 261 can face the second surface area 225 or 425 of the first portion 221 or 421. In further embodiments, as shown, the first contact surface 263 of the adhesive layer 261 can contact the second surface area 225 or 425 of the first portion 221 or 421. In some embodiments, as shown in FIGS. 2-5 and 12, the first contact surface 263 of the adhesive layer 261 can face the fourth surface area 235 or 435 of the second portion 231 or 431. In further embodiments, as shown, the first contact surface 263 of the adhesive layer 261 can contact the fourth surface area 235 or 435 of the second portion 231 or 431. In some embodiments, as shown in FIGS. 2-5 and 12, the first contact surface 263 of the adhesive layer 261 can face the second central surface area 219 or 419 of the central portion 281 or 481. In further embodiments, as shown in FIGS. 3-4, the first contact surface 263 of the adhesive layer 261 can contact the second central surface area 219 or 419 of the central portion 281 or 481. In further embodiments, as shown in FIGS. 3-4, the adhesive layer 261 can extend into the second recess 244 or 444. In some embodiments, although not shown, the second recess may not be totally filled, for example, to leave room for electronic devices and/or mechanical devices. In some embodiments, although not shown, another adhesive layer, for example similar to the adhesive layer 261, can be disposed over and/or contact the first major surface (e.g., first surface area, third surface area) and/or extend into the first recess, although the first recess may not be totally filled, for example, to leave room for electronic devices and/or mechanical devices.

In some embodiments, the adhesive layer 261 can comprise one or more of a polyolefin, a polyamide, a halide-containing polymer (e.g., polyvinylchloride or a fluorine-containing polymer), an elastomer, a urethane, phenolic resin, parylene, polyethylene terephthalate (PET), and polyether ether ketone (PEEK). Example embodiments of polyolefins include low molecular weight polyethylene (LDPE), high molecular weight polyethylene (HDPE), ultra-high molecular weight polyethylene (UHMWPE), and polypropylene (PP). Example embodiments of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example embodiments of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene). In further embodiments, the adhesive layer 261 can comprise an optically clear adhesive. In even further embodiments, the optically clear adhesive can comprise one or more optically transparent polymers: an acrylic (e.g., polymethylmethacrylate (PMMA)), an epoxy, silicone and/or a polyurethane. Examples of epoxies include bisphenol-based epoxy resins, novolac-based epoxies, cycloaliphatic-based epoxies, and glycidylamine-based epoxies. In even further embodiments, the optically clear adhesive can comprise, but is not limited to, acrylic adhesives, for example, 3M 8212 adhesive, or an optically transparent liquid adhesive, for example, a LOCTITE optically transparent liquid adhesive. Exemplary embodiments of optically clear adhesives comprise transparent acrylics, epoxies, silicones, and polyurethanes. For example, the optically transparent liquid adhesive could comprise one or more of LOCTITE AD 8650, LOCTITE AA 3922, LOCTITE EA E-05MR, LOCTITE UK U-09LV, which are all available from Henkel.

In some embodiments, the adhesive layer 261 can comprise an elastic modulus of about 0.001 MegaPascals (MPa) or more, about 0.01 MPa or more, about 0.1 MPa or more, about 1 MPa or less, about 0.5 MPa or less, about 0.1 MPa or less, or about 0.05 MPa or less. In some embodiments, the adhesive layer 261 can comprise an elastic modulus in a range from about 0.001 MPa to about 1 MPa, from about 0.01 MPa to about 1 MPa, from about 0.01 MPa to about 0.5 MPa, from about 0.05 MPa to about 0.5 MPa, from about 0.1 MPa to about 0.5 MPa, from about 0.001 MPa to about 0.5 MPa, from about 0.001 MPa to about 0.01 MPa, or any range or subrange therebetween. In some embodiments, the adhesive layer can comprise an elastic modulus within one or more of the ranges discussed below for the elastic modulus of the polymer-based portion 241.

As shown in FIGS. 2, 5, and 12, the polymer-based portion 241 of the foldable apparatus 101, 401, and/or 1201 can be positioned between the first portion 221 or 421 and the second portion 231 or 431. In some embodiments, as shown, the polymer-based portion 241 can be at least partially positioned in the second recess 244 or 444. In further embodiments, as shown, the polymer-based portion 241 can fill the second recess 244 or 444. In some embodiments, although not shown, the second recess may not be totally filled, for example, to leave room for electronic devices and/or mechanical devices. In some embodiments, although not shown, another polymer-based portion, for example similar to the polymer-based portion 241, can extend into the first recess and/or can fill the first recess. As shown in FIGS. 2, 5, and 12, the polymer-based portion 241 can comprise a fourth contact surface 247 opposite the third contact surface 245. In some embodiments, as shown, the fourth contact surface 247 can comprise a planar surface. In further embodiments, the fourth contact surface 247 may be substantially coplanar (e.g., extend along a common plane, second plane 204b or 404b) with the second surface area 225 or 425 and the fourth surface area 235 or 435. In some embodiments, the third contact surface 245 can comprise a planar surface. In some embodiments, in addition to the fourth contact surface 247 being substantially coplanar with the second surface area 225 or 425 and the fourth surface area 235 or 435, the third contact surface 245 can be substantially coplanar (e.g., extend along a common plane, fourth plane 204d) with the second central surface area 219 or 419. In some embodiments, as shown in FIGS. 2 and 5, the first contact surface 263 of the adhesive layer 261 can face the fourth contact surface 247 of the polymer-based portion 241. In further embodiments, as shown, the first contact surface 263 of the adhesive layer 261 can contact the fourth contact surface 247 of the polymer-based portion 241.

In some embodiments, the polymer-based portion 241 comprises a polymer (e.g., optically transparent polymer). In further embodiments, the polymer-based portion 241 can comprise one or more of an optically transparent: an acrylic (e.g., polymethylmethacrylate (PMMA)), an epoxy, a silicone, and/or a polyurethane. Examples of epoxies include bisphenol-based epoxy resins, novolac-based epoxies, cycloaliphatic-based epoxies, and glycidylamine-based epoxies. In further embodiments, the polymer-based portion 241 can comprise one or more of a polyolefin, a polyamide, a halide-containing polymer (e.g., polyvinylchloride or a fluorine-containing polymer), an elastomer, a urethane, phenolic resin, parylene, polyethylene terephthalate (PET), and polyether ether ketone (PEEK). Example embodiments of polyolefins include low molecular weight polyethylene (LDPE), high molecular weight polyethylene (HDPE), ultra-high molecular weight polyethylene (UHMWPE), and polypropylene (PP). Example embodiments of fluorine-containing polymers include polytetrafluoroethylene (PTFE), polyvinylfluoride (PVF), polyvinylidene fluoride (PVDF), perfluoropolyether (PFPE), perfluorosulfonic acid (PFSA), a perfluoroalkoxy (PFA), fluorinated ethylene propylene (FEP) polymers, and ethylene tetrafluoro ethylene (ETFE) polymers. Example embodiments of elastomers include rubbers (e.g., polybutadiene, polyisoprene, chloroprene rubber, butyl rubber, nitrile rubber) and block copolymers (e.g., styrene-butadiene, high-impact polystyrene, poly(dichlorophosphazene), for example, comprising one or more of polystyrene, polydichlorophosphazene, and poly(5-ethylidene-2-norbornene). In some embodiments, the polymer-based portion can comprise a sol-gel material. Example embodiments of polyurethanes comprise thermoset polyurethanes, for example, Dispurez 102 available from Incorez and thermoplastic polyurethanes, for example, KrystalFlex PE505 available from Huntsman. In even further embodiments, the second portion can comprise an ethylene acid copolymer. An exemplary embodiment of an ethylene acid copolymer includes SURLYN available from Dow (e.g., Surlyn PC-2000, Surlyn 8940, Surlyn 8150). An additional exemplary embodiment for the second portion comprises Eleglass w802-GL044 available from Axalta with from 1 wt % to 2 wt % cross-linker. In some embodiments, the polymer-based portion 241 can further comprise nanoparticles, for example, carbon black, carbon nanotubes, silica nanoparticles, or nanoparticles comprising a polymer. In some embodiments, the polymer-based portion can further comprise fibers to form a polymer-fiber composite.

In some embodiments, the polymer-based portion 241 can comprise a coefficient of thermal expansion (CTE). As used herein, a coefficient of thermal expansion is measured in accordance with ASTM E289-17 using a Picoscale Michelson Interferometer between $-20°$ C. and $40°$ C. In some embodiments, the polymer-based portion 241 can comprise particles of one or more of copper oxide, beta-quartz, a tungstate, a vanadate, a pyrophosphate, and/or a nickel-titanium alloy. In some embodiments, the polymer-based portion 241 can comprise a CTE of about $-20 \times 10^{-7}$ $1/°$ C. or more, about $-10 \times 10^{-7}$ $1/°$ C. or more, about $-5 \times 10^{-7}$ $1/°$ C. or more, about $-2 \times 10^{-7}$ $1/°$ C. or more, about $10 \times 10^{-7}$ $1/°$ C. or less, about $5 \times 10^{-7}$ $1/°$ C. or less, about $2 \times 10^{-7}$ $1/°$ C. or less, about $1 \times 10^{-7}$ $1/°$ C. or less, or $0$ $1/°$ C. or less. In some embodiments, the polymer-based portion 241 can comprise a CTE in a range from about $-20 \times 10^{-7}$ $1/°$ C. to about $10 \times 10^{-7}$ $1/°$ C., from about $-20 \times 10^{-7}$ $1/°$ C. to about $5 \times 10^{-7}$ $1/°$ C., from about $-10 \times 10^{-7}$ $1/°$ C. to about $-5 \times 10^{-7}$ $1/°$ C., from about $-10 \times 10^{-7}$ $1/°$ C. to about $2 \times 10^{-7}$ $1/°$ C., from about $-10 \times 10^{-7}$ $1/°$ C. to $0$ $1/°$ C., from about $-5 \times 10^{-7}$ $1/°$ C. to $0$ $1/°$ C., from about $-2 \times 10^{-7}$ $1/°$ C. to about $0$ $1/°$ C., or any range or subrange therebetween. By providing a polymer-based portion comprising a low (e.g., negative) coefficient of thermal expansion, warp caused by volume changes during curing of the polymer-based portion can be mitigated.

In some embodiments, the polymer-based portion 241 can comprise an elastic modulus of about 0.01 MegaPascals (MPa) or more, about 1 MPa or more, about 10 MPa or more, about 20 MPa or more, about 100 MPa or more, about 200 MPa or more, about 1,000 MPa or more, about 5,000 MPa or less, about 3,000 MPa or less, about 1,000 MPa or less, about 500 MPa or less, or about 200 MPa or less. In some embodiments, the polymer-based portion 241 can comprise an elastic modulus in a range from about 0.001 MPa to about 5,000 MPa, from about 0.01 MPa to about 3,000 MPa, from about 0.01 MPa to about 1,000 MPa, from about 0.01 MPa to about 500 MPa, from about 0.01 MPa to about 200 MPa, from about 1 MPa to about 5,000 MPa, from about 1 MPa to about 1,000 MPa, from about 1 MPa to about 1,000 MPa, from about 1 MPa to about 200 MPa, from about 10 MPa to about 5,000 MPa, from about 10 MPa to about 1,000 MPa, from about 10 MPa to about 200 MPa, from about 20 MPa to about 3,000 MPa, from about 20 MPa to about 1,000 MPa, from about 20 MPa to about 200 MPa, from about 100 MPa to about 3,000 MPa, from about 100 MPa to about 1,000 MPa, from about 100 MPa to about 200 MPa, from about 200 MPa to about 5,000 MPa, from about 200 MPa to about 3,000 MPa, from about 200 MPa to about 1,000 MPa, or any range or subrange therebetween. In some embodiments, the elastic modulus of the polymer-based portion 241 can be in a range from about 1 GPa to about 20 GPa, from about 1 GPa to about 18 GPa, from about 1 GPa to about 10 GPa, from about 1 GPa to about 5 GPa, from about 1 GPa to about 3 GPa, or any range or subrange therebetween. By providing a polymer-based portion 241 with an elastic modulus in a range from about 0.01 MPa to about 3,000 MPa (e.g., in a range from about 20 MPa to about 3 GPa), folding of the foldable apparatus without failure can be facilitated. In some embodiments, the adhesive layer 261 comprises an elastic modulus greater than the elastic modulus of the polymer-based portion 241, which arrangement provides improved performance in puncture resistance. In some embodiments, the elastic modulus of the polymer-based portion 241 can be less than the elastic modulus of the foldable substrate 206, 407, or 807. In some embodiments, the adhesive layer 261 may comprise an elastic modulus within the ranges listed above in this paragraph. In further embodiments, the adhesive layer 261 may comprise substantially the same elastic modulus as the elastic modulus of the polymer-based portion 241. In further embodiments, the elastic modulus of the adhesive layer 261 can be in a range from about 1 GPa to about 20 GPa, from about 1 GPa to about 18 GPa, from about 1 GPa to about 10 GPa, from about 1 GPa to about 5 GPa, from about 1 GPa to about 3 GPa, or any range or subrange therebetween. In some embodiments, the elastic modulus of the polymer-based portion 241 can be less than the elastic modulus of the first portion 221, 421, or 821. In some embodiments, the elastic modulus of the polymer-based portion 241 can be less than the elastic modulus of the second portion 231, 431, or 831.

In some embodiments, as shown in FIGS. 2-5 and 11-12, a coating 251 can be disposed over the first major surface 203 of the foldable substrate 206 or 407. In further embodiments, the coating 251 can be disposed over the first portion 221 or 421, the second portion 231 or 431, and the central portion 281 or 481. In some embodiments, the coating 251 can comprise a third major surface 253 and a fourth major surface 255 opposite the third major surface 253. In further embodiments, the coating 251 (e.g., fourth major surface 255) can contact the foldable substrate 206 or 407 (e.g., first major surface 203 or 403). In further embodiments, at least a part of the coating 251 can be positioned in the first recess 234 or 434. In even further embodiments, the coating 251 can fill the first recess 234 or 434. In further embodiments, the coating 251 can comprise a coating thickness 257 defined between the third major surface 253 and the fourth major surface 255. In further embodiments, the coating thickness 257 can be about 0.1 μm or more, about 1 μm or more, about 5 μm or more, about 10 μm or more, about 15 μm or more, about 20 μm or more, about 25 μm or more, about 40 μm or more, about 50 μm or more, about 60 μm or more, about 70 μm or more, about 80 μm or more, about 90

μm or more, about 200 μm or less, about 100 μm or less, or about 50 μm or less, about 30 μm or less, about 25 μm or less, about 20 μm or less, about 20 μm or less, about 15 μm or less, or about 10 μm or less. In some embodiments, the coating thickness 257 can be in a range from about 0.1 μm to about 200 μm, from about 1 μm to about 200 μm, from about 10 μm to about 200 μm, from about 50 μm to about 200 μm, from about 0.1 μm to about 100 μm, from about 1 μm to about 100 μm, from about 10 μm to about 100 μm, from about 20 μm to about 100 μm, from about 30 μm to about 100 μm, from about 40 μm to about 100 μm, from about 50 μm to about 100 μm, from about 60 μm to about 100 μm, from about 70 μm to about 100 μm, from about 80 μm to about 100 μm, from about 90 μm to about 100 μm, from about 0.1 μm to about 50 μm, from about 1 μm to about 50 μm, from about 10 μm to about 50 μm, or any range or subrange therebetween. In further embodiments, the coating thickness 257 can be in a range from about 0.1 μm to about 50 μm, from about 0.1 μm to about 30 μm, from about 0.1 μm to about 25 μm, from about 0.1 μm to about 20 μm, from about 0.1 μm to about 15 μm, from about 0.1 μm to about 10 μm, from about 1 μm to about 30 μm, from about 1 μm to about 25 μm, from about 1 μm to about 20 μm, from about 1 μm to about 15 μm, from about 1 μm to about 10 μm, from about 5 μm to about 30 μm, from about 5 μm to about 25 μm, from about 5 μm to about 20 μm, from about 5 μm to about 15 μm, from about 5 μm to about 10 μm, from about 10 μm to about 30 μm, from about 10 μm to about 25 μm, from about 10 μm to about 20 μm, from about 10 μm to about 15 μm, from about 15 μm to about 30 μm, from about 15 μm to about 25 μm, from about 15 μm to about 20 μm, from about 20 μm to about 30 μm, from about 20 μm to about 25 μm, or any range or subrange therebetween.

In some embodiments, the polymer-based portion and/or the adhesive layer can comprise a strain at yield. Providing a first recess opposite a second recess can reduce the strain encountered by the polymer-based portion or other material (e.g., adhesive layer) in the recess (e.g., from 0% to 50% reduction). Consequently, requirements for the strain at yield of the polymer-based portion can be relaxed. In some embodiments, the strain at yield of the polymer-based portion and/or adhesive layer can be about 3% or more, about 4% or more, about 5% or more, about 6% or more, about 7% or more, about 500% or less, about 100% or less, about 50% or less, about 20% or less, about 15% or less, about 10% or less, about 9% or less, or about 8% or less. In some embodiments, the strain at yield of the polymer-based portion and/or adhesive layer can be in a range from about 1% to about 500%, from about 1% to about 100%, from about 2% to about 100%, from about 2% to about 50%, from about 3% to about 50%, from about 3% to about 20%, from about 4% to about 20%, from about 4% to about 15%, from about 5% to about 15%, from about 5% to about 10%, from about 5% to about 9%, from about 6% to about 9%, from about 6% to about 8%, from about 7% to about 8% or any range or subrange therebetween.

In some embodiments, the coating 251 can comprise a polymeric hard coating. In further embodiments, the polymeric hard coating can comprise one or more of an ethylene-acid copolymer, a polyurethane-based polymer, an acrylate resin, and a mercapto-ester resin. Example embodiments of ethylene-acid copolymers include ethylene-acrylic acid copolymers, ethylene-methacrylic acid copolymers, and ethylene-acrylic-methacrylic acid terpolymers (e.g., Nucrel, manufactured by DuPont), ionomers of ethylene acid copolymers (e.g., Surlyn, manufactured by DuPont), and ethylene-acrylic acid copolymer amine dispersions (e.g., Aquacer, manufactured by BYK). Example embodiments of polyurethane-based polymers include aqueous modified polyurethane dispersions (e.g., Eleglas®, manufactured by Axalta). Example embodiments of acrylate resins which can be UV curable include acrylate resins (e.g., Uvekol® resin, manufactured by Allinex), cyanoacrylate adhesives (e.g., Permabond® UV620, manufactured by Krayden), and UV radical acrylic resins (e.g., Ultrabond windshield repair resin, for example, Ultrabond (45CPS)). Example embodiments of mercapto-ester resins include mercapto-ester trial-lyl isocyanuates (e.g., Norland optical adhesive NOA 61). In further embodiments, the polymeric hard coating can comprise ethylene-acrylic acid copolymers and ethylene-methacrylic acid copolymers, which may be ionomerized to form ionomer resins through neutralization of the carboxylic acid residue with typically alkali metal ions, for example, sodium and potassium, and also zinc. Such ethylene-acrylic acid and ethylene-methacrylic acid ionomers may be dispersed within water and coated onto the substrate to form an ionomer coating. Alternatively, such acid copolymers may be neutralized with ammonia which, after coating and drying liberates the ammonia to reform the acid copolymer as the coating. By providing a coating comprising a polymeric coating, the foldable apparatus can comprise low energy fracture.

In some embodiments, the coating can comprise a polymeric hard coating comprising an optically transparent polymeric hard-coat layer. Suitable materials for an optically transparent polymeric hard-coat layer include, but are not limited to: a cured acrylate resin material, an inorganic-organic hybrid polymeric material, an aliphatic or aromatic hexafunctional urethane acrylate, a siloxane-based hybrid material, and a nanocomposite material, for example, an epoxy and urethane material with nanosilicate. In some embodiments, an optically transparent polymeric hard-coat layer may consist essentially of one or more of these materials. In some embodiments, an optically transparent polymeric hard-coat layer may consist of one or more of these materials. As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. More specifically, suitable materials for an optically transparent polymeric (OTP) hard-coat layer include, but are not limited to, a polyimide, a polyethylene terephthalate (PET), a polycarbonate (PC), a poly methyl methacrylate (PMMA), organic polymer materials, inorganic-organic hybrid polymeric materials, and aliphatic or aromatic hexafunctional urethane acrylates. In some embodiments, an OTP hard-coat layer may consist essentially of an organic polymer material, an inorganic-organic hybrid polymeric material, or aliphatic or aromatic hexafunctional urethane acrylate. In some embodiments, an OTP hard-coat layer may consist of a polyimide, an organic polymer material, an inorganic-organic hybrid polymeric material, or aliphatic or aromatic hexafunctional urethane acrylate. In some embodiments, an OTP hard-coat layer may include a nanocomposite material. In some embodiments, an OTP hard-coat layer may include a nano-silicate at least one of epoxy and urethane materials. Suitable compositions for such an OTP hard-coat layer are described in U.S. Pat. Pub. No. 2015/0110990, which is hereby incorporated by reference in its entirety by reference thereto. As used herein, "organic polymer material" means a polymeric material comprising monomers with only organic components. In some embodiments, an OTP hard-coat layer may comprise an organic polymer material manufactured by Gunze Limited and having a hardness of 9H, for example Gunze's "Highly Durable Transparent Film." As used herein, "inorganic-organic hybrid polymeric material" means a polymeric material comprising monomers with inorganic and organic components. An inorganic-organic hybrid polymer is obtained by a polymerization reaction between monomers having an inorganic group and an organic group. An inorganic-organic hybrid polymer is not a nanocomposite material comprising separate inorganic and organic constituents or phases, for example, inorganic particulates dispersed within an organic matrix. In some embodiments, the inorganic-organic hybrid polymeric material may include polymerized monomers comprising an inorganic silicon-based group, for example, a silsesquioxane polymer. A silsesquioxane polymer may be, for example, an alky-silsesquioxane, an aryl-silsesquioxane, or an aryl alkyl-silsesquioxane having the following chemical structure: $(RSiO_{1.5})_n$, where R is an organic group for example, but not limited to, methyl or phenyl. In some embodiments, an OTP hard-coat layer may comprise a silsesquioxane polymer combined with an organic matrix, for example, SILPLUS manufactured by Nippon Steel Chemical Co., Ltd. In some embodiments, an OTP hard-coat layer may comprise 90 wt % to 95 wt % aromatic hexafunctional urethane acrylate (e.g., PU662NT (Aromatic hexafunctional urethane acrylate) manufactured by Miwon Specialty Chemical Co.) and 10 wt % to 5 wt % photo-initiator (e.g., Darocur 1173 manufactured by Ciba Specialty Chemicals Corporation) with a hardness of 8H or more. In some embodiments, an OTP hard-coat layer composed of an aliphatic or aromatic hexafunctional urethane acrylate may be formed as a stand-alone layer by spin-coating the layer on a polyethylene terephthalate (PET) substrate, curing the urethane acrylate, and removing the urethane acrylate layer from the PET substrate. An OTP hard-coat layer may have a coating thickness (e.g., coating thickness 257) in a range of 1 μm to 150 μm, including subranges. For example, the coating thickness (e.g., coating thickness 257) can be in a range from 10 μm to 140 μm, from 20 μm to 130 μm, 30 μm to 120 μm, from 40 μm to 110 μm, from 50 μm to 100 μm, from 60 μm to 90 μm, 70 μm, 80 μm, 2 μm to 140 μm, from 4 μm to 130 μm, 6 μm to 120 μm, from 8 μm to 110 μm, from 10 μm to 100 μm, from 10 μm to 90 μm, 10 μm, 80 μm, 10 μm, 70 μm, 10 μm, 60 μm, 10 μm, 50 μm, or within a range having any two of these values as endpoints. In some embodiments, an OTP hard-coat layer may be a single monolithic layer. In some embodiments, an OTP hard-coat layer may be an inorganic-organic hybrid polymeric material layer or an organic polymer material layer having a thickness in the range of 80 μm to 120 μm, including subranges. For example, an OTP hard-coat layer comprising an inorganic-organic hybrid polymeric material or an organic polymer material may have a thickness of from 80 μm to 110 μm, 90 μm to 100 μm, or within a range having any two of these values as endpoints. In some embodiments, an OTP hard-coat layer may be an aliphatic or aromatic hexafunctional urethane acrylate material layer having a thickness in the range of 10 μm to 60 μm, including subranges. For example, an OTP hard-coat layer comprising an aliphatic or aromatic hexafunctional urethane acrylate material may have a thickness of 10 μm to 55 μm, 10 μm to 50 μm, 10 μm to 40 μm, 10 μm to 45 μm, 10 μm to 40 μm, 10 μm to 35 μm, 10 μm to 30 μm, 10 μm to 25 μm, 10 μm to 20 μm, or within a range having any two of these values as endpoints.

In some embodiments, the coating 251, if provided, may also comprise one or more of an easy-to-clean coating, a low-friction coating, an oleophobic coating, a diamond-like coating, a scratch-resistant coating, or an abrasion-resistant coating. A scratch-resistant coating may comprise an oxynitride, for example, aluminum oxynitride or silicon oxynitride with a thickness of about 500 micrometers or more. In such embodiments, the abrasion-resistant layer may comprise the same material as the scratch-resistant layer. In some embodiments, a low friction coating may comprise a highly fluorinated silane coupling agent, for example, an alkyl fluorosilane with oxymethyl groups pendant on the silicon atom. In such embodiments, an easy-to-clean coating may comprise the same material as the low friction coating. In other embodiments, the easy-to-clean coating may comprise a protonatable group, for example an amine, for example, an alkyl aminosilane with oxymethyl groups pendant on the silicon atom. In such embodiments, the oleophobic coating may comprise the same material as the easy-to-clean coating. In some embodiments, a diamond-like coating comprises carbon and may be created by applying a high voltage potential in the presence of a hydrocarbon plasma.

Providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials (e.g., coating 251) can be positioned in the first recess, which can improve impact resistance, puncture resistance, abrasion resistance, and/or scratch resistance of the foldable apparatus. Additionally, controlling properties of a first material (e.g., coating 251) positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure.

In some embodiments, as shown in FIGS. 2 and 4, the foldable apparatus 101 and 401 can comprise the release liner 271 although other substrates (e.g., glass-based substrate and/or ceramic-based substrate discussed throughout the application) may be used in further embodiments rather than the illustrated release liner 271. In further embodiments, as shown, the release liner 271, or another substrate, can be disposed over the adhesive layer 261. In even further embodiments, as shown, the release liner 271, or another substrate, can directly contact the second contact surface 265 of the adhesive layer 261. The release liner 271, or another substrate, can comprise a first major surface 273 and a second major surface 275 opposite the first major surface 273. As shown, the release liner 271, or another substrate, can be disposed on the adhesive layer 261 by attaching the second contact surface 265 of the adhesive layer 261 to the first major surface 273 of the release liner 271, or another substrate. In some embodiments, as shown, the first major surface 273 of the release liner 271, or another substrate, can comprise a planar surface. In some embodiments, as shown, the second major surface 275 of the release liner 271, or another substrate, can comprise a planar surface. A substrate comprising the release liner 271 can comprise a paper and/or a polymer. Exemplary embodiments of paper comprise kraft paper, machine-finished paper, polycoated paper (e.g., polymer-coated, glassine paper, siliconized paper), or clay-coated paper. Exemplary embodiments of polymers comprise polyesters (e.g., polyethylene terephthalate (PET)) and polyolefins (e.g., low-density polyethylene (LDPE), high-density polyethylene (HDPE), polypropylene (PP)).

In some embodiments, as shown in FIGS. 3, 5, and 12, the foldable apparatus 301, 501, and 1201 can comprise the display device 307. In further embodiments, as shown, the display device 307 can be disposed over the adhesive layer 261. In further embodiments, as shown, the display device 307 can contact to the second contact surface 265 of the adhesive layer 261. In some embodiments, producing a foldable apparatus resembling the foldable apparatus 301, 501, or 1201 may be achieved by removing the release liner 271 of the foldable apparatus 101 or 401 of FIGS. 2 and 4 and attaching the display device 307 to the second contact surface 265 of the adhesive layer 261. Alternatively, the foldable apparatus 301 may be produced without the extra step of removing a release liner 271 before attaching the display device 307 to the second contact surface 265 of the adhesive layer 261, for example, when a release liner 271 is not applied to the second contact surface 265 of the adhesive layer 261. The display device 307 can comprise a first major surface 303 and a second major surface 305 opposite the first major surface 303. As shown, the display device 307 can be disposed on the adhesive layer 261 by attaching the second contact surface 265 of the adhesive layer 261 to the second major surface 305 of the display device 307. In some embodiments, as shown, the first major surface 303 of the display device 307 can comprise a planar surface. In some embodiments, as shown, the first major surface 303 of the display device 307 can comprise a planar surface. The display device 307 can comprise liquid crystal display (LCD), an electrophoretic displays (EPD), an organic light emitting diode (OLED) display, or a plasma display panel (PDP). In some embodiments, the display device 307 can be part of a portable electronic device, for example, a consumer electronic product, a smartphone, a tablet, a wearable device, or a laptop.

Embodiments of the disclosure can comprise a consumer electronic product. The consumer electronic product can comprise a front surface, a back surface, and side surfaces. The consumer electronic product can further comprise electrical components at least partially within the housing. The electrical components can comprise a controller, a memory, and a display. The display can be at or adjacent to the front surface of the housing. The consumer electronic product can comprise a cover substrate disposed over the display. In some embodiments, at least one of a portion of the housing or the cover substrate comprises the foldable apparatus discussed throughout the disclosure.

Figure 13:
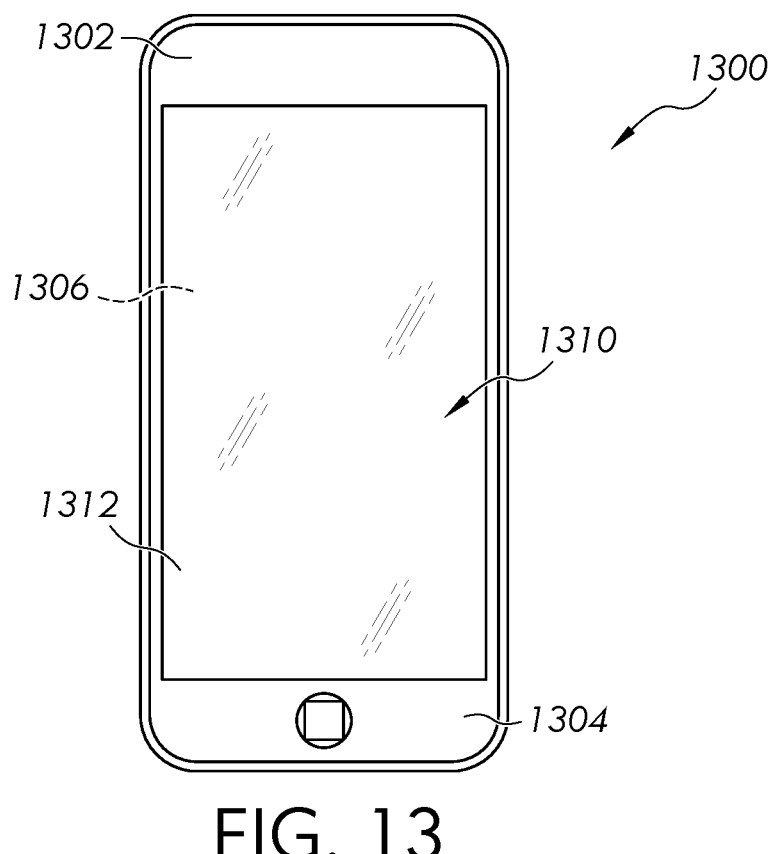
FIG. 13 is a schematic plan view of an example consumer electronic device according to some embodiments.
Figure 14:
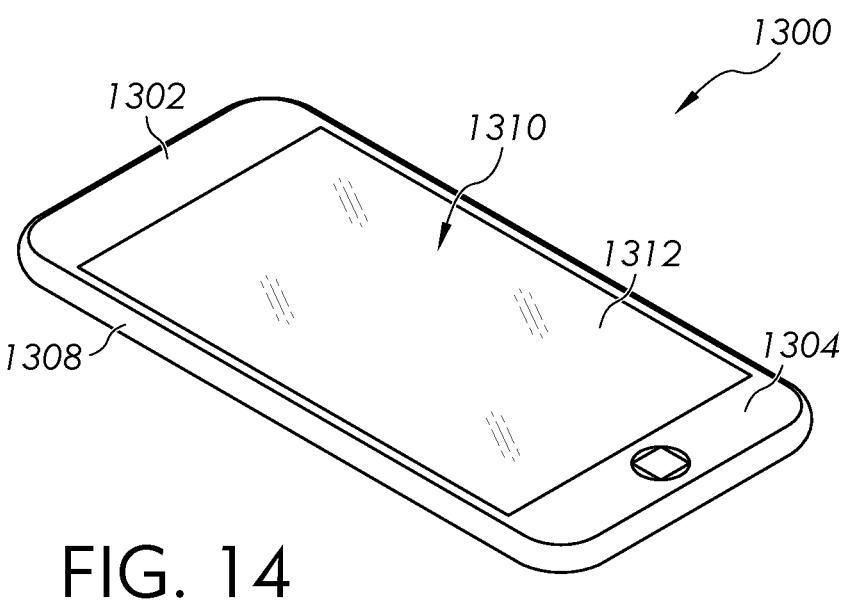
FIG. 14 is a schematic perspective view of the example consumer electronic device of FIG. 13.

The foldable apparatus disclosed herein may be incorporated into another article, for example, an article with a display (or display articles) (e.g., consumer electronics, including mobile phones, tablets, computers, navigation systems, wearable devices (e.g., watches) and the like), architectural articles, transportation articles (e.g., automotive, trains, aircraft, sea craft, etc.), appliance articles, or any article that may benefit from some transparency, scratch-resistance, abrasion resistance or a combination thereof. An exemplary article incorporating any of the foldable apparatus disclosed herein is shown in FIGS. 13-14. Specifically, FIGS. 13-14 show a consumer electronic device 1300 including a housing 1302 having front 1304, back 1306, and side surfaces 1308; electrical components (not shown) that are at least partially inside or entirely within the housing and including at least a controller, a memory, and a display 1310 at or adjacent to the front surface of the housing; and a cover substrate 1312 at or over the front surface of the housing such that it is over the display. In some embodiments, at least one of the cover substrate 1312 or a portion of housing 1302 may include any of the foldable apparatus disclosed herein, for example, the foldable substrate.

In some embodiments, the foldable substrate 206, 407, or 807 can comprise a glass-based substrate and/or a ceramic-based substrate, and the first portion 221, 421, or 821, the second portion 231, 431, or 831, and/or the central portion 281, 481, or 881 can comprise one or more compressive stress regions. In some embodiments, a compressive stress region may be created by chemically strengthening. Chemically strengthening may comprise an ion exchange process, where ions in a surface layer are replaced by—or exchanged with—larger ions having the same valence or oxidation state. Methods of chemically strengthening will be discussed later. Without wishing to be bound by theory, chemically strengthening the first portion 221, 421, or 821, the second portion 231, 431, or 831, and/or the central portion 281, 481, or 881 can enable good impact and/or puncture resistance (e.g., resists failure for a pen drop height of about 15 centimeters (cm) or more, about 20 cm or more, about 50 cm or more). Without wishing to be bound by theory, chemically strengthening the first portion 221, 421, or 821, the second portion 231, 431, or 831, and/or the central portion 281, 481, or 881 can enable small (e.g., smaller than about 10 mm or less) bend radii because the compressive stress from the chemical strengthening can counteract the bend-induced tensile stress on the outermost surface of the substrate. A compressive stress region may extend into a portion of the first portion and/or the second portion for a depth called the depth of compression. As used herein, depth of compression means the depth at which the stress in the chemically strengthened substrates and/or portions described herein changes from compressive stress to tensile stress. Depth of compression may be measured by a surface stress meter or a scattered light polariscope (SCALP, wherein values reported herein were made using SCALP-5 made by Glasstress Co., Estonia) depending on the ion exchange treatment and the thickness of the article being measured. Where the stress in the substrate and/or portion is generated by exchanging potassium ions into the substrate, a surface stress meter, for example, the FSM-6000 (Orihara Industrial Co., Ltd. (Japan)), is used to measure depth of compression. Unless specified otherwise, compressive stress (including surface CS) is measured by surface stress meter (FSM) using commercially available instruments, for example the FSM-6000, manufactured by Orihara. Surface stress measurements rely upon the accurate measurement of the stress optical coefficient (SOC), which is related to the birefringence of the glass. Unless specified otherwise, SOC is measured according to Procedure C (Glass Disc Method) described in ASTM standard C770-16, entitled "Standard Test Method for Measurement of Glass Stress-Optical Coefficient," the contents of which are incorporated herein by reference in their entirety. Where the stress is generated by exchanging sodium ions into the substrate, and the article being measured is thicker than about 400 μm, SCALP is used to measure the depth of compression and central tension (CT). Where the stress in the substrate and/or portion is generated by exchanging both potassium and sodium ions into the substrate and/or portion, and the article being measured is thicker than about 400 μm, the depth of compression and CT are measured by SCALP. Without wishing to be bound by theory, the exchange depth of sodium may indicate the depth of compression while the exchange depth of potassium ions may indicate a change in the magnitude of the compressive stress (but not the change in stress from compressive to tensile). The refracted near-field (RNF; the RNF method is described in U.S. Pat. No. 8,854,623, entitled "Systems and methods for measuring a profile characteristic of a glass sample", which is incorporated herein by reference in its entirety) method also may be used to derive a graphical representation of the stress profile. When the RNF method is utilized to derive a graphical representation of the stress profile, the maximum central tension value provided by SCALP is utilized in the RNF method. The graphical representation of the stress profile derived by RNF is force balanced and calibrated to the maximum central tension value provided by a SCALP measurement. As used herein, "depth of layer" (DOL) means the depth that the ions have exchanged into the substrate and/or portion (e.g., sodium, potassium). Through the disclosure, when the maximum central tension cannot be measured directly by SCALP (as when the article being measured is thinner than about 400 μm) the maximum central tension can be approximated by a product of a maximum compressive stress and a depth of compression divided by the difference between the thickness of the substrate and twice the depth of compression, wherein the compressive stress and depth of compression are measured by FSM.

In some embodiments, the first portion 221, 421, or 821 comprising the glass-based portion and/or ceramic-based portion may comprise a first compressive stress region at the first surface area 223, 423, or 823 that can extend to a first depth of compression from the first surface area 223, 432, or 823. In some embodiments, the first portion 221, 421, or 821 comprising a first glass-based and/or ceramic-based portion may comprise a second compressive stress region at the second surface area 225, 425, or 825 that can extend to a second depth of compression from the second surface area 225, 425, or 825. In some embodiments, the first depth of compression and/or the second depth of compression as a percentage of the substrate thickness 211, 411, or 811 can be about 1% or more, about 5% or more, about 10% or more, about 30% or less, about 25% or less, or about 20% or less. In some embodiments, the first depth of compression and/or the second depth of compression as a percentage of the substrate thickness 211, 411, or 811 can be in a range from about 1% to about 30%, from about 5% to about 30%, from about 5% to about 25%, from about 5% to about 20%, from about 10% to about 30%, from about 10% to about 25%, from about 10% to about 20%, or any range or subrange therebetween. In further embodiments, the first depth of compression and/or the second depth of compression as a percentage of the substrate thickness 211, 411, or 811 can be about 10% or less, for example, from about 1% to about 10%, from about 1% to about 8%, from about 3% to about 8%, from about 5% to about 8%, or any range or subrange therebetween.

In further embodiments, the first depth of compression can be substantially equal to the second depth of compression. In some embodiments, the first depth of compression and/or the second depth of compression can be about 1 μm or more, about 10 μm or more, about 30 μm or more, about 50 μm or more, about 200 μm or less, about 150 μm or less, about 100 μm or less, or about 60 μm or less. In some embodiments, the first depth of compression and/or the second depth of compression can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween. By providing a first portion comprising a first glass-based and/or ceramic-based portion comprising a first depth of compression and/or a second depth of compression in a range from about 1% to about 30% of the first thickness, good impact and/or puncture resistance can be enabled.

In some embodiments, the first compressive stress region can comprise a first maximum compressive stress. In some embodiments, the second compressive stress region can comprise a second maximum compressive stress. In further embodiments, the first maximum compressive stress and/or the second maximum compressive stress can be about 100 MegaPascals (MPa) or more, about 300 MPa or more, about 500 MPa or more, about 600 MPa or more, about 700 MPa or more, about 1,500 MPa or less, about 1,200 MPa or less, about 1,000 MPa or less, or about 800 MPa or less. In further embodiments, the first maximum compressive stress and/or the second maximum compressive stress can be in a range from about 100 MPa to about 1,500 MPa, from about 100 MPa to about 1,200 MPa, from about 300 MPa to about 1,200 MPa, from about 300 MPa to about 1,000 MPa, from about 500 MPa to about 1,000 MPa, from about 600 MPa to about 1,000 MPa, from about 600 MPa to about 1,000 MPa, from about 700 MPa to about 1,000 MPa, from about 700 MPa to about 800 MPa, or any range or subrange therebetween. By providing a first maximum compressive stress and/or a second maximum compressive stress in a range from about 100 MPa to about 1,500 MPa, good impact and/or puncture resistance can be enabled.

In some embodiments, the first portion 221, 421, or 821 can comprise a first depth of layer of one or more alkali metal ions associated with the first compressive stress region and the first depth of layer. In some embodiments, the first portion 221, 421, or 821 can comprise a second depth of layer of one or more alkali metal ions associated with the second compressive stress region and the second depth of layer. As used herein, the one or more alkali metal ions of a depth of layer of one or more alkali metal ions can include sodium, potassium, rubidium, cesium, and/or francium. In some embodiments, the one or more alkali ions of the first depth of layer of the one or more alkali ions and/or the second depth of layer of the one or more alkali ions comprises potassium. In some embodiments, the first depth of layer and/or the second depth of layer as a percentage of the substrate thickness 211, 411, or 811 can be about 1% or more, about 5% or more, about 10% or more, about 40% or less, about 35% or less, about 30% or less, about 25% or less, or about 20% or less. In some embodiments, the first depth of layer and/or the second depth of layer as a percentage of the substrate thickness 211, 411, or 811 can be in a range from about 1% to about 40%, from about 1% to about 35%, from about 1% to about 30%, from about 1% to about 25%, from about 1% to about 20%, from about 5% to about 30%, from about 5% to about 25%, from about 5% to about 20%, from about 10% to about 30%, from about 10% to about 25%, from about 10% to about 20%, or any range or subrange therebetween. In further embodiments, the first depth of layer of the one or more alkali metal ions and/or the second depth of layer of the one or more alkali metal ions as a percentage of the substrate thickness 211, 411, or 811 can be about 10% or less, for example, from about 1% to about 10%, from about 1% to about 8%, from about 3% to about 8%, from about 5% to about 8%, or any range or subrange therebetween. In some embodiments, the first depth of layer of the one or more alkali metal ions and/or the second depth of layer of the one or more alkali metal ions can be about 1 μm or more, about 10 μm or more, about 30 μm or more, about 50 μm or more, about 200 μm or less, about 150 μm or less, about 100 μm or less, or about 60 μm or less. In some embodiments, the first depth of layer of the one or more alkali metal ions and/or the second depth of layer of the one or more alkali metal ions can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween.

In some embodiments, the first portion 221, 421, or 821 may comprise a first tensile stress region. In some embodiments, the first tensile stress region can be positioned between the first compressive stress region and the second compressive stress region. In some embodiments, the first tensile stress region can comprise a first maximum tensile stress. In further embodiments, the first maximum tensile stress can be about 10 MPa or more, about 20 MPa or more, about 30 MPa or more, about 100 MPa or less, about 80 MPa or less, or about 60 MPa or less. In further embodiments, the first maximum tensile stress can be in a range from about 10 MPa to about 100 MPa, from about 10 MPa to about 80 MPa, from about 10 MPa to about 60 MPa, from about 20 MPa to about 100 MPa, from about 20 MPa to about 80 MPa, from about 20 MPa to about 60 MPa, from about 30 MPa to about 100 MPa, from about 30 MPa to about 80 MPa, from about 30 MPa to about 60 MPa, or any range or subrange therebetween. Providing a first maximum tensile stress in a range from about 10 MPa to about 100 MPa can enable good impact and/or puncture resistance while providing low energy fractures, as discussed below.

In some embodiments, the first portion 221, 421, or 821 can comprise a first average concentration of potassium on an oxide basis. As used herein, "on an oxide basis" means the component is measured as if the non-oxygen components in the compound were converted into a specified oxide form or a fully oxidized oxide if a specific oxide form is not specified. For example, sodium (Na) on an oxide basis refers to amounts in terms of sodium oxide ($Na_2O$) while potassium on an oxide basis refers to amounts in terms of potassium oxide ($K_2O$). As such, a component need not actually be in the specified oxide form or in the fully oxidized oxide form in order for the component to count in measures on "an oxide basis." As such, a measurement "an oxide basis" for a specific component comprises conceptually converting materials comprising the non-oxygen element of the specific component into the specified oxide form or the fully oxidized oxide if a specific oxide form is not specified before calculating the concentration on an oxide basis. In some embodiments, the first average concentration of potassium on an oxide basis can be about 10 parts per million (ppm) or more, about 50 ppm or more, about 200 ppm or more, about 500 ppm or more, about 1,000 ppm or more, about 2,000 ppm or more, about 300,000 or less, about 100,000 ppm or less, about 50,000 ppm or less, about 20,000 ppm or less, about 10,000 ppm or less, or about 5,000 ppm or less. In some embodiments, the first average concentration of potassium on an oxide basis can be in a range from about 10 ppm to about 300,000 ppm, from about 50 ppm to about 300,000, from about 50 ppm to about 100,000, from about 200 ppm to about 100,000, from about 200 ppm to about 50,000 ppm, from about 500 ppm to about 50,000, from about 500 ppm to about 20,000 ppm, from about 1,000 ppm to about 20,000 ppm, from about 2,000 ppm to about 10,000 ppm, from about 2,000 ppm to about 5,000 ppm, or any range or subrange therebetween. Without wishing to be bound by theory, the average concentration of potassium comprises potassium introduce through chemically strengthening and potassium in the as-formed foldable substrate.

In some embodiments, the second portion 231, 431, or 831 comprising a second glass-based and/or ceramic-based portion may comprise a third compressive stress region at the third surface area 233, 433, or 833 that can extend to a third depth of compression from the third surface area 233, 433, or 833. In some embodiments, the second portion 231, 431, or 831 comprising a second glass-based and/or ceramic-based portion may comprise a fourth compressive stress region at the fourth surface area 235, 435, or 835 that can extend to a fourth depth of compression from the fourth surface area 235. In some embodiments, the third depth of compression and/or the fourth depth of compression as a percentage of the substrate thickness 211, 411, or 811 can be about 1% or more, about 5% or more, about 10% or more, about 30% or less, about 25% or less, or about 20% or less. In some embodiments, the third depth of compression and/or the fourth depth of compression as a percentage of the substrate thickness 211, 411, or 811 can be in a range from about 1% to about 30%, from about 5% to about 30%, from about 5% to about 25%, from about 5% to about 20%, from about 10% to about 30%, from about 10% to about 25%, from about 10% to about 20%, or any range or subrange therebetween. In further embodiments, the third depth of compression can be substantially equal to the fourth depth of compression. In some embodiments, the third depth of compression and/or the fourth depth of compression can be about 1 μm or more, about 10 μm or more, about 30 μm or more, about 50 μm or more, about 200 μm or less, about 150 μm or less, about 100 μm or less, or about 60 μm or less. In some embodiments, the third depth of compression and/or the fourth depth of compression can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween. By providing a second portion comprising a glass-based and/or ceramic-based portion comprising a third depth of compression and/or a fourth depth of compression in a range from about 1% to about 30% of the substrate thickness, good impact and/or puncture resistance can be enabled.

In some embodiments, the third compressive stress region can comprise a third maximum compressive stress. In some embodiments, the fourth compressive stress region can comprise a fourth maximum compressive stress. In further embodiments, the third maximum compressive stress and/or the fourth maximum compressive stress can be about 100 MegaPascals (MPa) or more, about 300 MPa or more, about 500 MPa or more, about 600 MPa or more, about 700 MPa or more, about 1,500 MPa or less, about 1,200 MPa or less, about 1,000 MPa or less, or about 800 MPa or less. In further embodiments, the third maximum compressive stress and/or the fourth maximum compressive stress can be in a range from about 100 MPa to about 1,500 MPa, from about 100 MPa to about 1,200 MPa, from about 300 MPa to about 1,200 MPa, from about 300 MPa to about 1,000 MPa, from about 500 MPa to about 1,000 MPa, from about 600 MPa to about 1,000 MPa, from about 600 MPa to about 1,000 MPa, from about 700 MPa to about 1,000 MPa, from about 700 MPa to about 800 MPa, or any range or subrange therebetween. By providing a third maximum compressive stress and/or a fourth maximum compressive stress in a range from about 100 MPa to about 1,500 MPa, good impact and/or puncture resistance can be enabled.

In some embodiments, the second portion 231, 431, or 831 can comprise a third depth of layer of one or more alkali metal ions associated with the third compressive stress region and the third depth of layer. In some embodiments, the second portion 231 can comprise a fourth depth of layer of one or more alkali metal ions associated with the fourth compressive stress region and the fourth depth of compression. In some embodiments, the one or more alkali ions of the third depth of layer of the one or more alkali ions and/or the fourth depth of layer of the one or more alkali ions comprises potassium. In some embodiments, the third depth of layer and/or the fourth depth of layer as a percentage of the substrate thickness 211, 411, or 811 can be about 1% or more, about 5% or more, about 10% or more, about 40% or less, about 35% or less, about 30% or less, about 25% or less, or about 20% or less. In some embodiments, the third depth of compression and/or the fourth depth of compression as a percentage of the substrate thickness 211, 411, or 811 can be in a range from about 1% to about 40%, from about 1% to about 35%, from about 1% to about 30%, from about 1% to about 25%, from about 1% to about 20%, from about 5% to about 30%, from about 5% to about 25%, from about 5% to about 20%, from about 10% to about 30%, from about 10% to about 25%, from about 10% to about 20%, or any range or subrange therebetween. In further embodiments, the third depth of layer of the one or more alkali metal ions and/or the fourth depth of layer of the one or more alkali metal ions as a percentage of the substrate thickness 211, 411, or 811 can be about 10% or less, for example, from about 1% to about 10%, from about 1% to about 8%, from about 3% to about 8%, from about 5% to about 8%, or any range or subrange therebetween. In some embodiments, the third depth of layer of the one or more alkali metal ions and/or the fourth depth of layer of the one or more alkali metal ions can be about 1 μm or more, about 10 μm or more, about 30 μm or more, about 50 μm or more, about 200 μm or less, about 150 μm or less, about 100 μm or less, or about 60 μm or less. In some embodiments, the third depth of layer of the one or more alkali metal ions and/or the fourth depth of layer of the one or more alkali metal ions can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween.

In some embodiments, the second portion 231, 431, or 831 may comprise a second tensile stress region. In some embodiments, the second tensile stress region can be positioned between the third compressive stress region and the fourth compressive stress region. In some embodiments, the second tensile stress region can comprise a second maximum tensile stress. In further embodiments, the second maximum tensile stress can be about 10 MPa or more, about 20 MPa or more, about 30 MPa or more, about 100 MPa or less, about 80 MPa or less, or about 60 MPa or less. In further embodiments, the second maximum tensile stress can be in a range from about 10 MPa to about 100 MPa, from about 10 MPa to about 80 MPa, from about 10 MPa to about 60 MPa, from about 20 MPa to about 100 MPa, from about 20 MPa to about 80 MPa, from about 20 MPa to about 60 MPa, from about 30 MPa to about 100 MPa, from about 30 MPa to about 80 MPa, from about 30 MPa to about 60 MPa, or any range or subrange therebetween. Providing a second maximum tensile stress in a range from about 10

MPa to about 100 MPa can enable good impact and/or puncture resistance while providing low energy fractures, as discussed below.

In some embodiments, the second portion 231, 431, or 831 can comprise a second average concentration of potassium on an oxide basis. In some embodiments, the second average concentration of potassium on an oxide basis can be about 10 parts per million (ppm) or more, about 50 ppm or more, about 200 ppm or more, about 500 ppm or more, about 1,000 ppm or more, about 2,000 ppm or more, about 300,000 or less, about 100,000 ppm or less, about 50,000 ppm or less, about 20,000 ppm or less, about 10,000 ppm or less, or about 5,000 ppm or less. In some embodiments, the second average concentration of potassium on an oxide basis can be in a range from about 10 ppm to about 300,000 ppm, from about 50 ppm to about 300,000, from about 50 ppm to about 100,000, from about 200 ppm to about 100,000, from about 200 ppm to about 50,000 ppm, from about 500 ppm to about 50,000, from about 500 ppm to about 20,000 ppm, from about 1,000 ppm to about 20,000 ppm, from about 2,000 ppm to about 10,000 ppm, from about 2,000 ppm to about 5,000 ppm, or any range or subrange therebetween.

In some embodiments, the first depth of compression can be substantially equal to the third depth of compression. In some embodiments, the second depth of compression can be substantially equal to the fourth depth of compression. In some embodiments, the first maximum compressive stress can be substantially equal to the third maximum compressive stress. In some embodiments, the second maximum compressive stress can be substantially equal to the fourth maximum compressive stress. In some embodiments, the first depth of layer of one or more alkali metal ions can be substantially equal to the third depth of layer of one or more alkali metal ions. In some embodiments, the second depth of layer of one or more alkali metal ions can be substantially equal to the fourth depth of layer of one or more alkali metal ions. In some embodiments, the first average concentration of potassium can be substantially equal to the second average concentration of potassium.

In some embodiments, the central portion 281, 481, or 881 comprising the glass-based portion and/or ceramic-based portion may comprise a first central compressive stress region at the first central surface area 209, 409, or 809 that can extend to first central depth of compression from the first central surface area 209, 409, or 809. In some embodiments, the central portion 281, 481, or 881 comprising the glass-based and/or ceramic-based portion may comprise a second central compressive stress region at the second central surface area 219, 419, or 819 that can extend to a second central depth of compression from the second central surface area 219, 419, or 819. In some embodiments, the first central depth of compression and/or the second central depth of compression as a percentage of the central thickness 227, 427, or 827 can be about 1% or more, about 5% or more, about 10% or more, about 30% or less, about 25% or less, or about 20% or less. In some embodiments, the first central depth of compression and/or the second central depth of compression as a percentage of the central thickness 227, 427, or 827 can be in a range from about 1% to about 30%, from about 5% to about 30%, from about 5% to about 25%, from about 5% to about 20%, from about 10% to about 30%, from about 10% to about 25%, from about 10% to about 20%, or any range or subrange therebetween. In further embodiments, the first central depth of compression and/or the second central depth of compression as a percentage of the central thickness 227, 427, or 827 can be about 10% or more, for example, from about 10% to about 30%, from about 10% to about 25%, from about 15% to about 25%, from about 15% to about 20%, or any range or subrange therebetween.

In further embodiments, the first central depth of compression can be substantially equal to the second central depth of compression. In some embodiments, the first central depth of compression and/or the second central depth of compression can be about 1 μm or more, about 10 μm or more, about 30 μm or more, about 50 μm or more, about 200 μm or less, about 150 μm or less, about 100 μm or less, or about 60 μm or less. In some embodiments, the first central depth of compression and/or the second central depth of compression can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween. By providing a central portion comprising a glass-based and/or ceramic-based portion comprising a first central depth of compression and/or a second central depth of compression in a range from about 1% to about 30% of the central thickness, good impact and/or puncture resistance can be enabled.

In some embodiments, the first central compressive stress region can comprise a first central maximum compressive stress. In some embodiments, the second central compressive stress region can comprise a second central maximum compressive stress. In further embodiments, the first central maximum compressive stress and/or the second central maximum compressive stress can be about 100 MegaPascals (MPa) or more, about 300 MPa or more, about 500 MPa or more, about 600 MPa or more, about 700 MPa or more, about 1,500 MPa or less, about 1,200 MPa or less, about 1,000 MPa or less, or about 800 MPa or less. In further embodiments, the first central maximum compressive stress and/or the second central maximum compressive stress can be in a range from about 100 MPa to about 1,500 MPa, from about 100 MPa to about 1,200 MPa, from about 300 MPa to about 1,200 MPa, from about 300 MPa to about 1,000 MPa, from about 500 MPa to about 1,000 MPa, from about 600 MPa to about 1,000 MPa, from about 600 MPa to about 1,000 MPa, from about 700 MPa to about 1,000 MPa, from about 700 MPa to about 800 MPa, or any range or subrange therebetween. By providing a first central maximum compressive stress and/or a second central maximum compressive stress in a range from about 100 MPa to about 1,500 MPa, good impact and/or puncture resistance can be enabled.

In some embodiments, the central portion 281, 481, or 881 can comprise a first central depth of layer of one or more alkali metal ions associated with the first central compressive stress region and the first central depth of layer. In some embodiments, the central portion 281, 481, or 881 can comprise a second central depth of layer of one or more alkali metal ions associated with the second central compressive stress region and the second central depth of layer. In some embodiments, the one or more alkali ions of the first central depth of layer of the one or more alkali ions and/or the second central depth of layer of the one or more alkali ions comprises potassium. In some embodiments, the first central depth of layer and/or the second central depth of layer as a percentage of the central thickness 227, 427, 827 can be about 1% or more, about 5% or more, about 10% or more, about 40% or less, about 35% or less, about 30% or less, about 25% or less, or about 20% or less. In some embodiments, the first central depth of layer and/or the second central depth of layer as a percentage of the central thickness 227, 427, or 827 can be in a range from about 1% to about 40%, from about 1% to about 35%, from about 1% to about 30%, from about 1% to about 25%, from about 1% to about 20%, from about 5% to about 30%, from about 5% to about 25%, from about 5% to about 20%, from about 10% to about 30%, from about 10% to about 25%, from about 10% to about 20%, or any range or subrange therebetween. In further embodiments, the first central depth of layer of the one or more alkali metal ions and/or the second central depth of layer of the one or more alkali metal ions as a percentage of the central thickness 227, 427, or 827 can be about 10% or less, for example, from about 1% to about 10%, from about 1% to about 8%, from about 3% to about 8%, from about 5% to about 8%, or any range or subrange therebetween. In some embodiments, the first central depth of layer of the one or more alkali metal ions and/or the second central depth of layer of the one or more alkali metal ions can be about 1 μm or more, about 10 μm or more, about 30 μm or more, about 50 μm or more, about 200 μm or less, about 150 μm or less, about 100 μm or less, or about 60 μm or less. In some embodiments, the first central depth of layer of the one or more alkali metal ions and/or the second central depth of layer of the one or more alkali metal ions can be in a range from about 1 μm to about 200 μm, from about 1 μm to about 150 μm, from about 10 μm to about 150 μm, from about 10 μm to about 100 μm, from about 30 μm to about 100 μm, from about 30 μm to about 60 μm, from about 50 μm to about 60 μm, or any range or subrange therebetween.

In some embodiments, the first depth of compression and/or the third depth of compression can be greater than the first central depth of compression. In some embodiments, the second depth of compression and/or the fourth depth of compression can be greater than the second central depth of compression. In some embodiments, the first depth of layer and/or the third depth of layer can be greater than the first central depth of layer. In some embodiments, the second depth of layer and/or the fourth depth of layer can be greater than the second central depth of layer.

In some embodiments, the central portion 281, 481, or 881 may comprise a central tensile stress region. In some embodiments, the central tensile stress region can be positioned between the first central compressive stress region and the second central compressive stress region. In some embodiments, the central tensile stress region can comprise a central maximum tensile stress. In further embodiments, the central maximum tensile stress can be about 125 MPa or more, about 150 MPa or more, about 200 MPa or more, about 375 MPa or less, about 300 MPa or less, or about 250 MPa or less. In further embodiments, the central maximum tensile stress can be in a range from about 125 MPa to about 375 MPa, from about 125 MPa to about 300 MPa, from about 125 MPa to about 250 MPa, from about 150 MPa to about 375 MPa, from about 150 MPa to about 300 MPa, from about 150 MPa to about 250 MPa, from about 200 MPa to about 375 MPa, from about 200 MPa to about 300 MPa, from about 200 MPa to about 250 MPa, or any range or subrange therebetween. Providing a central maximum tensile stress in a range from about 125 MPa to about 375 MPa can enable low minimum bend radii.

In some embodiments, the first maximum tensile stress can be substantially equal to the second maximum tensile stress. In some embodiments, the first maximum tensile stress and the second maximum tensile stress can be less than the central maximum tensile stress. Providing a first maximum tensile stress and a second maximum tensile stress less than a central maximum tensile stress in a central portion can enable low energy fracture while simultaneously enabling lower minimum bend radii. In some embodiments, an absolute difference between the central maximum tensile stress and the first maximum tensile stress and/or the second maximum tensile stress can be 0 MPa or more, about 1 MPa or more, about 5 MPa or more, about 50 MPa or less, about 20 MPa or less, about 10 MPa or less, or about 8 MPa or less. In some embodiments, an absolute difference between the central maximum tensile stress and the first maximum tensile stress and/or the second maximum tensile stress can be in a range from 0 MPa to about 50 MPa, from about 1 MPa to about 50 MPa, from about 1 MPa to about 20 MPa, from about 5 MPa to about 20 MPa, from about 5 MPa to about 10 MPa, from about 5 MPa to about 8 MPa, or any range or subrange therebetween.

In some embodiments, the first depth of compression can be substantially equal to the first central depth of compression. In even further embodiments, the third depth of compression can be substantially equal to the first central depth of compression. In some embodiments, the second depth of compression can be substantially equal to the second central depth of compression. In further embodiments, the fourth depth of compression can be substantially equal to the second central depth of compression. As discussed above, the central thickness can be less than the substrate thickness (e.g., in a range from about 0.5% to about 13%), which can enable the central maximum central tension to be greater than the first maximum central tension and the second maximum central tension even though the depth of compression(s) for the first portion, the second portion, and the central portion may be substantially the same.

In some embodiments, a first transition portion (e.g., first transition portion 853) and/or the second transition portion can comprise a transition tensile stress region. The transition tensile stress region can comprise a transition maximum tensile stress. In further embodiments, the transition maximum tensile stress can be about 125 MPa or more, about 150 MPa or more, about 200 MPa or more, about 500 MPa or less, about 375 MPa or less, about 300 MPa or less, or about 250 MPa or less. In further embodiments, the transition maximum tensile stress can be in a range from about 125 MPa to about 500 MPa, 125 MPa to about 375 MPa, from about 125 MPa to about 300 MPa, from about 125 MPa to about 250 MPa, from about 150 MPa to about 375 MPa, from about 150 MPa to about 300 MPa, from about 150 MPa to about 250 MPa, from about 200 MPa to about 375 MPa, from about 200 MPa to about 300 MPa, from about 200 MPa to about 250 MPa, or any range or subrange therebetween. In further embodiments, the transition maximum tensile stress can be greater than the central maximum tensile stress. In further embodiments, the transition maximum tensile stress can be greater than the first maximum tensile stress and/or the second maximum tensile stress. Providing the transition maximum tensile stress greater than the central maximum tensile stress can counteract a strain between the first portion or the second portion and the first transition portion and/or second transition portion during folding. Providing the transition maximum tensile stress greater than the first maximum tensile stress and/or the second maximum tensile stress can counteract a strain between the central portion and the first transition portion and/or second transition portion during folding.

In some embodiments, the central portion 281, 481, or 881 can comprise a central average concentration of potassium on an oxide basis. In some embodiments, the central average concentration of potassium on an oxide basis can be about 10 parts per million (ppm) or more, about 50 ppm or more, about 200 ppm or more, about 500 ppm or more, about 1,000 ppm or more, about 2,000 ppm or more, about 300,000 or less, about 100,000 ppm or less, about 50,000 ppm or less, about 20,000 ppm or less, about 10,000 ppm or less, or about 5,000 ppm or less. In some embodiments, the central average concentration of potassium on an oxide basis can be in a range from about 10 ppm to about 300,000 ppm, from about 50 ppm to about 300,000, from about 50 ppm to about 100,000, from about 200 ppm to about 100,000, from about 200 ppm to about 50,000 ppm, from about 500 ppm to about 50,000, from about 500 ppm to about 20,000 ppm, from about 1,000 ppm to about 20,000 ppm, from about 2,000 ppm to about 10,000 ppm, from about 2,000 ppm to about 5,000 ppm, or any range or subrange therebetween.

Figure 54:
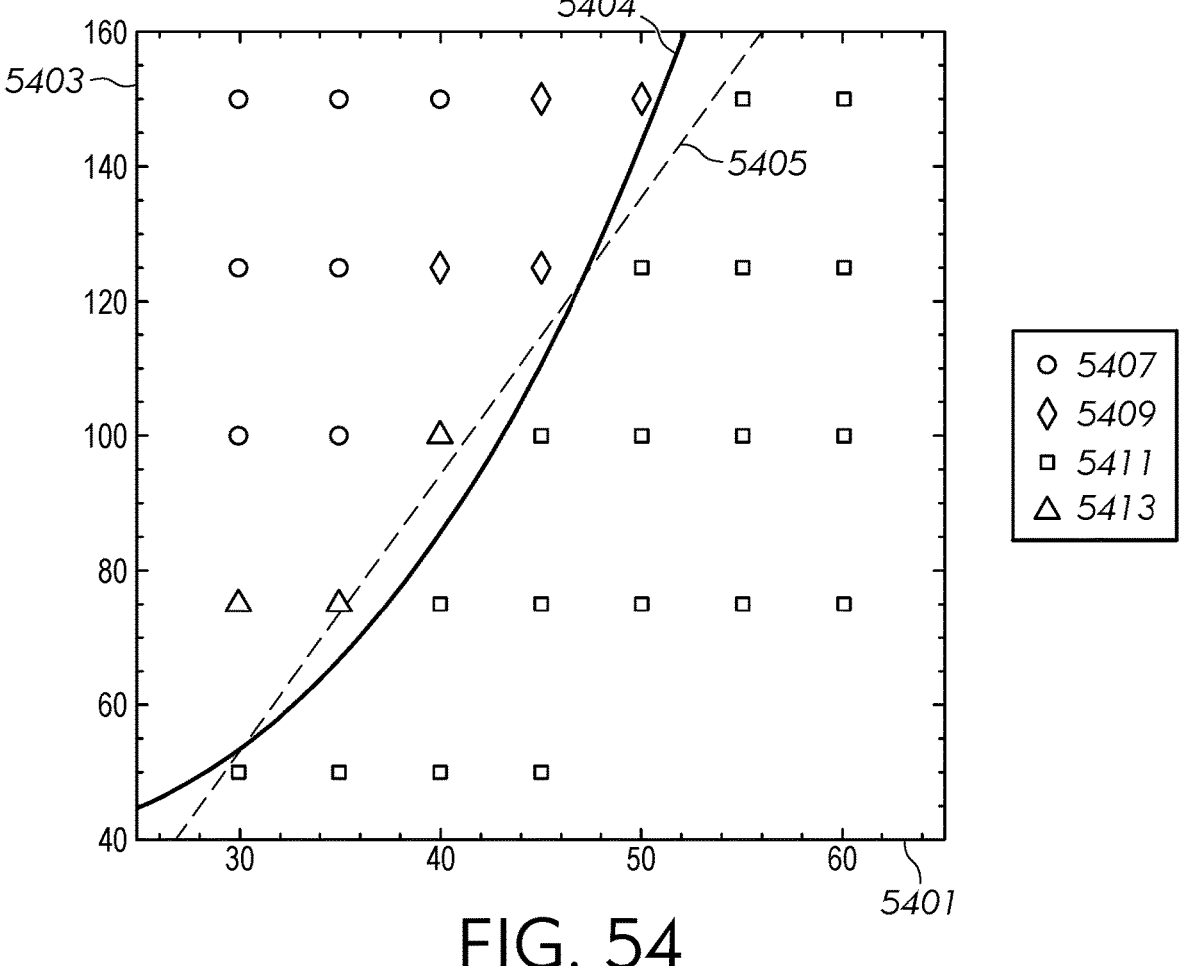
FIG. 54 shows types of mechanical instabilities observed for foldable apparatus as a function of the substrate thickness and the central thickness.

Foldable substrates (e.g., foldable substrate 206, 407, or 807) can be subject to a variety of types of mechanical instabilities. Throughout the disclosure, mechanical instabilities include localized mechanical instabilities as well as systemic mechanical instabilities. As used herein, a localized mechanical instability manifests as a deviation (e.g., a plurality of deviations) from a plane of a surface (e.g., first central surface area) without distorting the surface as a whole, for example, buckling and/or wrinkling. As used herein, a systemic mechanical instability manifests as a distortion of an entire surface from a plane, for example, warpage. As shown in FIG. 54, the horizontal axis 5401 (e.g., x-axis) comprises the central thickness (e.g., central thickness 227, 427, or 827) and the vertical axis 5403 (e.g., y-axis) comprises the substrate thickness 211, 411, or 811. The shapes plotted in FIG. 54 correspond to the type (or types) of mechanical instability observed for the combination of central thickness and substrate thickness at that location. Diamonds 5409 correspond to buckling. Circles 5407 correspond to buckling and wrinkling. Triangles 5413 correspond to warpage and wrinkling. Squares 5411 correspond to warpage. Curves 5404 and 5405 separate combinations of central thickness and substrate thickness where only broad instabilities (e.g., warpage) occurs as opposed to combinations where localized instabilities occur. Curve 5405 is a line indicating that localized instabilities may be observed when the substrate thickness is greater than about 4 times the central thickness minus 71 micrometers. More specifically, curve 5405 indicates that localized instabilities may be observed when the substrate thickness is greater than about 4.1 times the central thickness minus 71.37 micrometers. Curves 5404 and 5405 indicate that some instabilities (e.g., localized mechanical instabilities) encountered for thinner foldable substrates (e.g., above curve 5404 and/or 5405) can be different than those encountered for thicker foldable substrates (e.g., below curve 2804 and/or 2805).

An onset of mechanical instability (e.g., localized mechanical instability) may occur when a critical strain (e.g., critical buckling strain) of a portion (e.g., central portion) of the foldable substrate is exceeded. For example, a critical buckling strain of a central portion resembling the foldable substrate 807 of FIG. 8 comprising a width of the central portion 881 of 20 mm can be approximated by $10^6$ times the central thickness squared minus 23 times the central thickness plus 0.0006. For example, without wishing to be bound by theory, a critical buckling strain of a central portion resembling the foldable substrate 807 of FIG. 8 comprising a central thickness 827 of 30 μm can be approximated by $3\times10^{-7}$ divided by a square of the width of the central portion 281.

Chemical strengthening induced compressive strain of the central portion of the foldable substrate resulting from chemically strengthening the foldable substrate can be proportional to a product of the network dilation coefficient (B), a concentration difference (C), and a difference between a depth of layer of the central portion divided by the central thickness and a depth of layer of the first portion (or second portion) divided by the substrate thickness. In some embodiments, the compressive strain of the chemical strengthening induced compressive strain of the central portion can be reduced (e.g., to a level below the critical buckling strain) by minimizing the concentration difference and/or minimizing the difference between a depth of layer of the central portion divided by the central thickness and a depth of layer of the first portion (or second portion) divided by the substrate thickness. As used herein, a network dilation coefficient refers to how much a volume of a foldable substrate (e.g., first portion, second portion, central portion) expands as a result of an increase in the concentration of one or more alkali ions exchanged into the substrate (e.g., as a result of chemical strengthening). In some embodiments, a network dilation constant of the first portion and/or a network dilation constant of the second portion can be substantially equal to a network dilation constant of the central portion, for example, if the first portion and/or the second portion and the central portion all comprise the same material prior to the chemically strengthening.

As used herein, a concentration difference of a portion refers to a difference between a concentration at a surface of the portion and a concentration in a bulk of the portion. Unless indicated otherwise, the concentration and concentration difference refer to concentrations of one or more alkali metal ions associated with chemically strengthening and/or a compressive stress region. In some embodiments, the concentration and/or concentration difference can refer to a concentration of potassium on an oxide basis. In some embodiments, a concentration in a bulk of the first portion and/or a concentration of in a bulk of the second portion can be substantially equal to a concentration in a bulk of the central portion, for example, if the first portion and/or the second portion and the central portion comprise the same material prior to the chemically strengthening and/or if a depth of layer of a portion is less than about 45% of the thickness of the corresponding portion. In some embodiments, the first average concentration of potassium on an oxide basis of the first portion can be greater than a concentration of potassium on an oxide basis in the bulk of the first portion. In some embodiments, the second average concentration of potassium on an oxide basis of the second portion can be greater than a concentration of potassium on an oxide basis in the bulk of the second portion. In some embodiments, the central average concentration of potassium on an oxide basis of the central portion can be greater than a concentration of potassium on an oxide basis in the bulk of the central portion.

As used herein, a concentration difference between portions means a difference between one average concentration and another average concentration. Unless indicated otherwise, the concentration and concentration difference refer to concentrations of one or more alkali metal ions associated with chemically strengthening and/or a compressive stress region. In some embodiments, the concentration and/or concentration difference can refer to a concentration of potassium on an oxide basis. In some embodiments, an absolute difference between the first average concentration of potassium on an oxide basis and the central average concentration of potassium on an oxide basis can be about 1 ppm or more, about 10 ppm or more, about 20 ppm or more, about 50 ppm or more, about 70 ppm, about 500 ppm or less, about 200 ppm or less, about 100 ppm or less, or about 85 ppm or less. In some embodiments, an absolute difference between the first average concentration of the potassium on an oxide basis and the central average concentration of potassium on an oxide basis can be in a range from about 1 ppm to about 500 ppm, from about 10 ppm to about 500 ppm, from about 10 ppm to about 200 ppm, from about 20 ppm to about 200 ppm, from about 20 ppm to about 100 ppm, from about 50 ppm to about 100 ppm, from about 70 ppm to about 100 ppm, from about 70 ppm to about 85 ppm, or any range or subrange therebetween. In some embodiments, an absolute difference between the second average concentration of potassium on an oxide basis and the central average concentration of potassium on an oxide basis can be about 1 ppm or more, about 10 ppm or more, about 20 ppm or more, about 50 ppm or more, about 70 ppm, about 500 ppm or less, about 200 ppm or less, about 100 ppm or less, or about 85 ppm or less. In some embodiments, an absolute difference between the second average concentration of the potassium on an oxide basis and the central average concentration of potassium on an oxide basis can be in a range from about 1 ppm to about 500 ppm, from about 10 ppm to about 500 ppm, from about 10 ppm to about 200 ppm, from about 20 ppm to about 200 ppm, from about 20 ppm to about 100 ppm, from about 50 ppm to about 100 ppm, from about 70 ppm to about 100 ppm, from about 70 ppm to about 85 ppm, or any range or subrange therebetween. For example, a chemical strengthening induced strain can be less than a critical buckling strain for a foldable substrate comprising a central thickness of 30 μm and a central width of 20 mm when the absolute difference between average concentrations is about 75 ppm or less. In some embodiments, an absolute difference between the first average concentration of the potassium on an oxide basis and the central average concentration of potassium on an oxide basis can be less than 70 ppm, for example, in a range from about 0.1 ppm to about 60 ppm, from about 0.1 ppm to about 50 ppm, from about 0.1 ppm to about 40 ppm, from about 0.1 ppm to about 30 ppm, from about 0.1 ppm to about 20 ppm, from about 0.5 ppm to about 20 ppm, from about 0.5 ppm to about 10 ppm, from about 1 ppm to about 10 ppm, from about 5 ppm to about 10 ppm, or any range or subrange therebetween. In some embodiments, an absolute difference between the second average concentration of the potassium on an oxide basis and the central average concentration of potassium on an oxide basis can be less than 70 ppm, for example, in a range from about 0.1 ppm to about 50 ppm, from about 0.1 ppm to about 20 ppm, from about 0.5 ppm to about 20 ppm, from about 0.5 ppm to about 10 ppm, from about 1 ppm to about 10 ppm, from about 5 ppm to about 10 ppm, or any range or subrange therebetween. Providing an absolute difference between a first average concentration and/or a second average concentration and the central average concentration of potassium on an oxide basis can provide reduced chemical strengthening induced strain (e.g., below a critical buckling strain) and/or reduce an incidence of mechanical instabilities in the foldable substrate and/or foldable apparatus.

In some embodiments, an absolute difference between the first depth of layer divided by the substrate thickness and the first central depth of layer divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the first depth of layer divided by the substrate thickness and the first central depth of layer divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. In some embodiments, an absolute difference between the third depth of layer divided by the substrate thickness and the first central depth of layer divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the third depth of layer divided by the substrate thickness and the first central depth of layer divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween.

In some embodiments, an absolute difference between the second depth of layer divided by the substrate thickness and the second central depth of layer divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the second depth of layer divided by the substrate thickness and the second central depth of layer divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. In some embodiments, an absolute difference between the fourth depth of layer divided by the substrate thickness and the second central depth of layer divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the fourth depth of layer divided by the substrate thickness and the second central depth of layer divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. For example, a chemical strengthening induced strain can be less than a critical buckling strain for a foldable substrate comprising a central thickness of 30 μm and a central width of 20 mm when the absolute difference between a depth of layer associated with the first portion or second portion divided by the substrate thickness and a depth of layer associated with the central portion divided by the central thickness is about 0.075% or less. In some embodiments, an absolute difference between one of the first depth of layer, second depth of layer, third depth of layer, or fourth depth of layer divided by the substrate thickness and the first central depth of layer or second central depth of layer divided by the central thickness can be less than 0.07%, for example, in a range from about 0.001% to about 0.07%, from about 0.01% to about 0.07%, from about 0.01% to about 0.05%, from about 0.01% to about 0.02% or any range or subrange therebetween. Providing an absolute difference between a first depth of layer, second depth of layer, third depth of layer, and/or fourth depth of layer divided by the substrate thickness and the first central depth of layer, and/or the second central depth of layer divided by the central thickness (e.g., depths of layer of potassium) can provide reduced chemical strengthening induced strain (e.g., below a critical buckling strain) and/or reduce an incidence of mechanical instabilities in the foldable substrate and/or foldable apparatus.

A depth of compression can be proportional to a corresponding depth of layer. In some embodiments, an absolute difference between the first depth of compression divided by the substrate thickness and the first central depth of compression divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the first depth of compression divided by the substrate thickness and the first central depth of compression divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. In some embodiments, an absolute difference between the third depth of compression divided by the substrate thickness and the first central depth of compression divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the third depth of compression divided by the substrate thickness and the first central depth of compression divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween.

In some embodiments, an absolute difference between the second depth of compression divided by the substrate thickness and the second central depth of compression divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the second depth of compression divided by the substrate thickness and the second central depth of compression divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. In some embodiments, an absolute difference between the fourth depth of compression divided by the substrate thickness and the second central depth of compression divided by the central thickness can be about 0.001% or more, about 0.002% or more, about 0.005% or more, about 1% or less, about 0.2% or less, about 0.1% or less, or about 0.05% or less, about 0.01% or less, or about 0.008% or less. In some embodiments, an absolute difference between the fourth depth of compression divided by the substrate thickness and the second central depth of compression divided by the central thickness can be in a range from about 0.001% to about 1%, from about 0.002% to about 1%, from about 0.002% to about 0.2%, from about 0.005% to about 0.2%, from about 0.005% to about 0.1%, from about 0.005% to about 0.1%, from about 0.005% to about 0.05%, from about 0.005% to about 0.01%, from about 0.005% to about 0.008%, or any range or subrange therebetween. For example, a chemical strengthening induced strain can be less than a critical buckling strain for a foldable substrate comprising a central thickness of 30 μm and a central width of 20 mm when the absolute difference between a depth of compression associated with the first portion or second portion divided by the substrate thickness and a depth of compression associated with the central portion divided by the central thickness is about 0.075% or less. In some embodiments, an absolute difference between one of the first depth of compression, second depth of compression, third depth of compression, or fourth depth of compression divided by the substrate thickness and the first central depth of compression or second central depth of compression divided by the central thickness can be less than 0.07%, for example, in a range from about 0.001% to about 0.07%, from about 0.01% to about 0.07%, from about 0.01% to about 0.05%, from about 0.01% to about 0.02% or any range or subrange therebetween. Providing an absolute difference between a first depth of compression, second depth of compression, third depth of compression, and/or fourth depth of compression divided by the substrate thickness and the first central depth of compression and/or the second central depth of compression divided by the central thickness can provide reduced chemical strengthening induced strain (e.g., below a critical buckling strain) and/or reduce an incidence of mechanical instabilities in the foldable substrate and/or foldable apparatus.

In some embodiments, chemical strengthening induced strain and/or stress can be observed in an optical retardation profile of the foldable substrate. As used herein, the optical retardation profile is measured using a gray-field polarimeter that detects light emitted from green LEDs comprising an optical wavelength of about 553 nm through the foldable substrate. Without wishing to be bound by theory, spatial differences in optical retardation can correspond to differences in stress (e.g., in-plane strain) in the foldable substrate, for example, as stress-induced birefringence. In some embodiments, an optical retardation of the central portion along a centerline midway between the first portion and the second portion, an absolute difference between a maximum value of the optical retardation along the centerline and a minimum value of the optical retardation along the centerline can be about 0.1 nm or more, about 0.5 nm or more, about 1 nm or more, about 3 nm or less, about 2 nanometers or less, or about 1.5 nm or less. In some embodiments, an absolute difference between a maximum value of the optical retardation along the centerline and a minimum value of the optical retardation along the centerline can be in a range from about 0.1 nm to about 3 nm, from about 0.1 nm to about 2 nm, from about 0.5 nm to about 2 nm, from about 0.5 to about 1.5 nm, from about 1 nm to about 1.5 nm, or any range or subrange therebetween.

In some embodiments, a maximum difference between an optical retardation of the central portion 281, 481, or 881 and a minimum optical retardation of the first portion 221, 421, or 821 and/or the second portion 231, 431, or 831 can be about 0.1 nm or more, about 0.5 nm or more, about 1 nm or more, about 2 nm or more, about 3 nm or more, about 8 nm or less, about 6 nm or less, about 5 nm or less, or about 4 nm or less. In some embodiments, a maximum difference between an optical retardation of the central portion 281, 481, or 881 and a minimum optical retardation of the first portion 221, 421, or 821 and/or the second portion 231, 431, or 831 can be in a range from about 0.1 nm to about 8 nm, from about 0.1 nm to about 6 nm, from about 0.5 nm to about 6 nm, from about 0.5 nm to about 5 nm, from about 1 nm to about 5 nm, from about 2 nm to about 5 nm, from about 2 nm to about 5 nm, from about 2 nm to about 4 nm, or any range or subrange therebetween. For example, a foldable substrate comprising a central thickness of about 30 μm can avoid mechanical instabilities when the maximum difference between an optical retardation of the central portion 281, 481, or 881 and a minimum optical retardation of the first portion 221, 421, or 821 and/or the second portion 231, 431, or 831 is about 4.6 nm or less. For example, a foldable substrate comprising a central thickness of about 40 μm can avoid mechanical instabilities when the maximum difference between an optical retardation of the central portion 281, 481, or 881 and a minimum optical retardation of the first portion 221, 421, or 821 and/or the second portion 231, 431, or 831 is about 5.9 nm or less.

In some embodiments, the polymer-based portion 241 can be optically clear. The polymer-based portion 241 can comprise a first index of refraction. The first refractive index may be a function of a wavelength of light passing through the optically clear adhesive. For light of a first wavelength, a refractive index of a material is defined as the ratio between the speed of light in a vacuum and the speed of light in the corresponding material. Without wishing to be bound by theory, a refractive index of the optically clear adhesive can be determined using a ratio of a sine of a first angle to a sine of a second angle, where light of the first wavelength is incident from air on a surface of the optically clear adhesive at the first angle and refracts at the surface of the optically clear adhesive to propagate light within the optically clear adhesive at a second angle. The first angle and the second angle are both measured relative to a normal of a surface of the optically clear adhesive. As used herein, the refractive index is measured in accordance with ASTM E1967-19, where the first wavelength comprises 589 nm. In some embodiments, the first refractive index of the polymer-based portion 241 may be about 1 or more, about 1.3 or more, about 1.4 or more, about 1.45 or more, about 1.49 or more, about 3 or less, about 2 or less, or about 1.7 or less, about 1.6 or less, or about 1.55 or less. In some embodiments, the first refractive index of the polymer-based portion 241 can be in a range from about 1 to about 3, from about 1 to about 2 from about 1 to about 1.7, from about 1.3 to about 1.7, from about 1.4 to about 1.7, from about 1.4 to about 1.6, from about 1.45 to about 1.55, from about 1.49 to about 1.55, or any range or subrange therebetween.

In some embodiments, the foldable substrate 206, 407, or 807 can comprise a second index of refraction. In some embodiments, the second refractive index of the foldable substrate 206, 407, or 807 may be about 1 or more, about 1.3 or more, about 1.4 or more, about 1.45 or more, about 1.49 or more, about 3 or less, about 2 or less, or about 1.7 or less, about 1.6 or less, or about 1.55 or less. In some embodiments, the second refractive index of the foldable substrate

206, 407, or 807 can be in a range from about 1 to about 3, from about 1 to about 2 from about 1 to about 1.7, from about 1.3 to about 1.7, from about 1.4 to about 1.7, from about 1.4 to about 1.6, from about 1.45 to about 1.55, from about 1.49 to about 1.55, or any range or subrange therebetween. In some embodiments, a differential equal to the absolute value of the difference between the second index of refraction of the foldable substrate 206, 407, or 807 and the first index of refraction of the polymer-based portion 241 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the second index of refraction of the foldable substrate 206, 407, or 807 may be greater than the first index of refraction of the polymer-based portion 241. In some embodiments, the second index of refraction of the foldable substrate 206, 407, or 807 may be less than the first index of refraction of the polymer-based portion 241.

In some embodiments, the adhesive layer 261 can comprise a third index of refraction. In some embodiments, the third index of refraction of the adhesive layer 261 can be within one or more of the ranges discussed above with regards to the first index of refraction of the polymer-based portion 241. In some embodiments, a differential equal to the absolute value of the difference between the third index of refraction of the adhesive layer 261 and the first index of refraction of the polymer-based portion 241 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the third index of refraction of the adhesive layer 261 may be greater than the first index of refraction of the polymer-based portion 241. In some embodiments, the third index of refraction of the adhesive layer 261 may be less than the first index of refraction of the polymer-based portion 241.

In some embodiments, a differential equal to the absolute value of the difference between the third index of refraction of the adhesive layer 261 and the second index of refraction of the foldable substrate 206, 407, or 807 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the third index of refraction of the adhesive layer 261 may be greater than the second index of refraction of the foldable substrate 206, 407, or 807. In some embodiments, the third index of refraction of the adhesive layer 261 may be less than the second index of refraction of the foldable substrate 206, 407, or 807.

In some embodiments, the coating 251 can comprise a fourth index of refraction. In some embodiments, the fourth index of refraction of the coating 251 can be within one or more of the ranges discussed above with regards to the first index of refraction of the polymer-based portion 241. In some embodiments, a differential equal to the absolute value of the difference between the fourth index of refraction of the coating 251 and the first index of refraction of the polymer-based portion 241 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the fourth index of refraction of the coating 251 may be greater than the first index of refraction of the polymer-based portion 241. In some embodiments, the fourth index of refraction of the coating 251 may be less than the first index of refraction of the polymer-based portion 241.

In some embodiments, a differential equal to the absolute value of the difference between the fourth index of refraction of the coating 251 and the second index of refraction of the foldable substrate 206, 407, or 807 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the fourth index of refraction of the coating 251 may be greater than the second index of refraction of the foldable substrate 206, 407, or 807. In some embodiments, the fourth index of refraction of the coating 251 may be less than the second index of refraction of the foldable substrate 206, 407, or 807.

In some embodiments, a differential equal to the absolute value of the difference between the fourth index of refraction of the coating 251 and the third index of refraction of the adhesive layer 261 can be about 0.1 or less, about 0.07 or less, about 0.05 or less, about 0.001 or more, about 0.01 or more, or about 0.02 or more. In some embodiments, the differential is in a range from about 0.001 to about 0.1, from about 0.001 to about 0.07, from about 0.001 to about 0.05, from about 0.01 to about 0.1, from about 0.01 to about 0.07, from about 0.01 to about 0.05, from about 0.02 to about 0.1, from about 0.02 to about 0.07, from about 0.02 to about 0.05, or any range or subrange therebetween. In some embodiments, the fourth index of refraction of the coating 251 may be greater than the third index of refraction of the adhesive layer 261. In some embodiments, the fourth index of refraction of the coating 251 may be less than the third index of refraction of the adhesive layer 261.

The foldable apparatus and/or foldable substrate may have a failure mode that can be described as a low energy failure or a high energy failure. The failure mode of the foldable substrate can be measured using the parallel plate apparatus 1001 in FIG. 10. As described below for the effective minimum bend radius, the parallel rigid stainless-steel plates 1003, 1005 are moved together at a rate of 50 μm/second until the target parallel plate distance 1007 is achieved. The target parallel plate distance 1007 is the larger of 4 mm or twice the effective minimum bend radius of the foldable apparatus and/or foldable substrate. Then, a tung-sten carbide sharp contact probe impinges on the foldable substrate 206 at an impact location 1011 that is a distance 1009 of 30 mm from the outermost periphery of the foldable substrate 206. As used herein, a fracture is high energy if particles are ejected from the foldable substrate 206 during fracture at 1 meter per second (m/s) or more and the fracture results in more than 2 crack branches. As used herein, a fracture is low energy if the fracture results in 2 or less crack branches or does not result in ejection of particles from the foldable substrate 206 during fracture at 1 m/s or more. The average velocity of ejected particles may be measured by capturing high-speed video of the foldable apparatus from when the sharp contact probe contacts the impact location to 5,000 microseconds afterward.

Figures 9, 10:
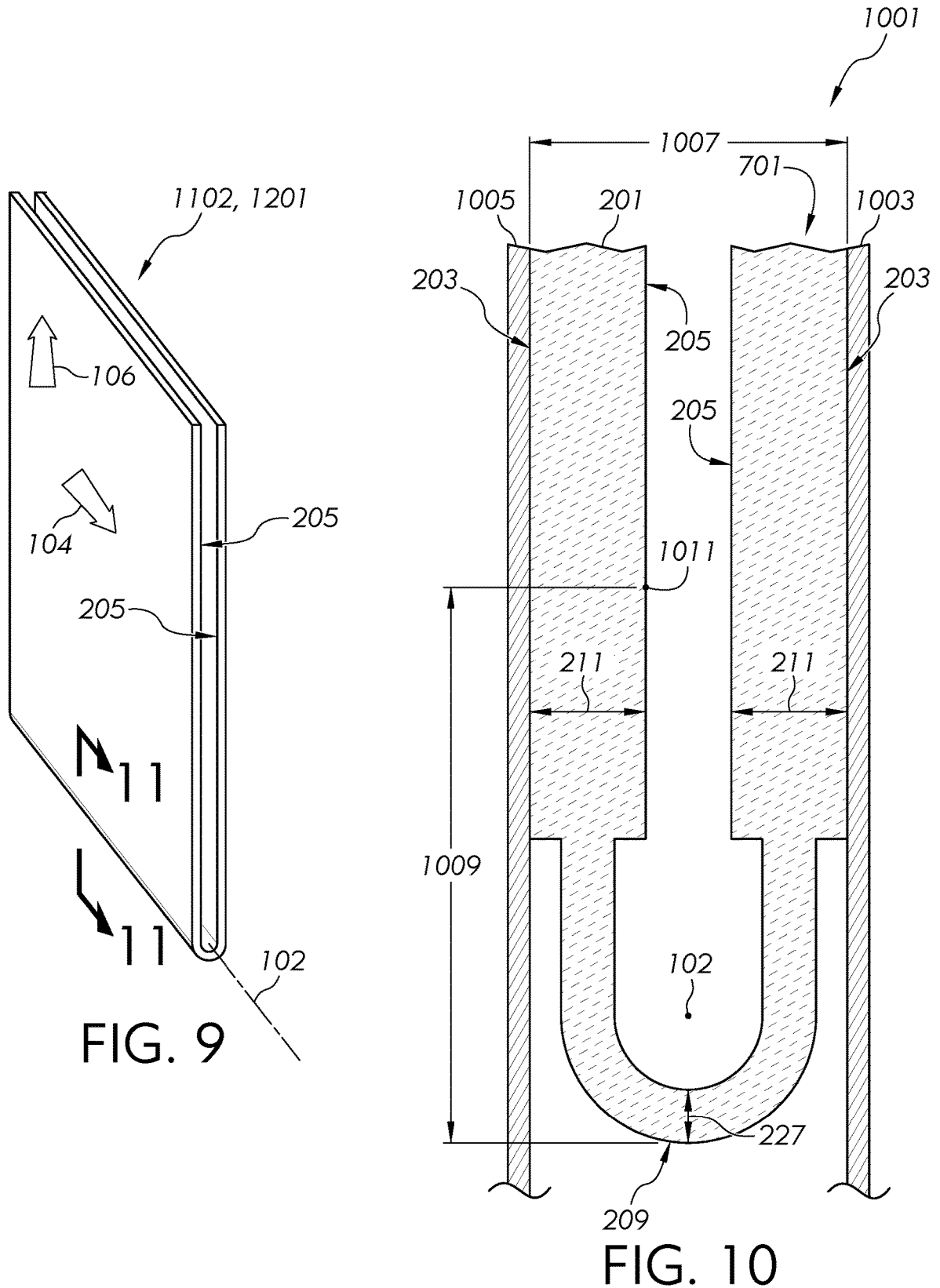
FIG. 9 is a schematic view of example foldable apparatus of embodiments of the disclosure in a folded configuration wherein a schematic view of the flat configuration may appear as shown in FIG. 1.
FIGS. 10-11 are cross-sectional views of testing apparatus to determine the effective minimum bend radius of an example modified foldable apparatus.

FIGS. 9 and 11-12 schematically illustrate some embodiments of a test foldable apparatus 1102 and/or foldable apparatus 1201 in accordance with embodiments of the disclosure in a folded configuration. As shown in FIG. 11, the test foldable apparatus 1102 is folded such that the second major surface 205 of the foldable substrate 206 is on the inside of the folded test foldable apparatus 1102. In the folded configuration shown in FIG. 11, a user would view the display device 307 in place of a PET sheet 1107 through the foldable substrate 206 and, thus, would be positioned on the side of the second major surface 205. As shown in FIG. 12, the foldable apparatus 401 is folded to form folded apparatus 1201 such that the second major surface 405 of the foldable substrate 407 is on the outside of the folded foldable apparatus 1201. In FIG. 12, a user would view the display device 307 through the foldable substrate 407 and, thus, would be positioned on the side of the second major surface 205. In some embodiments, as shown in FIGS. 11-12, a foldable apparatus can comprise a coating 251 disposed over the test foldable apparatus 1102 or foldable apparatus 1201 (e.g., first major surface 203 or 403, first central surface area 209 or 409). In further embodiments, a user would view the display device 307 through the coating. In some embodiments, although not shown, the polymer-based portion 241 and/or the adhesive layer 261 can be disposed over an additional substrate (e.g., glass-based substrate and/or ceramic-based substrate in place of release liner 271 or PET sheet 1107), and the additional substrate can be disposed over a display device 307.

As used herein, "foldable" includes complete folding, partial folding, bending, flexing, or multiple capabilities. As used herein, the terms "fail," "failure" and the like refer to breakage, destruction, delamination, or crack propagation. A foldable apparatus achieves an effective bend radius of "X," or has an effective bend radius of "X," or comprises an effective bend radius of "X" if it resists failure when the foldable apparatus is held at "X" radius for 24 hours at about 85° C. and about 85% relative humidity. Likewise, a foldable apparatus achieves a parallel plate distance of "X," or has a parallel plate distance of "X," or comprises a parallel plate distance of "X" if it resists failure when the foldable apparatus is held at a parallel plate distance of "X" for 24 hours at about 85° C. and about 85% relative humidity.

As used herein, the "effective minimum bend radius" and "parallel plate distance" of a foldable apparatus is measured with the following test configuration and process using a parallel plate apparatus 1101 (see FIG. 11) that comprises a pair of parallel rigid stainless-steel plates 1103, 1105 comprising a first rigid stainless-steel plate 1103 and a second rigid stainless-steel plate 1105. When measuring the "effective minimum bend radius" or the "parallel plate distance", the test adhesive layer 1109 comprises a thickness of 50 μm (e.g., instead of adhesive layer 261 in FIGS. 2-5). When measuring the "effective minimum bend radius" or the "parallel plate distance", the test is conducted with a 100 μm thick sheet 1107 of polyethylene terephthalate (PET) rather than the release liner 271 of FIGS. 2 and 4 or the display device 307 shown in FIGS. 3 and 5. Thus, during the test to determine the "effective minimum bend radius" or the "parallel plate distance" of a configuration of a foldable apparatus, the test foldable apparatus 1102 is produced by using the 100 μm thick sheet 1107 of polyethylene terephthalate (PET) rather than the release liner 271 of FIGS. 2 and 4 or the display device 307 shown in FIGS. 3 and 5. When preparing the test foldable apparatus 1102, the 100 μm thick sheet 1107 of polyethylene terephthalate (PET) is attached to the test adhesive layer 1109 in an identical manner that the release liner 271 is attached to the second contact surface 265 of the adhesive layer 261 as shown in FIGS. 2 and 4 or the display device 307 is attached to the second contact surface 265 of the adhesive layer 261 as shown in FIGS. 3 and 5. To test the foldable apparatus 601, 701, and/or 801 of FIGS. 6-8, the test adhesive layer 609 and the sheet 607 can likewise be installed as shown in the configuration of FIG. 12 to conduct the test on the test foldable apparatus 1102. The test foldable apparatus 1102 is placed between the pair of parallel rigid stainless-steel plates 1103, 1105 such that the foldable substrate 206, 407, or 807 will be on the inside of the bend, similar to the configuration shown in FIG. 11. For determining a "parallel plate distance", the distance between the parallel plates is reduced at a rate of 50 μm/second until the parallel plate distance 1111 is equal to the "parallel plate distance" to be tested. Then, the parallel plates are held at the "parallel plate distance" to be tested for 24 hours at about 85° C. and about 85% relative humidity. As used herein, the "minimum parallel plate distance" is the smallest parallel plate distance that the foldable apparatus can withstand without failure under the conditions and configuration described above. For determining the "effective minimum bend radius", the distance between the parallel plates is reduced at a rate of 50 μm/second until the parallel plate distance 11 is equal to twice the "effective minimum bend radius" to be tested. Then, the parallel plates are held at twice the effective minimum bend radius to be tested for 24 hours at about 85° C. and about 85% relative humidity. As used herein, the "effective minimum bend radius" is the smallest effective bend radius that the foldable apparatus can withstand without failure under the conditions and configuration described above.

In some embodiments, the foldable apparatus 101, 301, 401, 501, 601, 701, 801, and/or 1201 and/or test foldable apparatus 1102 can achieve a parallel plate distance of 100 mm or less, 50 mm or less, 20 mm or less, 10 mm or less, 5 mm or less, or 3 mm or less. In further embodiments, the foldable apparatus 101, 301, 401, 501, 601, 701, 801, and/or 1201 and/or test foldable apparatus 1102 can achieve a parallel plate distance of 50 millimeters (mm), or 20 mm, or 10 mm, of 5 mm, or 3 mm. In some embodiments, the foldable apparatus 101, 301, 401, 501, 601, 701, 801, and/or 1201 and/or test foldable apparatus 1102 can comprise a minimum parallel plate distance of about 40 mm or less, about 20 mm or less, about 10 mm or less, about 5 mm or less, about 3 mm or less, about 1 mm or less, about 1 mm or more, about 3 mm or more, about 5 mm or more, or about 10 mm or more. In some embodiments, the foldable apparatus 101, 301, 401, 501, 601, 701, 801, and/or 1201 and/or test foldable apparatus 1102 can comprise an effective minimum bend radius in a range from about 1 mm to about 40 mm, from about 1 mm to about 20 mm, from about 1 mm to about 10 mm, from about 1 mm to about 5 mm, from about 1 mm to about 3 mm, from about 3 mm to about 40 mm, from about 3 mm to about 40 mm, from about 3 mm to about 20 mm, from about 3 mm to about 10 mm, from about 3 mm to about 5 mm, from about 5 mm to about 10 mm, or any range or subrange therebetween.

In some embodiments, a width of the central portion 281, 481, and/or 881 of the foldable substrate 206, 407, or 807 defined between the first portion 221, 421, or 821 and the second portion 231, 431, or 831 in the direction 106 of the length 105. In some embodiments, the width of the central portion 281, 481, and/or 881 of the foldable substrate 206, 407, or 807 can extend from the first portion 221, 421, or 821 to the second portion 231, 431, or 831. In some embodiments, the width of the central portion 281, 481, or 881 of the foldable substrate 206, 407, or 807 defined between the first portion 221, 421, or 821 and the second portion 231, 431, or 831 in the direction 106 of the length 105 can be about 2.8 times or more, about 3 times or more, about 4 times or more, about 6 times or less, about 5 times or less, or about 4 times or less the effective minimum bend radius. In some embodiments, the width of the central portion 281, 481, and/or 881 as a multiple of the effective minimum bend radius can be in a range from about 2.8 times to about 6 times, from about 2.8 times to about 5 times, from about 2.8 times to about 4 times, from about 3 times to about 6 times, from about 3 times to about 5 times, from about 3 times to about 4 times, from about 4 times to about 6 times, from about 4 times to about 5 times, or any range or subrange therebetween. Without wishing to be bound by theory, the length of a bent portion in a circular configuration between parallel plates can be about 1.6 times the parallel plate distance 1111 (e.g., about 3 times the effective minimum bend radius, about 3.2 times the effective minimum bend radius). In some embodiments, the width of the central portion 281, 481, and/or 881 of the foldable substrate 206, 407, or 807. In some embodiments, the width of the central portion 281, 481, and/or 881 of the foldable substrate 206, 407, or 807 can be about 2.8 mm or more, about 6 mm or more, about 9 mm or more, about 60 mm or less, about 40 mm, or less, or about 24 mm or less. In some embodiments, the width of the central portion 281, 481, and/or 881 of the foldable substrate 206, 407, or 807 can be in a range from about 2.8 mm to about 60 mm, from about 2.8 mm to about 40 mm, from about 2.8 mm to about 24 mm, from about 6 mm to about 60 mm, from about 6 mm to about 40 mm, from about 6 mm to about 24 mm, from about 9 mm to about 60 mm, from about 9 mm to about 40 mm, from about 9 mm to about 24 mm, or any range of subrange therebetween. By providing a width within the above-noted ranges for the central portion (e.g., between the first portion and the second portion), folding of the foldable apparatus without failure can be facilitated.

The foldable apparatus 101, 301, 401, 501, 601, 701, 801, and 1201 may have an impact resistance defined by the capability of a region of the foldable apparatus (e.g., a region comprising the first portion 221, 421, or 821, a region comprising the second portion 231, 431, or 831, a region comprising the polymer-based portion 241 and/or central portion 281, 481, or 881) to avoid failure at a pen drop height (e.g., 5 centimeters (cm) or more, 10 centimeters or more, 20 cm or more), when measured according to the "Pen Drop Test." As used herein, the "Pen Drop Test" is conducted such that samples of foldable apparatus are tested with the load (i.e., from a pen dropped from a certain height) imparted to a major surface (e.g., second major surface 205, 405, or 805 of the foldable substrate 206, 407, or 807) configured as in the parallel plate test with 100 μm thick sheet 1107 of PET attached to the test adhesive layer 1109 having a thickness of 50 μm instead of the display device 307 shown in FIGS. 3 and 5 or the release liner 271 shown in FIGS. 2 and 4. As such, the PET layer in the Pen Drop Test is meant to simulate a foldable electronic display device (e.g., an OLED device). During testing, the foldable apparatus bonded to the PET layer is placed on an aluminum plate (6063 aluminum alloy, as polished to a surface roughness with 400 grit paper) with the PET layer in contact with the aluminum plate. No tape is used on the side of the sample resting on the aluminum plate.

A tube is used for the Pen Drop Test to guide a pen to an outer surface of the foldable apparatus. For the foldable apparatus 101, 301, 401, 501, 601, 701, 801, and 1201 and/or test foldable apparatus 1102 in FIGS. 2-8 and 11-12, the pen is guided to the second major surface 205, 405, or 805 of the foldable substrate 206, 407, or 807, and the tube is placed in contact with the second major surface 205, 405, or 805 of the foldable substrate 206, 407, or 807 so that the longitudinal axis of the tube is substantially perpendicular to the second major surface 205, 405, or 805 with the longitudinal axis of the tube extending in the direction of gravity. The tube has an outside diameter of 1 inch (2.54 cm), an inside diameter of nine-sixteenths of an inch (1.4 cm) and a length of 90 cm. An acrylonitrile butadiene (ABS) shim is employed to hold the pen at a predetermined height for each test. After each drop, the tube is relocated relative to the sample to guide the pen to a different impact location on the sample. The pen employed in Pen Drop Test is a BIC Easy Glide Pen, Fine, having a tungsten carbide ballpoint tip of 0.7 mm (0.68 mm) diameter, and a weight of 5.73 grams (g) including the cap (4.68 g without the cap).

For the Pen Drop Test, the pen is dropped with the cap attached to the top end (i.e., the end opposite the tip) so that the ballpoint can interact with the test sample. In a drop sequence according to the Pen Drop Test, one pen drop is conducted at an initial height of 1 cm, followed by successive drops in 0.5 cm increments up to 20 cm, and then after 20 cm, 2 cm increments until failure of the test sample. After each drop is conducted, the presence of any observable fracture, failure, or other evidence of damage to the sample is recorded along with the particular pen drop height. Using the Pen Drop Test, multiple samples can be tested according to the same drop sequence to generate a population with improved statistical accuracy. For the Pen Drop Test, the pen is to be changed to a new pen after every 5 drops, and for each new sample tested. In addition, all pen drops are conducted at random locations on the sample at or near the center of the sample, with no pen drops near or on the edge of the samples.

For purposes of the Pen Drop Test, "failure" means the formation of a visible mechanical defect in a laminate. The mechanical defect may be a crack or plastic deformation (e.g., surface indentation). The crack may be a surface crack or a through crack. The crack may be formed on an interior or exterior surface of a laminate. The crack may extend through all or a portion of the foldable substrate 206, 407, or 807 and/or coating. A visible mechanical defect has a minimum dimension of 0.2 mm or more.

Figure 53:
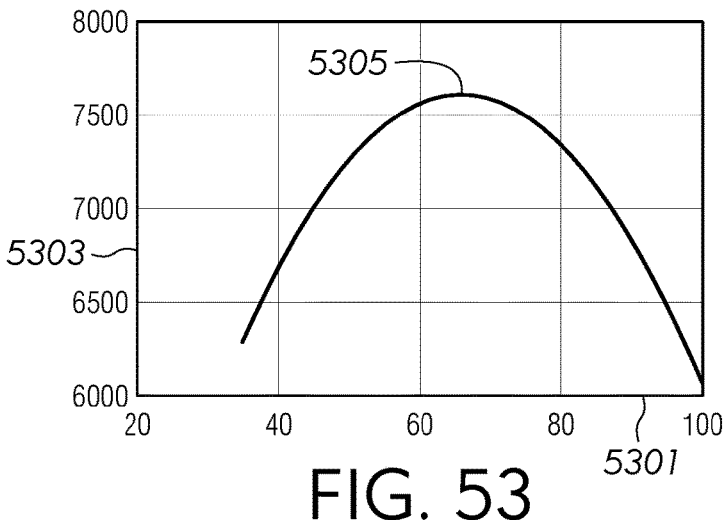
FIG. 53 shows experimental results of the Pen Drop Test of glass-based substrates that shows the maximum principal stress on a major surface of the glass-based substrate as a function of a thickness of a glass-based substrate.

FIG. 53 shows a curve 5305 of the maximum principal stress 5303 in MegaPascals (MPa) on the first major surface of a glass-based substrate as a function of a thickness 5301 in micrometers of the glass-based substrate based on a pen drop height of 2 cm onto the second major surface of a glass-based substrate. As shown in FIG. 53, the maximum principal stress on the first major surface of the glass-based sheet is greatest around 65 μm. This suggests that pen drop performance can be improved by avoiding thicknesses around 65 μm, for example, less than about 50 μm or greater than about 80 μm.

In some embodiments, the foldable apparatus can resist failure for a pen drop in a region comprising the first portion 221, 421, or 821 or the second portion 231, 431, or 831 at a pen drop height of 10 centimeters (cm), 12 cm, 14 cm, 16 cm, or 20 cm. In some embodiments, a maximum pen drop height that the foldable apparatus can withstand without failure over a region comprising the first portion 221, 421, or 821 or the second portion 231, 431, or 831 may be about 10 cm or more, about 12 cm or more, about 14 cm or more, about 16 cm or more, about 40 cm or less, or about 30 cm or less, about 20 cm or less, about 18 cm or less. In some embodiments, a maximum pen drop height that the foldable apparatus can withstand without failure over a region comprising the first portion 221, 421, or 821 or the second portion 231, 431, or 821 can be in a range from about 10 cm to about 40 cm, from about 12 cm to about 40 cm, from about 12 cm to about 30 cm, from about 14 cm to about 30 cm, from about 14 cm to about 20 cm, from about 16 cm to about 20 cm, from about 18 cm to about 20 cm, or any range or subrange therebetween.

In some embodiments, the foldable apparatus can resist failure for a pen drop in a region (e.g., central portion 281, 481, or 881) comprising the polymer-based portion 241 between the first portion 221, 421, or 821 and the second portion 231, 431, or 831 at a pen drop height of 1 cm, 2 cm, 3 cm, 4 cm, 5 cm, or more. In some embodiments, a maximum pen drop height that the foldable apparatus can withstand without failure over a region comprising the polymer-based portion 241 between the first portion 221, 421, or 821 and the second portion 231, 431, or 831 may be about 1 cm or more, about 2 cm or more, about 3 cm or more, about 4 cm or more, about 20 cm or less, about 10 cm or less, about 8 cm or less, or about 6 cm or less. In some embodiments, a maximum pen drop height that the foldable apparatus can withstand without failure over a region comprising the polymer-based portion 241 between the first portion 221, 421, or 821 and the second portion 231, 431, or 831 can be in a range from about 1 cm to about 20 cm, from about 2 cm to about 20 cm, from about 2 cm to about 10 cm, from about 3 cm to about 10 cm, from about 3 cm to about 8 cm, from about 4 cm to about 8 cm, from about 4 cm to about 6 cm, or any range or subrange therebetween. In some embodiments, a maximum pen drop height that the foldable apparatus can withstand without failure of a region comprising the polymer-based portion 241 between the first portion 221, 421, or 821 and the second portion 231, 431, or 831 can be in a range from about 1 cm to about 10 cm, from about 1 cm to about 8 cm, from about 1 cm to about 5 cm, from about 2 cm to about 5 cm, from about 3 cm to about 5 cm, from about 4 cm to about 5 cm, or any range or subrange therebetween.

A minimum force may be used to achieve a predetermined parallel plate distance with the foldable apparatus. The parallel plate apparatus 1101 of FIG. 11, described above, is used to measure the "closing force" of a foldable apparatus of embodiments of the disclosure. The force to go from a flat configuration (e.g., see FIG. 1) to a bent (e.g., folded) configuration (e.g., see FIGS. 9 and 11-12) comprising the predetermined parallel plate distance is measured. In some embodiments, the force to bend the foldable apparatus from a flat configuration to a parallel plate distance of 10 mm can be about 20 Newtons (N) or less, 15 N or less, about 12 N or less, about 10 N or less, about 0.1 N or more, about 0.5 N or more, about 1 N or more, about 2 N or more, about 5

N or more. In some embodiments, the force to bend the foldable apparatus from a flat configuration to a parallel plate distance of 10 mm can be in a range from about 0.1 N to about 20 N, from about 0.5 N to about 20 N, from about 0.5 N to about 15 N, from about 1 N to about 15 N, from about 1 N to about 12 N, from about 2 N to about 12 N, from about 2 N to about 10 N, from about 5 N to about 10 N, or any range or subrange therebetween. In some embodiments, the force to bend the foldable apparatus from a flat configuration to a parallel plate distance of 3 mm can be about 10 N or less, about 8 N or less, about 6 N or less, about 4 N or less, about 3 N or less, about 0.05 N or more about 0.1 N or more, about 0.5 N or more, about 1 N or more, about 2 N or more, about 3 N or more. In some embodiments, the force to bend the foldable apparatus from a flat configuration to a parallel plate distance of 3 mm can be in a range from about 0.05 N to about 10 N, from about 0.1 N to about 10 N, from about 0.1 N to about 8 N, from about 0.5 N to about 8 N, from about 0.5 N to about 6 N, from about 1 N to about 6 N, from about 1 N to about 4 N, from about 2 N to about 4 N, from about 2 N to about 3 N, or any range or subrange therebetween.

In some embodiments, the force per width 103 of the foldable apparatus to bend the foldable apparatus from a flat configuration to a parallel plate distance of 10 mm can be about 20 Newtons per millimeter (N/mm) or less, 0.15 N/mm or less, about 0.12 N/mm or less, about 0.10 N/mm or less, about 0.001 N/mm or more, about 0.005 N/mm or more, about 0.01 N/mm or more, about 0.02 N/mm or more, about 0.05 N/mm or more. In some embodiments, the force per width 103 of the foldable apparatus to bend the foldable apparatus from a flat configuration to a parallel plate distance of 0.10/mm can be in a range from about 0.001 N/mm to about 0.20 N/mm, from about 0.005 N/mm to about 0.20 N/mm, from about 0.005 N/mm to about 0.15 N/mm, from about 0.01 N/mm to about 0.15 N/mm, from about 0.01 N/mm to about 0.12 N/mm, from about 0.02 N/mm to about 0.12 N/mm, from about 0.02 N/mm to about 0.10 N/mm, from about 0.05 N/mm to about 0.10 N/mm, or any range or subrange therebetween. In some embodiments, the force per width 103 of the foldable apparatus to bend the foldable apparatus from a flat configuration to a parallel plate distance of 3 mm can be about 0.10 N/mm or less, about 0.08 N/mm or less, about 0.06 N/mm or less, about 0.04 N/mm or less, about 0.03 N/mm or less, about 0.0005 N/mm or more about 0.001 N/mm or more, about 0.005 N/mm or more, about 0.01 N/mm or more, about 0.02 N/mm or more, about 0.03 N/mm or more. In some embodiments, the force per width 103 of the foldable apparatus to bend the foldable apparatus from a flat configuration to a parallel plate distance of 3 mm can be in a range from about 0.0005 N/mm to about 0.10 N/mm, from about 0.001 N/mm to about 0.10 N/mm, from about 0.001 N/mm to about 0.08 N/mm, from about 0.005 N/mm to about 0.08 N/mm, from about 0.005 N/mm to about 0.06 N/mm, from about 0.01 N/mm to about 0.06 N/mm, from about 0.01 N/mm to about 0.04 N/mm, from about 0.02 N/mm to about 0.04 N/mm, from about 0.02 N/mm to about 0.03 N/mm, or any range or subrange therebetween.

Providing a coating can enable low forces to achieve small parallel plate distances. Without wishing to be bound by theory, a coating comprising a modulus less than a modulus of a foldable substrate can result in a neutral axis of the foldable substrate that is shifted away from the coating (e.g., surface facing the user) than if a glass-based substrate and/or a ceramic-based substrate was used. Without wishing to be bound by theory, providing a coating with a thickness of about 200 μm or less can result in a neutral axis of the foldable substrate that is shifted away from the coating (e.g., surface facing the user) than if a thicker substrate was used. Without wishing to be bound by theory, a neutral axis of the foldable substrate portion shifted away from the coating (e.g., surface facing the user) can enable low forces to achieve small parallel plate distances because it reduces the concentration of tensile stress and resulting deformation of a portion of the foldable substrate since the tensile stress is spread over a larger portion of the foldable substrate.

Embodiments of methods of making the foldable apparatus and/or foldable substrate in accordance with embodiments of the disclosure will be discussed with reference to the flow charts in FIGS. 15-18 and example method steps illustrated in FIGS. 19-52.

Example embodiments of making the foldable apparatus 101, 301, 601, and/or 1201, test foldable apparatus 1102, and/or foldable substrate 206 illustrated in FIGS. 2-3, 6, and 11-12 will now be discussed with reference to FIGS. 19-24 and 50-52 and the flow chart in FIG. 15. In a first step 1501 of methods of the disclosure, methods can start with providing a foldable substrate 206. In some embodiments, the foldable substrate 206 may be provided by purchase or otherwise obtaining a substrate or by forming the foldable substrate. As discussed above, the foldable substrate 206 can comprise a core layer 207 positioned between a first outer layer 213 and a second outer layer 215. In some embodiments, the core layer 207, the first outer layer 213, and/or the second outer layer 215 of the foldable substrate 206 can comprise a glass-based substrate and/or a ceramic-based substrate. In further embodiments, glass-based substrates and/or ceramic-based substrates can be provided by forming them with a variety of ribbon forming processes, for example, slot draw, down-draw, fusion down-draw, up-draw, press roll, redraw or float. In further embodiments, ceramic-based substrates can be provided by heating a glass-based substrate to crystallize one or more ceramic crystals. The foldable substrate 206 may comprise a second major surface 205 (see FIGS. 20-21) that can extend along a plane. The second major surface 205 can be opposite a first major surface 203.

Figure 19:
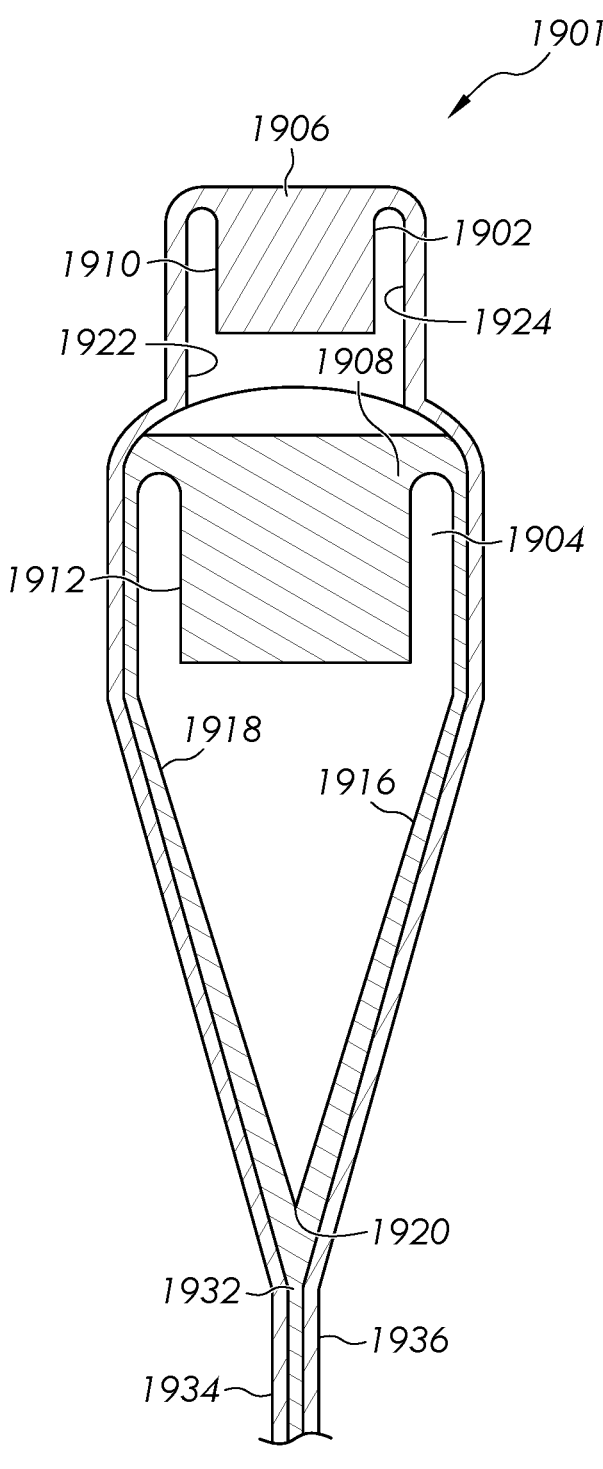

For example, as shown in FIG. 19, a laminate fusion draw apparatus 1901 can be used to produce the foldable substrate 206. As shown, the laminate fusion draw apparatus 1901 can comprise an upper forming device 1902 positioned over a lower forming device 1904. In some embodiments, as shown, the upper forming device 1902 can comprise a first trough 1910 configured to receive a first molten material 1906, and the lower forming device 1904 can comprise a second trough 1912 configured to receive a second molten material 1908. In some embodiments, the second molten material 1908 can overflow the second trough 1912 and flow over corresponding outer forming surfaces 1916 and 1918 of the lower forming device 1904. In further embodiments, as shown, the outer forming surfaces 1916 and 1918 can converge at a root 1920 of the lower forming device 1904 to form a core molten layer 1932 that can be cooled to form the core layer 207. In some embodiments, the first molten material 1906 can overflow the first trough 1910 and flow over corresponding outer surfaces 1922 and 1924 of the upper forming device 1902. In further embodiments, the first molten material 1906 can be deflected by the upper forming device 1902 such that the first molten material 1906 flows around the lower forming device 1904 and contacts the second molten material 1908, as the second molten material flows over the corresponding outer forming surfaces 1916 and 1918 of the lower forming device 1904. In even further embodiments, the first molten material 1906 can form a first molten outer layer 1934 that can be cooled to form the first outer layer 213, and the first molten material 1906 can form a second molten outer layer 1936 that can be cooled to form the second outer layer 215. In still further embodiments, as shown, the core molten layer 1932 can be positioned between the first molten outer layer 1934 and the second molten outer layer 1936 below the root 1920. In still further embodiments, a temperature of the first molten material 1906 comprising the first molten outer layer 1934 and the second molten outer layer 1936 at the root 1920 can be above a softening point of the first molten material 1906 comprising the first molten outer layer 1903 and the second molten outer layer 1936. In still further embodiments, a temperature of the second molten material 1908 comprising the core molten layer 1932 at the root 1920 can be above a softening point of the second molten material 1908 comprising the core molten layer 1932. In yet further embodiments, the first molten outer layer 1934 can be laminated to the core molten layer 1932 (e.g., the first outer layer 213 can be laminated to the third inner surface 208 of the core layer 207 in FIGS. 2-3 and 6) and/or the second molten outer layer 1936 can be laminated to the core molten layer 1932 (e.g., the second outer layer 215 can be laminated to the fourth inner surface 218 of the core layer 207 in FIGS. 2-3 and 6) to form the foldable substrate 206 shown in FIGS. 20-21.

In some embodiments, a core density the core layer 207 can be greater than a first density of the first outer layer 213 and/or a second density the second outer layer 215. In some embodiments, a network dilation coefficient of the core layer 207 can be less than a network dilation coefficient of the first outer layer 213 and/or a network dilation coefficient of the second outer layer 215. In some embodiments, a coefficient of thermal expansion of the core layer 207 can be greater than a coefficient of thermal expansion of the first outer layer 213 and/or a coefficient of thermal expansion of the second outer layer 215.

In some embodiments, in step 1501, the foldable substrate 206 can be provided with a first recess 234 in the first major surface 203 of the foldable substrate 206 that exposes a first central surface area 209 of the core layer 207 and/or a second recess 244 in the second major surface 205 of the foldable substrate 206 that exposes a second central surface area 219 of the core layer 207. In further embodiments, the recess(es) (e.g., first recess 234, second recess 244) may be formed by etching, laser ablation or mechanically working the first major surface 203 and/or second major surface 205. For example, an etching process may resemble steps 1503, 1505, and 1507 discussed below. For example, mechanically working the foldable substrate 206 may resemble step 1517 discussed below.

After step 1501, in some embodiments, the core layer 207 can comprise a core existing average concentration of potassium on an oxide basis and/or a core existing average concentration of lithium on an oxide basis. In some embodiments, the first outer layer 213 can comprise a first existing average concentration of potassium on an oxide basis and/or a first existing average concentration of lithium on an oxide basis. In some embodiments, the second outer layer 215 can comprise a second existing average concentration of potassium on an oxide basis and/or a second existing average concentration of lithium on an oxide basis. In some embodiments, the core existing average concentration of potassium is about 10 parts per million or more than the first existing average concentration of potassium and/or the second existing average concentration of potassium. In some embodiments, the first existing average concentration of lithium and/or the second existing average concentration of lithium can be about 10 parts per million or more than the core existing average concentration of lithium. Without wishing to be bound by theory, providing a greater existing average concentration of potassium in the core layer will decrease an expansion of the core layer as a result of the chemically strengthening process and/or decrease an extent of chemical strengthening of the core layer relative to the first outer layer and/or the second outer layer. Without wishing to be bound by theory, providing a greater existing average concentration of lithium in the first outer layer and/or second outer layer will increase the extent of chemical strengthening and/or increase an expansion of the corresponding layer as a result of the chemically strengthening process relative to the core layer.

After step 1501 (e.g., before step 1509 comprising chemically strengthening the foldable substrate 206), in some embodiments, the core layer can comprise a core diffusivity of one or more alkali metal ions. In some embodiments, the first outer layer can comprise a first diffusivity of one or more alkali metal ions. In some embodiments, the second outer layer can comprise a second diffusivity of one or more alkali metal ions. In some embodiments, the first diffusivity and/or the second diffusivity can be greater than the core diffusivity. In some embodiments, the diffusivities can be of sodium ions. In some embodiments, the diffusivities can be of potassium ions. Without wishing to be bound by theory, providing the first outer layer and/or the second outer layer with a diffusivity of one or more alkali metal ions that is less than an associated diffusivity in the core layer can increase the extent of chemical strengthening in the first outer layer and/or second outer layer relative to the core layer. In further embodiments, a first ratio can be defined as a square root of the first diffusivity divided by a first thickness (e.g., first outer thickness 217) of the first outer layer 213. In further embodiments, a second ratio can be defined as a square root of the second diffusivity divided by a second thickness (e.g., second outer thickness 237) of the second outer layer 215. In further embodiments, a core ratio can be defined as a square root of the core diffusivity divided by a central thickness (e.g., central thickness 227) of the core layer 207. In further embodiments, a difference between the first ratio and the core ratio can be about $0.01 \text{ s}^{-0.5}$ or less. In even further embodiments, the first ratio can be substantially equal to the core ratio. In further embodiments, a difference between the second ratio and the core ratio can be about $0.01 \text{ s}^{-0.5}$ or less. In even further embodiments, the second ratio can be substantially equal to the core ratio. In further embodiments, a difference between the first ratio and/or the second ratio and the core ratio can be about $0.00001 \text{ s}^{-0.5}$ or more, about $0.0001 \text{ s}^{-0.5}$ or more, about $0.001 \text{ s}^{-0.5}$ or more, about $0.003 \text{ s}^{-0.5}$ or more, about $0.1 \text{ s}^{-0.5}$ or less, about $0.05 \text{ s}^{-0.5}$ or less, about $0.02 \text{ s}^{-0.5}$ or less, about $0.01 \text{ s}^{-0.5}$ or less, or about $0.008 \text{ s}^{-0.5}$ or less. In further embodiments, a difference between the first ratio and/or the second ratio and the core ratio can be in a range from about $0.00001 \text{ s}^{-0.5}$ to about $0.1 \text{ s}^{-0.5}$, from about $0.0001 \text{ s}^{-0.5}$ to about $0.05 \text{ s}^{-0.5}$, from about $0.001 \text{ s}^{-0.5}$ to about $0.02 \text{ s}^{-0.5}$, from about from about $0.001 \text{ s}^{-0.5}$ to about $0.01 \text{ s}^{-0.5}$, from about from about $0.003 \text{ s}^{-0.5}$ to about $0.01 \text{ s}^{-0.5}$, from about from about $0.003 \text{ s}^{-0.5}$ to about $0.005 \text{ s}^{-0.5}$, or any range or subrange therebetween. Without wishing to be bound by theory, a depth of layer from chemical strengthening is proportional to the square root of the diffusivity divided by a corresponding thickness. Providing a first ratio, second ratio, and/or core ratio can provide substantially equal depths of layer as a percentage of the corresponding thickness, which can reduce chemical strengthening induced strain in the foldable substrate.

After step 1501, in some embodiments, methods can proceed to step 1517 comprising forming a first recess 234 and/or a second recess 244 by mechanically working the first major surface 203 and/or the second major surface 205 of the foldable substrate 206. The first recess 234 may be formed in the first major surface 203 of the foldable substrate 206 that exposes a first central surface area 209 of the core layer 207. The second recess 244 may be formed in the second major surface 205 of the foldable substrate 206 that exposes a second central surface area 219 of the core layer 207. For example, the first major surface 203 and/or second major surface 205 may be mechanically worked by diamond engraving to produce very precise patterns in glass-based substrates and/or ceramic-based substrates. As shown in FIG. 20, diamond engraving can be used to create the first recess 234 in the first major surface 203 of the foldable substrate 206 where a diamond-tip probe 2001 can be controlled using a computer numerical control (CNC) machine 2003. Materials other than diamond can be used for engraving with a CNC machine. In some embodiments, although not shown, a similar process may be used to form the second recess 244 that may be opposite the first recess 234. It is to be understood that other methods of forming the recess(es) can be used, for example, lithography and laser ablation.

After step 1501, in some embodiments, method can proceed to step 1503 comprising disposing a mask over one or more portions of the foldable substrate 206. In some embodiments, as shown in FIG. 21, step 1503 can comprise disposing a first liquid 2107 over one or more portions of the foldable substrate 206. In further embodiments, as shown, a container 2101 (e.g., conduit, flexible tube, micropipette, or syringe) may be used to dispose the first liquid 2107 over one or more portions of the foldable substrate 206. In further embodiments, as shown, the first liquid 2107 can be disposed over the first surface area 223 as a first liquid deposit 2103 and over the third surface area 233 as a second liquid deposit 2105. Although not shown, it is to be understood that similar liquid deposits can be formed over the second surface area and/or the fourth surface area. In further embodiments, the liquid deposits (e.g., first liquid deposit 2103 and second liquid deposit 2105 shown in FIG. 21) can be cured to form masks (e.g., first mask 2205 and third mask 2209 shown in FIG. 22). Curing the first liquid can comprise heating the first liquid 2107, irradiating the first liquid 2107 with ultraviolet (UV) radiation, and/or waiting a predetermined amount of time (e.g., from about 30 minutes to 24 hours, from about 1 hour to about 8 hours). In some embodiments, another method (e.g., chemical vapor deposition (CVD) (e.g., low-pressure CVD, plasma-enhanced CVD), physical vapor deposition (PVD) (e.g., evaporation, molecular beam epitaxy, ion plating), atomic layer deposition (ALD), sputtering, spray pyrolysis, chemical bath deposition, sol-gel deposition) may be used to form the mask(s) (e.g., masks 2205, 2207, 2209, and 2211). As shown in FIG. 22, the result of step 1503 can comprise a first mask 2205 disposed over the first surface area 223, a second mask 2207 disposed over a second surface area 225, a third mask 2209 disposed over a third surface area 233, and/or a fourth mask 2211 disposed over a fourth surface area 235. In some embodiments, a material of the mask can comprise titanium dioxide ($TiO_2$), zirconia ($ZrO_2$), tin oxide ($SnO_2$), alumina ($Al_2O_3$), silica ($SiO_2$), silicon nitride ($Si_3N_4$), and/or combinations thereof, although other materials for masks can be used in other embodiments.

After step 1503, as shown in FIG. 22, methods can proceed to step 1505 comprising etching the foldable substrate 206. In some embodiments, as shown, etching can comprise exposing the foldable substrate 206 to an etchant 2203. In further embodiments, as shown, the etchant 2203 can be a liquid etchant contained in an etchant bath 2201. In even further embodiments, the etching solution can comprise one or more mineral acids (e.g., HCl, HF, $H_2SO_4$, $HNO_3$). In some embodiments, as shown, etching can comprise etching the central portion 281 of the first major surface 203 to form a first central surface area 209. In further embodiments, as shown, the first central surface area 209 can comprise a portion of the third inner surface 208. In further embodiments, as shown, the etching can form the first recess 234 between the first plane 204a and the first central surface area 209. In some embodiments, a depth of the first recess 234 can be substantially equal to the first outer thickness 217 of the first outer layer 213 (see FIGS. 2-3 and 5). In some embodiments, although not shown, a depth of the first recess can be greater than the first thickness of the first outer layer. In some embodiments, as shown, etching can comprise etching the central portion 281 of the second major surface 205 to form a second central surface area 219. In further embodiments, as shown, the second central surface area 219 can comprise a portion of the fourth inner surface 218. In further embodiments, as shown, the etching can form the second recess 244 between the second plane 204b and the second central surface area 219. In some embodiments, a depth of the second recess 244 can be substantially equal to the second outer thickness 237 of the first outer layer 213 (see FIGS. 2-3 and 5). In some embodiments, although not shown, a depth of the second recess can be greater than the second thickness of the second outer layer.

Figure 23:
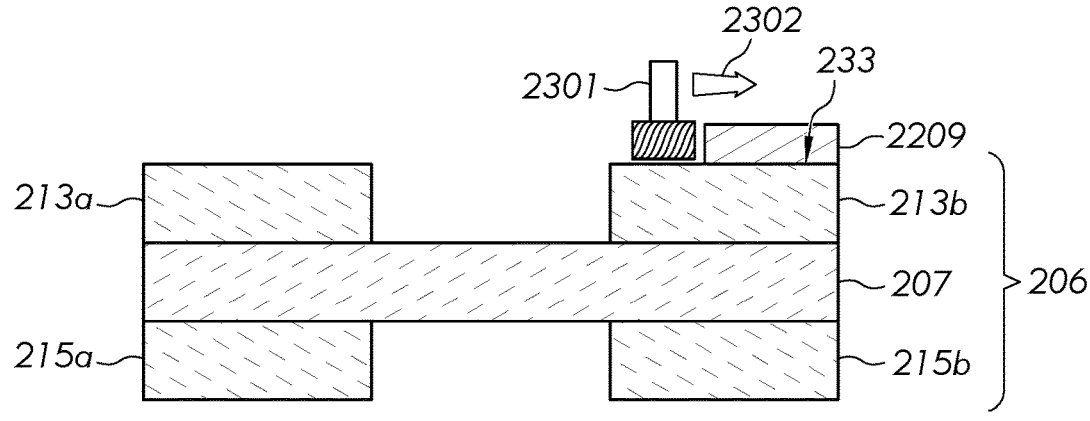

After step 1505, as shown in FIG. 23, methods can proceed to step 1507 comprising removing the mask(s). In some embodiments as shown, removing the mask(s) (e.g., masks 2205, 2207, 2209, and 2211) can comprise moving a grinding tool 2301 in a direction 2302 across the surface (e.g., third surface area 233). In even further embodiments, using the tool may comprise sweeping, scraping, grinding, pushing, etc. In further embodiments, the mask(s) (e.g., masks 2205, 2207, 2209, and 2211) can be removed by washing the surface (e.g., first surface area 223, second surface area 225, third surface area 233, fourth surface area 235) with a solvent. In some embodiments, removing the mask(s) can comprise removing the masks 2205, 2207, 2209, and 2211 from the first surface area 223, the second surface area 225, the third surface area 233, and the fourth surface area 235, respectively.

In addition, or alternatively, step 1501, 1507, or 1517 can comprise reducing the thickness of the foldable substrate 206 by removing a sub-layer from the second major surface 205 of the foldable substrate 206 to expose a new second major surface that can comprise the second major surface 205 illustrated in FIGS. 2-3 and 6 (e.g., by mechanically working, by etching, by lithography, by ablation). Removing sub-layers from both the first major surface and the second major surface can remove the outer sub-layers of the foldable substrate 206 that may have inconsistent optical properties than the underlying interior portions of the corresponding layer of the foldable substrate 206. Consequently, an entire thickness throughout the length and the width of the corresponding layer of the foldable substrate 206 may have more consistent optical properties to provide consistent optical performance with little or no distortions across the entire foldable substrate 206. Removing the sub-layer from the first major surface 203 and/or the sub-layer from the second major surface 205 can be beneficial to remove surface imperfections generated during formation of the first recess 234 and/or the second recess 244. For example, mechanically working the first major surface 203 and/or the second major surface 205 (e.g., with a diamond tip probe) to generate the first recess 234 and/or the second recess 244 may generate micro-crack surface flaws or other imperfections that can present points of weakness where catastrophic failure of the foldable substrate 206 may occur upon folding. Thus, by removing the sub-layer from the first major surface 203 and/or the sub-layer from the second major surface 205, surface imperfections generated in the sub-layer during formation of the first recess 234 and/or the second recess 244 may be removed where a new first major surface and/or a new second major surface with fewer surface imperfections can be presented. As fewer surface imperfections are present, a smaller bend radius may be achieved without failure of the foldable substrate. For example, some processing of foldable substrates may present differences in glass-based material properties and/or ceramic-based material properties at the first major surface and the second major surface of the foldable substrate than central portions of the foldable substrate. For example, during a down-draw process, properties of a glass-based material and/or a ceramic-based material at the major surfaces may be different than central portions.

Figure 24:
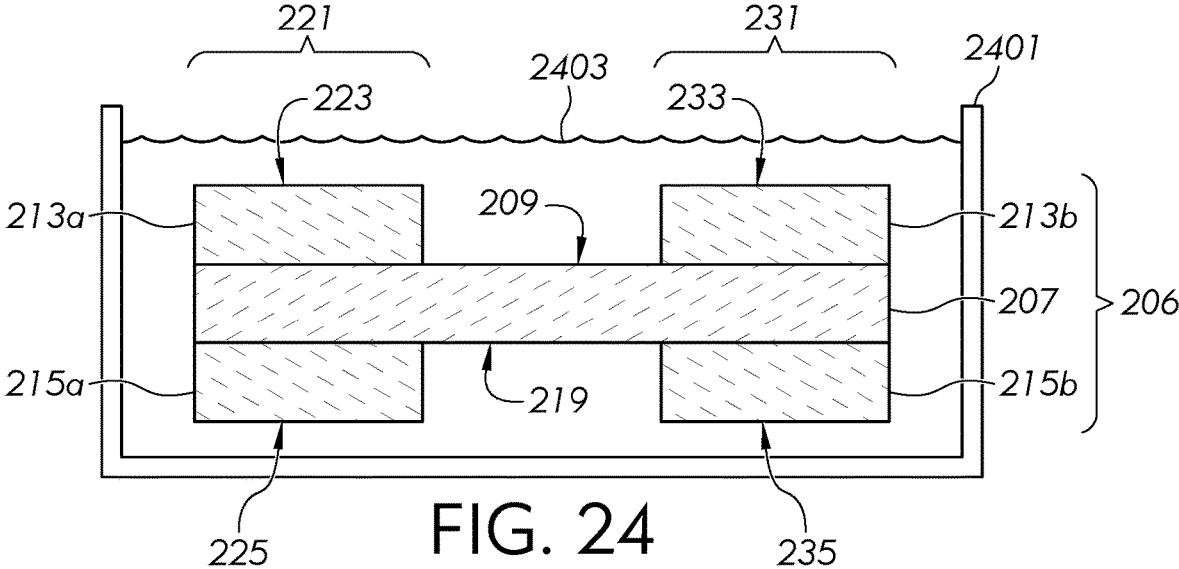

After step 1501, 1507, or 1517, as shown in FIG. 24, methods can proceed to step 1509 comprising chemically strengthening the foldable substrate 206. Chemically strengthening a foldable substrate 206 (e.g., glass-based substrate and/or ceramic-based substrate of the first outer layer, second outer layer, and/or core layer) by ion exchange can occur when a first cation within a depth of a surface of a foldable substrate 206 is exchanged with a second cation within a molten salt or salt solution 2403 that has a larger radius than the first cation. For example, a lithium cation within the depth of the surface of the foldable substrate 206 can be exchanged with a sodium cation or potassium cation within a salt solution 2403. Consequently, the surface of the foldable substrate 206 is placed in compression and thereby chemically strengthened by the ion exchange process since the lithium cation has a smaller radius than the radius of the exchanged sodium cation or potassium cation within the salt solution 2403. Chemically strengthening the foldable substrate 206 can comprise contacting at least a portion of a foldable substrate 206 comprising lithium cations and/or sodium cations with a salt bath 2401 comprising salt solution 2403 comprising potassium nitrate, potassium phosphate, potassium chloride, potassium sulfate, sodium chloride, sodium sulfate, sodium nitrate, and/or sodium phosphate, whereby lithium cations and/or sodium cations diffuse from the foldable substrate 206 to the salt solution 2403 contained in the salt bath 2401. In some embodiments, the temperature of the salt solution 2403 can be about 300° C. or more, about 360° C. or more, about 400° C. or more, about 500° C. or less, about 460° C. or less, or about 400° C. or less. In some embodiments, the temperature of the salt solution 2403 can be in a range from about 300° C. to about 500° C., from about 360° C. to about 500° C., from about 400° C. to about 500° C., from about 300° C. to about 460° C., from about 360° C. to about 460° C., from about 400° C. to about 460° C., from about 300° C. to about 400° C., from about 360° C. to about 400° C., or any range or subrange therebetween. In some embodiments, the foldable substrate 206 can be in contact with the salt solution 2403 for about 15 minutes or more, about 1 hour or more, about 3 hours or more, about 48 hours or less, about 24 hours or less, or about 8 hours or less. In some embodiments, the foldable substrate 206 can be in contact with the salt solution 2403 for a time in a range from about 15 minutes to about 48 hours, from about 1 hour to about 48 hours, from about 3 hours to about 48 hours, from about 15 minutes to about 24 hours, from about 1 hour to about 24 hours, from about 3 hours to about 48 hours, from about 3 hours to about 24 hours, from about 3 hours to about 8 hours, or any range or subrange therebetween.

Chemically strengthening the foldable substrate 206 can comprise chemically strengthening the first central surface area 209, chemically strengthening the first surface area 223, chemically strengthening the third surface area 233, chemically strengthening the second surface area 225, chemically strengthening the fourth surface area 235, and chemically strengthening the second central surface area 219. In some embodiments, chemically strengthening can comprise chemically strengthening the first portion 221 to a first depth of compression from the first surface area 223 of the first major surface 203, chemically strengthening the first portion 221 to a second depth of compression from the second surface area 225 of the second major surface 205, chemically strengthening the second portion 231 to a third depth of compression from the third surface area 233 of the first major surface 203, chemically strengthening the second portion 231 to a fourth depth of compression from the fourth surface area 235 of the second major surface 205, chemically strengthening the central portion 281 to a first central depth of compression from the first central surface area 209, and/or chemically strengthening the central portion 281 to a second central depth of compression from the second central surface area 219.

After step 1509, the foldable substrate 206 can comprise one or more compressive stress regions (e.g., first, second, third, fourth, first central, and/or second central compressive stress region(s)) comprising a depth of compression and/or an associated depth of layer within the one or more ranges discussed above in regards to the corresponding compressive stress region. In further embodiments, an absolute difference between a depth of layer between one of the first depth of layer, second depth of layer, third depth of layer, or fourth depth of layer divided by the substrate thickness and the first central depth of layer or second central depth of layer divided by the central thickness can be within one or more of the ranges discussed above. In further embodiments, an absolute difference between a depth of compression between one of the first depth of compression, second depth of compression, third depth of compression, or fourth depth of compression divided by the substrate thickness and the first central depth of compression or second central depth of compression divided by the central thickness can be within one or more of the ranges discussed above. In further embodiments, an absolute difference between the first average concentration of potassium or the second average concentration of potassium and the central average concentration of potassium can be within one or more of the ranges discussed above.

Figures 50, 51, 52:
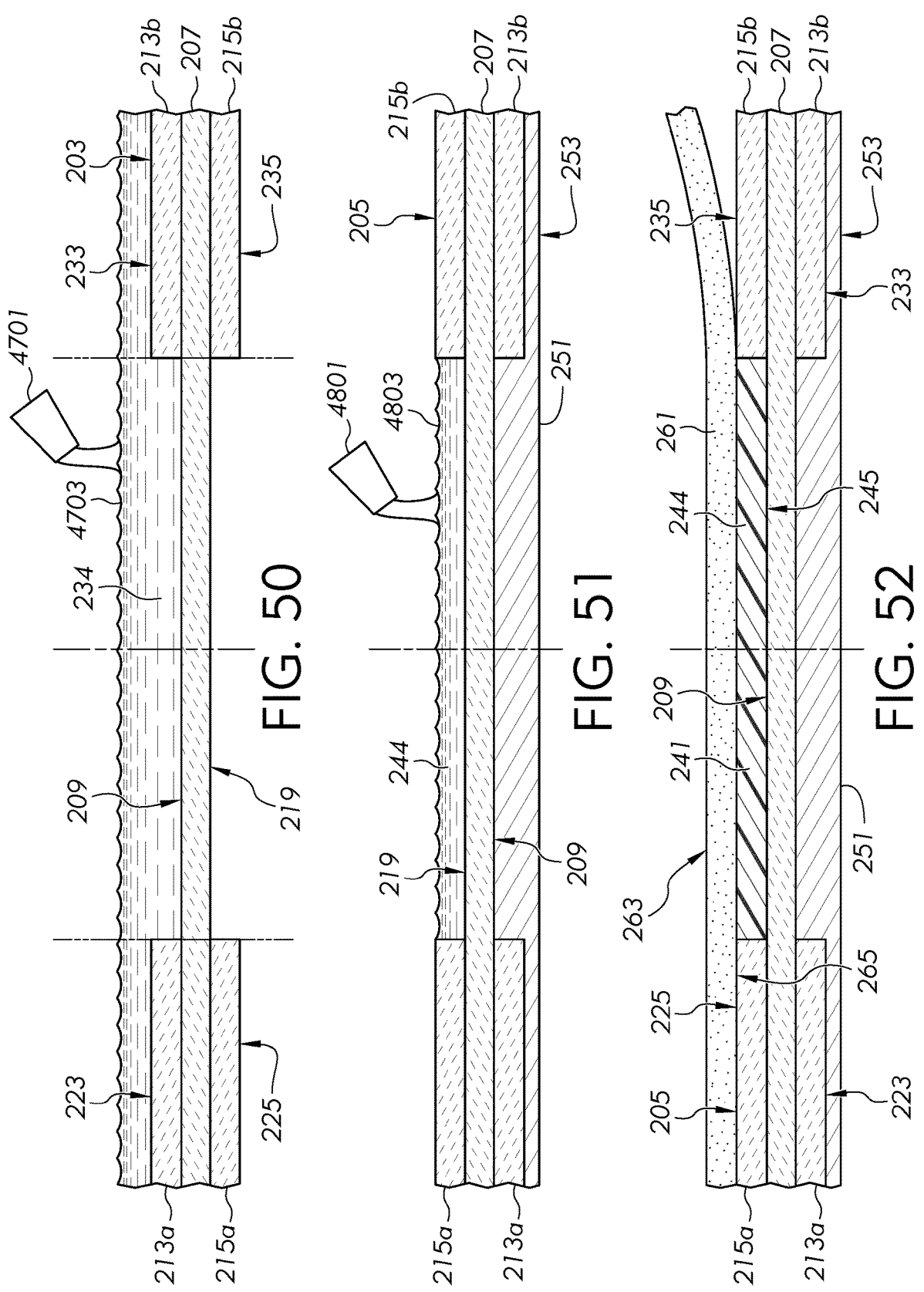

After step 1509, as shown in FIG. 50, methods of the disclosure can proceed to step 1511 comprising disposing a coating 251 over the first major surface 203 and/or in the first recess 234. In some embodiments, as shown, a second liquid 4703 can be disposed over the first major surface 203. In further embodiments, the second liquid 4703 can be disposed over the first surface area 223 of the first portion 221 and the third surface area 233 of the second portion 231. In further embodiments, the second liquid 4703 can be disposed over the first central surface area 209 and/or fill the first recess 234. In further embodiments, as shown, a container 4701 (e.g., conduit, flexible tube, micropipette, or syringe) may be used to dispose the second liquid 4703. In some embodiments, the second liquid 4703 may comprise a coating precursor, a solvent, particles, nanoparticles, and/or fibers. In some embodiments, the coating precursor can comprise, without limitation, one or more of a monomer, an accelerator, a curing agent, an epoxy, and/or an acrylate. In some embodiments, the solvent for the adhesive precursor may comprise a polar solvent (e.g., water, an alcohol, an acetate, acetone, formic acid, dimethylformamide, acetonitrile, dimethyl sulfoxone, nitromethane, propylene carbonate, poly(ether ether ketone)) and/or a non-polar solvent (e.g., pentane, 1,4-dioxane, chloroform, dichloromethane, diethyl ether, hexane, heptane, benzene, toluene, xylene). The second liquid 4703 can be cured to form a coating 251, as shown in FIG. 51. Curing the second liquid 4703 can comprise heating the second liquid 4703, irradiating the second liquid 4703 with ultraviolet (UV) radiation, and/or waiting a predetermined amount of time (e.g., from about 30 minutes to 24 hours, from about 1 hour to about 8 hours). In some embodiments, another method (e.g., chemical vapor deposition (CVD) (e.g., low-pressure CVD, plasma-enhanced CVD), physical vapor deposition (PVD) (e.g., evaporation, molecular beam epitaxy, ion plating), atomic layer deposition (ALD), sputtering, spray pyrolysis, chemical bath deposition, sol-gel deposition) may be used to form the coating 251. In some embodiments, although not shown, the coating 251 can be disposed in the first recess 234 (e.g., fill the first recess 234) without contacting the first major surface 203 (e.g., first surface area 223, third surface area 233).

After step 1509 or 1511, as shown in FIG. 51, methods of the disclosure can proceed to step 1513 comprising disposing a material in the second recess 244. In some embodiments, as shown, a third liquid 4803 can be disposed in the second recess 244. In some embodiments, the third liquid 4803 can comprise a precursor, a solvent, particles, nanoparticles, and/or fibers. In further embodiments, as shown, the third liquid 4803 can be disposed in the second recess 244 from a container 4801, although other methods may be used to deposit the third liquid or other material in the second recess, as discussed above with regards to the first recess and/or the second liquid. In some embodiments, the third liquid 4803 can be cured (e.g., heating the third liquid, irradiating the third liquid, waiting a specified amount of time) to form a polymer-based portion 241 in the second recess 244 as shown in FIG. 52. In some embodiments, although not shown, the third liquid can be cured to form an adhesive layer, for example resembling the adhesive layer 261, disposed in the second recess 244.

After step 1511 or 1513, methods of the disclosure can proceed to step 1515 comprising assembling the foldable apparatus using the foldable substrate 206. As shown in FIG. 52, step 1515 can comprise applying an adhesive layer 261 to contact the second surface area 225 of the second major surface 205 and the fourth surface area 235 of the second major surface 205. For example, in some embodiments, the adhesive layer 261 can comprise one or more sheets of an adhesive material. In some embodiments, there can be an integral interface between the one or more sheets comprising the adhesive layer 261 and/or the material disposed in the second recess (e.g., polymer-based portion 241), which can reduce (e.g., avoid) optical diffraction and/or optical discontinuities as light travels between the sheets since the one or more sheets can, in some embodiments, include substantially the same index of refraction. In some embodiments, although not shown, at least a portion of the adhesive layer can be disposed in the second recess. In some embodiments, a release liner (e.g., see release liner 271 in FIGS. 2 and 4) or a display device (e.g., see display device 307 in FIGS. 3 and 5) may be disposed on the adhesive layer 261 (e.g., first contact surface 263). After step 1515, methods of the disclosure according to the flow chart in FIG. 15 of making the foldable apparatus can be complete at step 1519.

Figures 15, 16:
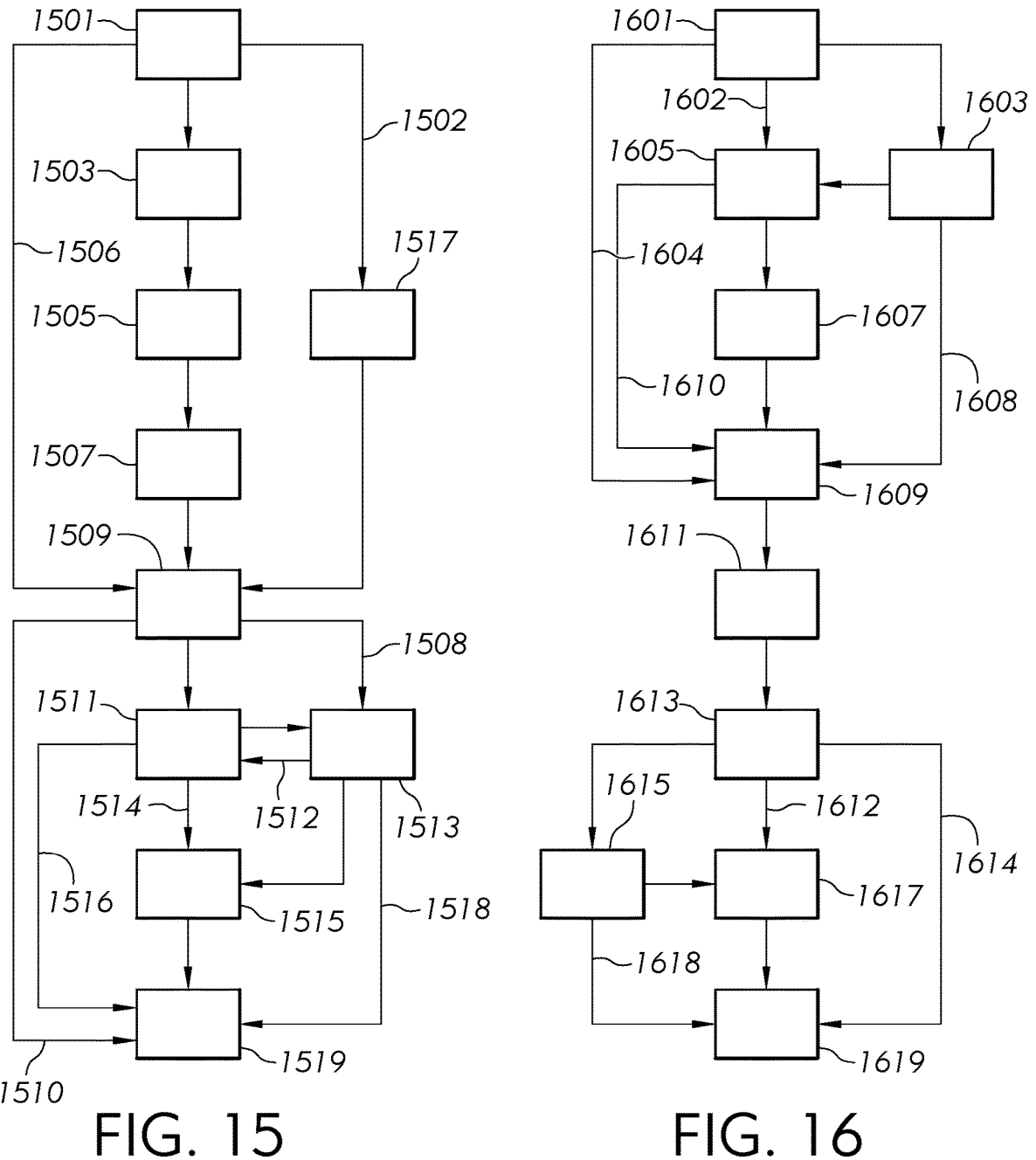

In some embodiments, methods of making a foldable apparatus in accordance with embodiments of the disclosure can proceed along steps 1501, 1503, 1505, 1507, 1509, 1511, 1513, 1515, and 1519 of the flow chart in FIG. 15 sequentially, as discussed above. In some embodiments, as shown in FIG. 15, arrow 1502 can be followed from step 1501 omitting step 1503, for example, when a recess or recesses are to be formed in the foldable substrate 206 by mechanically working the foldable substrate (e.g., instead of chemically etching the foldable substrate to form the recess(es)). In some embodiments, arrow 1506 can be followed from step 1501 to step 1509 comprising chemically strengthening the foldable substrate, for example, if the foldable apparatus comprised the recesses at the end of step 1501. In some embodiments, arrow 1508 can be followed from step 1509 to step 1513 comprising disposing a material in the second recess. In further embodiments, methods can follow arrow 1512 from step 1513 to step 1511 comprising disposing a coating 251 over the first major surface and/or in the first recess 234. In further embodiments, methods can follow arrow 1518 from step 1513 to step 1519, for example, if the foldable apparatus fully assembled at the end of step 1513 or if another material is to be disposed in the first recess, over the first major surface, and/or over the second major surface. In some embodiments, methods can follow arrow 1510 from step 1509 to step 1519, for example, if the foldable substrate 206 is the desired product (e.g., without a material in the first recess or second recess). Any of the above options may be combined to make a foldable apparatus in accordance with embodiments of the disclosure.

Example embodiments of making the foldable apparatus 401, 501, and/or 1201 and/or foldable substrate 407 illustrated in FIGS. 4-5, 7, and 12 will now be discussed with reference to FIGS. 25-34 and 47-49 and the flow chart in FIG. 16. In a first step 1601 of methods of the disclosure, methods can start with providing a foldable substrate 407 and/or foldable substrate 2505 (see FIGS. 25-27). In some embodiments, the foldable substrate 407 and/or foldable substrate 2505 may be provided by purchase or otherwise obtaining a substrate or by forming the foldable substrate. In some embodiments, the foldable substrate 407 and/or foldable substrate 2505 can comprise a glass-based substrate and/or a ceramic-based substrate. In further embodiments, glass-based substrates and/or ceramic-based substrates can be provided by forming them with a variety of ribbon forming processes, for example, slot draw, down-draw, fusion down-draw, up-draw, press roll, redraw or float. In further embodiments, ceramic-based substrates can be provided by heating a glass-based substrate to crystallize one or more ceramic crystals. The foldable substrate 407 and/or foldable substrate 2505 may comprise a second major surface 405 (see FIG. 27) that can extend along a plane. The second major surface 405 can be opposite a first major surface 403.

In some embodiments, in step 1601, the foldable substrate 407 can be provided with a first recess 434 in the first major surface 403 of the foldable substrate 407 and/or the foldable substrate 2505 that exposes a first central surface area 409 of the foldable substrate 407 and/or the foldable substrate 2505 in the central portion 481. In some embodiments, in step 1601, the foldable substrate 407 can be provided with a second recess 444 in the second major surface 405 of the foldable substrate 407 and/or the foldable substrate 2505 that exposes a second central surface area 419 of the foldable substrate 407 and/or the foldable substrate 2505 in the central portion 481. In further embodiments, although not shown, the first central surface area 409 and/or the second central surface area 419 can comprise a transition region (e.g., resembling transition regions 853 and/or 855). In further embodiments, the recess(es) (e.g., first recess 434, second recess 444) may be formed by etching, laser ablation or mechanically working the first major surface 403 and/or second major surface 405. For example, mechanically working the foldable substrate 407 and/or the foldable substrate 2505 may resemble step 1603 discussed below. In some embodiments, in step 1601, the foldable substrate 407 can be provided with one or more initial compressive stress regions, for example, with one or more of the properties discussed below with reference to step 1605.

Figure 26:
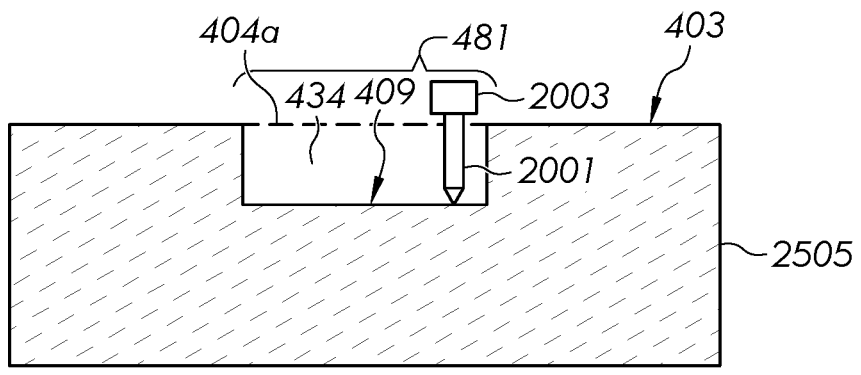

After step 1601, in some embodiments, methods can proceed to step 1603 comprising forming a first recess 434 and/or a second recess 444. In some embodiments, the recess(es) can be formed by mechanically working the first major surface 403 and/or the second major surface 405 of the foldable substrate 407 and/or the foldable substrate 2505. The first recess 434 may be formed in the first major surface 403 of the foldable substrate 407 and/or the foldable substrate 2505 that exposes a first central surface area 409 of central portion 481. The second recess 444 may be formed in the second major surface 405 of the foldable substrate 407 and/or the foldable substrate 2505 that exposes a second central surface area 419 of the central portion 481. For example, the first major surface 403 and/or second major surface 405 may be mechanically worked by diamond engraving to produce very precise patterns in glass-based substrates and/or ceramic-based substrates. As shown in FIG. 26, diamond engraving can be used to create the first recess 434 in the first major surface 403 of the foldable substrate 407 and/or the foldable substrate 2505 where a diamond-tip probe 2001 can be controlled using a computer numerical control (CNC) machine 2003. Materials other than diamond can be used for engraving with a CNC machine. In some embodiments, although not shown, a similar process may be used to form the second recess 444 that may be opposite the first recess 434. It is to be understood that other methods of forming the recess(es) can be used, for example, lithography and laser ablation. After step 1603, in some embodiments, the foldable substrate 2505 can comprise the foldable substrate 407 comprising the first recess 434 and/or the second recess 444.

Figure 27:
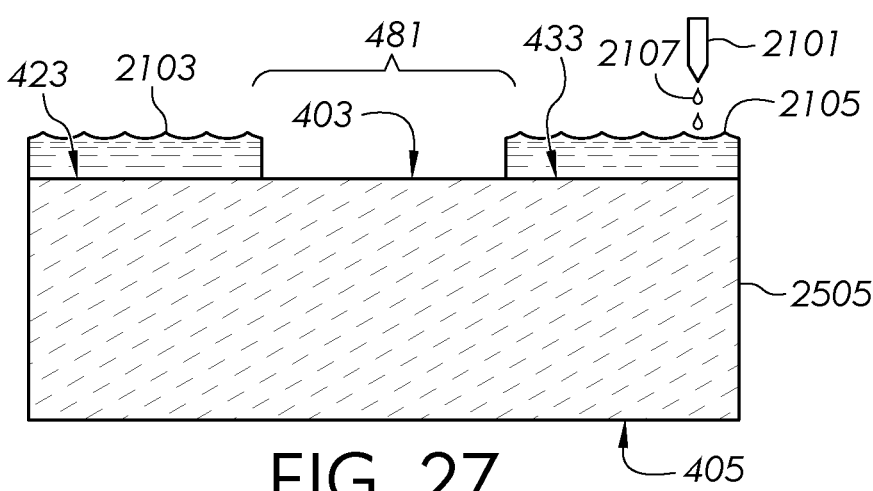
Figure 28:
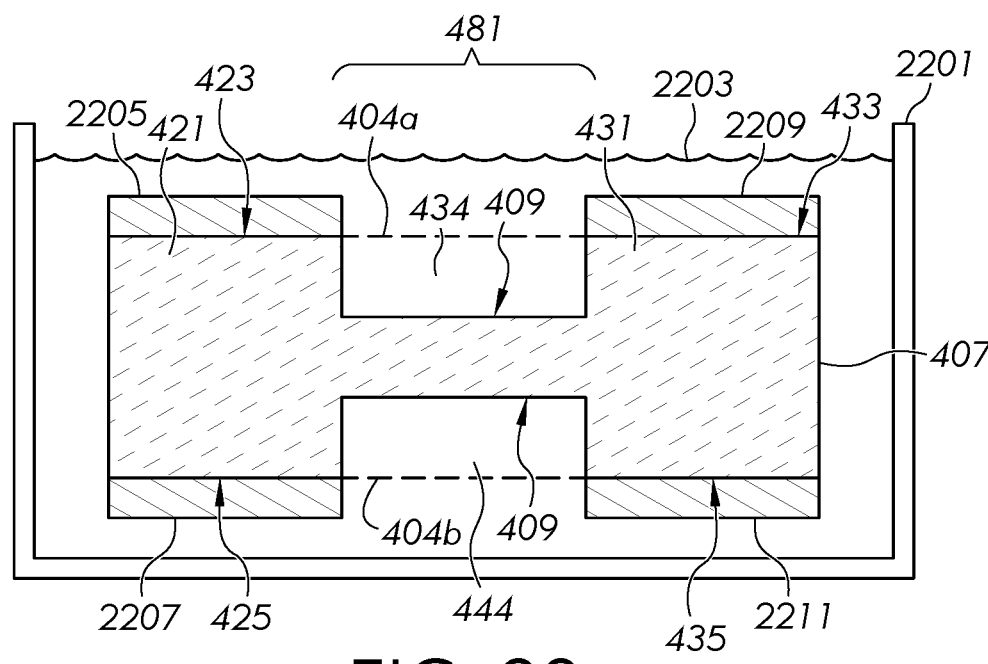
Figure 29:
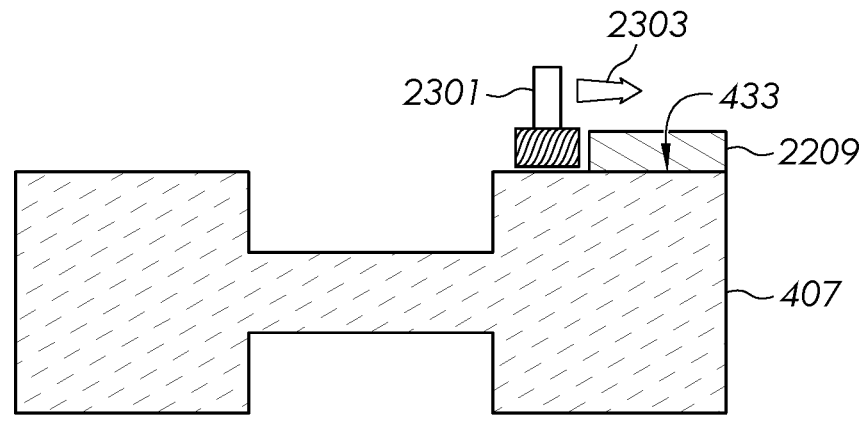

In some embodiments, step 1603 can comprise an etching process to form the first recess and/or second recess (e.g., masking, etching, and removing the mask(s) similar to steps 1503, 1505, and 1507 discussed above). In further embodiments, as shown in FIG. 27, step 1603 can comprise disposing a mask over one or more portions of the foldable substrate 407 and/or foldable substrate 2505. In further embodiments, as shown, step 1603 can comprise disposing a first liquid 2107 over one or more portions of the foldable substrate 407 and/or foldable substrate 2505. In further embodiments, as shown and discussed above with reference to step 1503, a container 2101 may be used to dispose the first liquid 2107 over one or more portions of the foldable substrate 407 and/or foldable substrate 2505. In further embodiments, as shown, the first liquid 2107 can be disposed over the first surface area 423 as a first liquid deposit 2103 and over the third surface area 433 as a second liquid deposit 2105. Although not shown, it is to be understood that similar liquid deposits can be formed over the second surface area and/or the fourth surface area. In further embodiments, the liquid deposits (e.g., first liquid deposit 2103 and second liquid deposit 2105 shown in FIG. 27) can be cured to form masks (e.g., first mask 2205 and third mask 2209 shown in FIG. 28). Curing the first liquid can comprise heating the first liquid 2107, irradiating the first liquid 2107 with ultraviolet (UV) radiation, and/or waiting a predetermined amount of time. In further embodiments, another method, as discussed above, may be used to form the mask(s) (e.g., masks 2205, 2207, 2209, and 2211). As shown in FIG. 28, a first mask 2205 can be disposed over the first surface area 423, a second mask 2207 can be disposed over a second surface area 425, a third mask 2209 can be disposed over a third surface area 433, and/or a fourth mask 2211 can be disposed over a fourth surface area 435. In further embodiments, as shown in FIG. 28, step 1603 can further comprise etching the foldable substrate 407 and/or foldable substrate 2505. In further embodiments, as shown, etching can comprise exposing the foldable substrate 407 and/or foldable substrate 2505 to an etchant 2203 (e.g., one or more mineral acids). In further embodiments, as shown, the etchant 2203 can be a liquid etchant contained in an etchant bath 2201. In further embodiments, as shown, etching can comprise etching the central portion 481 of the first major surface 403 to form a first central surface area 409. In further embodiments, as shown, the etching can form the first recess 434 between the first plane 404a and the first central surface area 409. In even further embodiments, the first recess 434 can be recessed from the first plane 404a and/or the first major surface 403 by the first distance 417. In further embodiments, as shown, etching can comprise etching the central portion 481 of the second major surface 405 to form a second central surface area 419. In further embodiments, as shown, the etching can form the second recess 444 between the second plane 404b and the second central surface area 419. In even further embodiments, the second recess 444 can be recessed from the second plane 404b and/or the second major surface 405 by the second distance 437. In even further embodiments, step 1603 can further comprise removing the mask(s). In some embodiments, as shown in FIG. 29, removing the mask(s) (e.g., masks 2205, 2207, 2209, and 2211) can comprise moving a grinding tool 2301 in a direction 2302 across the surface (e.g., third surface area 433). In even further embodiments, using the tool may comprise sweeping, scraping, grinding, pushing, etc. In further embodiments, the mask(s) (e.g., masks 2205, 2207, 2209, and 2211) can be removed by washing the surface (e.g., first surface area 423, second surface area 425, third surface area 433, fourth surface area 435) with a solvent. In some embodiments, removing the mask(s) can comprise removing the masks 2205, 2207, 2209, and 2211 from the first surface area 423, the second surface area 425, the third surface area 433, and the fourth surface area 435, respectively. After step 1603, in some embodiments, the foldable substrate 2505 can comprise the foldable substrate 407 comprising the first recess 434 and/or the second recess 444.

In addition, or alternatively, step 1601 and/or 1603 can comprise reducing the thickness of the foldable substrate 407 and/or foldable substrate 2505 by removing a sub-layer from the second major surface 205 of the foldable substrate 407 and/or foldable substrate 2505 to expose a new second major surface that can comprise the second major surface 405 illustrated in FIGS. 4-5 and 7 (e.g., by mechanically working, by etching, by lithography, by ablation). As discussed above, removing sub-layers from both the first major surface and the second major surface can remove the outer sub-layers of the foldable substrate 407 and/or foldable substrate 2505 that may have inconsistent optical properties than the underlying interior portions of the corresponding layer of the foldable substrate 407 and/or foldable substrate 2505, for example, having more consistent optical properties to provide consistent optical performance with little or no distortions across the entire foldable substrate 407 and/or foldable substrate 2505407 and/or foldable substrate 2505, removing surface imperfections generated during formation of the recess(es).

Figure 25:
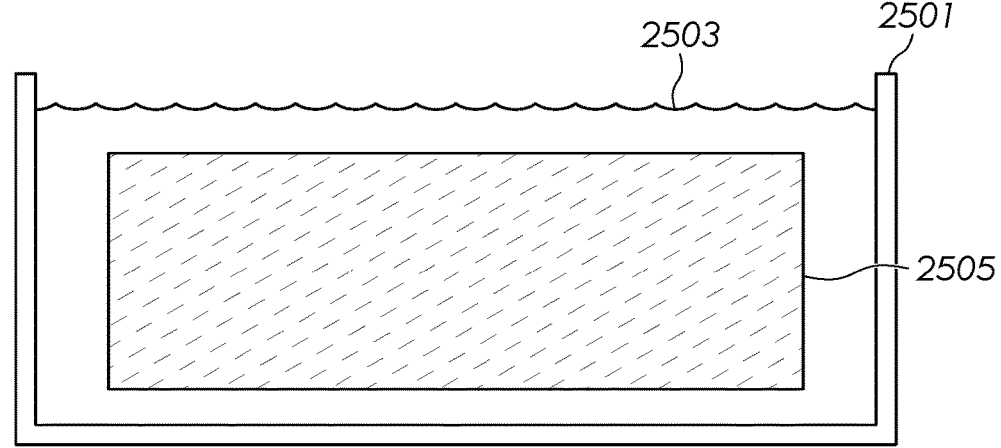
Figure 30:
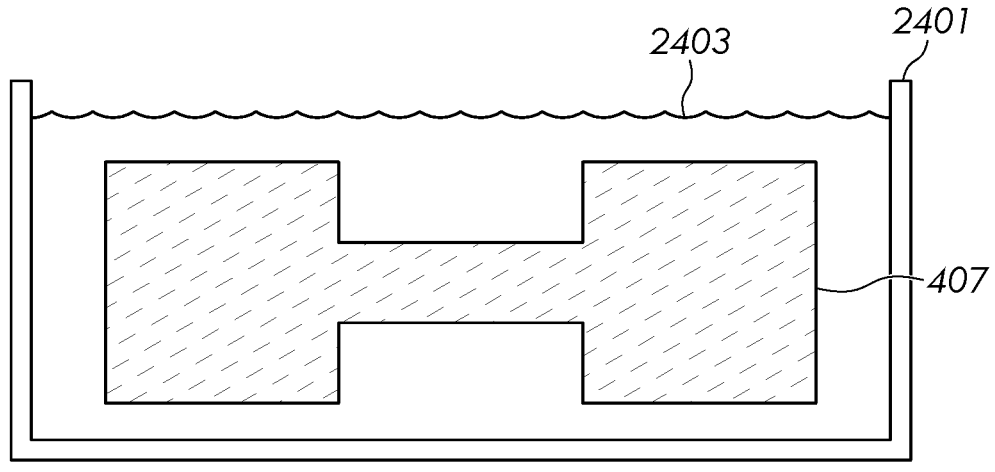

After step 1601 or 1603, as shown in FIGS. 25 and 30, methods can proceed to step 1605 comprising chemically strengthening the foldable substrate 407. In some embodiments, as shown, chemically strengthening the foldable substrate 407 can comprise contacting at least a portion of a foldable substrate 407 comprising lithium cations and/or sodium cations with a salt bath 2401 comprising salt solution 2403, which can comprise one or more of the components discussed above for the salt solution 2403 with respect to step 1509. In some embodiments, the temperature of the salt solution 2403 and/or the time that the foldable substrate 407 can contact the salt solution 2403 can be within one or more of the ranges discussed above with reference to step 1509. In some embodiments, chemically strengthening the foldable substrate 407 in step 1605 can comprise chemically strengthening the first central surface area 409 to form an initial first central compressive stress region extending to an initial first central depth of compression from the first central surface area 409, chemically strengthening the first surface area 423 to form an initial first compressive stress region extending to an initial first depth of compression from the first surface area 423, chemically strengthening the third surface area 433 to form an initial third depth of compression extending to an initial third depth of compression from the third surface area 433, chemically strengthening the second surface area 425 to form an initial second depth of compression extending to an initial second depth of compression from the second surface area 425, chemically strengthening the fourth surface area 435 to form an initial fourth compressive stress region extending to an initial fourth depth of compression from the fourth surface area 435, and chemically strengthening the second central surface area 419 to form an initial second central depth of compression extending to an initial second central depth of compression from the second central surface area 419.

After step 1601 or 1605, the foldable substrate 206 can comprise one or more initial compressive stress regions (e.g., first, second, third, fourth, first central, and/or second central compressive stress region(s)) comprising an initial depth of compression and/or an associated initial depth of layer. In some embodiments, the initial first depth of compression, initial second depth of compression, initial third depth of compression, and/or initial fourth depth of compression as a percentage of the substrate thickness 411 can be about 5% or more, 10% or more, about 12% or more, about 14% or more, about 25% or less, about 20% or less, about 18% or less, or about 16% or less. In some embodiments, the initial first depth of compression, initial second depth of compression, initial third depth of compression, and/or initial fourth depth of compression as a percentage of the substrate thickness 411 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of compression, initial second depth of compression, initial third depth of compression, and/or initial fourth depth of compression as a percentage of the corresponding depth of compression of the finished foldable substrate 407 can be about 50% or more, about 60% or more, about 65% or more, about 68% or more, about 80% or less, about 75% or less, or about 72% or less, or about 70% or less. In some embodiments, the initial first depth of compression, initial second depth of compression, initial third depth of compression, and/or initial fourth depth of compression as a percentage of the corresponding depth of compression of the finished foldable substrate 407 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween. In some embodiments, the initial first depth of layer, initial second depth of layer, initial third depth of layer, and/or initial fourth depth of layer as a percentage of the substrate thickness 411 can be about 5% or more, 10% or more, about 12% or more, about 14% or more, about 25% or less, about 20% or less, about 18% or less, or about 16% or less. In some embodiments, the initial first depth of layer, initial second depth of layer, initial third depth of layer, and/or initial fourth depth of layer as a percentage of the substrate thickness 411 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of layer, initial second depth of layer, initial third depth of layer, and/or initial fourth depth of layer as a percentage of the corresponding depth of layer of the finished foldable substrate 407 can be about 50% or more, about 60% or more, about 65% or more, about 68% or more, about 80% or less, about 75% or less, or about 72% or less, or about 70% or less. In some embodiments, the initial first depth of layer, initial second depth of layer, initial third depth of layer, and/or initial fourth depth of layer as a percentage of the corresponding depth of compression of the finished foldable substrate 407 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween.

After step 1605, although not shown, methods can proceed to step 1607 comprising etching the foldable substrate to remove a sub-layer from the existing first central surface area and/or existing the second central surface area. In some embodiments, as discussed above with reference to steps 1503, 1505, and 1507 or as discussed below with reference to steps 1707, 1709, and 1711, step 1605 can comprise disposing mask(s) over the first surface area 423, the second surface area 425, the third surface area 433, and/or the fourth surface area 435 before exposing the foldable substrate 407 (e.g., existing first central surface area and/or existing second central surface area) to an etchant (e.g., etchant 2203) after which the mask(s) can be removed. In further embodiments, a depth removed from central portion 481 (e.g., first central surface area, second central surface area) can be substantially equal to the corresponding depth of layer and/or depth of compression that the corresponding compressive stress region extends from the corresponding surface. In further embodiments, a depth removed from central portion 481 (e.g., first central surface area, second central surface area) can be greater than the corresponding depth of layer and/or depth of compression that the corresponding compressive stress region extends from the corresponding surface. In further embodiments, a depth removed from central portion 481 (e.g., first central surface area, second central surface area) can be less than the corresponding depth of layer and/or depth of compression that the corresponding compressive stress region extends from the corresponding surface.

Figure 31:
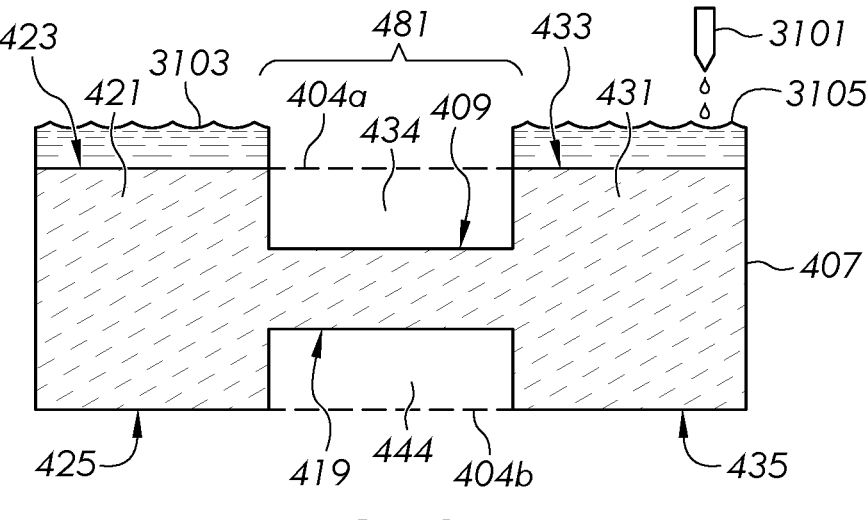

After step 1601, 1603, 1605, or 1607, as shown in FIG. 31, methods can proceed to step 1609 comprise applying a paste comprising alkali metal ions to the first portion 421 and the second portion 431. In some embodiments, as shown, step 1609 can comprise disposing a first salt paste 3103 on the first portion 421 and a first salt paste 3105 on the second portion 431 from a source 3101. In further embodiments, as shown, the first salt paste 3103 can be applied to the first surface area 423 of the first portion 421 and the first salt paste 3105 can be applied to the third surface area 433 of the second portion 431. In further embodiments, although not shown, the first salt paste (e.g., first salt paste 3103 and/or 3105) can be applied to the second surface area 425 of the first portion 421 and the fourth surface area 435 of the second portion 231. In some embodiments, the source 3101 may comprise a conduit (e.g., flexible tube, micropipette, or syringe), a spray nozzle, or a vessel (e.g., beaker). The first salt paste 3103 can be disposed on the first portion 421 and the second portion 431 can be cured to form the first salt deposits 3205, 3207, 3209, and/or 3211 as shown in FIGS. 32-33.

As used herein, the salt paste contains potassium and/or sodium. In some embodiments, the first salt paste 3103 and 3105 can comprise one or more of one or more of potassium nitrate, potassium phosphate, potassium chloride, potassium sulfate, sodium chloride, sodium sulfate, sodium nitrate, and/or sodium phosphate. In further embodiments, the first salt paste can comprise potassium nitrate and potassium phosphate. In further embodiments, the first salt paste can be substantially free from alkali earth metals (e.g., alkali earth metal ions, alkali earth metal-containing compounds). As used herein, alkali earth metals include beryllium, magnesium, calcium, strontium, barium, and radium. In further embodiments, the first salt paste can contain a concentration of potassium and/or sodium on an oxide basis of about 1,000 ppm or more, about 5,000 ppm or more, about 10,000 ppm or more, about 25,000 ppm or more, about 500,000 ppm or less, about 200,000 ppm or less, about 100,000 ppm or less, or about 50,000 ppm or less. In further embodiments, the first salt paste can contain a concentration of potassium and/or sodium on an oxide basis in a range from about 1,000 ppm to about 500,000 ppm, from about 5,000 ppm to about 500,000, from about 5,000 ppm to about 200,000 ppm, from about 10,000 ppm to about 200,000 ppm, from about 10,000 ppm to about 100,000, from about 25,000 ppm to about 100,000 ppm, from about 25,000 ppm to about 50,000 ppm, or any range or subrange therebetween.

In some embodiments, the first salt paste 3103 and 3105 can comprise an organic binder or a solvent. The organic binder can comprise one or more of cellulose, a cellulose derivative, a hydrophobically modified ethylene oxide urethane modifier (HUER), and an ethylene acrylic acid. Examples of a cellulose derivate comprise ethyl cellulose, methyl cellulose, and AQUAZOL (poly 2 ethyl-2 oxazine). The solvent can comprise a polar solvent (e.g., water, an alcohol, an acetate, acetone, formic acid, dimethylformamide, acetonitrile, dimethyl sulfoxone, nitromethane, propylene carbonate, poly(ether ether ketone)) and/or a nonpolar solvent (e.g., pentane, 1,4-dioxane, chloroform, dichloromethane, diethyl ether, hexane, heptane, benzene, toluene, xylene). In some embodiments, the first salt paste can be cured to form the first salt deposits 3205, 3207, 2109, and/or 3211 by removing the solvent and/or the organic binder. In further embodiments, the solvent and/or organic binder can be removed by drying the first salt paste 3103 and 3105 at room temperature (e.g., from about 20° C. to about 30° C.) for eight hours or more. In further embodiments, the solvent and/or organic binder can be removed by drying the first salt paste 3103 and 3105 at a temperature in a range from about 100° C. to about 140° C. or from about 100° C. to about 120° C. for a time period in a range from about 8 minutes to about 30 minutes, or from about 8 minutes to about 20 minutes, or from about 8 minutes to about 15 minutes.

Figure 32:
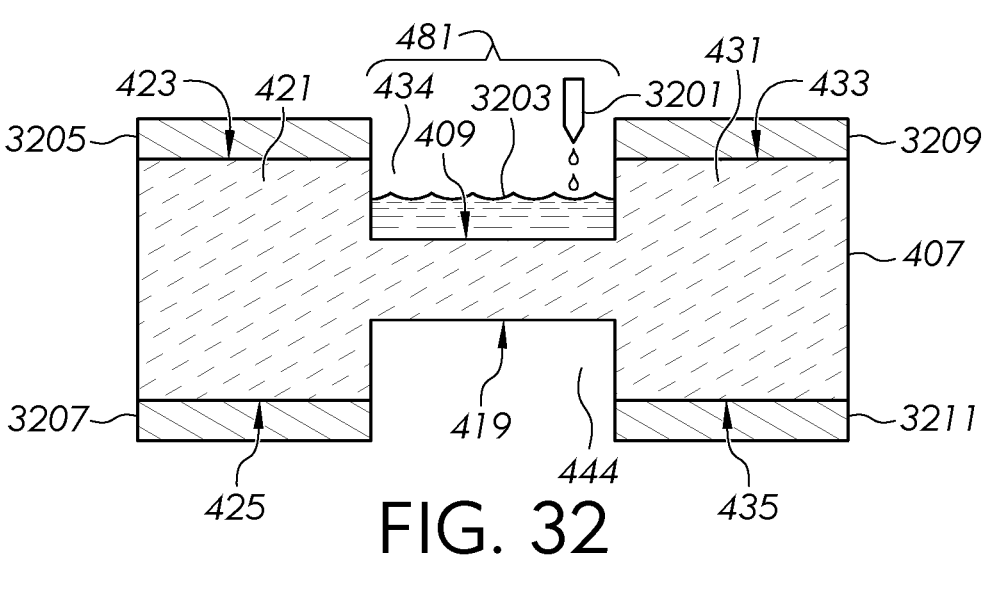
Figure 33:
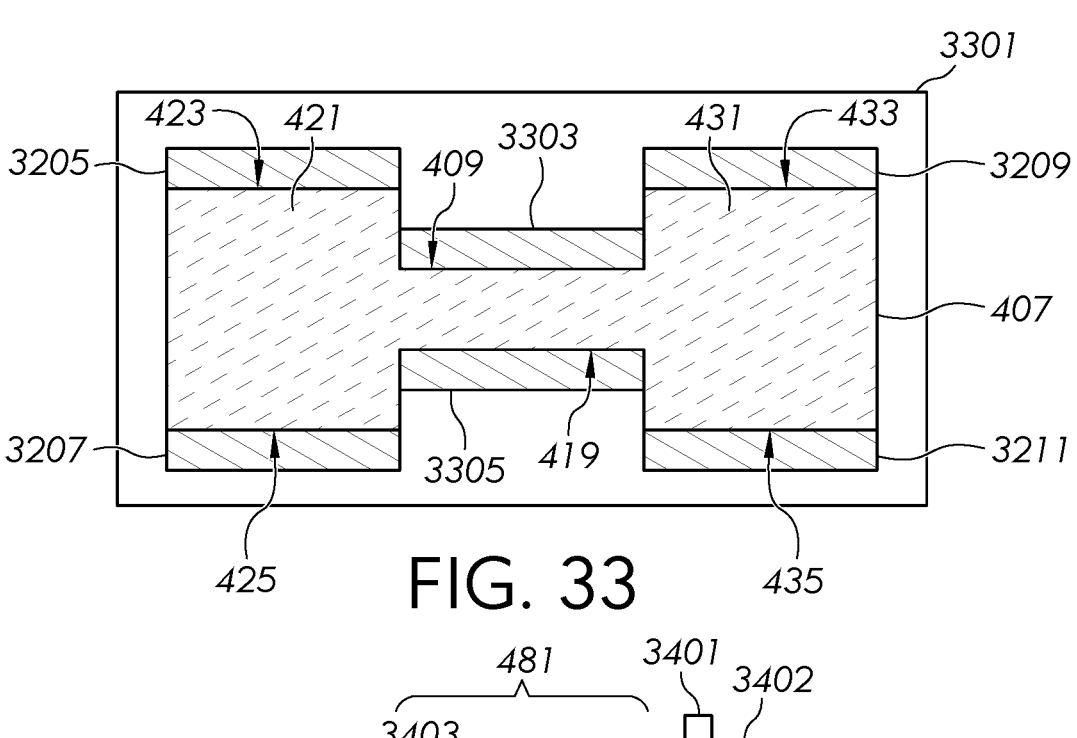

In some embodiments, as shown in FIG. 32, step 1609 can comprise applying a paste comprising alkali metal ions to the central portion 281. In some embodiments, as shown, step 1609 can comprise disposing a second salt paste 3203 on the first central surface area 409 of the central portion 481 from a container 3201. In further embodiments, although not shown, the second salt paste (e.g., second salt deposit 3303) can be applied to the second central surface area 419 of the central portion 481. In some embodiments, the source 3101 may comprise any of the structures described above with regards to the source 3101. The second salt paste 3203 can be disposed on the central portion 481 can be cured to form the second salt deposits 3303, and/or 3305 as shown in FIG. 33. In further embodiments, as shown in FIGS. 32-33, the second salt paste 3203 can be used in combination with the first salt paste 3103 and/or 3105 to form first salt deposits 3205, 3207, 3209, and/or 3211 and second salt deposits 3303 and/or 3305 disposed on the foldable substrate 407. In further embodiments, although not shown, the second salt deposits may be disposed on the foldable substrate without disposed the first salt deposits.

In some embodiments, the second salt paste 3203 can comprise one or more of the potassium-containing compounds and/or sodium-containing compounds discussed above with regards to the first salt paste 3103 and/or 3105. In some embodiments, the second salt paste 3203 can comprise the same composition as the first salt paste 3103 and/or 3105. In some embodiments, the second salt paste 3203 can comprise an organic binder or a solvent, including those discussed above with regards to the first salt paste 3103 and 3105. In some embodiments, the second salt paste can be cured to form the second salt deposits 3303 and/or 3305 by removing the solvent and/or the organic binder, for example, by drying the second salt paste 3203 at room temperature (e.g., for about 8 hours or more) or an elevated temperature (e.g., in a range from about 100° C. to about 140° C. or from about 100° C. to about 120° C.) for a time period (e.g., in a range from about 8 minutes to about 30 minutes, or from about 8 minutes to about 20 minutes, or from about 8 minutes to about 15 minutes).

In some embodiments, the second salt paste 3203 can comprise a concentration of potassium and/or sodium on an oxide basis that is less than a corresponding concentration of the first salt paste. In further embodiments, the concentration of potassium and/or sodium on an oxide basis as a percentage of the corresponding concentration of the first salt paste can be about 10% or more, about 20% or more, about 25% or more, about 80% or less, about 60% or less, about 50% or less, about 40% or less, or about 30% or less. In further embodiments, the concentration of potassium and/or sodium on an oxide basis as a percentage of the corresponding concentration of the first salt paste can be in a range from about 10% to about 80%, from about 10% to about 60%, from about 20% to about 60%, from about 20% to about 50%, from about 25% to about 50%, from about 25% to about 40%, from about 25% to about 30%, or any range or subrange therebetween.

In some embodiments, the second salt paste 3203 can comprise one or more alkali earth metals (e.g., alkali earth metal ions, alkali earth metal-containing compounds). In further embodiments, the one or more alkali earth metals in the second salt paste can comprise calcium (e.g., calcium ions, calcium chloride, calcium nitrate, potassium carbonate). Without wishing to be bound by theory, providing one or more alkali earth metals in a salt paste can reduce the extent of chemically strengthening, for example, by competing with alkali metals in the salt paste, which reduces the rate of exchange between ions in the foldable substrate and alkali metal ions in the salt paste. Without wishing to be bound by theory, providing calcium as the one or more alkali earth metals in the salt paste can more effectively compete with potassium than other alkali earth metals because of the similarity in ionic radius and mass between potassium ions and calcium ions. In further embodiments, a concentration of one or more alkali earth metals (e.g., calcium) can be about 10 ppm or more, about 50 ppm or more, about 100 ppm or more, about 200 ppm or more, about 400 ppm or more, about 10,000 ppm or less, about 5,000 ppm or less, about 2,000 ppm or less, about 1,000 ppm or less, about 750 ppm or less, or about 500 ppm or less. In further embodiments, a concentration of one or more alkali earth metals (e.g., calcium) can be in a range from about 10 ppm to about 10,000 ppm, from about 10 ppm to about 5,000 ppm, from about 50 ppm to about 5,000 ppm, from about 50 ppm to about 2,000 ppm, from about 100 ppm to about 2,000 ppm, from about 100 ppm to about 1,000 ppm, from about 200 ppm to about 1,000 ppm, from about 200 ppm to about 750 ppm, from about 400 ppm to about 750 ppm, from about 400 ppm to about 500 ppm, or any range or subrange therebetween.

After step 1609, as shown in FIG. 33, methods of the disclosure can proceed to step 1611 comprising heating the foldable substrate 407. In some embodiments, as shown, the foldable substrate 407 can be placed in an oven 3301. In further embodiments, as shown, the foldable substrate 407 can comprise a plurality of first salt deposits 3205, 3207, 3209, and/or 3211 and one or more second salt deposits 3303 and/or 3305. In some embodiments, although not shown, the foldable substrate 407 being heated (e.g., in the oven 3304) in step 1609 can comprise the first salt deposits 3205, 3207, 3209, and/or 3211 but not any second salt deposits 3303 and/or 3305 or vice versa. In some embodiments, the foldable substrate 407 can be heated at a temperature of about 300° C. or more, about 360° C. or more, about 400° C. or more, about 500° C. or less, about 460° C. or less, or about 400° C. or less. In some embodiments, foldable substrate 407 can be heated at a temperature in a range from about 300° C. to about 500° C., from about 360° C. to about 500° C., from about 400° C. to about 500° C., from about 300° C. to about 460° C., from about 360° C. to about 460° C., from about 400° C. to about 460° C., from about 300° C.

to about 400° C., from about 360° C. to about 400° C., or any range or subrange therebetween. In some embodiments, the foldable substrate 407 can be heated for about 15 minutes or more, about 1 hour or more, about 3 hours or more, about 48 hours or less, about 24 hours or less, or about 8 hours or less. In some embodiments, the foldable substrate 407 can be heated for a time in a range from about 15 minutes to about 48 hours, from about 1 hour to about 48 hours, from about 3 hours to about 48 hours, from about 15 minutes to about 24 hours, from about 1 hour to about 24 hours, from about 3 hours to about 48 hours, from about 3 hours to about 24 hours, from about 3 hours to about 8 hours, or any range or subrange therebetween. After the foldable substrate 407 has been heated, the foldable substrate 407 may comprise a chemically strengthened first portion 421, second portion 431, and/or central portion 481, which can comprise the compressive stress regions with associated depths of compression and/or depths of layer, as discussed above, which can further comprise any and/or all of the relationships discussed above (e.g., an absolute difference between the depth of compression and/or depth of layer from the first surface area, second surface area, third surface area, and/or fourth surface area as a percentage of the substrate thickness and the corresponding depth from the first central surface area and/or second central surface area as a percentage of the central thickness).

Figure 34:
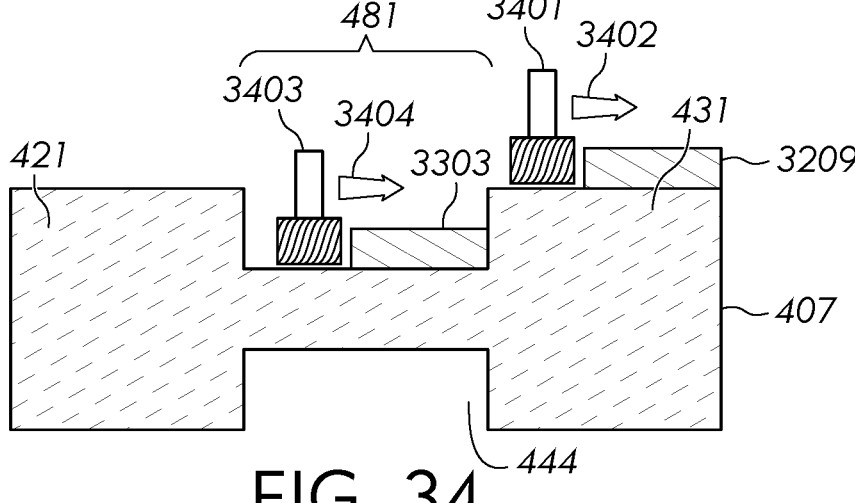

After step 1611, as shown in FIG. 34, methods of the disclosure can proceed to step 1613 comprising removing the salt paste (e.g., salt deposits). In some embodiments, as shown, removing the paste (e.g., first salt deposits 3209) can comprise moving a grinding a tool 3401 in a direction 3402 across the surface (e.g., third surface area 433). In even further embodiments, using the tool may comprise sweeping, scraping, grinding, pushing, etc. In further embodiments, the paste (e.g., first salt deposits 3205, 3207, 3209, and/or 3211) can be removed by washing the surface (e.g., first surface area 223, second surface area 225, third surface area 233, fourth surface area 235) with a solvent. In some embodiments, as shown, removing the paste (e.g., second salt deposits 3303) can comprise moving a grinding tool 3403 in a direction 3404 across the surface (e.g., first central surface area 409). In even further embodiments, using the tool may comprise sweeping, scraping, grinding, pushing, etc. In further embodiments, the paste (e.g., second salt deposits 3303 and/or 3305) can be removed by washing the surface (e.g., first central surface area 409 and/or second central surface area 419) with a solvent.

After step 1613, methods of the disclosure can proceed to step 1615 comprising further chemically strengthening the foldable substrate 407. In some embodiments, as shown in FIG. 30, the further chemically strengthening the foldable substrate 407 in step 1615 can be similar or identical to the chemically strengthening in step 1605 discussed above. In some embodiments, as shown in FIG. 30, step 1615 can comprise contacting at least a portion of a foldable substrate 407 comprising lithium cations and/or sodium cations with a salt bath 2401 comprising salt solution 2403 comprising one or more of the alkali metal ions and/or alkali metal-containing compounds discussed above with regards to step 1615 or 1509. In some embodiments, the salt solution 2403 can comprise a temperature within one or more of the ranges discussed above with regards to steps 1615 or 1509. After step 1615, the foldable substrate 407 can comprise one or more compressive stress regions (e.g., first, second, third, fourth, first central, and/or second central compressive stress region(s)) comprising a depth of compression and/or an associated depth of layer within the one or more ranges discussed above in regards to the corresponding compressive stress region.

In some embodiments, step 1613 or 1615 can further comprise chemically etching foldable substrate 407. As described above, chemically etching foldable substrate 407 can comprise contacting the foldable substrate 407 with an etching solution contained in an etching bath. In some embodiments, the first major surface 403 and the first central surface area 409 are etched. In some embodiments, the second major surface 405 is etched and the second central surface area 419. In further embodiments, the first major surface 403, the first central surface area 409, the second major surface 405, and/or the second central surface area 419 are etched. Chemically etching, if present in step 1613 or 1615, can be designed to remove surface imperfections that may be left over from chemically strengthening the foldable substrate 407. Indeed, chemically strengthening may result in surface imperfections that can affect the strength and/or optical quality of the foldable substrate 407. By etching during step 1613 or 1615, surface imperfections generated during chemically strengthening can be removed. In some embodiments, such etching can be designed to remove a portion of the layer comprising a depth of about 1 nm or more, about 5 nm or more, about 2 µm or less, about 1 µm or less, about 500 nm or less, about 100 nm or less, about 50 nm or less, or about 10 nm or less. In some embodiments, such etching can be designed to remove a portion of the layer comprising a depth in a range from about 1 nm to about 2 µm, from about 1 nm to about 1 µm, from about 5 nm to about 1 µm, from about 5 nm to about 500 nm, from about 5 nm to about 100 nm, from about 5 nm to about 50 nm, from about 5 nm to about 10 nm, or any range or subrange therebetween. Such etching may avoid substantially changing the thickness of the foldable substrate 407 or the surface compression achieved during chemically strengthening.

Figures 47, 48, 49:
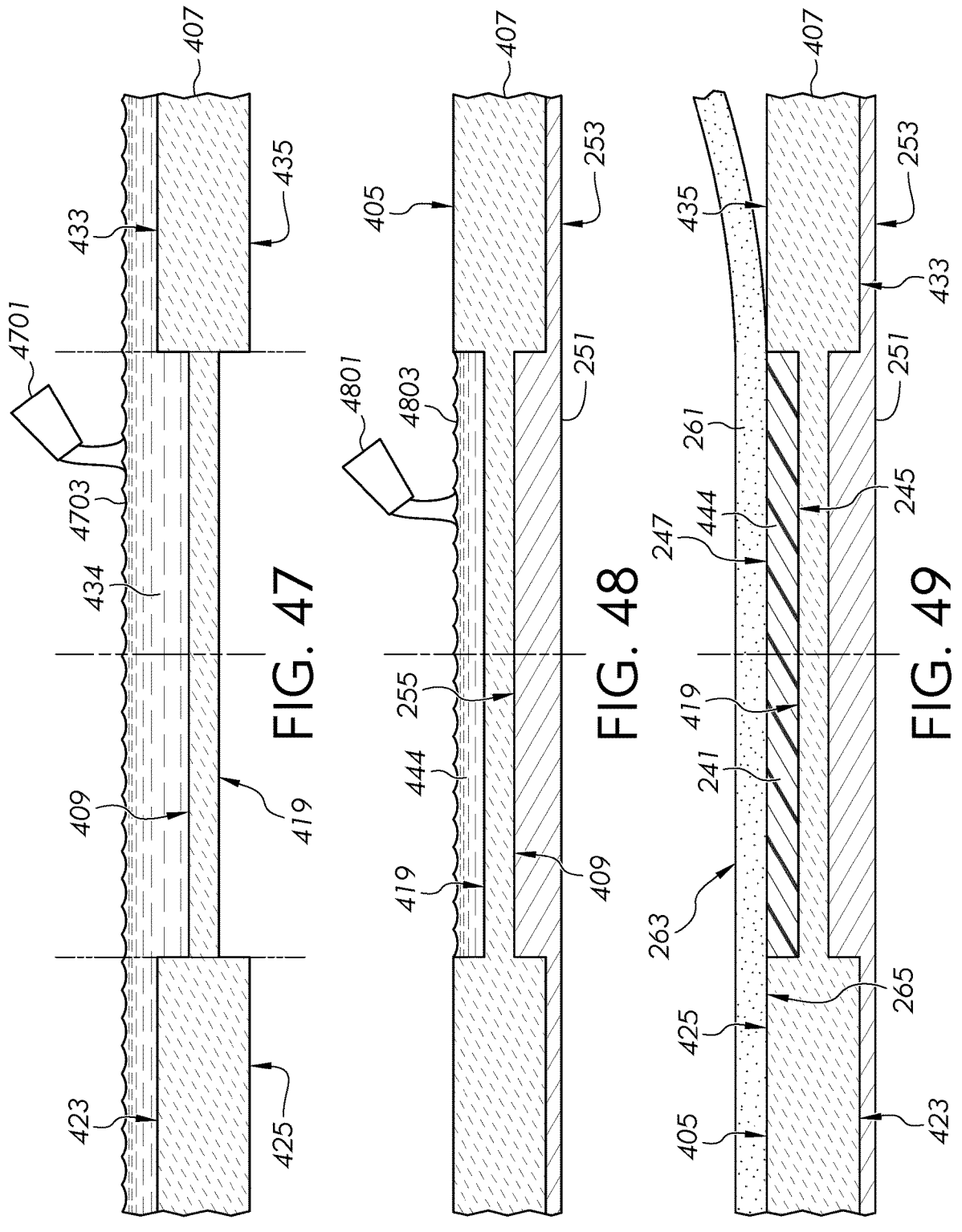

After step 1613 or 1615, methods of the disclosure can proceed to step 1617 comprising assembling the foldable apparatus using the foldable substrate 407. In some embodiments, as shown in FIG. 47, step 1617 can comprise disposing a coating 251 over the first major surface 403 and/or in the first recess 434. In some embodiments, as shown, a second liquid 4703 can be disposed over the first major surface 403. In further embodiments, the second liquid 4703 can be disposed over the first surface area 423 of the first portion 421 and the third surface area 433 of the second portion 431. In further embodiments, the second liquid 4703 can be disposed over the first central surface area 409 and/or fill the first recess 434. In further embodiments, as shown, a container 4701 (e.g., conduit, flexible tube, micropipette, or syringe) may be used to dispose the second liquid 4703. In some embodiments, the second liquid 4703 may comprise a coating precursor, a solvent, particles, nanoparticles, and/or fibers. In some embodiments, the coating precursor can comprise, without limitation, one or more of a monomer, an accelerator, a curing agent, an epoxy, and/or an acrylate as discussed above with reference to step 1511. The second liquid 4703 can be cured to form a coating 251, as shown in FIG. 48. Curing the second liquid 4703 can comprise heating the second liquid 4703, irradiating the second liquid 4703 with ultraviolet (UV) radiation, and/or waiting a predetermined amount of time (e.g., from about 30 minutes to 24 hours, from about 1 hour to about 8 hours). In some embodiments, as discussed above with reference to step 1511, another method may be used to form the coating 251. In some embodiments, although not shown, the coating

251 can be disposed in the first recess 434 (e.g., fill the first recess 434) without contacting the first major surface 403 (e.g., first surface area 423, third surface area 433).

In some embodiments, as shown in FIG. 48, step 1617 can comprise disposing a material in the second recess 444. In some embodiments, as shown, a third liquid 4803 can be disposed in the second recess 444. In some embodiments, the third liquid 4803 can comprise a precursor, a solvent, particles, nanoparticles, and/or fibers. In further embodiments, as shown, the third liquid 4803 can be disposed in the second recess 444 from a container 4801, although other methods may be used to deposit the third liquid or other material in the second recess, as discussed above with regards to the first recess and/or the second liquid with reference to steps 1511. In some embodiments, the third liquid 4803 can be cured (e.g., heating the third liquid, irradiating the third liquid, waiting a specified amount of time) to form a polymer-based portion 241 in the second recess 444 as shown in FIG. 49. In some embodiments, although not shown, the third liquid can be cured to form an adhesive layer, for example resembling the adhesive layer 261, disposed in the second recess 444.

After step 1613 or 1615, as shown in FIG. 49, methods can proceed to step 1619 comprising assembling the foldable apparatus using the foldable substrate 407. As shown in FIG. 49, step 1617 can comprise applying an adhesive layer 261 to contact the second surface area 425 of the second major surface 405 and the fourth surface area 435 of the second major surface 405. For example, in some embodiments, the adhesive layer 261 can comprise one or more sheets of an adhesive material. In some embodiments, there can be an integral interface between the one or more sheets comprising the adhesive layer 261 and/or the material disposed in the second recess (e.g., polymer-based portion 241), which can reduce (e.g., avoid) optical diffraction and/or optical discontinuities as light travels between the sheets since the one or more sheets can, in some embodiments, include substantially the same index of refraction. In some embodiments, although not shown, at least a portion of the adhesive layer can be disposed in the second recess. In some embodiments, a release liner (e.g., see release liner 271 in FIGS. 2 and 4) or a display device (e.g., see display device 307 in FIGS. 3 and 5) may be disposed on the adhesive layer 261 (e.g., first contact surface 263). After step 1617, methods of the disclosure according to the flow chart in FIG. 16 of making the foldable apparatus can be complete at step 1619.

In some embodiments, methods of making a foldable apparatus in accordance with embodiments of the disclosure can proceed along steps 1601, 1603, 1605, 1607, 1609, 1611, 1613, 1615, 1617, and 1619 of the flow chart in FIG. 16 sequentially, as discussed above. In some embodiments, as shown in FIG. 16, arrow 1602 can be followed from step 1601 omitting step 1603, for example, when the foldable substrate 407 already comprises a recess or recesses. In some embodiments, arrow 1604 can be followed from step 1601 to step 1609 comprising disposing a mask on the foldable substrate, for example, if the foldable apparatus comprised the recesses at the end of step 1501 and the foldable substrate 407 already comprises initial compressive stress regions or the foldable substrate 407 was not to be chemically strengthened until after step 1609. In some embodiments, arrow 1608 can be followed from step 1603 to step 1609 comprising disposing a mask on the foldable substrate 407, for example, if the foldable substrate 407 already comprises initial compressive stress regions or the foldable substrate 407 was not to be chemically strengthened until after step 1609. In further embodiments, methods can follow arrow 1612 from step 1613 to step 1617 comprising assembling the foldable apparatus, for example, if the coating 251 is not to be disposed in the first recess 434 and/or over the first major surface 403 and the polymer-based portion 241 is not to be disposed in the second recess 444. In some embodiments, methods can follow arrow 1614 from step 1613 to step 1619, for example, if the foldable substrate 407 is the desired product (e.g., without a material in the first recess or second recess). In some embodiments, methods can follow arrow 1618 from step 1615 to step 1619, for example, if the foldable apparatus is not to comprise a release liner 271, display device 307, and/or adhesive layer 261. Any of the above options may be combined to make a foldable apparatus in accordance with embodiments of the disclosure.

Example embodiments of making the foldable apparatus resembling foldable apparatus 701 and/or a foldable substrate resembling foldable substrate 707 illustrated in FIG. 8 will now be discussed with reference to FIGS. 35-39 and FIGS. 47-49 and the flow chart in FIG. 17. In a first step 1701 of methods of the disclosure, methods can start with providing a foldable substrate 707. In some embodiments, the foldable substrate 707 may be provided by purchase or otherwise obtaining a substrate or by forming the foldable substrate. In some embodiments, the foldable substrate 707 can comprise a glass-based substrate and/or a ceramic-based substrate. In further embodiments, glass-based substrates and/or ceramic-based substrates can be provided by forming them with a variety of ribbon forming processes, for example, slot draw, down-draw, fusion down-draw, up-draw, press roll, redraw or float. In further embodiments, ceramic-based substrates can be provided by heating a glass-based substrate to crystallize one or more ceramic crystals. The foldable substrate 707 may comprise a second major surface 405 (see FIG. 35) that can extend along a plane and/or a second major surface 405 opposite the first major surface 403 that can also extend along a plane. In further embodiments, the first recess 3534 may be formed by etching, laser ablation or mechanically working the first major surface 403. For example, mechanically working the foldable substrate 707 may resemble step 1603 discussed above. In some embodiments, in step 1701, the foldable substrate 707 can be provided with one or more initial compressive stress regions, for example, with one or more of the properties discussed above with reference to step 1605.

In some embodiments, in step 1701, the foldable substrate 707 can be provided with a first recess 3534 in the first major surface 403 of the foldable substrate 707 that exposes an existing first central surface area 3609 of the foldable substrate 707 in the central portion 781 as shown in FIG. 35. In further embodiments, a portion of the existing first central surface area 3609 can extend along a first central plane 3704a. In some embodiments, although not shown, the foldable substrate can be provided with a second recess in the second major surface of the foldable substrate that exposes a second central surface area of the foldable substrate in the central portion. In some embodiments, as shown in FIG. 35, the existing first central surface area 3609 can comprise a first transition portion 3553 (e.g., resembling first transition portion 853 in FIG. 8) and/or a second transition portion 3555 (e.g., resembling second transition portion 855 in FIG. 8). In further embodiments, as shown, a thickness of the first transition portion 3553 can continuously increase from a portion of the existing first central surface area 3609 comprising the first central plane 3704a to the first portion 421. In further embodiments, as shown, a thickness of the second transition portion 3555 can continuously increase from a portion of the existing first central surface area 3609 comprising the first central plane 3704a to the second portion 431.

After step 1701, as shown in FIG. 35, methods can proceed to step 1703 comprising chemically strengthening the foldable substrate 707. In some embodiments, as shown, chemically strengthening the foldable substrate 707 can comprise contacting at least a portion of a foldable substrate 707 comprising lithium cations and/or sodium cations with a salt bath 2401 comprising salt solution 2403, which can comprise one or more of the components discussed above for the salt solution 2403 with respect to step 1713. In some embodiments, the temperature of the salt solution 2403 and/or the time that the foldable substrate 707 can contact the salt solution 2403 can be within one or more of the ranges discussed above with reference to step 1509. In some embodiments, chemically strengthening the foldable substrate 707 in step 1703 can comprise chemically strengthening the first major surface 403 to form an initial first compressive stress region extending to an initial first depth of compression from the first major surface 403 of the first portion 421, chemically strengthening the first major surface 403 to form an initial third compressive stress region extending to an initial third depth of compression from the first major surface 403 of the second portion 431, chemically strengthening the second major surface 405 to form an initial second compressive stress region extending to an initial second depth of compression from the second major surface 405 in the first portion 421, chemically strengthening the second major surface 405 to form an initial fourth compressive stress region extending to an initial fourth depth of compression from the second major surface 405 in the second portion 431, chemically strengthening the existing first central surface area 3609 to form an initial first central compressive stress region extending to an initial first central depth of compression from the existing first central surface area 3609, and chemically strengthening the second major surface 405 to form an initial second central compressive stress region extending to an initial second central depth of compression from the second major surface 405 in the central portion 781. In some embodiments, the initial first depth of compression, initial second depth of compression, initial third depth of compression, and/or initial fourth depth of compression as a percentage of the substrate thickness 411 can be about 5% or more, 10% or more, about 12% or more, about 14% or more, about 25% or less, about 20% or less, about 18% or less, or about 16% or less. In some embodiments, the initial first depth of compression, initial second depth of compression, initial third depth of compression, and/or initial fourth depth of compression as a percentage of the substrate thickness 411 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of compression, initial second depth of compression, initial third depth of compression, and/or initial fourth depth of compression as a percentage of the corresponding depth of compression of the finished foldable substrate 407 can be about 50% or more, about 60% or more, about 65% or more, about 68% or more, about 80% or less, about 75% or less, or about 72% or less, or about 70% or less. In some embodiments, the initial first depth of compression, initial second depth of compression, initial third depth of compression, and/or initial fourth depth of compression as a percentage of the corresponding depth of compression of the finished foldable substrate 407 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween. In some embodiments, the initial first depth of layer, initial second depth of layer, initial third depth of layer, and/or initial fourth depth of layer as a percentage of the substrate thickness 411 can be about 5% or more, 10% or more, about 12% or more, about 14% or more, about 25% or less, about 20% or less, about 18% or less, or about 16% or less. In some embodiments, the initial first depth of layer, initial second depth of layer, initial third depth of layer, and/or initial fourth depth of layer as a percentage of the substrate thickness 411 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of layer, initial second depth of layer, initial third depth of layer, and/or initial fourth depth of layer as a percentage of the corresponding depth of layer of the finished foldable substrate 407 can be about 50% or more, about 60% or more, about 65% or more, about 68% or more, about 80% or less, about 75% or less, or about 72% or less, or about 70% or less. In some embodiments, the initial first depth of layer, initial second depth of layer, initial third depth of layer, and/or initial fourth depth of layer as a percentage of the corresponding depth of compression of the finished foldable substrate 407 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween.

After step 1701 or 1703, as shown in FIG. 36, methods can proceed to step 1707 comprising disposing a mask over one or more portions of the foldable substrate 707. In some embodiments, as shown, step 1707 can comprise disposing a first liquid 2107 over one or more portions of the foldable substrate 407. In further embodiments, as shown and discussed above with reference to step 1503, a container 2101 may be used to dispose the first liquid 2107 over one or more portions of the foldable substrate 707. In further embodiments, as shown, the first liquid 2107 can be disposed over the first major surface 403 of the first portion 421 and the first transition portion 3553 of the existing first central surface area 3609 as a first liquid deposit 3603 and over the first major surface 403 of the second portion 431 and the second transition portion 3555 of the existing first central surface area 3609 as a second liquid deposit 3605. Although not shown, it is to be understood that similar liquid deposits can be formed over the second major surface of the first portion and/or the second major surface of the second portion. In further embodiments, the liquid deposits (e.g., first liquid deposit 3603 and second liquid deposit 3605 shown in FIG. 36) can be cured to form masks (e.g., first mask 3705 and third mask 3709 shown in FIG. 37). Curing the first liquid can comprise heating the first liquid 2107, irradiating the first liquid 2107 with ultraviolet (UV) radiation, and/or waiting a predetermined amount of time. In further embodiments, another method, as discussed above, may be used to form the mask(s) (e.g., masks 3705, 3707, 3709, and 3711). As shown in FIG. 30, a first mask 3705 can be disposed over the first major surface 403 of the first portion 421 and the first transition portion 3553 of the existing first central surface area 3609, a second mask 3707 can be disposed over the first major surface 403 of the second portion 431 and the second transition portion 3555 of the existing first central surface area 3609, a third mask 3709 can be disposed over the second major surface 405 of the first portion 421, and/or a fourth mask 3711 can be disposed over the second major surface 405 of the second portion 431.

After step 1707, as shown in FIG. 37, methods can proceed to step 1709 comprising etching the foldable substrate 707. In some embodiments, as shown, etching can comprise exposing the foldable substrate 707 to an etchant 2203 (e.g., one or more mineral acids). In further embodiments, as shown, the etchant 2203 can be a liquid etchant contained in an etchant bath 2201. In further embodiments, as shown, etching can comprise etching a portion of the central portion 781 (e.g., an unmasked portion of the existing first central surface area 3609) to form a first central surface area 709. In further embodiments, as shown, the first central surface area 709 formed by the etching can be recessed from the first central plane 3704a by a transition depth 727. In further embodiments, the first central surface area 709 formed by the etching can comprise the first transition portion 753 and/or the second transition portion 755 comprising an abrupt change in the thickness of the corresponding transition portion comprising the transition depth 727. In further embodiments, as shown, the etching can form the second recess 444 between the second major surface 405 and the second central surface area 719.

Figure 38:
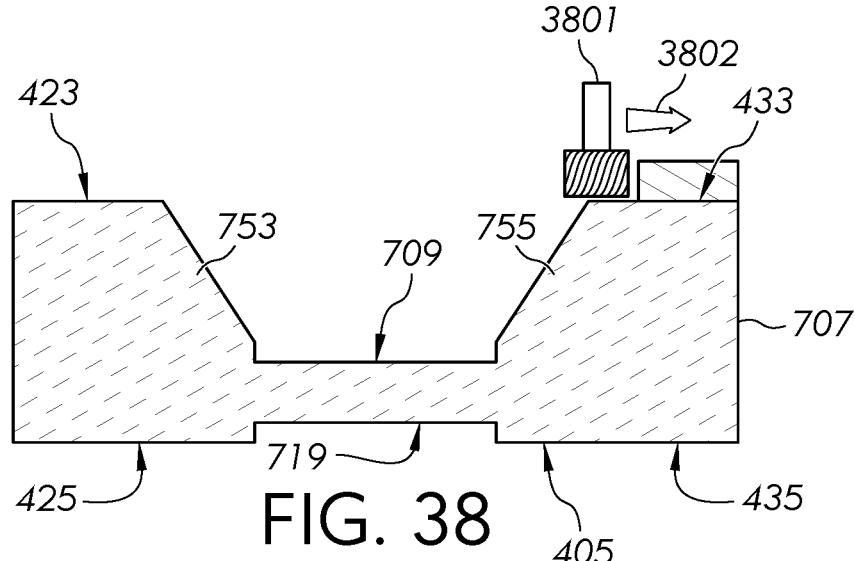

After step 1709, as shown in FIG. 38, methods can proceed to step 1711 comprising removing the mask(s). In some embodiments, as shown in FIG. 38, removing the mask(s) (e.g., masks 3705, 3707, 3709, and 3711) can comprise moving a grinding tool 3801 in a direction 3802 across the surface (e.g., third surface area 433). In even further embodiments, using the tool may comprise sweeping, scraping, grinding, pushing, etc. In further embodiments, the mask(s) (e.g., masks 3705, 3707, 3709, and 3711) can be removed by washing the surface (e.g., first surface area 423, second surface area 425, third surface area 433, fourth surface area 435) with a solvent. In some embodiments, removing the mask(s) can comprise removing the masks 3705, 3707, 3709, and 3711 from the first surface area 423, the second surface area 425, the third surface area 433, and the fourth surface area 435, respectively.

After step 1703, methods can proceed to step 1705 comprising mechanically working the foldable substrate 707. Similar to the effects of step 1707, step 1705 can remove material from the existing first central surface area 3609 comprising the first central plane 3704a and/or a central portion 781 of the second major surface 405. Mechanically working the foldable substrate 707 can comprise any of the techniques discussed above with reference to step 1517.

Figure 39:
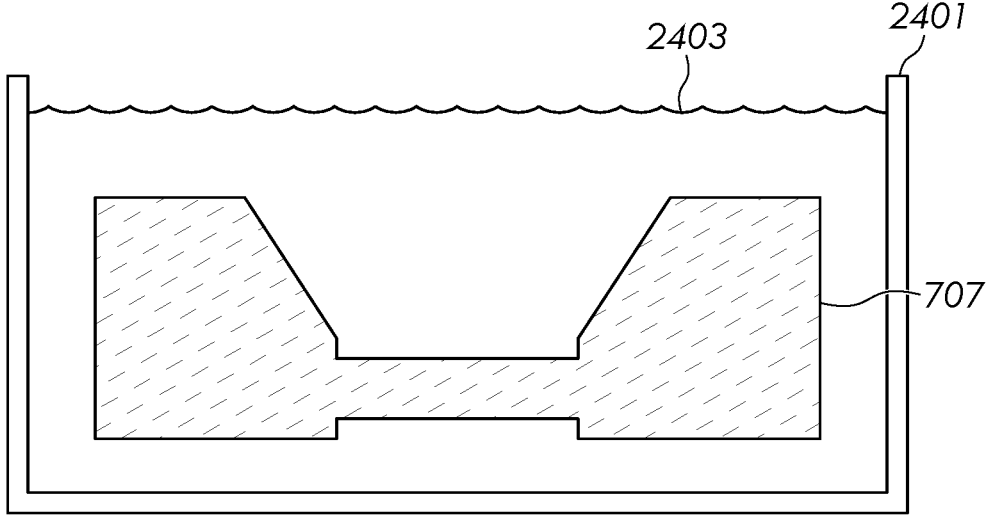

After step 1711 or 1705, as shown in FIG. 39, methods can proceed to step 1713 comprising chemically strengthening the foldable substrate 707. In some embodiments, as shown, chemically strengthening the foldable substrate 707 can comprise contacting at least a portion of a foldable substrate 707 comprising lithium cations and/or sodium cations with a salt bath 2401 comprising salt solution 2403, which can comprise one or more of the components discussed above for the salt solution 2403 with respect to step 1509. In some embodiments, the temperature of the salt solution 2403 and/or the time that the foldable substrate 707 can contact the salt solution 2403 can be within one or more of the ranges discussed above with reference to step 1509.

In some embodiments, chemically strengthening the foldable substrate 707 in step 1713 can comprise chemically strengthening the first surface area 423 to form a first compressive stress region extending to a first depth of compression from the first surface area 423, chemically strengthening the second surface area 425 to form a second compressive stress region extending to a second depth of compression from the second surface area 425, chemically strengthening the third surface area 433 to form a third compressive stress region extending to a third depth of compression from the third surface area 433, chemically strengthening the fourth surface area 435 to form a fourth compressive stress region extending to a fourth depth of compression from the fourth surface area 435, chemically strengthening the first central surface area 709 to form a first central compressive stress region extending to a first central depth of compression from the first central surface area 709, and chemically strengthening the second central surface area 719 to form a second central compressive stress region extending to a second central depth of compression from the second central surface area 719. After step 1713, the foldable substrate can comprise one or more compressive stress regions (e.g., first, second, third, fourth, first central, and/or second central compressive stress region(s)) comprising a depth of compression and/or an associated depth of layer within the one or more ranges discussed above in regards to the corresponding compressive stress region. In further embodiments, an absolute difference between a depth of layer between one of the first depth of layer, second depth of layer, third depth of layer, or fourth depth of layer divided by the substrate thickness and the first central depth of layer or second central depth of layer divided by the central thickness can be within one or more of the ranges discussed above. In further embodiments, an absolute difference between a depth of compression between one of the first depth of compression, second depth of compression, third depth of compression, or fourth depth of compression divided by the substrate thickness and the first central depth of compression or second central depth of compression divided by the central thickness can be within one or more of the ranges discussed above. In further embodiments, an absolute difference between the first average concentration of potassium or the second average concentration of potassium and the central average concentration of potassium can be within one or more of the ranges discussed above.

After step 1713, the first transition portion and/or the second transition portion can comprise a transition tensile stress region comprising a transition maximum tensile stress. In some embodiments, the first portion can comprise a first tensile stress region comprising a first maximum tensile stress, the second portion can comprise a second tensile stress region comprising a first maximum tensile stress, and the central portion can comprise a central tensile stress region comprising a central maximum tensile stress region. In further embodiments, the transition maximum tensile stress can be greater than the central maximum tensile stress. In further embodiments, the transition maximum tensile stress can be greater than the first maximum tensile stress and/or the second maximum tensile stress. For example, masking the first transition portion and/or second transition portion in steps 1705 and 1707 can prevent the removal of the corresponding initial compressive stress regions, which can enable the first transition portion and/or the second transition portion to comprise greater maximum tensile stress than the central portion after step 1713. Likewise, the initial compressive stress regions of the first transition portion and/or the second transition portion maintained through steps 1705 and 1707 in combination with the reduced thickness of the first transition portion and/or second transition portion relative to the first portion and/or second portion can enable the transition maximum tensile stress to be greater than the first maximum tensile stress and/or the second maximum tensile stress. Providing the transition maximum tensile stress greater than the central maximum tensile stress can counteract a strain between the first portion or the second portion and the first transition portion and/or second transition portion during folding. Providing the transition maximum tensile stress greater than the first maximum tensile stress and/or the second maximum tensile stress can counteract a strain between the central portion and the first transition portion and/or second transition portion during folding.

After step 1713, methods of the disclosure can proceed to step 1715 comprising disposing a coating 251 over the first major surface 403 and/or in the first recess 434. In some embodiments, as shown in FIG. 47 for foldable substrate 407, a second liquid 4703 can be disposed over the first major surface 403. In further embodiments, the second liquid 4703 can be disposed over the first surface area 423 of the first portion 421 and the third surface area 433 of the second portion 431. In further embodiments, the second liquid 4703 can be disposed over the first central surface area 709 and/or fill the first recess 434. In further embodiments, as shown, a container 4701 (e.g., conduit, flexible tube, micropipette, or syringe) may be used to dispose the second liquid 4703. In some embodiments, the second liquid 4703 may comprise a coating precursor, a solvent, particles, nanoparticles, and/or fibers. In some embodiments, the coating precursor can comprise, without limitation, one or more of a monomer, an accelerator, a curing agent, an epoxy, and/or an acrylate. In some embodiments, the solvent for the adhesive precursor may comprise a polar solvent (e.g., water, an alcohol, an acetate, acetone, formic acid, dimethylformamide, acetonitrile, dimethyl sulfoxone, nitromethane, propylene carbonate, poly(ether ether ketone)) and/or a non-polar solvent (e.g., pentane, 1,4-dioxane, chloroform, dichloromethane, diethyl ether, hexane, heptane, benzene, toluene, xylene). The second liquid 4703 can be cured to form a coating 251, as shown in FIGS. 48-49. Curing the second liquid 4703 can comprise heating the second liquid 4703, irradiating the second liquid 4703 with ultraviolet (UV) radiation, and/or waiting a predetermined amount of time (e.g., from about 30 minutes to 24 hours, from about 1 hour to about 8 hours). In some embodiments, another method (e.g., chemical vapor deposition (CVD) (e.g., low-pressure CVD, plasma-enhanced CVD), physical vapor deposition (PVD) (e.g., evaporation, molecular beam epitaxy, ion plating), atomic layer deposition (ALD), sputtering, spray pyrolysis, chemical bath deposition, sol-gel deposition) may be used to form the coating 251. In some embodiments, although not shown, the coating 251 can be disposed in the first recess 434 (e.g., fill the first recess 434) without contacting the first major surface 403 (e.g., first surface area 423, third surface area 433).

After step 1713 or 1715, methods of the disclosure can proceed to step 1719 comprising disposing a material in the second recess 444. In some embodiments, as shown in FIG. 48 for foldable substrate 407, a third liquid 4803 can be disposed in the second recess 444. In some embodiments, the third liquid 4803 can comprise a precursor, a solvent, particles, nanoparticles, and/or fibers. In further embodiments, as shown, the third liquid 4803 can be disposed in the second recess 444 from a container 4801, although other methods may be used to deposit the third liquid or other material in the second recess, as discussed above with regards to the first recess and/or the second liquid. In some embodiments, the third liquid 4803 can be cured (e.g., heating the third liquid, irradiating the third liquid, waiting a specified amount of time) to form a polymer-based portion 241 in the second recess 444 as shown in FIG. 49. In some embodiments, although not shown, the third liquid can be cured to form an adhesive layer, for example resembling the adhesive layer 261, disposed in the second recess 244.

After step 1715 or 1717, methods of the disclosure can proceed to step 1719 comprising assembling the foldable apparatus using the foldable substrate 707. As shown in FIG. 49 with reference to foldable substrate 407, step 1719 can comprise applying an adhesive layer 261 to contact the second surface area 425 of the second major surface 405 and the fourth surface area 435 of the second major surface 405. For example, in some embodiments, the adhesive layer 261 can comprise one or more sheets of an adhesive material. In some embodiments, there can be an integral interface between the one or more sheets comprising the adhesive layer 261 and/or the material disposed in the second recess (e.g., polymer-based portion 241), which can reduce (e.g., avoid) optical diffraction and/or optical discontinuities as light travels between the sheets since the one or more sheets can, in some embodiments, include substantially the same index of refraction. In some embodiments, although not shown, at least a portion of the adhesive layer can be disposed in the second recess. In some embodiments, a release liner (e.g., see release liner 271 in FIGS. 2 and 4) or a display device (e.g., see display device 307 in FIGS. 3 and 5) may be disposed on the adhesive layer 261 (e.g., first contact surface 263). After step 1719, methods of the disclosure according to the flow chart in FIG. 17 of making the foldable apparatus can be complete at step 1721.

In some embodiments, methods of making a foldable apparatus in accordance with embodiments of the disclosure can proceed along steps 1701, 1703, 1707, 1709, 1711, 1713, 1715, 1717, 1719, and 1721 of the flow chart in FIG. 17 sequentially, as discussed above. In some embodiments, as shown in FIG. 17, arrow 1702 can be followed from step 1701 omitting step 1703, for example, when the foldable substrate 707 comprises one or more compressive stress regions after step 1701. In further embodiments, arrow 1708 can be followed from step 1703 to step 1705 comprising mechanically working the foldable substrate 707 instead of chemically etching the foldable substrate through steps 1707, 1709, and 1711. In some embodiments, arrow 1704 can be followed from step 1701 to step 1707, for example, when the foldable substrate 707 comprises one or more compressive stress regions after step 1701. In some embodiments, arrow 1706 can be followed from step 1701 to step 1713 comprising chemically strengthening the foldable substrate, for example, when foldable substrate 707 already comprises the desired recess(es). In some embodiments, methods can follow arrow 1714 from step 1713 to step 1717 comprising disposing a material in the second recess 444. In further embodiments, methods can follow arrow 1716 from step 1717 to step 1715 comprising disposing a coating 251 over the first major surface and/or in the first recess 434. In even further embodiments, methods can follow arrow 1718 from step 1715 to step 1719 comprising assembling the foldable apparatus, for example, if the foldable apparatus already comprises the coating 251 and a polymer-based portion 241 or another material is to be disposed in one or more recess. In some embodiments, methods can follow arrow 1720 from step 1715 to step 1721, for example, if the foldable apparatus fully assembled at the end of step 1715 or if another material is to be disposed in the first recess and/or over the first major surface, and/or over the second major surface. In some embodiments, methods can follow arrow 1722 from step 1717 to step 1721, for example, if the foldable apparatus fully assembled at the end of step 1717 or if another material is to be disposed in the second recess and/or over the second major surface. In some embodiments, methods can follow arrow 1712 from step 1713 to step 1721, for example, if the foldable substrate 707 is the desired product (e.g., without a material in the first recess or second recess). Any of the above options may be combined to make a foldable apparatus in accordance with embodiments of the disclosure.

Example embodiments of making the foldable apparatus resembling foldable apparatus 801 illustrated in FIG. 8 will now be discussed with reference to FIGS. 40-49 and the flow chart in FIG. 18. In a first step 1801 of methods of the disclosure, methods can start with providing a foldable substrate 4007. In some embodiments, the foldable substrate 4007 may be provided by purchase or otherwise obtaining a substrate or by forming the foldable substrate. In some embodiments, the foldable substrate 4007 can comprise a glass-based substrate and/or a ceramic-based substrate. In further embodiments, glass-based substrates and/or ceramic-based substrates can be provided by forming them with a variety of ribbon forming processes, for example, slot draw, down-draw, fusion down-draw, up-draw, press roll, redraw or float. In further embodiments, ceramic-based substrates can be provided by heating a glass-based substrate to crystallize one or more ceramic crystals. The foldable substrate 4007 may comprise an existing second major surface 4005 (see FIG. 40) that can extend along a plane. The existing second major surface 4005 can be opposite a first major surface 4003.

In some embodiments, in step 1801, the foldable substrate 407 can be provided with a first recess 834 in the first major surface 4003 of the foldable substrate 4007 that exposes an existing first central surface area 4009 of the foldable substrate 4007 in the central portion 4081. In further embodiments, although not shown, the existing first central surface area 4009 can comprise a transition region (e.g., resembling transition regions 853 and/or 855). In further embodiments, the first recess 834 may be formed by etching, laser ablation or mechanically working the first major surface 4003. For example, mechanically working the foldable substrate 4007 may resemble step 1603 discussed above. In some embodiments, in step 1801, the foldable substrate 4007 can be provided with one or more initial compressive stress regions, for example, with one or more of the properties discussed above with reference to step 1605.

Figure 41:
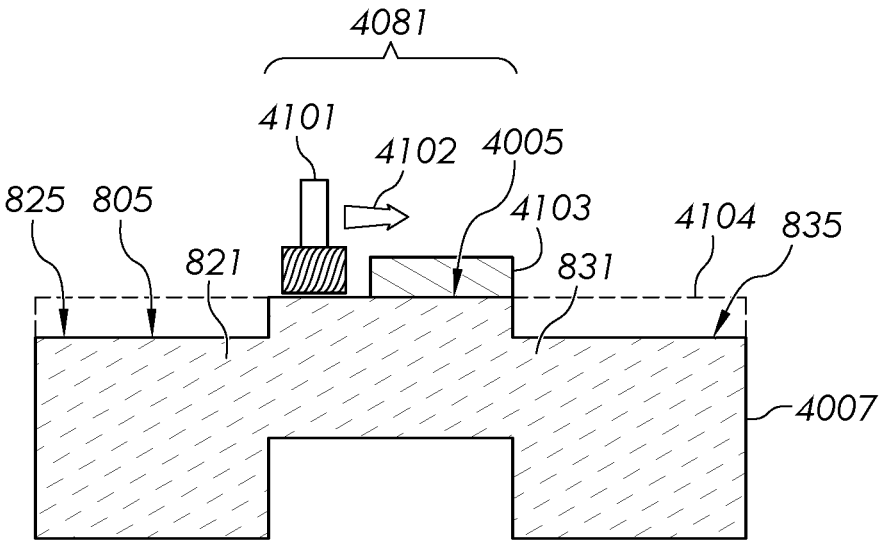

After step 1801, in some embodiments, methods can proceed to step 1803 comprising mechanically working the existing second major surface 4005 (see FIG. 41). In some embodiments, step 1803 can comprise removing a first portion 821 of the existing second major surface 4005 to reveal a second surface area 825 of the first portion 821. In some embodiments, step 1803 can comprise removing a second portion 831 of the existing second major surface 4005 to reveal a fourth surface area 835 of the second portion 831. As shown in FIG. 41, the second surface area 825 and/or the fourth surface area can comprise a second major surface 805. As shown in FIG. 41, the existing second major surface 4005 extending along a plane 4104 can be modified to reveal the second surface area 825 and/or the fourth surface area 835. For example, as shown in FIG. 26 with reference to foldable substrate 404, diamond engraving can be used where a diamond-tip probe 2001 can be controlled using a computer numerical control (CNC) machine 2003. Materials other than diamond can be used for engraving with a CNC machine. It is to be understood that other methods of forming the recess(es) can be used, for example, lithography and laser ablation.

Figure 40:
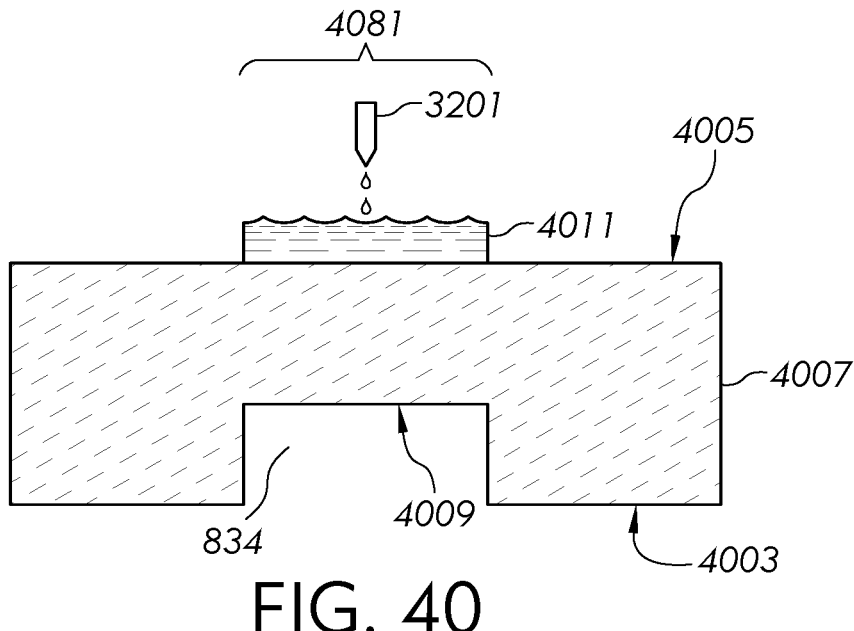

After step 1801, as shown in FIG. 40, methods can proceed to step 1805 comprising disposing a mask over one or more portions of the foldable substrate 4007. In further embodiments, as shown, step 1805 can comprise disposing a first liquid deposit 4011 on the existing second major surface 4005 in the central portion 4081. In further embodiments, as shown, a container 3201 can be used to dispose the first liquid deposit 4011. In further embodiments, the first liquid deposit 4011 can comprise the first liquid 2107 discussed above. In further embodiments, the liquid deposits (e.g., first liquid deposit 4011 shown in FIG. 40) can be cured to form masks (e.g., first mask 4103 shown in FIG. 41). Curing the first liquid deposit can comprise heating it, irradiating it with ultraviolet (UV) radiation, and/or waiting a predetermined amount of time. In further embodiments, another method, as discussed above, may be used to form the mask.

After step 1805, methods can proceed to step 1807 comprising etching at least the existing second major surface 4005 of the foldable substrate 4007. In further embodiments, etching can comprise exposing the foldable substrate 4007 to an etchant (e.g., one or more mineral acids). In further embodiments, as shown in FIG. 41, etching can comprise etching a first portion 821 of the existing second major surface 4005 extending along the plane 4104 to reveal a second surface area 825 of the first portion 821. In further embodiments, as shown in FIG. 41, etching can comprise etching a second portion 831 of the existing second major surface 4005 extending along the plane 4104 to reveal a fourth surface area 835 of the second portion 831. In further embodiments, as shown in FIG. 41, the second surface area 825 and/or fourth surface area 835 revealed by the etching can comprise a second major surface 805.

After step 1807, as shown in FIG. 41, methods can proceed to step 1809 comprising removing the mask 4103. In some embodiments, as shown, removing the mask 4103 can comprise moving a grinding tool 4101 in a direction 4102 across the surface (e.g., existing second major surface 4005 in the central portion 4081). In even further embodiments, using the tool may comprise sweeping, scraping, grinding, pushing, etc. In further embodiments, the mask 4103 can be removed by washing the surface (e.g., existing second major surface 4005 in the central portion 4081) with a solvent. In some embodiments, removing the mask can comprise removing the mask 4103 from the existing second major surface 4005 in the central portion 4081.

Figures 42, 43, 44:
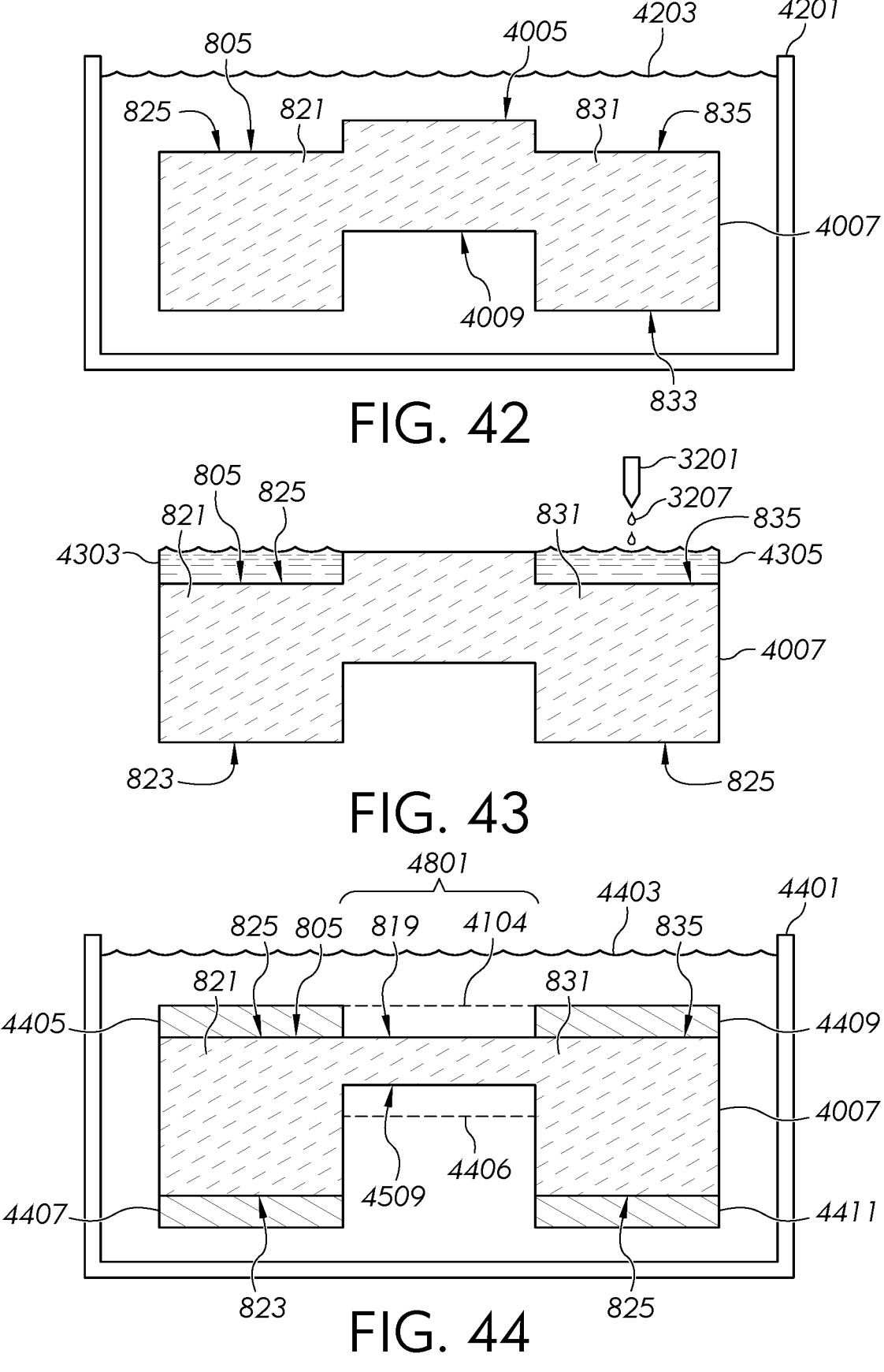

After step 1803 or 1809, as shown in FIG. 42, methods can proceed to step 1811 comprising chemically strengthening the foldable substrate 4007. In some embodiments, as shown, chemically strengthening the foldable substrate 407 can comprise contacting at least a portion of a foldable substrate 4007 comprising lithium cations and/or sodium cations with a salt bath 4201 comprising salt solution 4203, which can comprise one or more of the components discussed above for the salt solution 2403 with reference to step 1509. In some embodiments, the temperature of the salt solution 4203 and/or the time that the foldable substrate 4007 can contact the salt solution 100. can be within one or more of the ranges discussed above with reference to step 1509. In some embodiments, chemically strengthening the foldable substrate 4007 in step 1811 can comprise chemically strengthening the existing first central surface area

4009 to form an initial first central compressive stress region extending to an initial first central depth of compression from the existing first central surface area 4009, chemically strengthening the first surface area 823 to form an initial first compressive stress region extending to an initial first depth of compression from the first surface area 823, chemically strengthening the third surface area 833 to form an initial third compressive stress region extending to an initial third depth of compression from the third surface area 833, chemically strengthening the second surface area 825 to form an initial second compressive stress region extending to an initial second depth of compression from the second surface area 825, chemically strengthening the fourth surface area 835 to form an initial fourth compressive stress region extending to an initial fourth depth of compression from the fourth surface area 835, and chemically strengthening the existing second major surface 4005 to form an initial second central compressive stress region extending to an initial second central depth of compression from the existing second major surface 4005.

After step 1811, the foldable substrate 4007 can comprise one or more initial compressive stress regions (e.g., first, second, third, fourth, first central, and/or second central compressive stress region(s)) comprising an initial depth of compression and/or an associated initial depth of layer. In some embodiments, the initial first depth of compression, initial second depth of compression, initial third depth of compression, and/or initial fourth depth of compression as a percentage of the substrate thickness 811 can be about 5% or more, 10% or more, about 12% or more, about 14% or more, about 25% or less, about 20% or less, about 18% or less, or about 16% or less. In some embodiments, the initial first depth of compression, initial second depth of compression, initial third depth of compression, and/or initial fourth depth of compression as a percentage of the substrate thickness 811 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of compression, initial second depth of compression, initial third depth of compression, and/or initial fourth depth of compression as a percentage of the corresponding depth of compression of the finished foldable substrate 4007 can be about 50% or more, about 60% or more, about 65% or more, about 68% or more, about 80% or less, about 75% or less, or about 72% or less, or about 70% or less. In some embodiments, the initial first depth of compression, initial second depth of compression, initial third depth of compression, and/or initial fourth depth of compression as a percentage of the corresponding depth of compression of the finished foldable substrate 4007 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween. In some embodiments, the initial first depth of layer, initial second depth of layer, initial third depth of layer, and/or initial fourth depth of layer as a percentage of the substrate thickness 811 can be about 5% or more, 10% or more, about 12% or more, about 14% or more, about 25% or less, about 20% or less, about 18% or less, or about 16% or less. In some embodiments, the initial first depth of layer, initial second depth of layer, initial third depth of layer, and/or initial fourth depth of layer as a percentage of the substrate thickness 811 can be in a range from about 5% to about 25%, from about 8% to about 25%, from about 8% to about 20%, from about 10% to about 20%, from about 10% to about 18%, from about 12% to about 18%, from about 12% to about 16%, from about 14% to about 16%, or any range or subrange therebetween. In some embodiments, the initial first depth of layer, initial second depth of layer, initial third depth of layer, and/or initial fourth depth of layer as a percentage of the corresponding depth of layer of the finished foldable substrate 4007 can be about 50% or more, about 60% or more, about 65% or more, about 68% or more, about 80% or less, about 75% or less, or about 72% or less, or about 70% or less. In some embodiments, the initial first depth of layer, initial second depth of layer, initial third depth of layer, and/or initial fourth depth of layer as a percentage of the corresponding depth of compression of the finished foldable substrate 4007 can be in a range from about 50% to about 80%, from about 60% to about 80%, from about 60% to about 75%, from about 65% to about 75%, from about 65% to about 72%, from about 68% to about 72%, from about 68% to about 70%, or any range or subrange therebetween.

In some embodiments, as shown in FIG. 42, after step 1811 (e.g., before etching the foldable substrate 4007 in step 1815), the existing second central surface area comprising the existing second major surface 4005 can stand proud from the second major surface 805. As discussed above, the second surface area 825 and the fourth surface area 835 can comprise the second major surface 805. In further embodiments, a distance that the existing second central surface area comprising the existing second major surface 4005 stands proud from the second major surface 805 can be substantially equal to or greater than the initial second central depth of compression created in step 1811.

After step 1811, as shown in FIGS. 43-44, methods can proceed to step 1813 comprising disposing mask(s) over the foldable substrate 4007. In some embodiments, as shown in FIG. 43, step 1813 can comprise disposing a first liquid deposit 4303 over the second surface area 825 and disposing a second liquid deposit 4305 over the fourth surface area 835. In further embodiments, as shown, container 3201 (e.g., conduit, flexible tube, micropipette, or syringe) may be used to dispose the liquid comprising the first liquid deposit 4303 and the second liquid deposit 4305. In further embodiments, although not shown, a third liquid deposit can be disposed over the first surface area 823 and/or a fourth liquid deposit can be disposed over the second surface area 825. In further embodiments, the liquid deposits (e.g., first liquid deposit 4303, second liquid deposit 4305) can be cured to form masks (e.g., second mask 4405 and/or fourth mask 4409 shown in FIG. 44). Curing the liquid deposit(s) can comprise heating it, irradiating it with ultraviolet (UV) radiation, and/or waiting a predetermined amount of time. In further embodiments, another method, as discussed above, may be used to form the mask(s). As shown in FIG. 44, step 1813 can result in a first mask 4407 disposed over the first surface area 823, a second mask 4405 disposed over the second surface area 825, a third mask 4411 disposed over the third surface area 833, and a fourth mask 4409 disposed over the fourth surface area 835.

After step 1813, as shown in FIG. 44, methods can proceed to step 1815 comprising etching the foldable substrate 4007. In further embodiments, as shown, the etching solution 4403 can be a liquid etchant contained in an etchant bath 4401. In even further embodiments, the etching solution 4403 can comprise one or more mineral acids (e.g., HCl, HF, $H_2SO_4$, $HNO_3$). In some embodiments, as shown, etching can comprise etching the central portion 4081 of the existing second major surface 4005 extending along the plane 4104 to form a second central surface area 819. In further embodiments, as shown, the second central surface area 819 can be coplanar with the second surface area 825 and/or the fourth surface area 835. In some embodiments, as shown, etching can comprise etching the central portion 881 comprising the existing first central surface area 4009 (see FIG. 42) (e.g., extending along another plane 4406) to reveal a second central surface area 4509. In some embodiments, a depth of material removed to reveal the first central surface area can be substantially equal to, less than, or greater than the initial first central depth of compression. In some embodiments, a depth of material removed to reveal the second central surface area can be substantially equal to, less than, or greater than the initial second central depth of compression.

Figure 45:
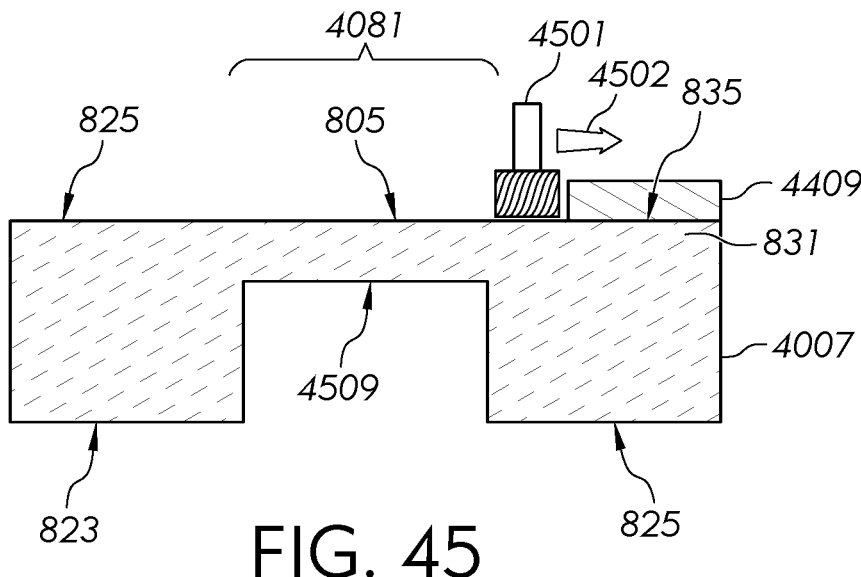

After step 1815, as shown in FIG. 45, methods of the disclosure can proceed to step 1817 comprising removing the mask(s). In some embodiments, as shown, removing the mask(s) (e.g., fourth mask 4409) can comprise moving a grinding a tool 4501 in a direction 4502 across the surface (e.g., fourth surface area 835). In even further embodiments, using the tool may comprise sweeping, scraping, grinding, pushing, etc. In further embodiments, the mask(s) can be removed by washing the surface(s) of the foldable substrate with a solvent. In some embodiments, as shown, removing the mask(s) can comprise removing the first mask 4407 from the first surface area 823, removing the second mask 4405 from the second surface area 825, removing the third mask 4411 from the third surface area 833, and/or removing the fourth mask 4409 from the fourth surface area (e.g., with the grinding tool 4501).

Figure 46:
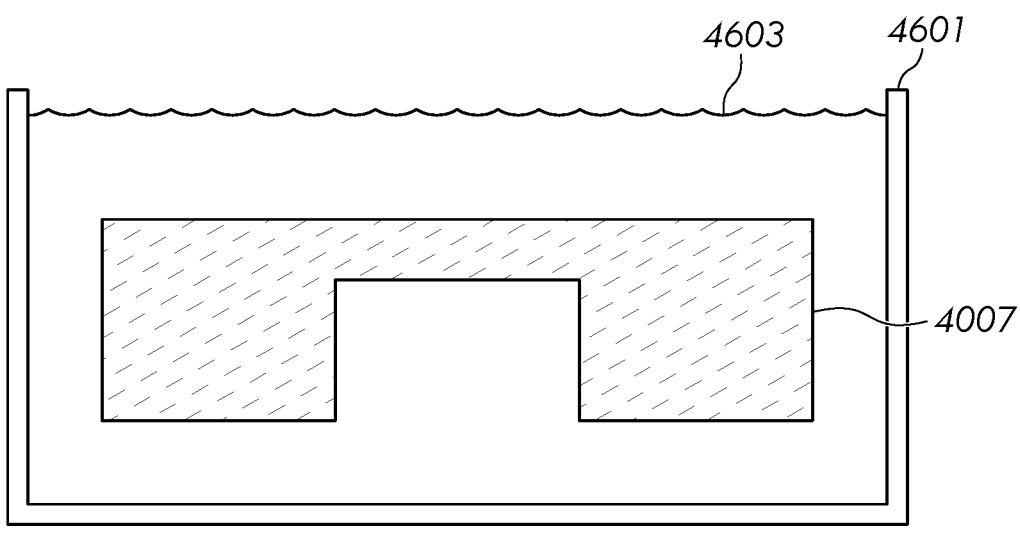

After step 1817, methods of the disclosure can proceed to step 1819 comprising further chemically strengthening the foldable substrate 807. In some embodiments, as shown in FIG. 46, the further chemically strengthening the foldable substrate 4007 in step 1817 can be similar or identical to the chemically strengthening in step 1605, 1615, or 1811 discussed above. In some embodiments, as shown in FIG. 46, step 1817 can comprise contacting at least a portion of a foldable substrate 4007 comprising lithium cations and/or sodium cations with a salt bath 4601 comprising salt solution 4603 comprising one or more of the alkali metal ions and/or alkali metal-containing compounds discussed above with regards to step 1811, 1615, or 1509. In some embodiments, the salt solution 4603 can comprise a temperature within one or more of the ranges discussed above with regards to steps 1811, 1615, or 1509. After step 1819, the foldable substrate 4007 can comprise one or more compressive stress regions (e.g., first, second, third, fourth, first central, and/or second central compressive stress region(s)) comprising a depth of compression and/or an associated depth of layer within the one or more ranges discussed above in regards to the corresponding compressive stress region, which can further comprise any and/or all of the relationships discussed above (e.g., an absolute difference between the depth of compression and/or depth of layer from the first surface area, second surface area, third surface area, and/or fourth surface area as a percentage of the substrate thickness and the corresponding depth from the first central surface area and/or second central surface area as a percentage of the central thickness).

After step 1819, methods of the disclosure can proceed to step 1821 comprising disposing a material (e.g., coating 251, polymer-based portion 241, adhesive layer 261) over the first major surface 803 and/or in the first recess 834. In some embodiments, disposing the coating can be identical or substantially similar to step 1713 or 1715 discussed above.

After step 1817 or 1819, methods of the disclosure can proceed to step 1821 comprising assembling the foldable apparatus using the foldable substrate 4007. Step 1821 can comprise applying an adhesive layer to contact the first In Table 1, the thickness of the first portion and second portion, the thickness of the central portion, the average depth of layer (DOL) of the first portion and second portion, and the average depth of layer (DOL) of the central portion are presented for Examples A-C at different stages of the illustrated methods.

TABLE 1

| | | Initial | | First Chemically Strengthening | | Etching Central Portion | | Second Chemically Strengthening | |
|---|---|---|---|---|---|---|---|---|---|
| Example | | First/Second | Central | First/Second | Central | First/Second | Central | First/Second | Central |
| A | t (μm) | 100 | 58 | 100 | 58 | 100 | 30 | 100 | 30 |
| | DOL (μm) | 0 | 0 | 14 | 14 | 14 | 0 | 20 | 6 |
| B | t (μm) | 150 | 78 | 150 | 78 | 150 | 30 | 150 | 30 |
| | DOL (μm) | 0 | 0 | 24 | 24 | 24 | 0 | 30 | 6 |
| C | t (μm) | 200 | 98 | 200 | 98 | 200 | 30 | 200 | 30 |
| | DOL (μm) | 0 | 0 | 34 | 34 | 34 | 0 | 40 | 6 | major surface or second major surface of the foldable substrate. Further, step 1821 can comprise disposing a release liner (e.g., see release liner 271 in FIGS. 2 and 4) or a display device (e.g., see display device 307 in FIGS. 3 and 5) on the adhesive layer. After step 1821, methods of the disclosure according to the flow chart in FIG. 18 of making the foldable apparatus can be complete at step 1823.

In some embodiments, methods of making a foldable apparatus in accordance with embodiments of the disclosure can proceed along steps 1801, 1805, 1807, 1809, 1811, 1813, 1815, 1817, 1819, 1821, 1823, and 1825 of the flow chart in FIG. 18 sequentially, as discussed above. In some embodiments, as shown in FIG. 18, arrow 1802 can be followed from step 1801 to step 1803 comprising mechanically working the foldable substrate to remove material from the central portion of the first major surface. In some embodiments, arrow 1804 can be followed from step 1801 to step 1804, for example, if the foldable substrate already comprises a first recess at the end of step 1801. In some embodiments, methods can follow arrow 1812 from step 1821 to step 1821, for example, if the foldable apparatus fully assembled at the end of step 1821 or if another material is to be disposed in the second recess and/or over the second major surface. In some embodiments, methods can follow arrow 1808 from step 1819 to step 1825, for example, if the foldable substrate 4007 is the desired product (e.g., without a material in the first recess or second recess). Any of the above options may be combined to make a foldable apparatus in accordance with embodiments of the disclosure.

EXAMPLES

Figures 55, 56, 57:
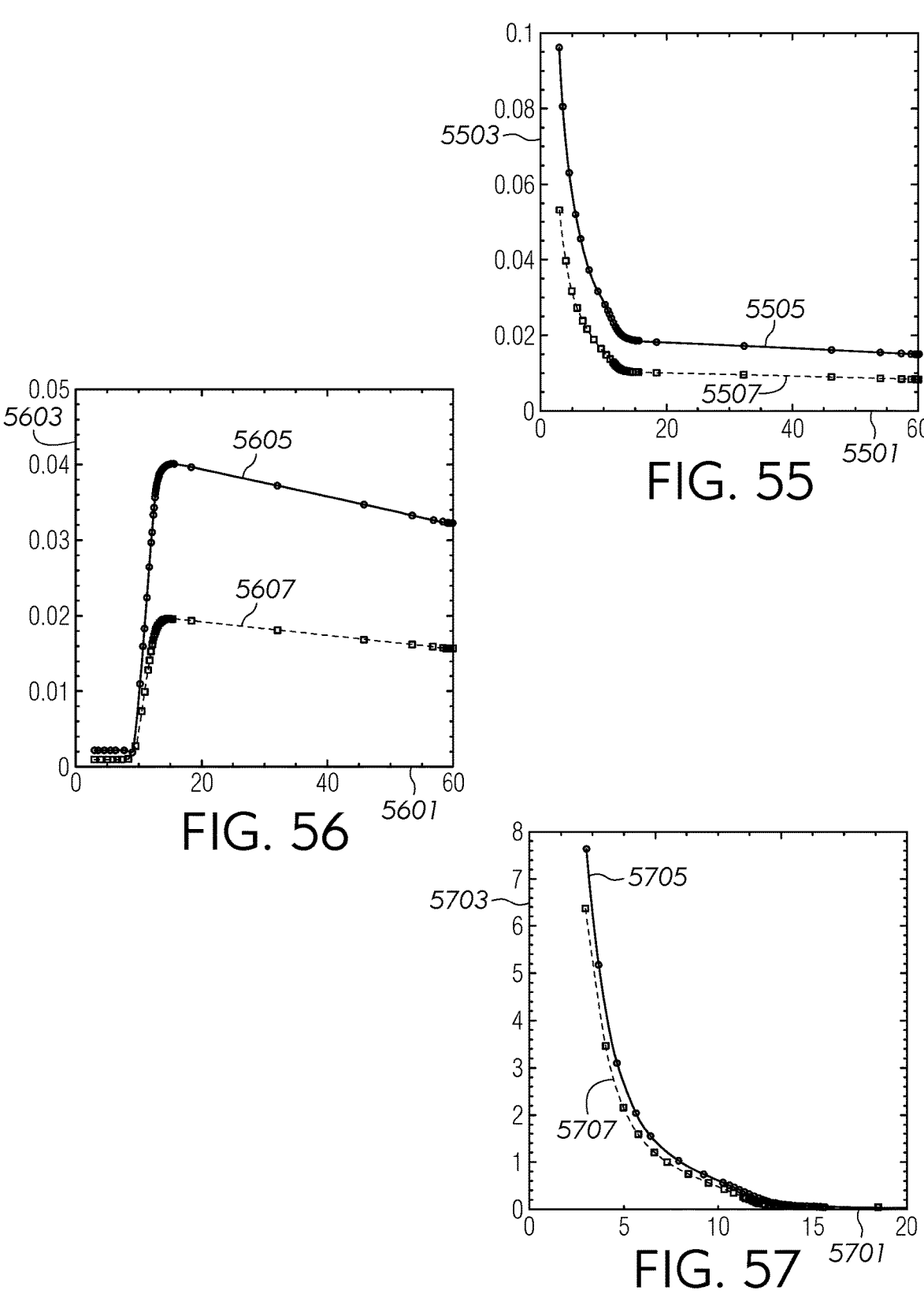
FIGS. 55-57 are plots illustrating results for some embodiments of the disclosure.
Figure 58:
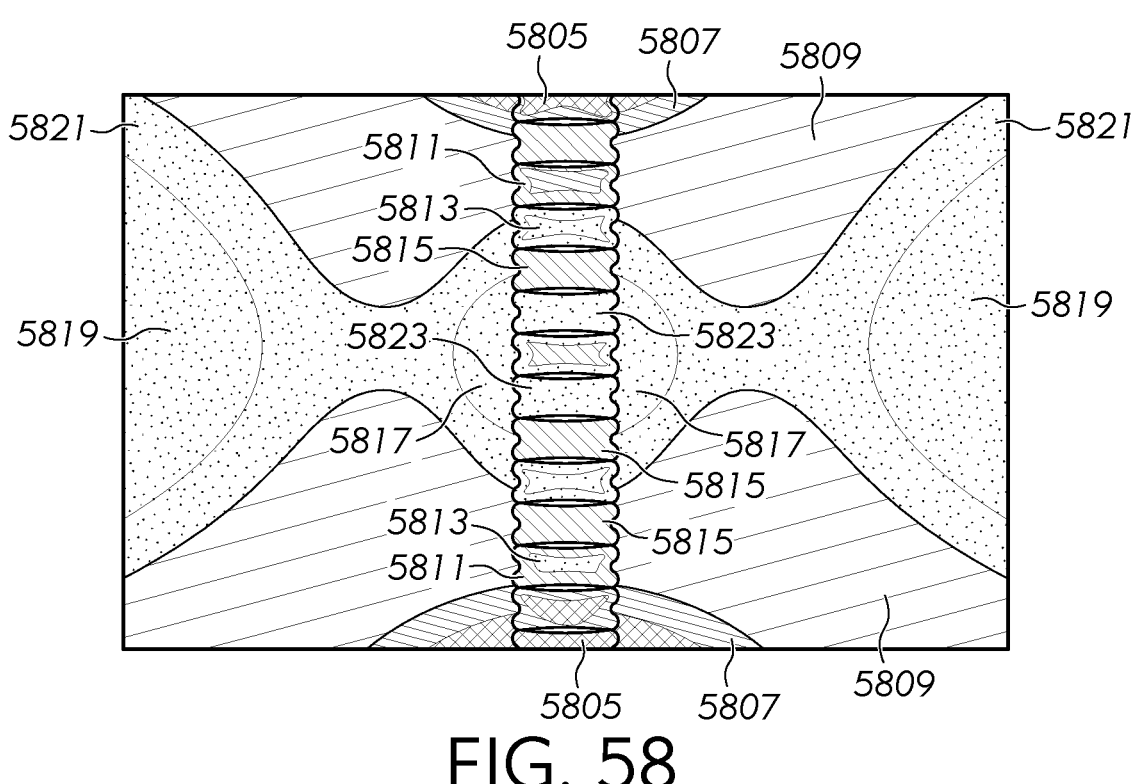
FIGS. 58-59 schematically show optical retardation measurements for a foldable substrate of embodiments of the disclosure.
Figure 59:
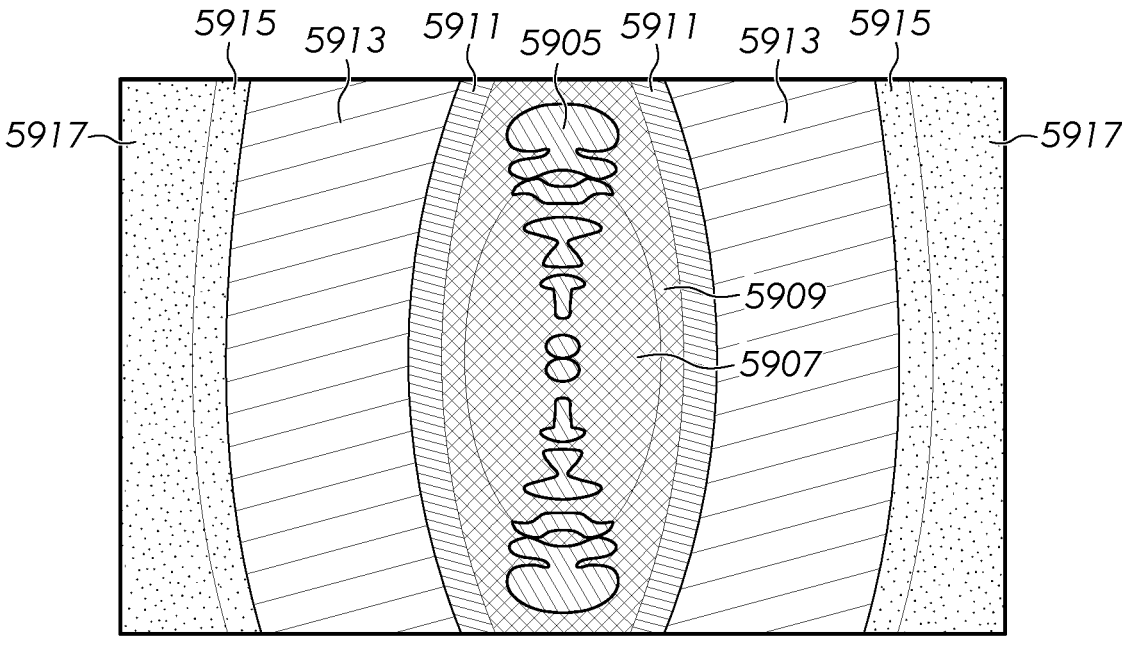

Various embodiments will be further clarified by the following examples. Examples A-C demonstrate example methods of embodiments of the disclosure for forming a foldable apparatus 401, 501, 701, or 801 comprising foldable substrate 407 or 801 shown in FIGS. 4-5 and 7-8. The strain of a material in a first recess of Examples D-E, the strain at the first central surface area of Examples D-E, and the force to fold Examples D-E are illustrated in FIGS. 55-57. The out-of-plane warp based on numerical simulations is schematically shown in FIGS. 58-59 for Examples F-G.

Example A initially comprised a glass-based substrate comprising a substrate thickness (e.g., first thickness, second thickness) of 100 μm and a central thickness of 58 μm. In the first chemically strengthening process, a substantially uniform depth of layer (DOL) of 14 μm was developed from all surfaces. Then, etching the central portion removed 14 μm from an existing first central surface area and 14 μm from a second existing second surface area, which removed substantially the entire DOL from those surfaces to produce a central thickness of 30 μm while leaving the first portion and second portion as is. In a second chemically strengthening process, all surfaces were strengthened sufficient to develop a DOL of 6 μm for the first central surface area and the second central surface area, which process also increased the DOL of the surfaces in the first portion and the second portion by 6 μm. As a whole, this process produced a first portion and a second portion comprising a DOL of 20 μm (20% of the 100 μm substrate thickness) and a central portion comprising a DOL of 6 μm (20% of the 30 μm central thickness).

Example B initially comprised a glass-based substrate comprising a substrate thickness (e.g., first thickness, second thickness) of 100 μm and a central thickness of 78 μm. In the first chemically strengthening process, a substantially uniform depth of layer (DOL) of 24 μm was developed from all surfaces. Then, etching the central portion removed 24 μm from an existing first central surface area and 24 μm from a second existing second surface area, which removed substantially the entire DOL from those surfaces to produce a central thickness of 30 μm while leaving the first portion and second portion as is. In a second chemically strengthening process, all surfaces were strengthened sufficient to develop a DOL of 6 μm for the first central surface area and the second central surface area, which process also increased the DOL of the surfaces in the first portion and the second portion by 6 μm. As a whole, this process produced a first portion and a second portion comprising a DOL of 30 μm (20% of the 150 μm substrate thickness) and a central portion comprising a DOL of 6 μm (20% of the 30 μm central thickness).

Example C initially comprised a glass-based substrate comprising a substrate thickness (e.g., first thickness, second thickness) of 200 μm and a central thickness of 98 μm. In the first chemically strengthening process, a substantially uniform depth of layer (DOL) of 34 μm was developed from all surfaces. Then, etching the central portion removed 34 μm from an existing first central surface area and 34 μm from a second existing second surface area, which removed substantially the entire DOL from those surfaces to produce a central thickness of 30 μm while leaving the first portion and second portion as is. In a second chemically strengthening process, all surfaces were strengthened sufficient to develop a DOL of 6 μm for the first central surface area and the second central surface area, which process also increased the DOL of the surfaces in the first portion and the second portion by 6 μm. As a whole, this process produced a first portion and a second portion comprising a DOL of 40 μm (20% of the 200 μm substrate thickness) and a central portion comprising a DOL of 6 μm (20% of the 30 μm central thickness).

Examples A-C demonstrate methods to achieve an average depth of layer of the first portion (e.g., first depth of layer, second depth of layer) and/or second portion (e.g., third depth of layer, fourth depth of layer) as a percentage of the substrate thickness that can be substantially equal to the average depth of layer of the central portion (e.g., first central depth of layer, second central depth of layer) as a percentage of the central thickness for different substrate thicknesses. In Examples A-C, the first chemically strengthening process achieves a DOL of 14% of the substrate thickness (70% of final DOL), then the DOL was etched from each surface of the central portion, and finally the further chemically strengthened process was used to achieve the final DOL. It is to be understood that similar methods can be used to produce foldable substrates of different substrate thickness, different central thicknesses, and different DOL as a percentage of the corresponding thickness.

Examples D-E comprise a glass-based substrate (Composition 1 having a nominal composition in mol % of: 63.6 SiO$_2$; 15.7 Al$_2$O$_3$; 10.8 Na$_2$O; 6.2 Li$_2$O; 1.16 ZnO; 0.04 SnO$_2$; and 2.5 P$_2$O$_5$), a substrate thickness of 150 μm, a central thickness of 30 μm, and a width of the central portion of 20 mm without any transition portion. Example D comprises a first recess with a first central surface area recessed from the first major surface by 120 μm but no second recess opposite the first recess. Example E comprises a first recess with a first central surface area recessed from the first major surface by 60 μm and a second recess opposite the first recess, where the second central surface area is recessed from the second major surface by 60 μm.

In FIG. 55, the horizontal axis 5501 (e.g., x-axis) is the parallel plate distance (in mm), and the vertical axis 5503 (e.g., y-axis) is the strain on a material positioned in the first recess (e.g., polymer-based portion, adhesive material, coating). The results for Example D are shown by curve 5505, and the results for Example E are shown by curve 5507. As shown, Example D comprising a single, first recess has greater strain on the material positioned in the first recess than the corresponding material of Example E comprising both a first recess and a second recess for all parallel plate distances shown. Indeed, the strain for Example E is about half of the strain for Example D.

In FIG. 56, the horizontal axis 5601 (e.g., x-axis) is the parallel plate distance (in mm), and the vertical axis 5603 (e.g., y-axis) is the strain on the first central surface area. The results for Example D are shown by curve 5605, and the results for Example E are shown by curve 5607. As shown, Example D comprising the single, first recess has greater strain on the first central surface area than the corresponding first central surface area of Example E comprising both the first recess and the second recess for all parallel plate distances shown. Indeed, for parallel plate distances greater than at least 12 mm, the strain of Example E is about half of the strain of Example D.

In FIG. 57, the horizontal axis 5701 (e.g., x-axis) is the parallel plate distance (in mm), and the vertical axis 5703 (e.g., y-axis) is the force (in Newtons (N)) to fold the foldable substrate to a given parallel plate distance. The results for Example D are shown by curve 5705, and the results for Example E are shown by curve 5707. As shown, the force to fold Example D to a parallel plate of about 10 mm or less is greater than the corresponding force to fold Example E to the same parallel plate distance.

FIGS. 55-57 demonstrate that using two recesses opposite one another instead of a single recess can reduce the strain on the material positioned in the recess by about half, reduce the strain on the foldable substrate (e.g., first central surface area) by about half, and reduce the force to bend the foldable substrate.

FIGS. 58-59 schematically show out-of-plane deformation for foldable apparatus based on numerical simulations of Examples F-G. Examples F-G both comprise a substrate thickness of 150 μm, a central thickness of 30 μm, and a width of the central portion comprises 20 mm. In Example F, the second central surface area is coplanar with the second major surface while the first central surface area is recessed from the first major surface by 120 μm. In contrast, in Example G, the first central surface area is recessed from the first major surface by 65 μm and the second central surface area is recessed from the second major surface by 65 μm. In Examples F-G, the first portion and second portion comprise an artificial coefficient of thermal expansion of 21520×10$^{-7\circ}$ C.$^{-1}$ while the central portion comprises an artificial coefficient of thermal expansion of 4300×10$^{-7\circ}$ C.$^{-1}$, and the foldable substrates were heated 1° C. from a temperature at which the first portion, second portion, and central portions comprising the stated dimensions. As used herein, an artificial coefficient of thermal expansion is equal to a product of 0.461, the network dilation coefficient, a difference in concentration of one or more alkali metal ions at a surface and in the bulk, and a depth of layer of a compressive stress region from the surface divided by the corresponding thickness.

Without wishing to be bound by theory, mechanical instabilities encountered from the difference in artificial coefficients of thermal expansion in Examples F-G can correspond to mechanical instabilities generated from differential expansion based on different depths of compression and/or depths of layer in the different portions resulting from chemically strengthening the foldable substrate. For example, the difference in artificial coefficient of thermal expansion in Examples F-G could correspond to a difference between a depth of layer of the first portion and/or second portion (e.g., first depth of layer, second depth of layer, third depth of layer, fourth depth of layer) as a percentage of the substrate thickness and a depth of layer of the central portion (e.g., first central depth of layer, second central depth of layer) as a percentage of the central thickness of about 23% for a network dilation coefficient of 700×10$^{-6}$/mol % and a concentration difference of 20 mol % between the surface and the bulk of each portion, a network dilation coefficient of 933×10$^{-6}$/mol % and a concentration difference of 15 mol % between the surface and the bulk of each portion, or a network dilation coefficient of 1400×10$^{-6}$/mol % and a concentration difference of 10 mol % between the surface and a bulk of each portion. For example, the difference in artificial coefficient of thermal expansion in Examples F-G could correspond to a difference between a first maximum tensile stress and/or a second maximum tensile stress and a central maximum tensile stress of about 140 MPa when each portion comprises a Poisson's ratio of 0.22 and an elastic modulus of 71 GPa. For example, the difference in artificial coefficient of thermal expansion in Examples F-G could correspond to a difference between a maximum compressive stress of the first portion and/or second portion (e.g., first maximum compressive stress, second maximum compressive stress, third maximum compressive stress, fourth maximum compressive stress) and a maximum compressive stress of the central portion (e.g., first central maximum compressive stress, second maximum compressive stress) of about 140 MPa each portion comprises a Poisson's ratio of 0.22 and an elastic modulus of 71 GPa.

In FIG. 58, showing Example F, the central portion is centered and comprises a width roughly corresponding to the widest part of region 5811. Region 5805 corresponds to the largest positive deformation (e.g., about 80 μm) and is primarily positioned at the top and bottom edges of the foldable substrate in the central portion and adjacent portions. At the top and bottom, region 5807 is adjacent to region 5805, and region 5807 corresponds to slightly less positive deformation than region 5805. Region 5809 is adjacent to region 5807, and region 5809 corresponds to negative deformation (e.g., about −450 μm).

In contrast, region 5821 corresponds to the largest negative deformation (e.g., about −850 μm) and is positioned along a centerline of the central portion. Region 5823 is adjacent to region 5815 that comprises a more moderate negative deformation (e.g., about −350 μm). The central portion comprises roughly banded section comprising, from top to bottom, regions 5805, 5815, 5811, 5813, 5815, 5823, 5815, 5823, 5815, 5813, 5815, 5815, and 5805. Indeed, these bands alternate with region 5815 in every other band with the remaining bands towards the middle of FIG. 58 comprising region 5823. Region 5813 corresponds to negative deformation intermediate between than of region 5809 and region 5815. Region 5817 is adjacent to the center of the banded regions (e.g., regions 5815 and 5823) and corresponds to negative deformations (e.g., −700 μm) less extreme than region 5823. Region 5819, positioned at the right and left edges, corresponds to negative deformation (e.g., −600 μm) less extreme than region 5817.

In FIG. 59, showing Example G, the central portion is centered and comprises a width roughly corresponding to the widest part of region 5905. Region 5907 corresponds to the largest positive deformation (e.g., less than 1 picometer), which is at least 6 orders of magnitude less than those encountered in FIG. 58 for Example F. Region 5905 is adjacent to region 5909 that corresponds to less positive deformation than region 5905. Region 5909 is adjacent to region 5911 that corresponds to roughly no deformation. Region 5905 positioned along the centerline of the central portion corresponds to deformation intermediate between region 5911 and region 5909. Region 5917, positioned at the left and right edges, corresponds to the largest negative deformation (e.g., less than −1 picometer), which is at least 6 orders of magnitude less than those encountered in FIG. 58 for Example F. Region 5917 is adjacent to region 5915 that corresponds to less negative deformation than region 5917. Region 5913 is positioned between regions 5911 and 5915, and region 5913 corresponds to deformations intermediate between those of regions 5911 and 5915.

Based on the results of Examples F-G presented in FIGS. 58-59, Example G comprising a central portion recessed from both the first major surface and the second major surface exhibited deformations at least 10 orders of magnitude less than those encountered for Example F. Further, positioning the central portion such that the first distance that the first central surface area is recessed from the first major surface is substantially equal to the second distance that second central surface area is recessed from the second major surface, as in Example G, further reduces deformations.

The above observations can be combined to provide foldable substrate comprising a low effective minimum bend radius, high impact resistance, low closing force, increased durability, and reduced fatigue. The portions can comprise glass-based and/or ceramic-based portions, which can provide good dimensional stability, reduced incidence of mechanical instabilities, good impact resistance, and/or good puncture resistance. The first portion and/or the second portion can comprise glass-based and/or ceramic-based portions comprising one or more compressive stress regions, which can further provide increased impact resistance and/or increased puncture resistance. By providing a substrate comprising a glass-based and/or ceramic-based substrate, the substrate can also provide increased impact resistance and/or puncture resistance while simultaneously facilitating good folding performance. In some embodiments, the substrate thickness can be sufficiently large (e.g., from about 80 micrometers (microns or μm) to about 2 millimeters) to further enhance impact resistance and puncture resistance. Providing foldable substrates comprising a central portion comprising a central thickness that is less than a substrate thickness (e.g., first thickness of the first portion and/or second thickness of the second portion) can enable small effective minimum bend radii (e.g., about 10 millimeters or less) based on the reduced thickness in the central portion.

In some embodiments, the foldable apparatus and/or foldable substrates can comprise a plurality of recesses, for example, a first central surface area recessed from a first major surface by a first distance and a second central surface area recessed from a second major surface by a second distance. Providing a first recess opposite a second recess can provide the central thickness that is less than a substrate thickness. Further, providing a first recess opposite a second recess can reduce a maximum bend-induced strain of the foldable apparatus, for example, between a central portion and a first portion and/or second portion since the central portion comprising the central thickness can be closer to a neutral axis of the foldable apparatus and/or foldable substrates than if only single recess was provided. Additionally, providing the first distance substantially equal to the second distance can reduce the incidence of mechanical instabilities in the central portion, for example, because the foldable substrate is symmetric about a plane comprising a midpoint in the substrate thickness and the central thickness. Moreover, providing a first recess opposite a second recess can reduce a bend-induced strain of a material positioned in the first recess and/or second recess compared to a single recess with a surface recessed by the sum of the first distance and the second distance. Providing a reduced bend-induced strain of a material positioned in the first recess and/or the second recess can enable the use of a wider range of materials because of the reduced strain requirements for the material. For example, stiffer and/or more rigid materials can be positioned in the first recess, which can improve impact resistance, puncture resistance, abrasion resistance, and/or scratch resistance of the foldable apparatus. Additionally, controlling properties of a first material positioned in a first recess and a second material positioned in a second recess can control the position of a neutral axis of the foldable apparatus and/or foldable substrates, which can reduce (e.g., mitigate, eliminate) the incidence of mechanical instabilities, apparatus fatigue, and/or apparatus failure. In some embodiments, the foldable apparatus and/or foldable substrates can comprise a first transition portion attaching the central portion to the first portion and/or a second transition region attaching the central portion to the second portion. Providing transition regions with continuously increasing thicknesses can reduce stress concentration in the transition regions and/or avoid optical distortions. Providing a sufficient length of the transition region(s) (e.g., about 1 mm or more) can avoid optical distortions that may otherwise exist from an abrupt, stepped changed in thickness of the foldable substrate. Providing a sufficiently small length of the transition regions (e.g., about 5 mm or less) can reduce the amount of the foldable apparatus and/or foldable substrates having an intermediate thickness that may have reduced impact resistance and/or reduced puncture resistance. Further, providing the first transition portion and/or the second transition portion with a tensile stress region comprising a maximum tensile stress that is greater than a maximum tensile stress of a central tensile stress region of the central portion can counteract a strain between the first portion or the second portion and the first transition portion and/or second transition portion during folding. Further, providing the first transition portion and/or the second transition portion with a tensile stress region comprising a maximum tensile stress that is greater than a maximum tensile stress of a first tensile stress region of the first portion and/or a second tensile stress region of the second portion can counteract a strain between the central portion and the first transition portion and/or second transition portion during folding.

Apparatus and methods of embodiments of the disclosure can reduce (e.g., mitigate, eliminate) the incidence of mechanical instabilities, apparatus fatigue, and/or apparatus failure by controlling (e.g., limiting, reducing, equalizing) a difference between an expansion of different portions of the foldable apparatus and/or the foldable substrates as a result of chemically strengthening. Controlling the difference between the expansion of different portion can reduce the chemical strengthening induced strain between portions of the foldable apparatus and/or the foldable substrates that can facilitate a greater fold-induced strain before the foldable apparatus and/or foldable substrates reach a critical buckling strain (e.g., onset of mechanical instabilities). Further, reducing mechanical instabilities and/or the difference between the core layer and the first outer layer and/or the first outer layer or the difference between the central portion and the first portion and/or the second portion can reduce optical distortions, for example, caused by strain within the foldable apparatus and/or foldable substrate from such difference(s).

In some embodiments, providing a foldable apparatus and/or foldable substrates comprising a laminate can enable control of a difference in expansion between a first portion, a second portion, and a central portion in a single chemically strengthening process. For example, the properties of a core layer relative to a first outer layer and/or a second outer layer can enable a substantially uniform expansion of the foldable apparatus and/or foldable substrate. In some embodiments, a density of the core layer can be greater than a density of the first outer layer and/or the second outer layer. In some embodiments, a coefficient of thermal expansion of the core layer can be greater than a coefficient of thermal expansion of the first outer layer and/or the second outer layer. In some embodiments, a network dilation coefficient of the core layer can be less than a network dilation coefficient of the first outer layer and/or the second outer layer. Further, providing a core layer with a relationship to the first outer layer and/or the second outer layer can reduce (e.g., minimize) a force to fold the foldable apparatus and/or foldable substrates.

Providing a first portion and/or a second portion comprising an average concentration of one or more alkali metal that is close to (e.g., within 100 parts per million, 10 parts per million on an oxide basis) a concentration of one or more alkali metal of the central portion can minimize differences in expansion of the first portion and/or the second portion compared to the central portion as a result of chemically strengthening. Substantially uniform expansion can decrease the incidence of mechanical deformation and/or mechanical instability as a result of the chemically strengthening. Providing a ratio of a depth of layer to a thickness of the first portion and/or the second portion that is close to (e.g., within 0.5%, within 0.1%, within 0.01%) a corresponding ratio of the central portion can minimize differences in near-surface expansion of the first portion and/or the second portion compared to the central portion as a result of chemically strengthening. Minimizing differences in near-surface expansion can reduce stresses and/or strains in a plane of the first major surface, the second major surface, the first central surface area, and/or the second central surface area, which can further reduce the incidence of mechanical deformation and/or mechanical instability as a result of the chemically strengthening. Providing a ratio of a depth of compression to a thickness of the first portion and/or the second portion that is close to (e.g., within 1%, within 0.5%, within 0.1%) a corresponding ratio of the central portion can minimize differences between chemically strengthening-induced strains in the first portion and/or the second portion relative to the central portion. Minimizing differences in chemically strengthening-induced strains can reduce the incidence of mechanical deformation and/or mechanical instability as a result of the chemically strengthening. Minimizing stresses and/or strains in the first major surface, the second major surface, the first central surface area, and/or the second central surface area can reduce stress-induced optical distortions. Also, minimizing such stresses can increase puncture and/or impact resistance. Also, minimizing such stresses can be associated with low difference in optical retardation along a centerline (e.g., about 2 nanometers or less). Further, minimizing such stresses can reduce the incidence of mechanical deformation and/or mechanical instability as a result of the chemically strengthening.

Methods of the disclosure can enable making foldable substrates comprising one or more of the above-mentioned benefits. In some embodiments, methods of the disclosure can achieve the above-mentioned benefits in a single chemically strengthening step, for example making a foldable substrate comprising a laminate, which can reduce time, equipment, space, and labor costs associated with producing a foldable substrate. In some embodiments, an existing recess (e.g., existing first central surface area recessed from the first major surface, existing second central surface area recessed from the second major surface) may be provided or formed prior to any chemically strengthening of the foldable substrate, which can provide the above benefits for foldable apparatus with deeper recesses (e.g., greater first distance, greater second distance) than might otherwise be achievable. In some embodiments, the above benefits can be provided by chemically strengthening the foldable substrate, etching the central portion of the foldable substrate (e.g., etching an existing first central surface area to form a new first central surface area, etching an existing second central surface area to form a new second central surface area), and then further chemically strengthening the foldable substrate. In further embodiments, the above benefits can be provided by controlling a period of time of the chemically strengthening relative to a second period of time of the further chemically strengthening, and/or a thickness etched from the central portion. Providing the further chemically strengthening the foldable substrate can achieve greater compressive stresses without encountering mechanical deformation and/or mechanical instability, and the greater compressive stresses can further increase the impact and/or puncture resistance of the foldable substrate.

Directional terms as used herein—for example, up, down, right, left, front, back, top, bottom—are made only with reference to the figures as drawn and are not intended to imply absolute orientation.

It will be appreciated that the various disclosed embodiments may involve features, elements, or steps that are described in connection with that embodiment. It will also be appreciated that a feature, element, or step, although described in relation to one embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. For example, reference to "a component" comprises embodiments having two or more such components unless the context clearly indicates otherwise. Likewise, a "plurality" is intended to denote "more than one."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. Ranges can be expressed herein as from "about" one particular value, and/or to "about" another particular value. When such a range is expressed, embodiments include from the one particular value and/or to the other particular value. Similarly, when values are expressed as approximations, by use of the antecedent "about," it will be understood that the particular value forms another embodiment. Whether or not a numerical value or endpoint of a range in the specification recites "about," the numerical value or endpoint of a range is intended to include two embodiments: one modified by "about," and one not modified by "about." It will be further understood that the endpoints of each of the ranges are significant both in relation to the other endpoint and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, for example, within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an apparatus that comprises A+B+C include embodiments where an apparatus consists of A+B+C and embodiments where an apparatus consists essentially of A+B+C. As used herein, the terms "comprising" and "including", and variations thereof shall be construed as synonymous and open-ended unless otherwise indicated.

The above embodiments, and the features of those embodiments, are exemplary and can be provided alone or in any combination with any one or more features of other embodiments provided herein without departing from the scope of the disclosure.

It will be apparent to those skilled in the art that various modifications and variations can be made to the present disclosure without departing from the spirit and scope of the disclosure. Thus, it is intended that the present disclosure cover the modifications and variations of the embodiments herein provided they come within the scope of the appended claims and their equivalents.

What is claimed is:

1. A foldable substrate comprises:
   a substrate thickness defined between a first major surface and a second major surface opposite the first major surface, the substrate thickness is in a range from about 100 micrometers to about 2 millimeters;
   a first portion comprising the substrate thickness, the first portion comprises a first average concentration of potassium on an oxide basis, a first compressive stress region extending to a first depth of compression from the first major surface, a second compressive stress region extending to a second depth of compression from the second major surface;
   a second portion comprising the substrate thickness, the second portion comprises a second average concentration of potassium on an oxide basis, a third compressive stress region extending to a third depth of compression from the first major surface, a fourth compressive stress region extending to a fourth depth of compression from the second major surface;
   a central portion positioned between the first portion and the second portion, the central portion comprises a central thickness defined between a first central surface area and a second central surface area opposite the first central surface area, a central average concentration of potassium on an oxide basis, a first central compressive stress region extending to a first central depth of compression from the first central surface area, the central portion further comprises a second central compressive stress region extending to a second central depth of compression from the second central surface area, wherein the central thickness is in a range from about 25 micrometers to about 80 micrometers, wherein the first central surface area is recessed from the first major surface by a first distance, and an absolute difference between the first average concentration of potassium and the central average concentration of potassium is about 100 parts per million or less.

2. The foldable substrate of claim 1, wherein an absolute difference between the first depth of compression as a percentage of the substrate thickness and the first central depth of compression as a percentage of the central thickness is about 1% or less.

3. The foldable substrate of claim 1, wherein the substrate thickness is in a range from about 125 micrometers to about 200 micrometers.

4. The foldable substrate of claim 1, wherein the second central surface area is recessed from the second major surface by a second distance.

5. The foldable substrate of claim 4, wherein the second distance is from about 5% to about 20% of the substrate thickness.

6. The foldable substrate of claim 4, wherein the first distance is substantially equal to the second distance.

7. The foldable substrate of any one of claim 1, wherein the first compressive stress region comprises a first maximum compressive stress of about 700 MegaPascals or more; the second compressive stress region comprises a second maximum compressive stress; the third compressive stress region comprises a third maximum compressive stress of about 700 MegaPascals or more; the fourth compressive stress region comprises a fourth maximum compressive stress; the first central compressive stress region comprises a first central maximum compressive stress of about 700 MegaPascals or more; the second central compressive stress region comprises a second central maximum compressive stress.

8. The foldable substrate of claim 1, further comprising a first tensile stress region of the first portion positioned between the first compressive stress region and the second compressive stress region; the first tensile stress region comprises a first maximum tensile stress; the foldable substrate comprises a second tensile stress region of the second portion positioned between the third compressive stress region and the fourth compressive stress region; the second tensile stress region comprises a second maximum tensile stress; the foldable substrate comprises a central tensile stress region of the central portion positioned between the first central compressive stress region and a second central compressive stress region; the central tensile stress region comprises a central maximum tensile stress; an absolute difference between the central maximum tensile stress and the first maximum tensile stress is about 10 MegaPascals or less.

9. The foldable substrate of claim 1, wherein the central portion further comprises a central tensile stress region of the central portion positioned between a portion of the first central surface area and a portion of the second central surface area; the central tensile stress region comprising a central maximum tensile stress; the central portion comprises a first transition portion attaching the first central major surface to the first portion; the first transition portion comprising a first transition tensile stress region comprising a first transition maximum tensile stress; the central portion comprises a second transition portion attaching the first central major surface to the second portion; the second transition portion comprising a second transition tensile stress region comprising a second transition maximum tensile stress; the first transition maximum tensile stress is greater than the central maximum tensile stress.

10. The foldable substrate of claim 9, wherein the second transition maximum tensile stress is greater than the central maximum tensile stress.

11. The foldable substrate of any one of claims 1-10, wherein the first distance is about 20% to about 45% of the substrate thickness.

12. The foldable substrate of claim 1, wherein the substrate achieves an effective bend radius of 5 millimeters.

13. A foldable apparatus comprising the foldable substrate of claim 1, the foldable apparatus further comprises an adhesive comprising a first contact surface and a second contact surface opposite the first contact surface, wherein at least a portion of the adhesive is positioned in a recess defined between the second central surface area and a second plane defined by the second major surface.

14. A foldable apparatus comprises the foldable substrate of claim 1, the foldable apparatus further comprises a polymer-based portion positioned in a recess defined between the second central surface area and a second plane defined by the second major surface, wherein the foldable apparatus comprises an adhesive comprising a first contact surface and a second contact surface opposite the first contact surface.

15. The foldable apparatus of claim 14, wherein the polymer-based portion comprises a strain at yield in a range from about 5% to about 10%, and wherein a magnitude of a difference between an index of refraction of the foldable substrate and an index of refraction of the polymer-based portion is about 0.1 or less.

* * * * *